US011635957B2

(12) United States Patent
Harthcock

(10) Patent No.: US 11,635,957 B2
(45) Date of Patent: Apr. 25, 2023

(54) HARDWARE-IMPLEMENTED UNIVERSAL FLOATING-POINT INSTRUCTION SET ARCHITECTURE FOR COMPUTING DIRECTLY WITH HUMAN-READABLE DECIMAL CHARACTER SEQUENCE FLOATING-POINT REPRESENTATION OPERANDS

(71) Applicant: Jerry D. Harthcock, Boerne, TX (US)

(72) Inventor: Jerry D. Harthcock, Boerne, TX (US)

( * ) Notice: Subject to any disclaimer, the term of this patent is extended or adjusted under 35 U.S.C. 154(b) by 0 days.

(21) Appl. No.: 17/591,963

(22) Filed: Feb. 3, 2022

(65) Prior Publication Data
US 2022/0156070 A1 May 19, 2022

Related U.S. Application Data

(62) Division of application No. 16/943,077, filed on Jul. 30, 2020, now Pat. No. 11,275,584.
(Continued)

(51) Int. Cl.
*G06F 9/30* (2018.01)
*G06F 7/483* (2006.01)
(Continued)

(52) U.S. Cl.
CPC ........... *G06F 9/30025* (2013.01); *G06F 5/00* (2013.01); *G06F 7/483* (2013.01);
(Continued)

(58) Field of Classification Search
CPC .. G06F 9/30025; G06F 7/483; G06F 9/30079; G06F 9/30101; G06F 9/3557;
(Continued)

(56) References Cited

U.S. PATENT DOCUMENTS

2007/0061387 A1* 3/2007 Carlough ................ H03M 7/24
708/204
2007/0203965 A1* 8/2007 Reynolds .............. G06F 40/111
708/200
(Continued)

OTHER PUBLICATIONS

L. -K. W. et al., Hardware Designs for Decimal Floating-Point Addition and Related Operations, IEEE Transactions on Computers, vol. 58, No. 3, Mar. 2009, pp. 322-335 [online], [retrieved on Nov. 9, 2022]. Retrieved from the Internet <URL: https://ieeexplore.ieee.org/document/4599577> <doi: 10.1109/TC.2008.147>.*

*Primary Examiner* — Shawn Doman
(74) *Attorney, Agent, or Firm* — Steven W. Smith

(57) ABSTRACT

A universal floating-point Instruction Set Architecture (ISA) compute engine implemented entirely in hardware. The ISA compute engine computes directly with human-readable decimal character sequence floating-point representation operands without first having to explicitly perform a conversion-to-binary-format process in software. A fully pipelined convertToBinaryFromDecimalCharacter hardware operator logic circuit converts one or more human-readable decimal character sequence floating-point representations to IEEE 754-2008 binary floating-point representations every clock cycle. Following computations by at least one hardware floating-point operator, a convertToDecimalCharacterFromBinary hardware conversion circuit converts the result back to a human-readable decimal character sequence floating-point representation.

20 Claims, 89 Drawing Sheets

Related U.S. Application Data

(60) Provisional application No. 62/886,570, filed on Aug. 14, 2019.

(51) Int. Cl.
*G06F 12/06* (2006.01)
*G06F 9/355* (2018.01)
*G06F 9/54* (2006.01)
*H03M 7/24* (2006.01)
*G06F 5/00* (2006.01)

(52) U.S. Cl.
CPC ...... *G06F 9/30079* (2013.01); *G06F 9/30101* (2013.01); *G06F 9/3557* (2013.01); *G06F 9/544* (2013.01); *G06F 12/063* (2013.01); *H03M 7/24* (2013.01)

(58) Field of Classification Search
CPC .......... G06F 9/544; G06F 12/063; G06F 9/30; G06F 9/321; G06F 9/325; G06F 9/35; G06F 9/38; G06F 9/3824; G06F 2212/1048; G06F 12/0292; G06F 2212/1024; G06F 12/0284; H03M 7/24
See application file for complete search history.

(56) References Cited

U.S. PATENT DOCUMENTS

| | | | |
|---|---|---|---|
| 2007/0266073 A1* | 11/2007 | Cornea-Hasegan | G06F 7/4912 708/680 |
| 2009/0240753 A1* | 9/2009 | Carlough | G06F 7/483 708/442 |
| 2014/0046994 A1* | 2/2014 | Kamoshida | G06F 7/483 708/505 |
| 2014/0101215 A1* | 4/2014 | Ayoub | H03M 7/12 708/204 |
| 2015/0089205 A1* | 3/2015 | Carlough | G06F 9/3016 712/222 |
| 2017/0322768 A1* | 11/2017 | Brooks | G06F 5/00 |
| 2021/0034328 A1* | 2/2021 | Payer | G06F 7/49947 |

* cited by examiner

1/89

←2000

| Direct Address | Programming Model Registers | Assembler Label | Access Modes | Reset State |
|---|---|---|---|---|
| 0x7FFF | not used | n/a | n/a | n/a |
| 0x7FFE | Stack Pointer | SP | R/W | 0x0000FF80 |
| 0x7FFD | Auxiliary Register 6 | AR6 | R/W | 0x00000000 |
| 0x7FFC | Auxiliary Register 5 | AR5 | R/W | 0x00000000 |
| 0x7FFB | Auxiliary Register 4 | AR4 | R/W | 0x00000000 |
| 0x7FFA | Auxiliary Register 3 | AR3 | R/W | 0x00000000 |
| 0x7FF9 | Auxiliary Register 2 | AR2 | R/W | 0x00000000 |
| 0x7FF8 | Auxiliary Register 1 | AR1 | R/W | 0x00000000 |
| 0x7FF7 | Auxiliary Register 0 | AR0 | R/W | 0x00000000 |
| 0x7FF6 | Branch Always Long | PCR | W | n/a |
| 0x7FF5 | Program Counter (PC) | PC | R/W | 0x00000100 |
| 0x7FF4 | Bit-Test and Branch If Set | PCS | W | n/a |
| 0x7FF3 | Bit-Test and Branch If Clear | PCC | W | n/a |
| 0x7FF2 | PC Copy | PC_COPY | R | 0x00000100 |
| 0x7FF1 | Status Register | STATUS | R/W | 0x0000000040000191 |
| 0x7FF0 | not used | n/a | n/a | n/a |
| 0x7FEF | Repeat Counter | REPEAT | R/W | 0x00000000 |
| 0x7FEE | Loop Counter 1 | LPCNT1 | R/W | 0x00000000 |
| 0x7FED | Loop Counter 0 | LPCNT0 | R/W | 0x00000000 |
| 0x7FEC | Timer | TIMER | R/W | 0x00000000 |
| 0x7FEB | Real-Time Monitor Data | n/a | R | 0x00000000 |
| 0x7FEA | not used | n/a | n/a | n/a |
| 0x7FE9 | not used | n/a | n/a | n/a |
| 0x7FE8 | Spare Vector 1 | n/a | n/a | n/a |
| 0x7FE7 | Spare Vector 0 | n/a | n/a | n/a |
| 0x7FE6 | NMI Vector | NMI_VECT | W | 0x00000000 |
| 0x7FE5 | IRQ Vector | IRQ_VECT | W | 0x00000000 |
| 0x7FE4 | Invalid Vector | INV_VECT | W | 0x00000000 |
| 0x7FE3 | Divide By Zero Vector | DIVx0_VECT | W | 0x00000000 |
| 0x7FE2 | Overflow Vector | OVFL_VECT | W | 0x00000000 |
| 0x7FE1 | Underflow Vector | UNFL_VECT | W | 0x00000000 |
| 0x7FE0 | Inexact Vector | INEXT_VECT | W | 0x00000000 |
| 0x7FDF | XCU Control Register | XCUCR | R/W | 0x00000000FFFF0000 |
| 0x7FDE | XCU Status Register | XCUSR | R | 0xFFFF000000000000 |
| 0x7FDD | Exception Capture Register 3 | CAPT_3 | R | 0x0000000000000000 |
| 0x7FDC | Exception Capture Register 2 | CAPT_2 | R | 0x0000000000000000 |
| 0x7FDB | Exception Capture Register 1 | CAPT_1 | R | 0x0000000000000000 |
| 0x7FDA | Exception Capture Register 0 | CAPT_0 | R | 0x0000000000000000 |
| 0x7FC4 | XCU Pre-emption Register | PREEMPT | W | 0x0000 |
| 0x7FC3 | XCU Single-Step Register | SSTEP | W | 0x0000 |
| 0x7FC2 | XCU Force_Break Register | FBREAK | W | 0x0000 |
| 0x7FC1 | XCU Force-Reset Register | FRESET | W | 0x0000 |
| 0x7FC0 | XCU Poke_All Register | POKEALL | W | 0x0000 |
| 0x7FBX | XCU Monitor Request | MREQ | W | 0x0000000000000000 |

| IEEE 754-2008 Mandated Comparison Predicates | Assembler Label | Direct Address | Input Size (in bytes) |
|---|---|---|---|
| compareSignalingEqual | cmpSE | 0x7CFF | 2,4,8 |
| compareQuietEqual | cmpQE | 0x7CFE | 2,4,8 |
| compareSignalingNotEqual | cmpSNE | 0x7CFD | 2,4,8 |
| compareQuietNotEqual | cmpQNE | 0x7CFC | 2,4,8 |
| compareSignalingGreater | cmpSG | 0x7CFB | 2,4,8 |
| compareQuietGreater | cmpQG | 0x7CFA | 2,4,8 |
| compareSignalingGreaterEqual | cmpSGE | 0x7CF9 | 2,4,8 |
| compareQuietGreaterEqual | cmpQGE | 0x7CF8 | 2,4,8 |
| compareSignalingLess | cmpSL | 0x7CF7 | 2,4,8 |
| compareQuietLess | cmpQL | 0x7CF6 | 2,4,8 |
| compareSignalingLessEqual | cmpSLE | 0x7CF5 | 2,4,8 |
| compareQuietLessEqual | cmpQLE | 0x7CF4 | 2,4,8 |
| compareSignalingNotGreater | cmpSNG | 0x7CF3 | 2,4,8 |
| compareQuietNotGreater | cmpQNG | 0x7CF2 | 2,4,8 |
| compareSignalingLessUnordered | cmpSLU | 0x7CF1 | 2,4,8 |
| compareQuietLessUnordered | cmpQLU | 0x7CF0 | 2,4,8 |
| compareSignalingNotLess | cmpSNL | 0x7CEF | 2,4,8 |
| compareQuietNotLess | cmpQNL | 0x7CEE | 2,4,8 |
| compareSignalingGreaterUnordered | cmpSGU | 0x7CED | 2,4,8 |
| compareQuietGreaterUnordered | cmpQGU | 0x7CEC | 2,4,8 |
| compareQuietUnordered | cmpQU | 0x7CEB | 2,4,8 |
| compareQuietOrdered | cmpQO | 0x7CEA | 2,4,8 |

| IEEE 754-2008 Mandated (dual-operand) non-computational non-exceptional operators | Assembler Label | Direct Address | Input Size (in bytes) |
|---|---|---|---|
| totalOrder | tOrd | 0x7CE9 | 2,4,8 |
| totalOrderMag | tOrdM | 0x7CE8 | 2,4,8 |

| IEEE 754-2008 Mandated (single-operand) non-computational non-exceptional operators | Assembler Label | Direct Address | Input Size (in bytes) |
|---|---|---|---|
| isCanonical | isCanonical | 0x7CD8 | 2,4,8 |
| isSignaling | isSignaling | 0x7CD7 | 2,4,8 |
| isNaN | isNaN | 0x7CD6 | 2,4,8 |
| isInfinite | isInfinite | 0x7CD5 | 2,4,8 |
| isSubnormal | isSubnormal | 0x7CD4 | 2,4,8 |
| isZero | isZero | 0x7CD3 | 2,4,8 |
| isFinite | isFinite | 0x7CD2 | 2,4,8 |
| isNormal | isNormal | 0x7CD1 | 2,4,8 |
| isSignMinus | isSignMinus | 0x7CD0 | 2,4,8 |
| Class | clas | 0x7FCE | 2,4,8 |

| Miscellaneous Mandated Operations | Assembler Lable | Direct Address | Example Code |
|---|---|---|---|
| saveAllFlags | saveAllFlags | 0x7FD9 | _8:saveAllFlags = _8:STATUS |
| testSavedFlags | tstSavFlg | 0x7FCE | _1:tstSavflg = _1:saveAllFlags |
| testFlags | tstFlg | 0x7CE3 | _1:tstFlg = (_1:saveAllFlags, _1:#3) |
| getBinaryRoundingDirection | sgtBinRnDir | 0x7FD8 | _1:sgtBinRnDir = _8:STATUS |
| setBinaryRoundingDirection | sgtBinRnDir | 0x7FD8 | _1:sgtBinRnDir = _1: getRndDir |
| saveModes | saveModes | 0x7FD7 | _1:saveModes = _8: STATUS |
| restoreModes | restModes | 0x7FD7 | _1:restModes = _1: saveModes |
| defaultModes | defModes | 0x7FD7 | _1:defModes = _1:#0 |
| radix | radix | 0x7FD5 | _1:<dest> = _1:radix |
| is1985 | is1985 | 0x0000 | _1:<dest> = _1:is1985 |
| is2008 | is2008 | 0x7FD0 | _1:<dest> = _1:is2008 |

| Implemented but not Mandated Computational Operators | Assembler Lable with 1st buffer# | Last buffer# | 1st Direct Address | Input Size (in bytes) | Result Size |
|---|---|---|---|---|---|
| SIND (integer in, SP degrees out) | SIND.0 | SIND.15 | 0x7B50 | 1,2 | 2 |
| COSD (integer in, SP degrees out) | COSD.0 | COSD.15 | 0x7B40 | 1,2 | 2 |
| TAND (integer in, SP degrees out) | TAND.0 | TAND.15 | 0x7B30 | 1,2 | 2 |
| COTD (integer in, SP degrees out) | COTD.0 | COTD.15 | 0x7B20 | 1,2 | 2 |
| LOG | LOG.0 | LOG.15 | 0x7B10 | 2,4,8 | 2,4,8 |
| EXP | EXP.0 | EXP.15 | 0x7B00 | 2,4,8 | 2,4,8 |
| POW | POW.0 | POW.31 | 0x7AE0 | 2,4,8 | 2,4,8 |
| POWR | POWR.0 | POWR.31 | 0x7AE0 | 2,4,8 | 2,4,8 |
| POWN | POWN.0 | POWN.31 | 0x7AE0 | 2,4,8 | 2,4,8 |
| universal FusedMultiplyAdd | UFMA.0 | UFMA.31 | 0x7B60 | 1 to 47 | 2,4,8 |
| universal C register/Accumulator | UC.0 | UC.31 | 0x7B80 | 1 to 47 | 2,4,8 |

| Logical and Integer Arithmatic Operators | Assembler Lable with 1st buffer# | Last buffer# | Direct Address | Input Size (in bytes) | Result Size |
|---|---|---|---|---|---|
| AND | and.0 | and.15 | 0x7EF0 | 1,2,4,8 | 1,2,4,8 |
| OR | or.0 | or.15 | 0x7EE0 | 1,2,4,8 | 1,2,4,8 |
| XOR | xor.0 | xor.15 | 0x7ED0 | 1,2,4,8 | 1,2,4,8 |
| ADD | add.0 | add.15 | 0x7EC0 | 1,2,4,8 | 1,2,4,8 |
| ADDC | addc.0 | addc.15 | 0x7EB0 | 1,2,4,8 | 1,2,4,8 |
| SUB | sub.0 | sub.15 | 0x7EA0 | 1,2,4,8 | 1,2,4,8 |
| SUBB | subb.0 | subb.15 | 0x7E90 | 1,2,4,8 | 1,2,4,8 |
| MUL | mul.0 | mul.15 | 0x7E80 | 1,2,4,8 | 1,2,4,8 |
| DIV | div.0 | div.15 | 0x7E70 | 1,2,4,8 | 1,2,4,8 |
| Shift | shft.0 | shft.15 | 0x7E60 | 1,2,4,8 | 1,2,4,8 |
| Maximum | max.0 | max.15 | 0x7E50 | 1,2,4,8 | 1,2,4,8 |
| Minimum | min.0 | min.15 | 0x7E40 | 1,2,4,8 | 1,2,4,8 |
| Bit Set | bset.0 | bset.15 | 0x7E30 | 1,2,4,8 | 1,2,4,8 |
| Bit Clear | bclr.0 | bclr.15 | 0x7E20 | 1,2,4,8 | 1,2,4,8 |
| Swap Endian-ness | endi.0 | endi.15 | 0x7E10 | 1,2,4,8 | 1,2,4,8 |
| Convert from Hex to ASCII | cnvFHTA.0 | cnvFHTA.15 | 0x7E00 | 1,2,4 | 1,2,4,8 |
| Convert to Hex from ASCII | cnvTHFA.0 | cnvTHFA.15 | 0x7DF0 | 1,2,4,8 | 1,2,4 |
| Compare | cmp | n/a | 0x7FCF | 1,2,4,8 | 1,2,4,8 |

| bit # | name | setBit Address | clearBit Address | group Bit Pos | reset State | readable | writeable | |
|---|---|---|---|---|---|---|---|---|
| 63 | subsAbruptUnderflow | 0x7CDF | 0x7CDE | 7 | 0 | yes | yes | ⎫ 5010 |
| 62 | substitute X | 0x7CDF | 0x7CDE | 6 | 0 | yes | yes | ⎪ Resuming alternate |
| 61 | substitute xor(X) | 0x7CDF | 0x7CDE | 5 | 0 | yes | yes | ⎬ exception handling |
| 60 | enable subs Inexact | 0x7CDF | 0x7CDE | 4 | 0 | yes | yes | ⎪ attributes |
| 59 | enable subs Underflow | 0x7CDF | 0x7CDE | 3 | 0 | yes | yes | ⎪ (substitution) |
| 58 | enable subs Overflow | 0x7CDF | 0x7CDE | 2 | 0 | yes | yes | ⎪ |
| 57 | enable subs DivBy0 | 0x7CDF | 0x7CDE | 1 | 0 | yes | yes | ⎪ |
| 56 | enable subs Invalid | 0x7CDF | 0x7CDE | 0 | 0 | yes | yes | ⎭ |
| 55 | override RM bits | 0x7CD9 | 0x7CD9 | 0 | 0 | yes | yes | 5020 |
| 54 | Away | 0x7FD8 | 0x7FD8 | 3 | 0 | yes | yes | ⎫ Rounding direction |
| 53 | enable RM attribute | 0x7FD8 | 0x7FD8 | 2 | 0 | yes | yes | ⎬ attributes |
| 52 | RM bit 1 | 0x7FD8 | 0x7FD8 | 1 | 0 | yes | yes | ⎪ |
| 51 | RM bit 0 | 0x7FD8 | 0x7FD8 | 0 | 0 | yes | yes | ⎭ |
| 50 | IEEE compare True | n/a | n/a | n/a | 0 | yes | yes | 5030 |
| 49 | IEEE "is" True | n/a | n/a | n/a | 0 | yes | yes | 5040 |
| 48 | a flag raised | n/a | n/a | n/a | 0 | yes | yes | 5050 |
| 47 | total Order Mag True | n/a | n/a | n/a | 0 | yes | yes | 5060 |
| 46 | total Order True | n/a | n/a | n/a | 0 | yes | yes | 5070 |
| 45 | positive Infinity | n/a | n/a | n/a | 0 | yes | yes | ⎫ |
| 44 | positive Normal | n/a | n/a | n/a | 0 | yes | yes | ⎪ |
| 43 | positive subNormal | n/a | n/a | n/a | 0 | yes | yes | ⎪ 5080 |
| 42 | positive Zero | n/a | n/a | n/a | 0 | yes | yes | ⎬ |
| 41 | negative Zero | n/a | n/a | n/a | 0 | yes | yes | ⎪ Class |
| 40 | negative subNormal | n/a | n/a | n/a | 0 | yes | yes | ⎪ |
| 39 | negative Normal | n/a | n/a | n/a | 0 | yes | yes | ⎪ |
| 38 | negative Infinity | n/a | n/a | n/a | 0 | yes | yes | ⎪ |
| 37 | quiet NaN | n/a | n/a | n/a | 0 | yes | yes | ⎪ |
| 36 | signaling NaN | n/a | n/a | n/a | 0 | yes | yes | ⎭ |
| 35 | enAltImmInexactHandl | 0x7CDB | 0x7CDA | 4 | 0 | yes | yes | ⎫ 5090 |
| 34 | enAltImmUnderflowHandl | 0x7CDB | 0x7CDA | 3 | 0 | yes | yes | ⎪ Alternate immediate |
| 33 | enAltImmOverflowHandl | 0x7CDB | 0x7CDA | 2 | 0 | yes | yes | ⎬ exception handler |
| 32 | enAltImmDivByZeroHandl | 0x7CDB | 0x7CDA | 1 | 0 | yes | yes | ⎪ enables |
| 31 | enAltImmInvalidHandl | 0x7CDB | 0x7CDA | 0 | 0 | yes | yes | ⎭ |
| 30 | razNoInexactFlag | 0x7CE5 | 0x7CE4 | 4 | 1 | yes | yes | ⎫ 5100 |
| 29 | razNoUnderflowFlag | 0x7CE5 | 0x7CE4 | 3 | 0 | yes | yes | ⎪ Resuming alternate |
| 28 | razNoOverflowFlag | 0x7CE5 | 0x7CE4 | 2 | 0 | yes | yes | ⎬ exception handling |
| 27 | razNoDivByZeroFlag | 0x7CE5 | 0x7CE4 | 1 | 0 | yes | yes | ⎪ attributes |
| 26 | razNoInvalidFlag | 0x7CE5 | 0x7CE4 | 0 | 0 | yes | yes | ⎭ (raise no flag) |
| 25 | inexact Flag | 0x7CE7 | 0x7CE6 | 4 | 0 | yes | yes | ⎫ 5110 |
| 24 | underflow Flag | 0x7CE7 | 0x7CE6 | 3 | 0 | yes | yes | ⎪ IEEE 754-2008 |
| 23 | overflow Flag | 0x7CE7 | 0x7CE6 | 2 | 0 | yes | yes | ⎬ exception flags |
| 22 | divByZero Flag | 0x7CE7 | 0x7CE6 | 1 | 0 | yes | yes | ⎪ |
| 21 | invalid Flag | 0x7CE7 | 0x7CE6 | 0 | 0 | yes | yes | ⎭ |
| 20 | inexact Signal | 0x7CE1 | 0x7CE0 | 4 | 0 | yes | yes | ⎫ 5120 |
| 19 | underflow Signal | 0x7CE1 | 0x7CE0 | 3 | 0 | yes | yes | ⎪ IEEE 754-2008 |
| 18 | overflow Signal | 0x7CE1 | 0x7CE0 | 2 | 0 | yes | yes | ⎬ exception signals |
| 17 | divByZero Signal | 0x7CE1 | 0x7CE0 | 1 | 0 | yes | yes | ⎪ |
| 16 | invalid Signal | 0x7CE1 | 0x7CE0 | 0 | 0 | yes | yes | ⎭ |

FIG. 18A

| bit # | name | setBit Address | clearBit Address | group Bit Pos | reset State | readable | writeable | |
|---|---|---|---|---|---|---|---|---|
| 15 | spare4 | n/a | n/a | n/a | 0 | yes | no | ⎫ 5130 |
| 14 | spare3 | n/a | n/a | n/a | 0 | yes | no | ⎬ |
| 13 | spare2 | n/a | n/a | n/a | 0 | yes | no | ⎬ unused |
| 12 | spare1 | n/a | n/a | n/a | 0 | yes | no | ⎬ |
| 11 | spare0 | n/a | n/a | n/a | 0 | yes | no | ⎭ |
| 10 | IRQ | n/a | n/a | n/a | 0 | yes | no | 5140 |
| 9 | exception Source | n/a | n/a | n/a | 0 | yes | no | 5150 |
| 8 | A GTE B | n/a | n/a | n/a | 1 | yes | no | 5160 |
| 7 | A LTE B | n/a | n/a | n/a | 1 | yes | no | 5170 |
| 6 | A GT B | n/a | n/a | n/a | 0 | yes | no | 5180 |
| 5 | interrupt Enable | 0x7CDD | 0x7CDC | 5 | 0 | yes | yes | ⎫ 5190 |
| 4 | Done Bit | 0x7CDD | 0x7CDC | 4 | 1 | yes | yes | ⎬ Processor integer |
| 3 | V Flag | 0x7CDD | 0x7CDC | 3 | 0 | yes | yes | ⎬ arithmetic flags; |
| 2 | N Flag | 0x7CDD | 0x7CDC | 2 | 0 | yes | yes | ⎬ status and |
| 1 | C Flag | 0x7CDD | 0x7CDC | 1 | 0 | yes | yes | ⎬ control bits |
| 0 | Z Flag | 0x7CDD | 0x7CDC | 0 | 1 | yes | yes | ⎭ |

FIG. 18B

```
input  CLK;
input  RESET;
input  rden;
input  [10:0] biasedExp;
input  [51:0] mantissa;
input  zeroIn;
input  [5:0] subnLeadZeros;
output [66:0] IntWeight;
output [73:0] IntTrunc;
output [51:0] fractMask;
output [51:0] intMask;
output fractionOnly;

reg  [140:0] ROM[1023:0];
reg  [140:0] rddata;
reg  intEnable;
reg  NaN_q;    //or inf
reg  fractionOnly;

reg  [51:0] intMask;
reg  [103:0] fractMaskWork;

wire [66:0] IntWeight;
wire [73:0] IntTrunc;
wire [51:0] fractMask;
wire [10:0] unbiasedExp;
```

```
9314
H=20 binaryToDecimalCharacterSequence
IntegerPart ROM

First 20 decimal digits          Second 22 decimal digits
[1023] = {67'D89884656743115795386, 74'D4652595394512366808988}; // +307
[1022] = {67'D44942328371557897693, 74'D2326297697256183404494}; // +307
[1021] = {67'D22471164185778948846, 74'D6163148848628091702247}; // +307
[1020] = {67'D11235582092889474423, 74'D3081574424314045851123}; // +307
[1019] = {67'D56177910464447372116, 74'D5407872121570229255617}; // +306
[1018] = {67'D28088955232223686058, 74'D2703936060785114627808}; // +306
[1017] = {67'D14044477616111843029, 74'D1351968030392557313904}; // +306
                                :                                :
                                :                                :
                                :                                :
[   4] = {67'D00000000000000000016, 74'D0000000000000000000000}; // +  1
[   3] = {67'D00000000000000000008, 74'D0000000000000000000000}; // +  0
[   2] = {67'D00000000000000000004, 74'D0000000000000000000000}; // +  0
[   1] = {67'D00000000000000000002, 74'D0000000000000000000000}; // +  0
[   0] = {67'D00000000000000000001, 74'D0000000000000000000000}; // +  0
``` unbiasedExp[10:0]

```
assign IntWeight = intEnable ? rddata[140:74] : 0;
assign IntTrunc  = intEnable ? rddata[73:0] : 0;
assign fractMask = fractMaskWork[51:0];
assign unbiasedExp = biasedExp - 1023;
assign NaN = &biasedExp;

always @(posedge CLK)
    if (RESET) rddata <= 0;
    else if (rden) rddata <= ROM[unbiasedExp[9:0]];

always @(posedge CLK) begin
    if (RESET) begin
        intEnable <= 1'b0;
        NaN_q <= 1'b0;
        fractionOnly <= 1'b0;
        intMask <= 0;
        fractMaskWork <= 0;
    end
    else begin
        intEnable <= (rdaddrs > 1022) && ~NaN && ~zeroIn;
        NaN_q <= NaN;
        fractionOnly <= rdaddrs < 1023;

if ((rdaddrs[10:0] < 1075) && (rdaddrs[10:0] > 1022) && ~NaN && ~zeroIn) intMask <= ({52{1'b1}} << (1075 - rdaddrs[10:0])) &
                                                                                                                            mantissa;
        else if ((rdaddrs[10:0] > 1022) && ~NaN && ~zeroIn) intMask <= mantissa;
        else intMask <= 0;

if ((rdaddrs[10:0] < 1074) && (rdaddrs[10:0] > 1022) && ~NaN && ~zeroIn) fractMask <= mantissa << (rdaddrs[10:0] - 1022);
        else if (~|rdaddrs[10:0] && ~zeroIn) fractMask <= mantissa << subnLeadZeros + 1;    //for subnormal numbers
        else if ((rdaddrs[10:0] < 1023) && ~NaN && ~zeroIn) fractMask <= {1'b1, mantissa};   //fraction only
        else fractMask <= 0;
    end
end
```

FIG. 33

```
                                                              H=20 binaryToDecimalCharacterSequence
                  9324                                                  FractionPart ROM (ROMA)

First 20 decimal digits      Second 22 decimal digits
                                                                      |                        |
                                              [1023] = {67'D00000000000000000000, 74'D0000000000000000000000};  // 0 for integer + fraction
   input  CLK;                                [1022] = {67'D50000000000000000000, 74'D0000000000000000000000};  // -1 fraction only
   input  RESET;                              [1021] = {67'D25000000000000000000, 74'D0000000000000000000000};  // -1
   input  rden;                               [1020] = {67'D12500000000000000000, 74'D0000000000000000000000};  // -1
   input  [10:0] rdaddrs;                     [1019] = {67'D62500000000000000000, 74'D0000000000000000000000};  // -2
   input  [51:0] mantissa;                    [1018] = {67'D31250000000000000000, 74'D0000000000000000000000};  // -2
   input  zeroIn;
   output [66:0] FractWeight;                          :                               :
   output [73:0] FractTrunc;                           :                               :
   output [5:0] subnLeadZeros;                         :                               :
   output [5:0] subnAddrs;                   [  4] = {67'D17800590868057611064, 74'D7218617386592325137500};  // -307
                                             [  3] = {67'D89002954340288055323, 74'D6093086932961625687700};  // -308
   reg [140:0] ROMA[1023:0];                 [  2] = {67'D44501477170144027661, 74'D8046543466480812843800};  // -308
   reg [140:0] ROMB[51:0];                   [  1] = {67'D22250738585072013830, 74'D9023271733240406421900};  // -308
   reg [140:0] rddata;                       [  0] = {67'D00000000000000000000, 74'D0000000000000000000000};  // -308  subnormal
   reg [140:0] subndata;
   reg [5:0]   subnAddrs;
   reg [5:0]   subnLeadZeros;                           H=20 binaryToDecimalCharacterSequence
   reg [66:0]  FractWeight;                                    Subnormal ROM (ROMB)
   reg [73:0]  FractTrunc;
   reg zeroOutput;                           [ 51] = {67'D11125369292536006915, 74'D4511635866620203210900};
   reg substitutePnt5;                       [ 50] = {67'D55626846462680034577, 74'D2558179333101016054800};
   reg normal;                               [ 49] = {67'D27813423231340017288, 74'D6279089666550508027400};
                                             [ 48] = {67'D13906711615670008644, 74'D3139544833275254013700};
   wire [10:0] unbiasedExp;
   wire [10:0] biasedExp;                              :                               :
                                                       :                               :
   assign biasedExp = rdaddrs;               [  2] = {67'D19762625833649861767, 74'D0627517147288548946000};
   assign unbiasedExp = biasedExp - 1023;    [  1] = {67'D98813129168249308835, 74'D3137585736442744730100};
                                             [  0] = {67'D49406564584124654417, 74'D6568792868221372365100};

always @(*) casex(mantissa)
    52'b1xxxxxxxxxxxxxxxxxxxxxxxxxxxxxxxxxxxxxxxxxxxxxxxxxxxx : {subnAddrs, subnLeadZeros}={6'D51, 6'D0 };
    52'b01xxxxxxxxxxxxxxxxxxxxxxxxxxxxxxxxxxxxxxxxxxxxxxxxxxxx : {subnAddrs, subnLeadZeros}={6'D50, 6'D1 };
    52'b001xxxxxxxxxxxxxxxxxxxxxxxxxxxxxxxxxxxxxxxxxxxxxxxxxxx : {subnAddrs, subnLeadZeros}={6'D49, 6'D2 };
    52'b0001xxxxxxxxxxxxxxxxxxxxxxxxxxxxxxxxxxxxxxxxxxxxxxxxxx : {subnAddrs, subnLeadZeros}={6'D48, 6'D3 };
    52'b00001xxxxxxxxxxxxxxxxxxxxxxxxxxxxxxxxxxxxxxxxxxxxxxxxx : {subnAddrs, subnLeadZeros}={6'D47, 6'D4 };
                                :                                   :        :         :      :
                                :                                   :        :         :      :
    52'b0000000000000000000000000000000000000000000000001xxx : {subnAddrs, subnLeadZeros}={6'D3 , 6'D48};
    52'b00000000000000000000000000000000000000000000000001xx : {subnAddrs, subnLeadZeros}={6'D2 , 6'D49};
    52'b000000000000000000000000000000000000000000000000001x : {subnAddrs, subnLeadZeros}={6'D1 , 6'D50};
    52'b0000000000000000000000000000000000000000000000000001 : {subnAddrs, subnLeadZeros}={6'D0 , 6'D51};
                                                     default : {subnAddrs, subnLeadZeros}={6'D52, 6'D52};
   endcase
   always @(posedge CLK)
     if (RESET) normal <= 1;
     else normal <= |biasedExp;
   always @(*) if (zeroOutput) {FractWeight, FractTrunc} = 0;
           else if (substitutePnt5) {FractWeight, FractTrunc} = {67'D50000000000000000000, 74'D0000000000000000000000};
           else {FractWeight, FractTrunc} = normal ? rddata : subndata;
   always @(posedge CLK)
     if (RESET) zeroOutput <= 1'b1;
     else zeroOutput <= (biasedExp > 1074) || zeroIn || ((biasedExp > 1022) && ~|mantissa);
   always @(posedge CLK)
     if (RESET) substitutePnt5 <= 1'b0;
     else substitutePnt5 <= (biasedExp > 1022) && |mantissa;
   always @(posedge CLK)
     if (RESET) rddata <= 0;
     else if (rden && |biasedExp) rddata <= ROMA[unbiasedExp[9:0]];
   always @(posedge CLK)
     if (RESET) subndata <= 0;
     else if (rden && ~|biasedExp) subndata <= ROMB[subnAddrs[5:0]];
```

```
module baseExpROM (
    CLK,
    RESET,
    rden,
    rdaddrs,
    baseExp,
    subnAddrs
    );

input CLK;
input RESET;
input rden;
input [10:0] rdaddrs;
output [8:0] baseExp;
input [5:0] subnAddrs;

reg [8:0] RAMA[2047:0];  //9 bits x 2048
reg [8:0] RAMB[51:0];    //9 bits x 52
reg [8:0] baseExp_q;
reg [8:0] subnExp_q;
reg subnormal;

reg [5:0] subnAddrs_del_1,
          subnAddrs_del_2,
                :
          subnAddrs_del_15;

wire [8:0] baseExp;
assign baseExp = subnormal ? subnExp_q : baseExp_q;

always @(posedge CLK) begin
    if (RESET) baseExp_q <= 0;
    else if (rden) baseExp_q <= RAMA[rdaddrs];
end always @(posedge CLK)
    if (RESET) subnormal <= 0;
    else subnormal <= ~|rdaddrs;

always @(posedge CLK) begin
    if (RESET) subnExp_q <= 0;
    else if (rden && ~|rdaddrs) subnExp_q <=
                        RAMB[subnAddrs_del_15];
end always @(posedge CLK) begin
    if (RESET) begin
        subnAddrs_del_1 <= 0;
               :
        subnAddrs_del_15 <= 0;
    end
    else begin
        subnAddrs_del_1 <= subnAddrs ;
               :
        subnAddrs_del_15 <= subnAddrs_del_14;
    end
end endmodule
```

9336

Binary To Decimal
Subnormal Exponent
Look-Up ROM
9 Bits x 52- Entry
(RAMB)

```
initial begin
RAMB[51] = 308; // -308
RAMB[50] = 309; // -309
RAMB[49] = 309; // -309
RAMB[48] = 309; // -309
RAMB[47] = 310; // -310
RAMB[46] = 310; // -310
RAMB[45] = 310; // -310
RAMB[44] = 311; // -311
RAMB[43] = 311; // -311
RAMB[42] = 311; // -311
RAMB[41] = 311; // -311
RAMB[40] = 312; // -312
RAMB[39] = 312; // -312
RAMB[38] = 312; // -312
RAMB[37] = 313; // -313
RAMB[36] = 313; // -313
RAMB[35] = 313; // -313
RAMB[34] = 314; // -314
RAMB[33] = 314; // -314
RAMB[32] = 314; // -314
RAMB[31] = 314; // -314
RAMB[30] = 315; // -315
RAMB[29] = 315; // -315
RAMB[28] = 315; // -315
RAMB[27] = 316; // -316
RAMB[26] = 316; // -316
RAMB[25] = 316; // -316
RAMB[24] = 317; // -317
RAMB[23] = 317; // -317
RAMB[22] = 317; // -317
RAMB[21] = 317; // -317
RAMB[20] = 318; // -318
RAMB[19] = 318; // -318
RAMB[18] = 318; // -318
RAMB[17] = 319; // -319
RAMB[16] = 319; // -319
RAMB[15] = 319; // -319
RAMB[14] = 320; // -320
RAMB[13] = 320; // -320
RAMB[12] = 320; // -320
RAMB[11] = 320; // -320
RAMB[10] = 321; // -321
RAMB[ 9] = 321; // -321
RAMB[ 8] = 321; // -321
RAMB[ 7] = 322; // -322
RAMB[ 6] = 322; // -322
RAMB[ 5] = 322; // -322
RAMB[ 4] = 323; // -323
RAMB[ 3] = 323; // -323
RAMB[ 2] = 323; // -323
RAMB[ 1] = 324; // -324
RAMB[ 0] = 324; // -324
end
```

9334

Adjusted Binary To Decimal
Normal Exponent Look-Up ROM
9 Bits x 2049- Entry
(RAMA)

```
initial begin

RAMA[2047] = 511;      //NaN
RAMA[2046] = 307 - 19;
RAMA[2045] = 307 - 19;
RAMA[2044] = 307 - 19;
RAMA[2043] = 307 - 19;
RAMA[2042] = 306 - 19;
RAMA[2041] = 306 - 19;
RAMA[2040] = 306 - 19;
RAMA[2039] = 305 - 19;
RAMA[2038] = 305 - 19;
RAMA[2037] = 305 - 19;
         :
         :
RAMA[1090] = 20 - 19;
RAMA[1089] = 19 - 19;
RAMA[1088] = 19 - 19;
RAMA[1087] = 19 - 19;
RAMA[1086] = 0; // 18;
RAMA[1085] = 0; // 18;
RAMA[1084] = 0; // 18;
RAMA[1083] = 0; // 18;
RAMA[1082] = 0; // 17;
RAMA[1081] = 0; // 17;
RAMA[1080] = 0; // 17;
RAMA[1079] = 0; // 16;
RAMA[1078] = 0; // 16;
RAMA[1077] = 0; // 16;
RAMA[1076] = 0; // 15;
RAMA[1075] = 0; // 15;
         :
         :
RAMA[1026] = 0; // 0;
RAMA[1025] = 0; // 0;
RAMA[1024] = 0; // 0;
RAMA[1023] = 0; // 0;
RAMA[1022] = 1; //minus
RAMA[1021] = 1; // |
RAMA[1020] = 1; // |
RAMA[1019] = 2; // v
RAMA[1018] = 2;
RAMA[1017] = 2;
RAMA[1016] = 3;
RAMA[1015] = 3;
RAMA[1014] = 3;
         :
         :
RAMA[ 6] = 307;
RAMA[ 5] = 307;
RAMA[ 4] = 307;
RAMA[ 3] = 308;
RAMA[ 2] = 308;
RAMA[ 1] = 308;
RAMA[ 0] = 308; //subnormal end
```

FIG. 38

```
parameter   XCU_CNTRL_REG_ADDRS = 15'h7FDF;
parameter   XCU_STATUS_REG_ADDRS = 15'h7FDE;
parameter   XCU_PREEMPT_ADDRS = 15'h7FD4;                  ⟋7740
parameter   XCU_SSTEP_ADDRS = 15'h7FD3;
parameter   XCU_FORCE_BREAK_ADDRS = 15'h7FD2;
parameter   XCU_FORCE_RESET_ADDRS = 15'h7FD1;
```

```
                                                                              ⟋7742
//eXtra Compute Unit (XCU) control register mapped in parent CPU data space
always @(posedge CLK)
    if (RESET) XCU_CNTRL_REG <= 64'h0000_0000_FFFF_0000;  ⟋7744
    else if ((OPdest_q2==XCU_CNTRL_REG_ADDRS)  && wrcyc1 && ~Ind_Dest_q2 && q2_sel)  ⟋7746
        XCU_CNTRL_REG <= wrsrcAdata;
    else if ((OPdest_q2==XCU_FORCE_RESET_ADDRS) && wrcyc1 && ~Ind_Dest_q2 && q2_sel)  ⟋7748
        XCU_CNTRL_REG[15:0] <= wrsrcAdata[15:0];
    else if ((OPdest_q2==XCU_FORCE_BREAK_ADDRS) && wrcyc1 && ~Ind_Dest_q2 && q2_sel)  ⟋7750
        XCU_CNTRL_REG[31:16] <= wrsrcAdata[15:0];
    else if ((OPdest_q2==XCU_SSTEP_ADDRS) && wrcyc1 && ~Ind_Dest_q2 && q2_sel)  ⟋7752
        XCU_CNTRL_REG[47:32] <= wrsrcAdata[15:0];
    else if ((OPdest_q2==XCU_PREEMPT_ADDRS) && wrcyc1 && ~Ind_Dest_q2 && q2_sel)  ⟋7754
        XCU_CNTRL_REG[63:48] <= wrsrcAdata[15:0];
``` wire [63:0] XCU_STATUS_REG = XCU_DONE[15:0], XCU_SWBRKDET[15:0], XCU_BROKE[15:0], XCU_SKIPCMPLT[15:0]};

```
                    CPU     "SYMPL64.TBL"
                    HOF     "bin32"
                    WDLN    8
; SYMPL 64-Bit CPU Demo 3D Transform Micro-Kernel (SYMPL Assembly Language version)
; version 3.05   August 5, 2019
; Author: Jerry D. Harthcock
; Copyright (C) 2019.  All rights reserved.
;
; This program employs from 0 to 16 eXtra Compute Units (XCU) to perform a 3D transform (rotate, translate, scale)
; of a .STL 3D object in external memory. If there are 0 XCUs attached to the CPU, then the CPU performs the 3D
; transform solo. Once the CPU determines there is a .stl file to transform, it counts how many XCUs are available,
; then distributes the triangles as evenly as possible among them for processing. Once the CPU determines the XCUs
; have completed the transform, it pulls the transformed triangles out of each XCU's buffer and then pushes them
; out to external memory and automatically changes endian-ness during the push.
; Observe that the .stl format triangles are IEEE 754 binary32 floating-point format, but the hardware
; floating-point operators are binary64 format. The cores do not care because they automatically convert from one
; binary format to the other without explicit instructions to do so.

;private dword storage
bitbucket:    EQU    0x0000           ;this dword location is reserved.  Always reads as 0
work_1:       EQU    0x0008
work_2:       EQU    0x0010
work_3:       EQU    0x0018
capt0_save:   EQU    0x0020           ;alternate delayed exception capture register 0 save location
capt1_save:   EQU    0x0028           ;alternate delayed exception capture register 1 save location
capt2_save:   EQU    0x0030           ;alternate delayed exception capture register 2 save location
capt3_save:   EQU    0x0038           ;alternate delayed exception capture register 3 save location ;for private storage of parameters for 3D transform
ext_vert_start: EQU  0x0040           ;location in external memory where the first triangle x1 may be found
triangles:    EQU    0x0048           ;storage location of number of triangles in this thread's list to process ;dword storage locations for parameters so it will be easy to change to/from double precision
scaleX:       EQU    0x0050           ;scale factor X axis
scaleY:       EQU    0x0058           ;scale factor Y axis
scaleZ:       EQU    0x0060           ;scale factor Z axis
transX:       EQU    0x0068           ;translate amount X axis
transY:       EQU    0x0070           ;translate amount Y axis
transZ:       EQU    0x0078           ;translate amount Z axis ;(32-bit) storage for x1, y1, z1, x2, y2, z2, x3, y3, z3 for assembling half-word pieces from external memory
;of .stl 3D object
x1:           EQU    0x0080
y1:           EQU    0x0084
z1:           EQU    0x0088
x2:           EQU    0x008C
y2:           EQU    0x0090
z2:           EQU    0x0094
x3:           EQU    0x0098
y3:           EQU    0x009C
```

FIG. 50A

```
000000A0                                      z3:              EQU  0x00A0

000000A4                                      sin_thetaX:      EQU  0x00A4      ;sine of theta X for rotate X
000000A8                                      cos_thetaX:      EQU  0x00A8      ;cosine of theta X for rotate X
000000AC                                      sin_thetaY:      EQU  0x00AC      ;sine of theta Y for rotate Y
000000B0                                      cos_thetaY:      EQU  0x00B0      ;cosine of theta Y for rotate Y
000000B4                                      sin_thetaZ:      EQU  0x00B4      ;sine of theta X for rotate Z
000000B8                                      cos_thetaZ:      EQU  0x00B8      ;cosine of theta X for rotate Z 000000C0                                      XCUs:            EQU  0x00C0      ;number of XCUs in this implementation
000000C8                                      result_buf:      EQU  0x00C8      ;this is start of the buffer where results are stored and then
                                                                                 ;read back out to external memory when processing is complete
000000D0                                      remainder_push:  EQU  0x00D0
000000D8                                      remainder_pull:  EQU  0x00D8

80000000                                      PROG_START:      EQU  0x80000000  ;CPU and XCU program memory can be indirectly accessed starting here
00100000                                      STL_START:       EQU  0x00100000  ;start location of .stl file in external memory space
00000100                                      buf_START:       EQU  0x00000100  ;start location of internal tri-port indirectly addressable RAM,
                                                                                 ;which is where the firsttriangle x1 will be pushed 00000000                                                       org  0x0

00000000 0000000000000100                     Constants:       DFL  0, load_vects    ;entry point for this program
00000001 0000000000000225                     prog_len:        DFL  0, progend ;parameters for this particular 3D transform test run
00000002                                      xform_3axis_parameters:

00000002 000000000000001D                     rotx:            dfl  0, 29        ;rotate around x axis in integer degrees
00000003 000000000000002C                     roty:            dfl  0, 44        ;rotate around y axis in integer degrees
00000004 000000000000004B                     rotz:            dfl  0, 75        ;rotate around z axis in integer degrees
00000005 0000000000400000                     scal_x:          dff  0, 2.0       ;scale X axis amount real
00000006 0000000000400000                     scal_y:          dff  0, 2.0       ;scale y axis amount real
00000007 0000000000401000                     scal_z:          dff  0, 2.25      ;scale Z axis amount real
00000008 0000000004980000                     trans_x:         dff  0, 4.75      ;translate on X axis amount real
00000009 00000000047AE14                      trans_y:         dff  0, 3.87      ;translate on Y axis amount real
0000000A 000000000480F2802                    trans_z:         dff  0, 2.237     ;translate on Z axis amount real ;                                                              RM   siz:dest = (siz:srcA, siz:srcB)

00000100                                                       org  0x00000100

00000100                                      load_vects:
00000100 317FE61000000178                      -               _2:#NMI_VECT    = _2:#NMI_      ;default interrupt vector locations
00000101 317FE51000000AD                       -               _2:#IRQ_VECT    = _2:#IRQ_      ;load of interrupt vectors for faster interrupt response
00000102 317FE41000000017C                     -               _2:#INV_VECT    = _2:#INV_      ;these registers are presently not visible to app s/w
00000103 317FE31000000185                      -               _2:#DIVx0_VECT  = _2:#DIVx0_
00000104 317FE21000000018E                     -               _2:#OVFL_VECT   = _2:#OVFL_
00000105 317FE11000000197                      -               _2:#UNFL_VECT   = _2:#UNFL_
00000106 317FE01000000001A0                    -               _2:#INEXT_VECT  = _2:#INEXT_
```

FIG. 50B

```
00000107  307CDD0000000020               __1:setDVNCZ = __1:#intEnable       ;set interrupt enable bit done:
00000108  307CDD0000000010               __1:setDVNCZ = __1:#DoneBit         ;set Done bit
00000109  327FEC200000EA60               _4:TIMER = _4:#60000                ;load time-out timer with sufficient time to process before timeout
0000010A  127FF30000000000               _4:PCC = (_1:0x00, 0, $)            ;s/w break here (note: $ is current PC)

begin:
0000010B  1A7FF30000000002               s4:PCC = (_1:0x00, 0, threadStart)  ;gosub threadStart
0000010C  127FF30000003FFC               _4:PCC = (_1:0x00, 0, done)         ;goto done threadStart:
0000010D  307CDC0000000010               __1:clrDVNCZ = __1:#DoneBit         ;clear Done bit to signal host CPU or XCU has started
0000010E  02BFC727FF200000               _4:*SP-[8] = _4:PC_COPY             ;save return address 0000010F  027FF7200C800000               _4:AR0 = _4:result_buf              ;load AR0 with pointer to source/destination internal result buffer
                                                                             ;for XCU X1 of first triangle
00000110  027FF8200C800000               _4:AR1 = _4:result_buf 00000111  227B50200200000                _4:sind.0 = _4:@rotx                ;calculate sine of theta X and save
00000112  227B402000200000               _4:cosd.0 = _4:@rotx                ;calculate cosine of theta X and save
00000113  227B512000300000               _4:sind.1 = _4:@roty                ;calculate sine of theta Y and save
00000114  227B412000300000               _4:cosd.1 = _4:@roty                ;calculate cosine of theta Y and save
00000115  227B522000400000               _4:sind.2 = _4:@rotz                ;calculate sine of theta Z and save
00000116  227B422000400000               _4:cosd.2 = _4:@rotz                ;calculate cosine of theta Z and save 00000117  0200A427B5000000               _4:sin_thetaX   _4:sind.0
00000118  0200A827B4000000               _4:cos_thetaX = _4:cosd.0
00000119  0200AC27B5100000               _4:sin_thetaY = _4:sind.1
0000011A  0200B027B4100000               _4:cos_thetaY = _4:cosd.1
0000011B  0200B427B5200000               _4:sin_thetaZ = _4:sind.2
0000011C  0200B827B4200000               _4:cos_thetaZ = _4:cosd.2

0000011D  2200502000500000               _4:scaleX = _4:@scal_x              ;save scale X factor
0000011E  2200582000600000               _4:scaleY = _4:@scal_y              ;save scale Y factor
0000011F  2200602000700000               _4:scaleZ = _4:@scal_z              ;save scale Z factor
00000120  2200682000800000               _4:transX = _4:@trans_x             ;save translate X axis amount
00000121  2200702000900000               _4:transY = _4:@trans_y             ;save translate Y axis amount
00000122  2200782000A00000               _4:transZ = _4:@trans_z             ;save translate Z axis amount 00000123  017FED1004800000               _2:LPCNT0 = _2:triangles            ;load loop counter 0 with number of triangles loop:    ;scale on X, Y, Z axis ;the following routine performs scaling on all three axis first,
                                ;rotate on all three axis second, then translate on all three axis last ;vertex 1
00000124  0278202802020050               _4:FMUL.0 = (_4:*AR0++[4], _4:scaleX)
00000125  0278212802020058               _4:FMUL.1 = (_4:*AR0++[4], _4:scaleY)
00000126  0278222802020060               _4:FMUL.2 = (_4:*AR0++[4], _4:scaleZ)
                                ;vertex 2
```

FIG. 50C

```
00000127 02782232802020050              ; _4:FMUL.3 = (_4:*AR0++[4], _4:scaleX)
00000128 02782242802020058              ; _4:FMUL.4 = (_4:*AR0++[4], _4:scaleY)
00000129 02782252802020060              ; _4:FMUL.5 = (_4:*AR0++[4], _4:scaleZ)
                                        ;vertex 3
0000012A 02782262802020050              ; _4:FMUL.6 = (_4:*AR0++[4], _4:scaleX)
0000012B 02782272802020058              ; _4:FMUL.7 = (_4:*AR0++[4], _4:scaleY)
0000012C 02782282802020060              ; _4:FMUL.8 = (_4:*AR0++[4], _4:scaleZ)

X1 is now in FMUL_0
                                        Y1 is now in FMUL_1
                                        Z1 is now in FMUL_2
                                        X2 is now in FMUL_3
                                        Y2 is now in FMUL_4
                                        Z2 is now in FMUL_5
                                        X3 is now in FMUL_6
                                        Y3 is now in FMUL_7
                                        Z3 is now in FMUL_8

;rotate around X axis
                                        ;vertex 1
                                        ; (cos(xrot) * Y1) - (sin(xrot) * Z1)
0000012D 02782927782110A8                ; _4:FMUL.9  = (_4:FMUL.1, _2:cos_thetaX) ; FMUL.9  = (cos(xrot) * Y1)
0000012E 02782A27782220A4                ; _4:FMUL.10 = (_4:FMUL.2, _2:sin_thetaX) ; FMUL.10 = (sin(xrot) * Z1)
                                        ; (sin(xrot) * Y1) + (cos(xrot) * Z1)
0000012F 02782B27782110A4                ; _4:FMUL.11 = (_4:FMUL.1, _2:sin_thetaX) ; FMUL.11 = (sin(xrot) * Y1)
00000130 02782C27782220A8                ; _4:FMUL.12 = (_4:FMUL.2, _2:cos_thetaX) ; FMUL.12 = (cos(xrot) * Z1)

00000131 02781827829278ZA                ; _4:FSUB.0 = (_4:FMUL.9,  _4:FMUL.10)    ; FSUB.0 = (cos(xrot) * Y1) - (sin(xrot) * Z1)
00000132 02780027820282Z8Z                ; _4:FADD.0 = (_4:FMUL.11, _4:FMUL.12)    ; FADD.0 = (sin(xrot) * Y1) + (cos(xrot) * Z1)

;vertex 2
                                        ; (cos(xrot) * Y2) - (sin(xrot) * Z2)
00000133 02781227782410A8                ; _4:FMUL.1 = (_4:FMUL.4, _2:cos_thetaX)  ; FMUL.1 = (cos(xrot) * Y2)
00000134 02782227825100A4                ; _4:FMUL.2 = (_4:FMUL.5, _2:sin_thetaX)  ; FMUL.2 = (sin(xrot) * Z2)
                                        ; (sin(xrot) * Y2) + (cos(xrot) * Z2)
00000135 02782D27782410A4                ; _4:FMUL.13 = (_4:FMUL.4, _2:sin_thetaX) ; FMUL.13 = (sin(xrot) * Y2)
00000136 02782E27825100A8                ; _4:FMUL.14 = (_4:FMUL.5, _2:cos_thetaX) ; FMUL.14 = (cos(xrot) * Z2)

00000137 02781127782127822                ; _4:FSUB.1 = (_4:FMUL.1,  _4:FMUL.2)     ; FSUB.1 = (cos(xrot) * Y2) - (sin(xrot) * Z2)
00000138 02780127820272Z8E                ; _4:FADD.1 = (_4:FMUL.13, _4:FMUL.14)    ; FADD.1 = (sin(xrot) * Y2) + (cos(xrot) * Z2)

;vertex 3
                                        ; (cos(xrot) * Y3) - (sin(xrot) * Z3)
00000139 02782927827100A8                ; _4:FMUL.9  = (_4:FMUL.7, _2:cos_thetaX) ; FMUL.9  = (cos(xrot) * Y3)
0000013A 02782A27828100A4                ; _4:FMUL.10 = (_4:FMUL.8, _2:sin_thetaX) ; FMUL.10 = (sin(xrot) * Z3)
                                        ; (sin(xrot) * Y3) + (cos(xrot) * Z3)
0000013B 02782B27827100A4                ; _4:FMUL.11 = (_4:FMUL.7, _2:sin_thetaX) ; FMUL.11 = (sin(xrot) * Y3)
0000013C 02782C27828100A8                ; _4:FMUL.12 = (_4:FMUL.8, _2:cos_thetaX) ; FMUL.12 = (cos(xrot) * Z3)

0000013D 02781227829278ZA                ; _4:FSUB.2 = (_4:FMUL.9,  _4:FMUL.10)    ; FSUB.2 = (cos(xrot) * Y3) - (sin(xrot) * Z3)
```

FIG. 50D

```
00000013E 0278022778282782C          ; 4:FADD.2 = (_4:FMUL.11, _4:FMUL.12)    ; FADD.2 = (sin(xrot) * Y3) + (cos(xrot) * Z3)

X1 is now in FMUL_0
                                     Y1 is now in FSUB_0
                                     Z1 is now in FADD_0
                                     X2 is now in FMUL_3
                                     Y2 is now in FSUB_1
                                     Z2 is now in FADD_1
                                     X3 is now in FMUL_6
                                     Y3 is now in FSUB_2
                                     Z3 is now in FADD_2

;rotate around Y axis
                                    ;vertex 1
                                    ; (cos(yrot) * X1) + (sin(yrot) * Z1)
00000013F 02782127782010080           4:FMUL.1 = (_4:FMUL.0, _2:cos_thetaY)   ; FMUL.1 = (cos(yrot) * X1)
000000140 02782227800100AC            4:FMUL.2 = (_4:FADD.0, _2:sin_thetaY)   ; FMUL.2 = (sin(yrot) * Z1)

000000141 02782427780010080          ; (cos(yrot) * Z1) - (sin(yrot) * X1)
000000142 02782527820100AC            4:FMUL.4 = (_4:FADD.0, _2:cos_thetaY)   ; FMUL.4 = (cos(yrot) * Z1)
                                      4:FMUL.5 = (_4:FMUL.0, _2:sin_thetaY)   ; FMUL.5 = (sin(yrot) * X1)

000000143 02780327820127822           4:FADD.3 = (_4:FMUL.1, _4:FMUL.2)       ; FADD.3 = (cos(yrot) * X1) + (sin(yrot) * Z1)
000000144 02781327820127825           4:FSUB.3 = (_4:FMUL.4, _4:FMUL.5)       ; FSUB.3 = (cos(yrot) * Z1) - (sin(yrot) * X1)

;vertex 2
                                    ; (cos(yrot) * X2) + (sin(yrot) * Z2)
000000145 02782727782310080           4:FMUL.7 = (_4:FMUL.3, _2:cos_thetaY)   ; FMUL.7 = (cos(yrot) * X2)
000000146 02782827801000AC            4:FMUL.8 = (_4:FADD.1, _2:sin_thetaY)   ; FMUL.8 = (sin(yrot) * Z2)

000000147 02782927801010080          ; (cos(yrot) * Z2) - (sin(yrot) * X2)
000000148 02782A27823100AC            4:FMUL.9 = (_4:FADD.1, _2:cos_thetaY)   ; FMUL.9 = (cos(yrot) * Z2)
                                      4:FMUL.10 = (_4:FMUL.3, _2:sin_thetaY)  ; FMUL.10 = (sin(xrot) * X2)

000000149 02780427820727828           4:FADD.4 = (_4:FMUL.7, _4:FMUL.8)       ; FADD.4 = (cos(yrot) * X2) + (sin(yrot) * Z2)
00000014A 02781427829278A             4:FSUB.4 = (_4:FMUL.9, _4:FMUL.10)      ; FSUB.4 = (cos(yrot) * Z2) - (sin(yrot) * X2)

;vertex 3
                                    ; (cos(yrot) * X3) + (sin(yrot) * Z3)
00000014B 02782B27826100B0            4:FMUL.11 = (_4:FMUL.6, _2:cos_thetaY)  ; FMUL.11 = (cos(yrot) * X3)
00000014C 02782C27802100AC            4:FMUL.12 = (_4:FADD.2, _2:sin_thetaY)  ; FMUL.12 = (sin(yrot) * Z3)

00000014D 02782D27802100B0           ; (cos(yrot) * Z3) - (sin(yrot) * X3)
00000014E 02782E27826100AC            4:FMUL.13 = (_4:FADD.2, _2:cos_thetaY)  ; FMUL.13 = (cos(xrot) * Z3)
                                      4:FMUL.14 = (_4:FMUL.6, _2:sin_thetaY)  ; FMUL.14 = (sin(xrot) * X3)

00000014F 02780527820282782C          4:FADD.5 = (_4:FMUL.11, _4:FMUL.12)     ; FADD.5 = (cos(yrot) * X3) + (sin(yrot) * Z3)
000000150 02781527820270782E          4:FSUB.5 = (_4:FMUL.13, _4:FMUL.14)     ; FSUB.5 = (cos(yrot) * Z3) - (sin(yrot) * X3)

X1 is now in FADD_3
                                     Y1 is now in FSUB_0
                                     Z1 is now in FSUB_3
                                     X2 is now in FADD_4
```

FIG. 50E

```
                                    ;  Y2 is now in FSUB_1
                                    ;  Z2 is now in FSUB_4
                                    ;  X3 is now in FADD_5
                                    ;  Y3 is now in FSUB_2
                                    ;  Z3 is now in FSUB_5

;rotate around Z axis
                                    ;vertex 1
                                    ; (cos(zrot) * X1) - (sin(zrot) * Y1)
00000151  0278202780310088          ;   _4:FMUL.0 = (_4:FADD.3, _2:cos_thetaZ)   ;  FMUL.0 = (cos(zrot) * X1)
00000152  02782127810100B4          ;   _4:FMUL.1 = (_4:FSUB.0, _2:sin_thetaZ)   ;  FMUL.1 = (sin(xrot) * Y1)
                                    ; (sin(zrot) * X1) + (cos(zrot) * Y1)
00000153  02782227803100B4          ;   _4:FMUL.2 = (_4:FADD.3, _2:sin_thetaZ)   ;  FMUL.2 = (sin(xrot) * X1)
00000154  02782327810100B8          ;   _4:FMUL.3 = (_4:FSUB.0, _2:cos_thetaZ)   ;  FMUL.3 = (cos(xrot) * Y1)

00000155  0278162782027821          ;   _4:FSUB.6 = (_4:FMUL.0, _4:FMUL.1)       ;  FSUB.6 = (cos(zrot) * X1) - (sin(zrot) * Y1)
00000156  0278062782227823          ;   _4:FADD.6 = (_4:FMUL.2, _4:FMUL.3)       ;  FADD.6 = (sin(zrot) * X1) + (cos(zrot) * Y1)

;vertex 2
                                    ; (cos(zrot) * X2) - (sin(zrot) * Y2)
00000157  02782427804100B8          ;   _4:FMUL.4 = (_4:FADD.4, _2:cos_thetaZ)   ;  FMUL.4 = (cos(zrot) * X1)
00000158  02782527811100B4          ;   _4:FMUL.5 = (_4:FSUB.1, _2:sin_thetaZ)   ;  FMUL.5 = (sin(xrot) * Y1)
                                    ; (sin(zrot) * X2) + (cos(zrot) * Y2)
00000159  02782627804100B4          ;   _4:FMUL.6 = (_4:FADD.4, _2:sin_thetaZ)   ;  FMUL.6 = (sin(xrot) * X2)
0000015A  02782727811100B8          ;   _4:FMUL.7 = (_4:FSUB.1, _2:cos_thetaZ)   ;  FMUL.7 = (cos(xrot) * Y2)

0000015B  0278172782427825          ;   _4:FSUB.7 = (_4:FMUL.4, _4:FMUL.5)       ;  FSUB.7 = (cos(zrot) * X2) - (sin(zrot) * Y2)
0000015C  0278072782627827          ;   _4:FADD.7 = (_4:FMUL.6, _4:FMUL.7)       ;  FADD.7 = (sin(zrot) * X2) + (cos(zrot) * Y2)

;vertex 3
                                    ; (cos(zrot) * X3) - (sin(zrot) * Y3)
0000015D  02782827805100B8          ;   _4:FMUL.8 = (_4:FADD.5, _2:cos_thetaZ)   ;  FMUL.8 = (cos(zrot) * X3)
0000015E  02782927812100B4          ;   _4:FMUL.9 = (_4:FSUB.2, _2:sin_thetaZ)   ;  FMUL.9 = (sin(xrot) * Y3)
                                    ; (sin(zrot) * X3) + (cos(zrot) * Y3)
0000015F  02782A27805100B4          ;   _4:FMUL.10 = (_4:FADD.5, _2:sin_thetaZ)  ;  FMUL.10 = (sin(xrot) * X3)
00000160  02782B27812100B8          ;   _4:FMUL.11 = (_4:FSUB.2, _2:cos_thetaZ)  ;  FMUL.11 = (cos(xrot) * Y3)

00000161  0278182782827829          ;   _4:FSUB.8 = (_4:FMUL.8, _4:FMUL.9)       ;  FSUB.8 = (cos(zrot) * X3) - (sin(zrot) * Y3)
00000162  0278082782A2782B          ;   _4:FADD.8 = (_4:FMUL.10, _4:FMUL.11)     ;  FADD.8 = (sin(zrot) * X3) + (cos(zrot) * Y3)

;  X1 is now in FSUB.6
                                    ;  Y1 is now in FADD.6
                                    ;  Z1 is now in FSUB.3
                                    ;  X2 is now in FSUB.7
                                    ;  Y2 is now in FADD.7
                                    ;  Z2 is now in FSUB.4
                                    ;  X3 is now in FSUB.8
                                    ;  Y3 is now in FADD.8
                                    ;  Z3 is now in FSUB.5
```

FIG. 50F

```
                                            ;now translate on X, Y, Z axis
                                            ;vertex 1
00000163  02780027781620068                 {   _4:FADD.0  = (_4:FSUB.6, _4:transX)
00000164  02780127780620078                 ;   _4:FADD.1  = (_4:FSUB.6, _4:transY)
00000165  02780227781320078                 ;   _4:FADD.2  = (_4:FSUB.3, _4:transZ)
                                            ;vertex 2
00000166  02780927781720068                 {   _4:FADD.9  = (_4:FSUB.7, _4:transX)
00000167  02780A27780720070                 ;   _4:FADD.10 = (_4:FSUB.7, _4:transY)
00000168  02780B27781420078                 ;   _4:FADD.11 = (_4:FSUB.4, _4:transZ)
                                            ;vertex 3
00000169  02780C27781820068                 {   _4:FADD.12 = (_4:FSUB.8, _4:transX)
0000016A  02780D27780820070                 ;   _4:FADD.13 = (_4:FSUB.8, _4:transY)
0000016B  02780E27781520078                 ;   _4:FADD.14 = (_4:FSUB.5, _4:transZ)

0000016C  02802127780000000                 {   _4:*AR1++[4] = _4:FADD.0       ;copy transformed X1 to alignable memory
0000016D  02802127801100000                 ;   _4:*AR1++[4] = _4:FADD.1       ;copy transformed Y1 to alignable memory
0000016E  02802127802000000                 ;   _4:*AR1++[4] = _4:FADD.2       ;copy transformed Z1 to alignable memory
0000016F  02802127809900000                 ;   _4:*AR1++[4] = _4:FADD.9       ;copy transformed X2 to alignable memory
00000170  02802127780A00000                 ;   _4:*AR1++[4] = _4:FADD.10      ;copy transformed Y2 to alignable memory
00000171  02802127780B00000                 ;   _4:*AR1++[4] = _4:FADD.11      ;copy transformed Z2 to alignable memory
00000172  02802127780C00000                 ;   _4:*AR1++[4] = _4:FADD.12      ;copy transformed X3 to alignable memory
00000173  02802127780D00000                 ;   _4:*AR1++[4] = _4:FADD.13      ;copy transformed Y3 to alignable memory
00000174  02802127780E00000                 ;   _4:*AR1++[4] = _4:FADD.14      ;copy transformed Z3 to alignable memory 00000175  127FFF417FED43FAF                 {   _4:PCS = (_2:LPCNT0, 16, loop) ;NEXT continue until done
00000176  00000000000000000                 ;this NOP needed here to prevent triggering SP increment below
00000177  027FFF5280470000                  ;   _4:PC = _4:*SP++[8]            ;return ; interrupt/exception trap service routines
00000178  0ABFC727FF200000  NMI_:            {   s4:*SP--[8] = _4:PC_COPY      ;save return address from non-maskable interrupt
00000179  327FEC20000EA60                   ;    _4:TIMER = _4:#60000          ;(time-out timer in this instance)
0000017A  000000000000000                   ;                                   ;put a new value in the timer
0000017B  0A7FF5280470000                   ;    s4:PC = _4:*SP++[8]           ;return from interrupt 0000017C  0ABFC727FF200000  INV_:            {   s4:*SP--[8] = _4:PC_COPY      ;save return address from maskable invalid operation exception
0000017D  03002837FDA00000                  ;    _8:capt0_save = _8:CAPTURE0   ;read out CAPTURE0 register and save it
0000017E  03002837FDB00000                  ;    _8:capt1_save = _8:CAPTURE1   ;read out CAPTURE1 register and save it
0000017F  03003037FDC00000                  ;    _8:capt2_save = _8:CAPTURE2   ;read out CAPTURE2 register and save it
00000180  03003837FDD00000                  ;    _8:capt3_save = _8:CAPTURE3   ;read out CAPTURE3 register and save it
00000181  307CE000000001                    ;    _1:lowSig = _1:#invalid       ;lower invalid signal
00000182  307CE700000000001                 ;    _1:razFlg = _1:#invalid       ;raise invalid flag
00000183  327FEC20000EA60                   ;    _4:TIMER = _4:#60000          ;put a new value in the timer
00000184  0A7FF5280470000                   ;    s4:PC = _4:*SP++[8]           ;return from interrupt 00000185  0ABFC727FF200000  DIVx0_:          {   s4:*SP--[8] = _4:PC_COPY      ;save return address from maskable divide by 0 exception
00000186  03002037FDA00000                  ;    _8:capt0_save = _8:CAPTURE0   ;read out CAPTURE0 register and save it
00000187  03002837FDB00000                  ;    _8:capt1_save = _8:CAPTURE1   ;read out CAPTURE1 register and save it
00000188  03003037FDC00000                  ;    _8:capt2_save = _8:CAPTURE2   ;read out CAPTURE2 register and save it
00000189  03003837FDD00000                  ;    _8:capt3_save = _8:CAPTURE3   ;read out CAPTURE3 register and save it
```

FIG. 50G

```
0000018A  307CE0000000002                           _1:lowSig  = _1:#divByZero         ;lower divByZero signal
00000188  307CE70000000002                          _1:razFlg  = _1:#divByZero         ;raise divByZero flag
0000018C  327FEC200000EA60                          _4:TIMER   = _4:#60000             ;put a new value in the timer
0000018D  0A7FF5280047000000                        s4:PC      = _4:*SP++[8]           ;return from interrupt 0000018E  0ABFC727FF200000    OVFL_:                s4:*SP--[8]    = _4:PC_COPY        ;save return address from maskable overflow exception
0000018F  030002837FDA000000                        _8:capt0_save  = _8:CAPTURE0       ;read out CAPTURE0 register and save it
00000190  030002837FDB000000                        _8:capt1_save  = _8:CAPTURE1       ;read out CAPTURE1 register and save it
00000191  030003037FDC000000                        _8:capt2_save  = _8:CAPTURE2       ;read out CAPTURE2 register and save it
00000192  030003837FDD000000                        _8:capt3_save  = _8:CAPTURE3       ;read out CAPTURE3 register and save it
00000193  307CE0000000004                           _1:lowSig  = _1:#overflow          ;lower overflow signal
00000194  307CE70000000004                          _1:razFlg  = _1:#overflow          ;raise overflow flag
00000195  327FEC200000EA60                          _4:TIMER   = _4:#60000             ;put a new value in the timer
00000196  0A7FF5280047000000                        s4:PC      = _4:*SP++[8]           ;return from interrupt 00000197  0ABFC727FF200000    UNFL_:                s4:*SP--[8]    = _4:PC_COPY        ;save return address from maskable underflow exception
00000198  030002837FDA000000                        _8:capt0_save  = _8:CAPTURE0       ;read out CAPTURE0 register and save it
00000199  030002837FDB000000                        _8:capt1_save  = _8:CAPTURE1       ;read out CAPTURE1 register and save it
0000019A  030003037FDC000000                        _8:capt2_save  = _8:CAPTURE2       ;read out CAPTURE2 register and save it
0000019B  030003837FDD000000                        _8:capt3_save  = _8:CAPTURE3       ;read out CAPTURE3 register and save it
0000019C  307CE0000000008                           _1:lowSig  = _1:#underflow         ;lower underflow signal
0000019D  307CE70000000008                          _1:razFlg  = _1:#underflow         ;raise underflow flag
0000019E  327FEC200000EA60                          _4:TIMER   = _4:#60000             ;put a new value in the timer
0000019F  0A7FF5280047000000                        s4:PC      = _4:*SP++[8]           ;return from interrupt 000001A0  0ABFC727FF200000    INEXT_:               s4:*SP--[8]    = _4:PC_COPY        ;save return address from maskable inexact exception
000001A1  030002837FDA000000                        _8:capt0_save  = _8:CAPTURE0       ;read out CAPTURE0 register and save it
000001A2  030002837FDB000000                        _8:capt1_save  = _8:CAPTURE1       ;read out CAPTURE1 register and save it
000001A3  030003037FDC000000                        _8:capt2_save  = _8:CAPTURE2       ;read out CAPTURE2 register and save it
000001A4  030003837FDD000000                        _8:capt3_save  = _8:CAPTURE3       ;read out CAPTURE3 register and save it
000001A5  307CE0000000010                           _1:lowSig  = _1:#inexact           ;lower inexact signal
000001A6  307CE70000000010                          _1:razFlg  = _1:#inexact           ;raise inexact flag
000001A7  327FEC200000EA60                          _4:TIMER   = _4:#60000             ;put a new value in the timer
000001A8  0A7FF5280047000000                        s4:PC      = _4:*SP++[8]           ;return from interrupt 000001A9  0ABFC727FF200000    IRQ_XCU:              s4:*SP--[8]    = _4:PC_COPY        ;save return address (general-purpose, maskable interrupt)
000001AA  327FEC200000EA60                          _4:TIMER   = _4:#60000             ;put a new value in the timer
000001AB  0000000000000000
000001AC  0A7FF5280047000000                        s4:PC      = _4:*SP++[8]           ;return from interrupt 000001AD                      thread_end:

000001AD  0ABFC727FF200000    IRQ_:                 s4:*SP--[8]    = _4:PC_COPY

000001AE  307CDC0000000010                          _1:clrDVNCZ   _1:#DoneBit
000001AF                      push_thread:
000001AF  317FD11000000FFFF                         _2:#{XCU_FORCE_RESET = _2:#{XCU15|XCU14|XCU13|XCU12|XCU11|XCU10|XCU9|XCU8|XCU7|XCU6|XCU5|XCU4|XCU3|XCU2|XCU1|XCU0}
000001B0  317FD21000000FFFF                         _2:#{XCU_FORCE_BREAK = _2:#{XCU15|XCU14|XCU13|XCU12|XCU11|XCU10|XCU9|XCU8|XCU7|XCU6|XCU5|XCU4|XCU3|XCU2|XCU1|XCU0}
000001B1  317FD11000000000                          _2:#{XCU_FORCE_RESET = _2:#0
```

FIG. 50H

```
                           ;at this point all XCUs should be in h/w break state doing absolutely nothing 000001B2  227FFC2000100000       _4:AR5 = _4:@prog_len
000001B3  327FF72080000000    ;  _4:AR0 = _4:#0x80000000         ;load AR0 with pointer to location of beginning of thread to be pushed
000001B4  327FF82080000000    ;  _4:AR1 = _4:#0x80000000         ;into XCU program memories be sure to set MSB of pointer to access program
                                                                 ;memory indirectly place the thread starting at 0x00000000 in XCU program
000001B5  017FEF27FFC00000    ;  _2:REPEAT = _4:AR5              ;memory (setting MSB of address) forces data to be written to program
000001B6  037FC08800938008       _8:XCU_MON_POKE_ALL = (8:*AR1++[1], _8:*AR0++[1]) ;XCU program memory--simultaneously the
                                                                 ;entire thread is pushed into XCU using this
                                                                 ;instruction sequence
000001B7  327FF72000100000    ;  _4:AR0 = _4:#STL_START          ;load AR0 with address of external RAM location where raw
000001B8  3200402000100060    ;  _4:ext_vect_start = _4:#STL_START + 96 ;STL file beginsthis is the location of the first triangle
000001B9  3200C82000000100    ;  _4:result_buf = _4:#buf_START   ;X1 in external RAM
000001BA  0A0048202880000004  ;  s4:triangles = _4:*AR0[80]      ;set destination "signal" bit to signal reverse
                                                                 ;endian-ness and get number of triangles
000001BB  127FF337FDEFC004    _16_XCUs:  4:PCC = (_8:XCU_S_R, 63, _8_XCUs) ;test DONE bit for XCU15
000001BC  3000C00000000010              _1:XCUs = _1:#16
000001BD  127E602004800604              _4:shift.0 = (_4:triangles, RIGHT, 4)
000001BE  127FF30000000013              _4:PCC = (_1:0x00, 0, push_XCUs)

000001BF  127FF337FDEDC004    _8_XCUs:   4:PCC = (_8:XCU_S_R, 55, _4_XCUs) ;test DONE bit for XCU7
000001C0  3000C00000000008              _1:XCUs = _1:#8
000001C1  127E602004800404              _4:shift.0 = (_4:triangles, RIGHT, 3) ;divide #triangles x 8
000001C2  127FF3000000000F              _4:PCC = (_1:0x00, 0, push_XCUs)     ;goto push_XCUs 000001C3  127FF337FDECC004    _4_XCUs:   4:PCC = (_8:XCU_S_R, 51, _2_XCUs) ;test DONE bit for XCU3
000001C4  3000C00000000004              _1:XCUs = _1:#4
000001C5  127E602004800204              _4:shift.0 = (_4:triangles, RIGHT, 2) ;divide #triangles x 4
000001C6  127FF3000000000B              _4:PCC = (_1:0x00, 0, push_XCUs)     ;goto push_XCUs 000001C7  127FF337FDEC4004    _2_XCUs:   4:PCC = (_8:XCU_S_R, 49, _1_XCU)  ;test DONE bit for XCU1
000001C8  3000C00000000002              _1:XCUs = _1:#2
000001C9  127E602004800004              _4:shift.0 = (_4:triangles, RIGHT, 1) ;divide #triangles x 2
000001CA  127FF30000000007              _4:PCC = (_1:0x00, 0, push_XCUs)     ;goto push_XCUs 000001CB  127FF337FDEC0004    _1_XCU:    4:PCC = (_8:XCU_S_R, 48, NO_XCUs) ;test DONE bit for XCU0
000001CC  3000C00000000001              _1:XCUs = _1:#1
000001CD  127E602004800002              _4:shift.0 = (_4:triangles, COPY, 1) ;no shift--just copy into shift.0
000001CE  127FF30000000003              _4:PCC = (_1:0x00, 0, push_XCUs)     ;goto push_XCUs 000001CF  3000C00000000000    NO_XCUs:  _1:XCUs = _1:#0
000001D0  127FF3000000003D              _4:PCC = (_1:0x00, 0, solo_process)  ;GOTO solo_process  ;the CPU has to do the
                                                                             ;3D transform solo
000001D1                      push_XCUs:
000001D1  327FFA2000000100              _4:AR3 = _4:#load_vects                 ;each XCU PC will be initialized to begin executing here
000001D2  327FFB2000000108              _4:AR4 = _4:#begin                      ;this is the PC address from which all threads
                                                                                ;begin processing (ie, exit out of break)
000001D3  3200082000007FB0              _4:work_1 = _4:{XCU_MON_REQUEST.0}      ;get base address of pushXCU operator
```

FIG. 50I

```
000001D4  027EC02000088000C0                                    4:add.0   = (_4:work_1, _1:XCUs)          ;add number of XCUs to get most significant address +1
000001D5  027E8027E6000000C0                                    4:mul.0   = (_4:shift.0, _1:XCUs)         ;determine any remainder
000001D6  027EA02004827E80                                      4:sub.0   = (_4:triangles, _4:mul.0)      ;sub.0 now contains any remainder
000001D7  0200D027EA0000000                                    _4:remainder_push = _4:sub.0              ;copy result of remainder calc into remainder
                                                                                                          ;so it can be used later
000001D8  0200D027EA0000000                                    _4:remainder_pull = _4:sub.0              ;copy result of remainder calc into remainderr
                                                                                                          ;so it can be used late
000001D9  027FC027FFA27FF5                                      4:XCU_MON_POKE_ALL = (_4:AR3, __4:PC)     ;preset PCs of all XCUs at once to point to entrypoint of
                                                                                                          ;initialization sequence
000001DA  027FC02000C8200C8                                     4:XCU_MON_POKE_ALL = (_4:result_buf, _4:ext_vect_start) ;push the location of the beginning of XCU
                                                                                                          ;input/result buffer
000001DB  027FF927EC000000                                      4:AR2   = _4:add.0                        ;current XCU base address for that XCU
000001DC  027FF82004000000                                      4:AR1   = _4:ext_vect_start               ;address in external RAM of where the first
                                                                                                          ;triangle X1 is located
000001DD  017FEE100C0000000                                    _2:LPCNT1 = _2:XCUs                        ;for the number of XCUs ...
000001DE                         push_outer:
000001DE  010000018FFA00000                                     2:0x0000 = _2:*AR2-[1]                    ;bumb by -1 XCU number
000001DF  027FF7200C8000000                                     4:AR0   = _4:result_buf                   ;load AR0 with pointer to destination result buffer for
                                                                                                          ; XCU X1 of first triangle
000001E0  127EC127E6020000                                      4:add.1   = (_4:shift.0, _4:#0)           ;copy calculated triangles/XCUs
                                                                                                          ;into add.1 for future use
000001E1  127CF20001D0000                                       4:compare = (_4:remainder_push, _2:#0x0)  ;see if there was any remainder from original
                                                                                                          ;triangles/XCU calculation of first triangle
000001E2  127FF437FF1000004                                     4:PCS   = (_8:STATUS, Z, no_remainder_push) ;if no remainder, skip over a push of one more
                                                                                                          ;triangle for the current XCU
000001E3  127EA02000000001                                      4:sub.0   = (_4:remainder_push, _1:#1)    ;decrement any remainder by 1
000001E4  127EC127E6020001                                      4:add.1   = (_4:shift.0, _4:#1)           ;add.1 now contains the number of triangles this
000001E5  0200D027EA0000000                                    _4:remainder_push = _4:sub.0              ; particular XCU is to process
000001E6                         no_remainder_push:
000001E6  02800217EC100048                                      4:*AR2++[0] = (_2:add.1, _2:triangles)    ;poke the triangle batch size for this XCU into its
                                                                                                          ;"triangles" location
000001E7  017FED17EC100000                                     _2:LPCNT0 = _2:add.1                       ;for the number of triangles per XCU
000001E8  317FEF1000000011                                      2:REPEAT = _2:#17                         ;push 18 half-words into target XCU
000001E9  0A80022180118010                     push_inner:   s4:*AR2++[0] = (_2:*AR1++[14], _2:*AR0++[2]) ;(for a total of 9 32-bit floats per triangle)
                                                                                                          ;reverse endian-ness just before push
000001EA  0100001807100000                                      2:0x0000 = _2:*AR1++[14]                  ;bump source pointer by 14 to skip over .STL attribute
000001EB  127FF417FED43FFD                                     _4:PCS   = (_2:LPCNT0, 16, push_inner)     ;and NORM fields NEXT LPCNT0 decrement and
                                                                                                          ;jump if result not zero
000001EC                         push_next_XCU:
000001EC  127FF417FEE43FF2                                      4:PCS   = (_2:LPCNT1, 16, push_outer)     ;NEXT LPCNT1 decrement number of XCUs in LPCNT0
                                                                                                          ;and jump if not zero
000001ED  317FD210000000000                                     2:XCU_FORCE_BREAK = __2:#0                ;clear all h/w breakpoints
000001EE  317FD310000BFFFF                                    _2:XCU_SSTEP = _2:#{XCU15|XCU14|XCU13|XCU12|XCU11|XCU10|XCU9|XCU8|XCU7|XCU6|XCU5|XCU4|XCU3|XCU2|XCU1|XCU0}
000001EF  317FD310000000000                                     2:XCU_SSTEP = __2:#0
                                                                                                          ;like the CPU before it was interrupted to invoke this process, the XCUs will
                                                                                                          ;now encounter a "s/w" breakpoint at which point the CPU will change their PC's
                                                                                                          ;to threadStart to begin processing
```

FIG. 50J

```
00000001F0                                  waitForXCUbreak0:
00000001F0 127FF337FDE80000                      _4:PCC = (_8:XCU_S_R, 32, waitForXCUbreak0)    ;wait for XCU_0 to hit s/w breakpoint
00000001F1 000000000000000                    ;
00000001F2 000000000000000                    ;
00000001F3 027FC027FFB27FF5                      _4:XCU_MON_POKE_ALL = (_,_4:AR4,_4:PC)         ;push "begin" into all XCU PCs simultaneously
00000001F4 317FD310000FFFF                      _2:XCU_SSTEP = _2:#{XCU15|XCU14|XCU13|XCU12|XCU11|XCU10|XCU9|XCU8|XCU7|XCU6|XCU5|XCU4|XCU3|XCU2|XCU1|XCU0}
00000001F5 317FD3100000000                      _2:XCU_SSTEP = _2:#0
00000001F6                                  waitForNotDone0:
00000001F6 127FF437FDEC0000                      _4:PCS = (_8:XCU_S_R, 48, waitForNotDone0)     ;wait for XCU_0 to bring its DONE bit low,
                                                                                                ;indicating processing has started
                                             ;   XCUs are busy processing here
                                             ;
00000001F7                                  waitForDone0:
00000001F7 127FF337FDEC0000                      _4:PCC = (_8:XCU_S_R, 48, waitForDone0)        ;wait for XCU_0 to bring its DONE bit high,
                                                                                                ;indicating completion
                                             ;   now that XCU0 is done processing its triangles, it's time to start pulling
                                             ;   them out and pushing them back into external memory
00000001F8 027F917EC0000000                      _4:AR2 = _2:add.0                              ;previously calculated current XCU base address for that XCU
00000001F9 027FF8204000000                       _4:AR1 = _4:ext_vect_start                     ;address in external RAM of where the first triangle X1 is located
00000001FA 017FEE10C0000000                      _2:LPCNT1 = _2:XCUs                            ;for the number of XCUs
00000001FB                                  pull_outer:
00000001FB 010001BFFA000000                      _2:0x0000 = _2:*AR2--[1]                       ;bump by -1 XCU number
00000001FC 027FF720C80000000                     _4:AR0 = _4:result_buf                         ;load AR0 with pointer to destination result buffer for XCU X1
                                                                                                ;of first triangle
00000001FD 127EC127E6020000                      _4:add.1 = (_4:shift.0, _4:#0)                 ;copy calculated triangles/XCUs into add.1 for future use
00000001FE 127CF20D810000                        _4:compare = (_4:remainder_pull, _2:#0X0)      ;see if there was any remainder from original
                                                                                                ;   triangles/XCU calculation
00000001FF 127FF4371000004                       _4:PCS = (_8:STATUS, Z, no_remainder_pull)     ;if no remainder, skip over a push of one more
                                                                                                ;triangle for the current XCU
0000000200 127EA0200D800001                      _4:sub.0 = (_4:remainder_pull, _1:#1)          ;decrement any remainder by 1
0000000201 127EC127E602001                       _4:add.1 = (_4:shift.0, _4:#1)                 ;add.1 now contains the number of triangles
                                                                                                ;this particular XCU is to process
0000000202 02000827EA000000                      _4:remainder_pull = _4:sub.0
0000000203                                  no_remainder_pull:
0000000203 017FED17EC100000                  pull_inner:
0000000204 317FEF100000011                       _2:LPCNT0 = _2:add.1                           ;for the number of triangles per XCU
                                                 _2:REPEAT = _2:#17                             ;pull 18 half-words from target XCU
0000000205 09801118002180100                     s2:*AR1++[2] = (_2:*AR2++[0],                  ;(for a total of 9 32-bit floats per triangle)
                                                                _2:*AR0++[2])                   ;set destination "signal" bit to
                                                                                                ;reverse endian-ness just before pull
                                                                                                ;(AR2 contains the current XCU number)
0000000206 00000000000000                                                                       ;nop
0000000207 00000000000000                                                                       ;nop
0000000208 010000180710000                                                                      ;bump source pointer by 14 to skip over .STL attribute
                                                                                                ;and NORM fields
0000000209 127FF417FED43FFB                      _4:PCS = (_2:LPCNT0, 16, pull_inner)           ;NEXT LPCNT0 decrement and jump if result not zero
000000020A                                  pull_next_XCU:
```

FIG. 50K

```
0000020A  127FF417FEE43FF1     _4:PCS = (_2:LPCNT1, 16, pull_outer)    ;NEXT LPCNT1 decrement and jump if result not zero
0000020B  307CDD0000000010     _1:setDVNCZ = _1:#DoneBit                ;set Done bit
0000020C  0A7FF52804700000     s4:PC = _4:*SP++[8]                      ;return from interrupt--we are done 0000020D                    solo_process:
0000020D  327FF72000100000     _4:AR0 = _4:#STL_START                   ;load AR0 with address of external RAM location where
                                                                        ;raw STL file begins
0000020E  32004020001000060    _4:ext_vect_start = _4:#STL_START + 96   ;this is the location of the first triangle X1 in external
0000020F  0A00482C28000000     s4:triangles = _4:*AR0[80]               ;RAM set destination sign extend bit to signal reverse
                                                                        ;endian-ness and get number of triangles
00000210  327FF72000000100     _4:AR0 = _4:#buf_START                   ;load AR0 with pointer to destination result buffer for
                                                                        ;XCU X1 of first triangle
00000211  027FF82004000000     _4:AR1 = _4:ext_vect_start               ;address in external RAM of where the
                                                                        ;first triangle X1 is located
00000212  017FED1004800000     _2:LPCNT0 = _2:triangles                 ;FOR LPCNT0 pull triangles in from external memory into
                                                                        ;internal working memory 00000213  317FEF1000000011   pull_solo:
00000213  317FEF1000000011     _2:REPEAT = _2:#17                       ;reverse endian-ness just before push by setting
00000214  098101801100000                s2:*AR0++[2] = _2:*AR1++[2]    ;destination sign extend bit (ie, "s2")
00000215  010000180700000      _2:0x0000 = _2:*AR1++[14]                ;bump source pointer by 14 to skip over
                                                                        ;.STL attribute and NORM fields
00000216  127FF417FED43FFD     _4:PCS = (_2:LPCNT0, 16, pull_solo)      ;NEXT LPCNT0 decrement and jump if result not zero 00000217  1A7FF30000003EF6     s4:PCC = (_1:0x00, 0, threadStart)       ;gosub threadStart compute the transform of
                                                                        ;entire 3D object--solo
00000218  027FF82004000000     _4:AR1 = _4:ext_vect_start
00000219  327FF72000000100     _4:AR0 = _4:#buf_START 0000021A                    push_solo:
0000021B  017FED1004800000     _2:LPCNT0 = _2:triangles                 ;FOR LPCNT0 push computed transform result back out
                                                                        ;to external memory
0000021C  317FEF1000000011     _2:REPEAT = _2:#17
0000021D  098111801000000                s2:*AR1++[2] = _2:*AR0++[2]
0000021E  0000000000000000     _2:0x0000 = _2:*AR0++[14]
0000021F  010000180700000
00000220  127FF417FED43FFB     _4:PCS = (_2:LPCNT0, 16, push_solo)      ;NEXT LPCNT0 decrement and jump if result not zero
00000221  307CDD0000000010     _1:setDVNCZ = _1:#DoneBit                ;set Done bit
00000222  097FF52804700000     s2:PC = _4:*SP++[8]
00000223  0000000000000000
00000224  0000000000000000   progend:
00000225                    end
00000000
```

FIG. 50L

HARDWARE-IMPLEMENTED UNIVERSAL FLOATING-POINT INSTRUCTION SET ARCHITECTURE FOR COMPUTING DIRECTLY WITH HUMAN-READABLE DECIMAL CHARACTER SEQUENCE FLOATING-POINT REPRESENTATION OPERANDS

CROSS-REFERENCE TO RELATED APPLICATIONS

This application is a divisional of co-pending U.S. patent application Ser. No. 16/943,077 filed Jul. 30, 2020, which claims the priority benefit under 35 U.S.C. § 119(e) of U.S. Provisional Application No. 62/886,570 filed on Aug. 14, 2019, the disclosures of which are incorporated herein by reference in their entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present disclosure relates generally to digital processors, and more particularly to a universal floating-point Instruction Set Architecture (ISA) computer.

BACKGROUND

Conventional architectures such as Reduced Instruction Set Architecture (RISC), Complex Instruction Set Computing (CISC), and General-Purpose computing on Graphics Processing Units (GP-GPU) are woefully inadequate for applications involving computations on large floating-point data sets where the raw input is in the form of human-readable decimal character sequences of 9-20 decimal digits or more. Among the reasons they are inadequate is because nine decimal digits is nine bytes, not counting "+" or "−" sign, "." character, or exponent characters. These characters, together, can add an additional seven bytes to the overall length of the decimal character representation. Stated another way, for a 9-digit representation in formal scientific floating-point notation, up to 16 bytes are required just to store a single representation.

For a 20-byte representation, up to 27 bytes are required. Conventional architectures require that these long character sequences be explicitly converted to IEEE 754-formatted binary representations prior to actual use in computation. Among the first steps in this process is simply loading one or more characters of a given string into a working register, which is typically no wider than 64 bits (8 characters/bytes). Thus, these conventional machines cannot directly compute with these character sequences because they can typically read or write no more than 64 bits (8 characters) at a time. To carry out an IEEE 754-2008 "H=20" double-precision conversion, conventional computers must go through a thousand or more clock cycles of computation, especially for double-precision (binary64), for a single decimal character sequence representation.

Assuming, arguendo, that these machines have special hardware that can do a portion of the conversion process using just three or four specialized instructions after the entire raw character sequence is loaded into a supposed special register, a double-precision binary64 conversion could be completed with a latency of just 30 or so clock cycles. However, there is still the problem of how to hide this latency.

One common method for hiding latency is designing the architecture so that it is of the interleaving, multi-threading type. Basically, an interleaving, multi-threading architecture is one in which the workload is distributed among threads that overlap during execution, in a round-robin fashion, with each thread having its own time-slot for a pre determined number of clocks, usually just one clock in heavy workload environments. With special pipelined hardware for doing these conversions, all the thread has to do during its first several time-slots is push the entire decimal character representation into this special hardware, such that, once this first time slot has been consumed and all the time slots of all the other threads have been likewise consumed and the first thread's next time slot arrives, all the first thread then has to do is read the converted result out and store it elsewhere, with the other threads doing the same.

The problem with employing an interleaving, multi-threading approach to hiding extra-long execution cycles is that even with 8 threads, this is not sufficient to completely hide a 30-or-more-clock conversion pipeline. Eight (8) threads can only hide 8 clocks worth of latency. In this scenario, the overall pipeline of the processor will stall for 22 clocks per conversion while waiting for the current conversion to complete. This strategy works fine for hardware operators with latencies of 8 or fewer clocks, but not for something that has a 30-or-more-clock latency, such as would be the case for such hardware IEEE 754-2008 mandated operators as convertToDecimalCharacter, convertFromDecimalCharacter, square Root, and Remainder to name a few.

One might propose designing a processor that has 30 threads so that latencies of all types of operations up to 30 clocks deep can be completely hidden. But this is simply not practical. The main reason is that, while all these conventional threads share the same hardware operators, opcodes, and the like, each thread requires its own program counter (PC), Stack Pointer, working register set, Status Register, and so forth. This creates logic bloat when you start sprinkling this type processor on a chip. Not only that, but such a huge processor would be extremely difficult to debug. Imagine a hydra with 30 heads all joined at the hip as would be the case for a 30-thread interleaving, multi-threading machine. The place where they join together, i.e., where the instruction's opcode decode and execution unit is situated, creates an inherent bottleneck.

Moreover, assuming such a processor will always have a workload heavy enough to keep all threads occupied all the time, more time and resources will be required just to divide up, distribute, and manage the workload among 30 threads (again, the idea of interleaving threads being to hide long execution latencies). Without a workload sufficient to keep all threads occupied all the time, the hardware to implement 30 threads would be a colossal waste of resources that could be better spent elsewhere or not at all.

SUMMARY

The present disclosure provides a new kind of universal floating-point ISA that can "push" and "pull" in a single clock cycle, dual operands including not only long decimal character sequences up to 128 characters in length each, but also "gobs" of data that can be a mix of character sequences, IEEE 754-2008 binary formatted floating-point numbers, integers, and basically any combination thereof, into and out of memory-mapped logical, integer and floating-point operators. In certain heavy ("big data") workload environments, the disclosed ISA can completely hide long latencies without the use of any interleaving, multi-threading methods, or hardware. In fact, the disclosed universal floating-point ISA is a new kind of processor that does NOT employ opcodes at all, but rather is a pure "mover'-style architecture that can push and pull "gobs" of data without the encumbering prior-art "opcode" fetch, decode and execute bottleneck.

Additionally, the new universal floating-point ISA has direct, indirect, immediate, and table-read addressing modes, with the indirect addressing mode having both programmable offset and auto-post-modification of index register capability and a memory-mapped "REPEAT" counter so that, with a single instruction, entire vectors can easily and efficiently be pulled from and pushed into stand-alone operators capable of accepting dual operands of 1 to 128 bytes each—every clock cycle—all without the use of opcodes in the instruction.

Rather than opcodes, the disclosed universal floating-point ISA employs stand alone, memory-mapped operators, complete with their own pipeline that is completely decoupled from the processor's primary push-pull pipeline, automatic semaphore, and their own private, directly and indirectly addressable, three-ported (one write-side and two read-side) result buffers. Results, including their exception signals, automatically spill into the private result buffers and are automatically copied into the processor Status Register when pulled from such result buffers. The two read-side ports of the result buffers enable simultaneous pulling-then-pushing, with a single instruction, two operands (operandA and operandB) into the same or different operator in a single clock.

Likewise, the disclosed universal floating-point ISA has at least some directly and indirectly addressable three-port Static Random-Access Memory (SRAM). At least some of this SRAM is able to simultaneously read 1, 2, 4, 8, 16, 32, 64, and 128 bytes at a time on both side A and side B in a single clock.

Furthermore, the disclosed universal floating-point ISA is capable of being easily and efficiently preempted during execution, with all operator result buffers being capable of being preserved and fully restored upon completion of the preempting process, interrupt service routines, and subroutine calls. Because some of the results (together with their exception signals stored in their respective result buffers) can be up to 1029 bits wide, the disclosed ISA employs a new kind of stack that can receive, in a single clock/push, all these bits for context save operations, and when the routine is completed, restore such buffer to its original state with a single pull.

Additionally, the disclosed universal floating-point ISA is capable of scaling its computing power by attaching to the parent CPU, eXtra (child) Compute Units (XCUs) that execute the same instruction set as the parent CPU and offload work the parent CPU pushes into them and pulls from them.

Additionally, the disclosed universal floating-point ISA has a "natural" real-time debug and monitoring capability designed into it that can perform real-time data exchange tasks via a host IEEE 1149.1 (JTAG) and/or host system interface, on-the-fly, without the use of interrupts, opcodes, or direct memory access (DMA) hardware. The real-time monitoring and debug interface is able to easily and efficiently set hardware or software breakpoints, reset, single-step and provide at least a minimum level of real-time trace capability.

For web-based artificial intelligence (AI) applications where data is stored primarily in human-readable form, the disclosed universal floating-point ISA has the ability, in hardware, to compute directly with dual decimal character sequences up to IEEE 754-2008 "H=20" in length, without first having to explicitly perform a conversion-to-binary-format process in software before computing with these human-readable floating-point or integer representations. Oftentimes, vectors of data can comprise hundreds, if not thousands, of decimal character sequence entries that conventional processors must explicitly convert beforehand to binary representations before entering the actual computational stream. By way of example, this means that if a vector of dual operands comprising decimal character sequences of at least twenty decimal digits and one hundred entries deep per operand, it could potentially take a conventional processor hundreds of thousands to well over a million clock cycles just to convert these strings to binary representation prior to actually computing with them.

The disclosed universal floating-point ISA performs all the above functions by dispensing with "opcodes" altogether; and employing: special three-port, 1024-bit wide SRAMS; a special dual asymmetric system stack; memory-mapped stand-alone hardware operators with private result buffers with simultaneously readable side-A and side-B read ports; and dual hardware H=20 convertFromDecimalCharacter conversion operators.

With the disclosed universal floating-point ISA and related hardware, the conversion of IEEE 754-2008 H=20 decimal character sequences to IEEE 754 binary format is automatic, if desired, and, for big data scenarios, such conversion can actually be free, in terms of clock cycles and explicit instructions to perform these conversions. For example, with a minimum dual operand vector of just thirty-two entries each of twenty-eight digit decimal sequences being fed into this design's multi-function, universal Fused-Multiply_Add operator, the net clock requirement is only thirty-two clocks, which includes the automatic conversion of the sixty-four twenty-eight decimal character sequence representations. Meaning the conversion to binary step is free. This is due to the fact that by the time thirty-two H=20 decimal character sequences are pushed into the present invention's hardware convertFromDecimalCharacter operator using the memory-mapped "REPEAT" operator, the results from the first push are already available for reading.

Stated another way, using the REPEAT operator to push qty. 32 H=20 decimal character sequence operands in the convertFromDecimalCharacter operator and then immediately use the REPEAT operator to pull them out in rapid succession, results in one clock to perform the push and one clock to perform the pull, per conversion. Meaning that the clocks required to do the actual conversion AND the target computation, if any, are "free" and completely hidden. Since the present invention is capable of performing two such conversions every clock cycle, such equates to only 0.5 clocks per conversion of 64 H=20 decimal character sequences, which includes both the push and the pull, due to the fact that the instant invention's ability to push two H=20 decimal character sequences simultaneously, every clock cycle.

The disclosed universal floating-point ISA includes a "Universal" Fused-Multiply-Add (FMA) operator that is also "multi-mode". Universal in this context means the FMA operator can directly accept IEEE-754 half-precision binary16, single-precision binary32, double-precision binary64, decimal character sequences up to 28 decimal digits in length, including decimal character sequences with "token" exponents such as the trailing letters "K", "M", "B", "T" and the character "%"—in any combination—without the CPU or XCU having to first explicitly convert them to binary64. Such automatic conversion is designed into this Universal FMA's pipeline hardware. Here, "K" is the token for exponent "e+003", "M" for "e+006", "B" for "e+009", "T" for "e+012" and "%" for "e−002". Moreover, results of each Universal FMA computation are automatically converted into binary16, binary32, or binary64 format as specified by the originating instruction, such conversion logic also built into the this operator's pipeline hardware.

In the context of the Universal FMA operator, "multi-mode" means the Universal FMA operator can operate as a conventional FMA by bypassing the automatic decimal-character-to-binary conversion circuit, thereby making its pipe much shorter. The Universal FMA operator can also be used in a second mode as a "single" or "dual" decimal-character-to-binary conversion operator—only, by bypassing the Universal FMA operator and simultaneously converting and writing two results into this operator's result buffers every clock cycle. Such a capability is essential mainly due to the fact each decimal-character-to-binary conversion circuit is rather large and, as such, in many applications it would be inefficient to incorporate a third stand-alone decimal-character-to-binary conversion circuit to support conversions in computations not involving the Universal FMA operator.

As a third mode, the Universal FMA operator can be used as a very powerful Sum-of-Products operator, which is similar to a generic FMA, except the Sum-of-Products includes 32 "fat" accumulators (one for each operator input buffer) on the output of its adder for accumulation of each iteration and to supply this accumulation back into this adder's "C" input for the next summation. This accumulator is special, because it has an additional 10 lower bits and its contents are never rounded, meaning that the intermediate value actually stored in a given FMA accumulator is never rounded, but such value IS rounded during final conversion to one of the IEEE 754 binary formats specified by the originating instruction immediately before automatic storage into one of the 32 result buffers specified in the originating instruction. Hence the word "Fused" in the IEEE 754-2008 mandated "Fused-Multiply-Add" operation. Here, "Fused" means no rounding during the operation. The extra 10 bits of fraction in the accumulator are there mainly to help absorb underflows until the final iteration. This amount can be increased or decreased by design as the application requires. This sum of products mode is essential for fast, efficient, and precise computation of tensors.

To enable single-clock movement of dual operands (ie, operandA and operandB), whose length can be up to 128 bytes each (for a total of up to 256 bytes), it is now apparent that a special kind of new and novel processor is needed that has embedded in it, specially designed dual-bus infrastructure and memory that can be simultaneously written at 1 to 128 bytes and read at up to 256 bytes per clock cycle, all without the use of opcodes. The disclosed universal floating-point ISA is such a processor.

In one embodiment, the present disclosure provides an opcode-less universal floating-point Instruction Set Architecture (ISA) computer implemented entirely in hardware. The ISA computer includes a program memory and hardware circuitry connected to the program memory. The hardware circuitry is configured to compute directly with human-readable decimal character sequence floating-point representations without first having to explicitly perform a conversion-to-binary-format process in software before computing with the human-readable decimal character sequence floating-point representations. The hardware circuitry is configured to accept, in any combination, human-readable decimal character sequence floating-point representations or IEEE 754-2008 standard binary arithmetic format floating-point representations, wherein the human-readable decimal character sequence floating-point representations are up to IEEE 754-2008 "H=20" in length. The IEEE 754-2008 standard binary arithmetic format floating-point representations may be IEEE 754-2008 standard binary16 (half-precision), binary32 (single-precision), and binary64 (double-precision) floating-point representations.

In another embodiment, the present disclosure provides a method for converting long decimal character sequences using relatively small dual-half system abbreviated look up tables and on-the-fly interpolation of binary weights derived from these tables.

In another embodiment, the present disclosure provides a novel asymmetric dual hardware stack for saving in one clock cycle and restoring in one clock cycle, contents of certain memory-mapped hardware operator result buffers, along with their status/exception signals simultaneously.

In yet another embodiment, the present disclosure provides a universal, multi function Fused-Multiply-Add-Accumulate floating-point operator embedded in the ISA computer for directly computing long series vectors whose data comprise long decimal character sequences and/or binary formats in any combination without first having to explicitly convert them from-to any of these formats beforehand. The multi-function universal FMA operator can be used for fused-multiply-add, sum-of-products, and simultaneous dual decimal-character-to-binary format conversion operations. Because the disclosed universal floating-point ISA can move dual "GOBs" of data of up to 128 bytes each and every clock cycle into memory-mapped operators, such operators can be parallel clusters of operators as in the case of tensors employed for artificial intelligence (AI), deep learning, neural networks, and the like. For example, in the case of binary16 (half-precision) vectors, the disclosed universal floating-point ISA can write to up to quantity 64 sum-of-products operators simultaneously in a single clock cycle (quantity 32 for binary32 and quantity 16 for binary64 formatted numbers). The dual data being written (i.e., operandA and operand B) into such operators can be decimal-character sequences (up to 28 decimal digits in length each), decimal-character sequences with token exponents, half-precision binary16, single-precision binary32, and/or double-precision binary64 formatted representations—in any combination. These formats are automatically converted by novel hardware embedded in such operator(s) pipelines and, once a binary64 result is obtained, again converted to the target binary format immediately prior to automatic storage into one of several operator result buffers specified by the original single "pull"/"push" instruction executed.

Because this novel architecture employs no op-codes, the core processor instruction pipeline knows how to do one thing and one thing only—simultaneous "pull" and "push" single or dual operands—which requires no opcodes.

Further features and benefits of embodiments of the disclosed apparatus will become apparent from the detailed description below.

BRIEF DESCRIPTION OF THE DRAWINGS

In the following section, the invention will be described with reference to exemplary embodiments illustrated in the figures, in which:

FIG. 11 is an exemplary memory-map of the disclosed universal floating-point ISA's memory-mapped programming model register set in an exemplary embodiment of the present disclosure;

FIG. 12B is an exemplary memory-map of the disclosed universal floating-point ISA's hardware-implemented IEEE 754-2008 Mandated Comparison Predicates operators in an exemplary embodiment of the present disclosure;

FIG. 12C is an exemplary memory-map of the disclosed universal floating-point ISA's hardware-implemented IEEE 754-2008 Mandated dual-operand, non-computational, non-exceptional operators in an exemplary embodiment of the present disclosure;

FIG. 12D is an exemplary memory-map of the disclosed universal floating-point ISA's hardware-implemented IEEE 754-2008 Mandated single-operand, non-computational, non-exceptional operators in an exemplary embodiment of the present disclosure;

FIG. 12E is an exemplary memory-map of the disclosed universal floating-point ISA's hardware-implemented IEEE 754-2008 miscellaneous mandated operators in an exemplary embodiment of the present disclosure;

FIG. 12F is an exemplary memory-map of the disclosed universal floating-point ISA's hardware-implemented, stand-alone floating-point computational operators not mandated by IEEE 754-2008 in an exemplary embodiment of the present disclosure;

FIG. 13 is an exemplary table showing the disclosed universal floating-point ISA's hardware-implemented native logical and integer arithmetic operators in an exemplary embodiment of the present disclosure;

FIGS. 18A and 18B are an exemplary table illustrating the bits of the CPU's and XCU's memory-mapped STATUS register/operator and their respective functions in an exemplary embodiment of the present disclosure;

FIG. 33 is a partial detail of an exemplary embodiment of the contents of the integer part binary-to-decimal-character mantissa D52 weight look-up ROM;

FIG. 37 is a partial detail illustrating an exemplary embodiment of the convertToDecimalCharacter fraction part ROM weight look-up contents showing the first 20 digits and the second 22 digits (truncated part of the weight), along with the actual Verilog RTL source code employed to obtain a mantissa mask used during the hardware computation;

FIG. 38 is a partial detail illustrating an exemplary embodiment of the look-up ROM block 9330 and actual Verilog RTL source code used by the convertToDecimalCharacter operator for converting the adjusted binary exponent input to an adjusted decimal exponent for both normal and subnormal numbers;

FIG. 48B illustrates exemplary snippets of Verilog RTL showing memory mapping and behavioral description of the parent CPU's XCU hardware breakpoint control and status registers in an exemplary embodiment of the present disclosure;

FIGS. 50A through 50L are a post-assembly listing of an example program written in the instant ISA assembly language that employs up to quantity (16) child XCUs to perform a 3D transform (rotate, scale, and translate) on all three axes, of a 3D object in .STL file format and to write the results of such transform back out to external program memory.format and to write the results of such transform back out to external program memory.

DETAILED DESCRIPTION

The present disclosure will now be described more fully hereinafter with reference to the accompanying drawings, in which preferred embodiments of the disclosure are shown. In the below, for purposes of explanation and not limitation, specific details are set forth in order to provide a thorough understanding of the present disclosure. It will be apparent to one skilled in the art that the present disclosure may be practiced in other embodiments that depart from these specific details.

The IEEE 754-2008 Standard for Floating-Point Arithmetic is hereby incorporated by reference herein. Likewise, the IEEE 1149.1-1990 Joint Test Action Group (JTAG) standard is hereby incorporated by reference herein.

The disclosed embodiment of the Universal Floating-Point ISA processor employs a doubly modified Harvard architecture memory model, meaning that it comprises separate program and data memory buses, but with the added ability to access program memory as if it were data memory, doubly because the present architecture can push and pull two operands simultaneously. It has immediate, direct and indirect addressing modes, as well as table read from program memory using direct or indirect addressing mode. The modified Harvard model can be implemented as either a single-thread processor or a interleaving, multi-threading processor, wherein the threads share the same operators, but have their own processor registers (such as PC, SP, Auxiliary Registers, Status Register, etc.) and can share some or all the system memory. This ISA can be easily adapted as a Von Neumann memory model as well.

Generally speaking, the source and/or destination operator(s) ultimately determine the meaning of certain bit fields of the instruction.

Figure 1:
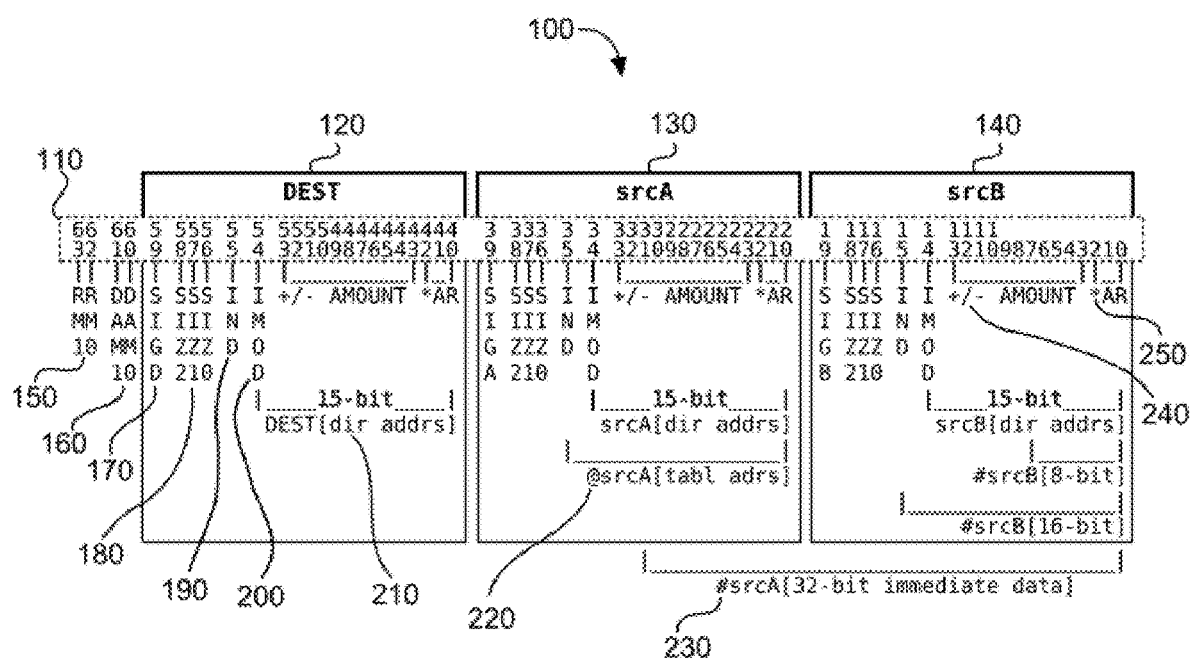
FIG. 1 is a diagram of bit fields in an exemplary embodiment of the present disclosure's 64-bit instruction word.

FIG. 1 is a diagram of bit fields 110 in an exemplary embodiment of the present disclosure's 64-bit instruction word. The bit fields are broken down as follows:

Bits 63 and 62 make up the RM[1:0] "static" directed rounding mode specifier 150 that can be used by floating-point hardware operators to effectuate a correctly rounded floating-point result according to this specifier. This rounding mode specifier is lower priority to the "dynamic" directed rounding mode attribute specifier in the processor's STATUS register, if enabled.

This "opcode-less" ISA has only four mnemonics: "_", "P", "N" and "Z", which may be used to specify the static rounding direction of a given floating-point instruction. Each assembly line begins with one of these four mnemonics, usually after a tab or unique label identifying the source line. Each of these four single-character mnemonics, when encountered, signal the assembler to insert a "00", "01", "10", or "11" in the RM[1:0] bit positions 150 of the instant instruction as follows:

Mnemonic/2-Bit Value

"_"=00=round using current "default" rounding direction, i.e., "nearest". Note: the "default" rounding direction can be changed to "away" by setting bit 54 in the STATUS register.
"P"=01=round towards positive infinity
"N"=10=round towards negative infinity
"Z"=11=round towards zero Note: the two RM bits 150 of the instruction can be overridden by setting bit 53 (enable RM attributes) of the STATUS register. If set, rounding mode attribute bits 51 and 52 of the STATUS register determine rounding direction using the same 2-bit code definitions above.

It should also be noted that IEEE 754-2008 does not, per se, anticipate or comprehend that rounding direction be embedded or signaled in the instruction, but rather as an attribute implemented in software. Consequently, some implementations of the instant ISA may not have use of the RM bits for signaling rounding direction within the instruction itself. In such cases, it may be more desirable to employ these two bits for some other signaling purpose, depending on the needs of the operator and the implementer.

DAM[1:0] Data Access Mode 160 specifies from which memory the operand read(s) are to take place for the instant instruction. The assembler/compiler determines what these two bits should be according to the addressing modes specified in the instant assembly line source statement. Their 2-bit encoded meanings are:

00=both operand A and operand B are read from data memory using either direct or indirect addressing modes.

01=operand A is either direct or indirect and operand B is immediate (i.e, immediately available within lower 16 bits of the srcB field 140 of the instant instruction). A "#" character 230 immediately preceding operandB in the source line signals the assembler that operandB is "immediate" and to insert a "01" into DAM[1:0] bit positions 160 of the instant instruction during assembly.

10=operand A is a table-read from program memory using direct (table read from program memory) addressing mode and operand B is either direct or indirect and NEVER immediate. An "@" character 220 immediately preceding operandA in the source line signals the assembler that operandA resides in program memory and to therefore insert a "10" into DAM[1:0] bit positions 160 of the instant instruction during assembly.

11=32-bit immediate (i.e, immediately available within instant instruction). If there is only one operand, i.e., operandA all by itself on the assembly line and it is immediately preceded by a "#" character, this signals the assembler that the sole operandA is a 32-bit immediate value within the instant instruction and to insert a "11" into DAM[1:0] bit positions 160 of the instant instruction during assembly. Note: there are enough unused bits in this particular mode to actually make this a 40-bit immediate value, but the present assembler does not support 40-bit immediate values.

DEST 120, srcA 130 and srcB 140 Bit Fields

The instant ISA is designed to effectuate in a single clock simultaneous movement of single or dual operands, operandA and operandB, to a destination specified in DEST 120 using the addressing mode, size and signal specified in their respective srcA 130 and srcB 140 bit fields. The source and destination addresses can be processor hardware operator result buffers, data memory, both on-chip and off-chip, program memory, basically anything within the processor's address map, which also includes the entire memory map of any child XCU's attached to the parent CPU.

Contained within each of the DEST 120, srcA 130 and srcB 140 bit fields are size specifier 180, direct/indirect addressing mode specifier 190 and, if indirect addressing mode is specified in 190, which type of indirect addressing mode is to be employed for the instant access as specified by 200.

SIGA, SIGB and SIGD 170 are general-purpose "signals" whose meaning depends on context, such as implied by source and/or destination operator, if any. For example if the source(s) are SRAM locations and the destination is an integer arithmetic operator, then if the source operand's SIGA/B is set, this would usually signal that the sign of the operand is to be automatically sign-extended in hardware to 64 bits before being pushed into that operator. If the destination SIGD is set, this can be used to signal the operator that it is to employ signed arithmetic, as opposed to unsigned arithmetic, in that particular operation.

For floating-point operations such as the instant invention's Universal Fused-Multiply-Add operator, SIGA and SIGB, when set, are used to signal that the operands are human-readable decimal-character sequences as opposed to IEEE 754 binary format numbers, which is default. SIGD for this operator, when set along with SIGA and SIGB also being set, signals the operator to bypass FMA function and simply convert the two decimal-character sequences to the binary format specified by the destination size bits and automatically store them simultaneously in the result buffer location specified in the DEST 120. If SIGA and SIGB are clear along with SIGD being set, this signals the Universal FMA to bypass the delay circuit used for coherency when both operands are binary format, which has the effect of substantially shortening the Universal FMA pipeline by about 23 clocks, as that particular operation does not involve a convertFromDecimalChar step. When SIGD is clear (0), this signals that both operands propagate thru the entire length of the pipeline to maintain coherency, regardless of the state of SIGA or SIGB.

SIGA, SIGB and SIGD Summarized

SIGA Signal for operandA field meaning depends on context—either "s" or "_" must immediately precede Size field and can be mixed and matched with the other operand's and/or destination SIG signals.

can mean: For integer or logical operators, "s"=1=signed (sign-extended); "_"=default=0=unsigned (zero-extended), depending on target operator.

can also mean: 1=text (decimal character sequence); 0=binary format (mainly used with direct character sequence computations/operators).

Implementer can make it mean anything he/she wants it to mean, depending on the target operator.

SIGB Signal for operandB field meaning depends on context—either "s" or "_" must immediately precede Size field can be mixed and matched.

can mean: For integer or logical operators, "s"=1=signed (sign-extended); "_"=default=0=unsigned (zero-extended), depending on target operator.

can also mean: 1=text (decimal character sequence); 0=binary format (mainly used with direct character sequence computations/operators).

Implementer can make it mean anything he/she wants it to mean, depending on the target operator.

SIGD Signal for DEST field meaning depends on context—either "s" or "_" must immediately precede Size field can be mixed and matched.

can mean: "s"=1=signed (sign-extended) results; "_"=0=unsigned (zero-extended), depending on target operator can mean: 1=eXchange ends (ie, flip endian-ness) on and during read of operand A, depending on context. For example, reading/writing from/to external memory versus on-chip memory in cases where external data is little endian.

can also mean: 1=store results as text (decimal character sequence) 0=binary format can also mean: restore selected operator with value and flags being written. Implementer can make it mean anything he/she wants it to mean, depending on the target operator.

SIZ[2:0] 180 Size in bytes, of source/destination (shown with SIGn bit cleared, i.e., immediately preceded with "_" character, which means "default").

"_1:"=0 000=1 byte
"_2:"=0 001=2 bytes (half-word)
"_4:"=0 010=4 bytes (word)
"_8:"=0 011=8 bytes (double-word)
"_16:"=0 100=16 bytes (gob)—i.e, vector, structure and/or mix of types up to this byte count
"_32:"=0 101=32 bytes (gob)
"_64:"=0 110=64 bytes (gob)
"_128:"=0 111=128 bytes (gob)

SIZ[2:0] Size in bytes, of source/destination (shown with SIGn bit set, i.e., immediately preceded with "s" character). Preceding the Size 180 specifier with a "s" character, signals the assembler to set the SIG bit for the respective DEST, srcA or srcB field.

"s1:"=1 000=1 byte
"s2:"=1 001=2 bytes (half-word)
"s4:"=1 010=4 bytes (word)
"s8:"=1 011=8 bytes (double-word)
"s16:"=1 100=16 bytes (gob)—i.e, vector, structure and/or mix of types up to this byte count
"s32:"=1 101=32 bytes (gob)
"s64:"=1 110=64 bytes (gob)
"s128:"=1 111=128 bytes (gob)

INDirect Addressing IND 190 Bit

The DEST 120, srcA 130, srcB 140 fields each have a IND 190 bit, which, when set, employs the contents of the specified Auxiliary Register as a pointer to either data or program memory for read operations if srcA or srcB field(s), or write operation if in the DEST field. An "*" character immediately preceding one of the specified AR0 thru AR6 Auxiliary Registers ("ARn") specifier 250 or the Stack Pointer (SP) specifier 250, signals the assembler to set IND bit 190 in the respective field in the instruction.

IND 1=indirect addressing mode for that field. IND 0=direct addressing mode for that field. If IND=0, then the 15 bits specified in 210 of the respective DEST 120, srcA 130 and/or srcB 140 field(s) is employed as the lower 15 bits of the direct address, with the higher order bits all=0. Direct addressing mode enables "direct" access to the specified zero-page location without first having to load an Auxiliary Register with a pointer to the location to be accessed.

While the direct addressing mode does have it advantages and uses, it also has its disadvantages. Among them, absent some kind of paging mechanism, the direct addressing mode can only reach the first 32k locations in the memory map. Another disadvantage is that since the direct address comes from the instruction in program memory, this address cannot be automatically post-modified or offset, unlike Auxiliary Registers (ARn) and Stack Pointer (SP) employed by the indirect addressing mode.

IMOD 200 Bit

There are two indirect addressing modes that may be employed for reads and writes: Indirect with +/−auto-post-modification and Indirect with +/−offset but with no auto-post-modification.

IMOD is only used with IND=1, meaning it is only used with indirect addressing mode for a given field.

IMOD=1 means: use specified ARn contents + (plus) or − (minus) signed AMOUNT field 240 for the effective address for accessing operandA, operandB or DEST. ARn remains unmodified. With IMOD=1, the range of AMOUNT is +1023 to −1024.

IMOD=0 means: use specified ARn contents as pointer for the instant read cycle of operandA or operandB (if specified) or write cycle for DEST. Then automatically post-modify the contents of ARn by adding or subtracting UNsigned AMOUNT field to/from it. With IMOD=0, the range of AMOUNT is 0 to 1023 for positive amounts and 0 to 1024 for negative amounts. Note: the programmer enters an unsigned amount in the source line, but the assembler automatically converts this amount to "signed" during assembly.

Direct Addressing Mode General Rules

On the same assembly line, direct addressing mode can be mixed and matched with:
  indirect addressing mode (any combination)
  immediate addressing mode for srcB in case of dual operands
  immediate addressing mode for srcA in case of single operand
  table-read from program memory for srcA in case of dual operands
  table-read from program memory for srcA in case of single operand Indirect Addressing Mode General Rules On the same assembly line, indirect addressing mode can be mixed and matched with:
  indirect addressing mode (any combination)
  immediate addressing mode for srcB in case of dual operands
  immediate addressing mode for srcA in case of single operand
  table-read from program memory for srcA in case of dual operands
  table-read from program memory for srcA in case of single operand

Immediate Addressing Mode General Rules

On the same line, immediate addressing mode can be mixed with:
  direct addressing mode as srcA and immediate as srcB
  indirect addressing mode as srcA and immediate as srcB
  if srcA is signaled as #immediate and appears as the sole source, then it is 32-bit immediate. Note: 32 bits is a limitation of the present assembler, in that the instruction word can accommodate up to 40 bits in this field.
  #immediate addressing mode may not be used with @table-read addressing mode on the same line @Table-Read Addressing Mode General Rules On the same line, @table-read addressing mode can be mixed with:
  direct or indirect addressing mode as srcB
  @table-read addressing mode may not be used with the #immediate addressing mode on the same line Below are examples of actual usage conforming to the following assembly line format for a single operand, i.e., srcB is absent from the assembly line. Refer to FIGS. 9, 10, 11, 12A thru 12D and FIG. 13 for mapping of SRAM, programming model registers, floating-point, integer and logical operators and their respective labels and assignments used by the assembler:

| Label: | RM | SigSizeD:DEST = SigSizeA:srcA |
|---|---|---|
| demoA: | _ | _8:work.0 = s1:work.1 |
|  | _ | _2:LPCNT1 = _2:#50 |
|  | _ | _2:*AR1++[2] = _2:work.3 |
|  | _ | _8:work.4 = _8:@progTable1 |
|  | p | _8:cnvFDCS.0 = _32:*AR2[+0] |

In the first example given above, "demoA" followed by a semicolon is an optional label. The first "_" character is the mnemonic that specifies in this instance the "default" rounding mode, but that since the destination is not a floating-point operator, means "don't care." The next "_" is the signal 170 for the destination 120 and the "8" character followed by a colon specifies the size 180 in bytes of the value to be stored in direct memory location "work.0", the destination 180 address. The "=" character means "pulled from". The "s" character in front of the "1" character is the signal 170 for the operandA source, signaling that the value being pulled from direct location "work.1" is to be automatically sign-extended to 64 bits while in-route to the destination. The "1" character to the left of the semicolon specifies the size 180 in bytes of operandA being pulled from "work.1", the srcA 130 address.

In the second example shown above, "LPCNT1" is the label specifying the direct address of one of the processor's memory-mapped hardware loop counters as the destination 120 address. In this example, LPCNT is being loaded with an immediate value of 50 decimal. The "#" character 230 appearing to the right of the colon in the srcA 130 field signals immediate addressing mode. Note that in this instance, because a single operand immediate is always 32 bits and only two bytes (16 bits) are specified, the two-byte value of "50" is automatically zero-extended by the assembler to 32 bits before being inserted into the assembled instruction word.

In the third example, "*AR1++[2]" specifies indirect addressing mode for the destination 120. In this instance, it is specifying the use of the contents of Auxiliary Register AR1 as an indirect pointer to where the two-byte value pulled from "work.3" is to be pushed. The "*AR1" followed by "++" signals the assembler that this is post-modified indirect addressing mode and to insert a "0" into the destination 120 IMOD 200 bit position in the assembled instruction word. The "*" character 250 in front of the "AR" 250 characters signals the assembler that the addressing mode for the destination 120 field is indirect and to insert a "1" into the IND bit position 190 for the destination 120 field. The "[2]" characters to the right of the "++" characters specify the amount by which AR1 is to be automatically post-incremented. If "−−" had appeared in place of the "++", this would have signaled post-decrement.

In the fourth example, the "@" character in front of the label "progTable1" signals the assembler that progTable1 is a direct address for srcA field 130 accessing program memory for data and to insert a "10" into Data Access Mode bits DAM[1:0] 160 in the instruction word during assembly. In this instance, 8 bytes will be pulled from program memory location progTable1 and all 8 bytes will be pushed into direct data memory location work.4, when executed.

In the fifth and last example above, a 32-byte decimal character string will be pulled from the data memory location specified by the contents of AR2 (with offset of +0) and pushed into the convertFromDecimalCharacter operator input buffer number 0. The unrounded intermediate result of the conversion will be converted to IEEE 754-2008 binary64 (double-precision) format and rounded towards positive infinity before being stored in this operator's result buffer number 0. If the "p" mnemonic had been a "_" instead, the intermediate result would have been rounded to nearest even, which is default rounding mode. If the size 180 of the destination 120 field had been a "4" instead of an "8", the intermediate result would have been automatically converted to binary32 (single-precision) format instead binary64 format. In this example, the "[+0]" to the right of *AR signals the assembler that srcA 130 is indirect with offset addressing mode and to insert a "1" in srcA field IMOD bit position 200 of srcA field 130 during assembly.

Below are a few examples of actual usage conforming to the following assembly line format for both single and dual operands:

| Label: | RM | SigSizeD:DEST = (SigSizeA:srcA, SigSizeB:srcB) |
|---|---|---|
| demoB: | n | _8:fmul.0 = (_8:vect+32, _8:scale.1) |
| demoC: | _ | _4:AR0 = _4:#fadd.0 |
|  | _ | _4:AR3 = _4:#vectStart |
|  | _ | _4:AR2 = _4:#vectStart + 8 |
|  | _ | _2:REPEAT = _2:#15 |
|  | _ | _8:*AR0++[1] = (_8:*AR3++[16], _8:*AR2++[16]) |
| demoD: | _ | _4:AR3 = _4:#vectStart |
|  | _ | _4:AR2 = _4:#vectStart + 32 |
|  | _ | _2:LPCNT0 = _2:#16 |
| loopD: | _ | _4:AR0 = _4:#ufma.0 |
|  | _ | _2:REPEAT = _2:#31 |
|  | p | _8:*AR0++[1] = (s32:*AR3++[64], s32:*AR2++[64]) |
|  | _ | _4:PCS = (_2:LPCNT0, 16, loopD) |

In the line above with the label "demoB:" is a double-precision floating-point multiply operation that has its result rounded towards negative infinity. The syntax for operations involving two or more operands expects the operand list to be enclosed in parenthesis. In this instance, the destination, srcA and srcB are direct addressing mode. Fmul.0 is the first input buffer to the IEEE 754-2008 floating-point "multiplication" hardware operator. The final result is stored in the operator's first result buffer location, which is the same location as the input.

The sequence of instructions beginning with the label "demoC" illustrates how to use the processor's memory-mapped hardware REPEAT counter. In this example, the destination, srcA and srcB employ the indirect addressing mode. A vector comprises 16 entries of dual operands, operandA and operandB that are binary64 (double-precision) floating-point representations. The destination is the first input buffer to the processor's IEEE 754-2008 floating-point "addition" operator, fadd.0. "REPEAT n" means: fetch and execute the following instruction once, then "repeat" it n additional times after that. Thus, in this instance, the floating-point addition operation is executed a total of 16 times. Because all addressing is indirect, AR0 must be loaded with the physical address of the first input buffer to the floating-point addition operator. AR3 must be loaded with the physical address of the first element of the vector and AR2 must be loaded with the physical address of the second element of the vector, which are operandA and operandB, respectively. The instruction that immediately follows the REPEAT instruction will execute exactly 16 times. When complete, this floating-point addition's sixteen result buffers fadd.0 thru fadd.15 will contain results for all 16 operations, with all being immediately available for use in subsequent operations by the time they are pulled out using the REPEAT instruction, meaning an apparent zero latency.

The sequence of instructions beginning with the label "demoD" above is very similar to "demoC", except it involves computing directly with raw, human-readable decimal character sequence pairs stored in qty. 32, 16-entry vectors of dual decimal character sequences, operandA and operandB. The target operator is the present invention's hardware Universal FMA operator employed as a double-precision sum of products operator. It is assumed all of the Universal FMA Creg/accumulators have already been initialized to 0 by the time the sequence starting at "demoD" begins. Auxiliary Registers AR0, AR3 and AR2 are initialized with their respective pointers into the vectors. Because each of the 32 vectors of dual decimal character sequence operands are 16 deep, the processor's memory-mapped hardware loop counter LPCNT0 is initialized with the number of iterations, which is 16. The REPEAT counter is initialized with the number of vectors−1, which is 32−1, which is 31.

Because both operandA and operandB are human-readable decimal character sequences in this instance, such is signaled in the source line by use of the "s" character in each operand's "signal" bit 170, SIGA and SIGB. If the "signal" character for srcB had been a "_" instead of an "s" character and its size=8 instead of 32, then operandB would be treated as a IEEE 754 binary64 format representation, causing a bypass of the convertFromDecimalCharacter portion of the pipeline and instead routed thru a delay of equivalent length for coherency.

"PCS" in the last line is a conditional load shadow location of the processor's memory-mapped hardware Program Counter operator. It will accept a push of a new value only if the bit specified in the source line is "set", i.e., ="1" when pushed. In this instance, the source line is specifying that the PC only be loaded with a relative displacement if bit 16 of the processor's memory-mapped hardware loop counter LPCNT0 is "set", i.e., ="1". If not already zero, the hardware loop counter will automatically decrement by 1 if tested or pulled, but only if the destination of that instruction is the PCS address. In this instance, Bit 16 is the hardware loop counter's "Not Zero" signal. If the pre-decremented value of the contents of the hardware loop counter is not zero, then the "Not Zero" signal will be="1". "PCS" is only used to test for "1" to take a branch. To test for "0" to take a branch, use "PCC", which resides at a different shadow location.

Once all the vectors have been pushed into the Universal FMA roughly 592 clocks later, the processor can immediately begin pulling out all 32 Universal FMA result buffers for use in subsequent operations. When results are pulled out in the same order they were pushed in, there is an apparent zero latency, which includes the IEEE 754-2008 H=20 conversion from decimal character sequence AND the actual computations. In this instance, results are rounded only once, towards positive infinity as specified by the "p" mnemonic.

Special Cases for srcB

Figure 2:
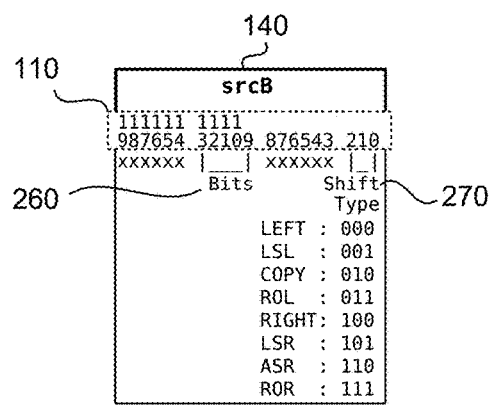
FIG. 2 is a diagram of a special case for the srcB field of the instruction word specifying the number of bits to shift and the shift type for use with the 64-bit SHIFT operator in an exemplary embodiment of the present disclosure.
Figure 3:
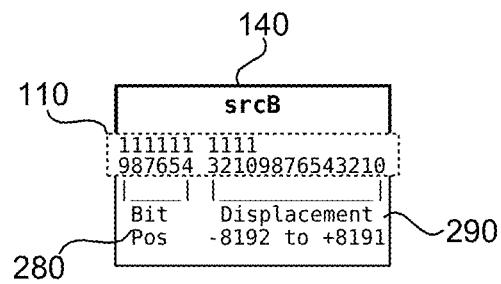
FIG. 3 is a diagram of a special case for the srcB field of the instruction word specifying the bit position to test and the displacement amount for use with the conditional relative branch operator in an exemplary embodiment of the present disclosure.

Referring to FIG. 2 and FIG. 3, at least two special cases for srcB show how srcB bit fields can be further broken down for easier assembly by the assembler and easier readability by the programmer.

SHIFT Operator Example

FIG. 2 is a diagram of a special case for the srcB field of the instruction word specifying the number of bits to shift and the shift type for use with the 64-bit SHIFT operator in an exemplary embodiment of the present disclosure. When the assembler detects a literal shift type such as "LEFT", "LSL", "ROL", etc., 270 in the srcB field of the source assembly line, it parses the argument and forms a srcB bit pattern for the srcB 140 portion of the instruction word. "Bits" 260 specifies the number of bit positions to shift by, and "Shift Type" 270 specifies the type of shift that is to take place. In addition to filling in the "Bits" 260 and "Shift Type" 270 subfields of srcB 140, the assembler also inserts a "01" into the DAM[1:0] 160 bits to indicate that srcB 140 is to be treated as #immediate. Note that the result is a hardwired shift operation because it employs an immediate value for srcB. For computed shift operations, that is, ones that have a computed shift amount and direction, the user can synthesize a srcB in data RAM with software and use it like any other operator.

Example SHIFT Operation Coding:

```
demoE:      _    _8:SHIFT.0 = (_8:work.5, LEFT, 12)
            _    _8:SHIFT.1 = (_8:AND.2, ASR, 3)
            _    _8:SHIFT.2 = (_8:XOR.7, COPY, 1)
```

In the first example starting with the line labeled "demoE", the 64-bit contents of location "work.5" are pushed into the first input buffer, SHIFT.0, of the processor's memory-mapped hardware SHIFT operator with instructions to shift that value LEFT, 12 places, with the 12 LSBs being replaced with 0s. The carry ("C") and overflow ("O") signals are not affected. The zero ("Z") signal is set if the result of the shift is zero and cleared if not zero. The negative ("N") signal is set if the result is negative and cleared if positive. Results, along with the C, V, Z, and N signals, are stored in result buffer SHIFT.0.

In the second example, the 64-bit contents of result buffer "AND.2" are pushed into the second input buffer, SHIFT.1, of the processor's memory-mapped hardware SHIFT operator with instructions to perform an arithmetic-shift-right 3 places, with the 3 MSBs being replaced with a copy of the original MSB. The carry and overflow signals are not affected. The zero signal is set if the result of the shift is zero and cleared if not zero. The negative signal is set if the result is negative and cleared if positive. Results, along with the C, V, Z, and N signals, are stored in result buffer, SHIFT.1.

In the third example, the 64-bit contents of result buffer "XOR.7" are pushed into the third input buffer, SHIFT.2, of the processor's memory-mapped hardware SHIFT operator with instructions to do nothing but copy it into result buffer SHIFT.2. The carry and overflow signals are not affected. The zero signal is set if the value copied is zero and cleared if not zero. The negative signal is set if it is negative and cleared if positive. Results, along with the C, V, Z and N signals, are stored in result buffer, SHIFT.2.

Program Counter (PC) Example

FIG. 3 is a diagram of a second special case for the srcB field of the instruction word specifying the bit position to test and the displacement amount for use with the conditional relative branch operator in an exemplary embodiment of the present disclosure. The second special case for srcB formatting involves the processor's memory-mapped hardware Program Counter (PC). Referring to FIG. 11, the PC has a base address labeled "PC" as well as three shadow addresses labeled "PCC", "PCS" and "PCR".

Pushing a value into "PC" direct address will load the PC unconditionally with that absolute, unsigned value and the processor's PC will begin incrementing from there, effectuating an unconditional JUMP.

Pushing a value into "PCR" direct address will load the PC unconditionally with the result obtained from adding the signed value being pushed to the current PC value, effectuating a unconditional long relative BRANCH.

Pushing a value into "PCC" direct address will load the PC if and only if the condition specified on the assembly line is true. In the case of the PCC address, the condition is true, if and only if, the specified bit position 280 of the memory-mapped location specified in srcA 130 is clear, i.e., "0". If the condition is true, then and only then will the PC be loaded with the result obtained from adding to the current PC value the signed value 290 being pushed, effectuating a conditional bit-test-and-branch-if-CLEAR operation. Otherwise, if not true, the push will be ignored and the PC will continue incrementing.

Pushing a value into "PCS" direct address will load the PC if and only if the condition specified on the assembly line is true. In the case of the PCS address, the condition is true, if and only if the specified bit position 280 of the memory-mapped location specified in srcA 130 is set, i.e., "1". If the condition is true, then and only then will the PC be loaded with the result obtained from adding to the current PC value to the signed value 290 being pushed, effectuating a conditional bit-test-and-branch-if-SET operation. Otherwise, if not true, the push will be ignored and the PC will continue incrementing.

Example Program Counter (PC) Operation Coding

```
restart:           _   _4:PC = _4:#START
ifEqual:           _   _2:COMPARE = (_2:ADD.6, _2:#0x3456)
                   _   _4:PCS = (_8:STATUS, Z, waitForXCUbreak0)
                   _       _4:PCR = _4:#continue
waitForXCUbreak0:
                       _4:PCC = (_8:XCU_S_R, 32, waitForXCUbreak0)
continue:          _
                   _
```

In the first example above beginning with the label "restart", the PC is unconditionally loaded with the immediate absolute program address "START", which, hypothetically might be the beginning of a program. When executed, the pre-PC begins fetching instructions from that address.

The second example is a hypothetical test for equality between two 16-bit integers using the processor's memory-mapped hardware integer compare operator. In this instance, a 16-bit value residing in the processor's memory-mapped integer ADD operator result buffer 6 is compared with the 16-bit immediate integer 0x3456. On the line after the comparison, a test of the processor's 64-bit STATUS register is performed to determine whether the zero ("Z") flag is set, i.e., ="1". If set, the signed offset, "waitForXCUbreak0", is added to the PC value at the location of that instruction, effectuating a relative branch. If not set, the two 16-bit values are not equal, in which case, the push into the PC is ignored and the PC just keeps on incrementing.

The next line is a simple unconditional relative long branch using the processor's memory-mapped PCR operator. In this instance, the PC value at that instruction's program address is added with the immediate signed relative offset, "continue", effectuating an unconditional, relative long branch.

The last example is of the processor's PCC operator. In this instance, had the previous COMPARE operation resulted in the "Z" flag being set, i.e., equality, then program execution would have entered here. Assuming that it did enter here and assuming, hypothetically that the parent CPU had previously set a breakpoint in its child XCU.0, the parent program will just sit here and wait until bit 32 of the parent processor's XCU Status/Control register is set, indicating the breakpoint had been reached by XCU.0. If the test tests true, i.e., the breakpoint has been reached, the parent processor PC will fall out the bottom and continue executing the remainder of the program or thread.

Note: a source line containing only a "_" mnemonic and nothing else that follows, with or without label, is a "No Operation" (NOP). In such case, the instruction generated is a 64-bit 0x0000000000000000. In this case, when executed, operandA and operandB are simultaneously pulled from data RAM location 0x00000000 and immediately pushed right back into the same location. In this architecture, the first eight byte locations in data RAM are always pulled as 0, no matter what values had previously been pushed there. No flags or signals are affected from pulling or pushing any data RAM location. Consequently, the net effect of a "_" all by itself is no operation. The PC does, however, continue to increment.

Default Decimal Character Sequence Format

Figure 4:
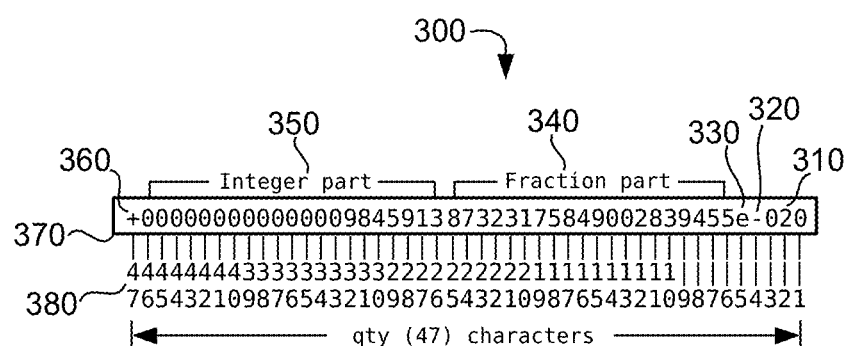
FIG. 4 is a diagram illustrating an exemplary embodiment of the present disclosure's default floating-point decimal character sequence input and output format 300 used by the processor's memory-mapped hardware IEEE 754-2008 H=20 convertFromDecimalCharacter, convertToDecimalCharacter, and Universal FMA operators.

FIG. 4 is a diagram illustrating an exemplary embodiment of the present disclosure's default floating-point decimal character sequence input and output format 300 used by the processor's memory-mapped hardware IEEE 754-2008 H=20 convertFromDecimalCharacter, convertToDecimalCharacter, and Universal FMA operators. The stand-alone version of the disclosed universal floating-point ISA's convertFromDecimalCharacter operator, if present, only accepts this default format as input.

The instant invention's convertToDecimalCharacter operator produces this default format as output. When pulled from one of its result buffers, the representation's most significant bytes that fall outside the 47 characters shown will automatically be filled with null characters to 64 bytes during the pull.

Figure 5:
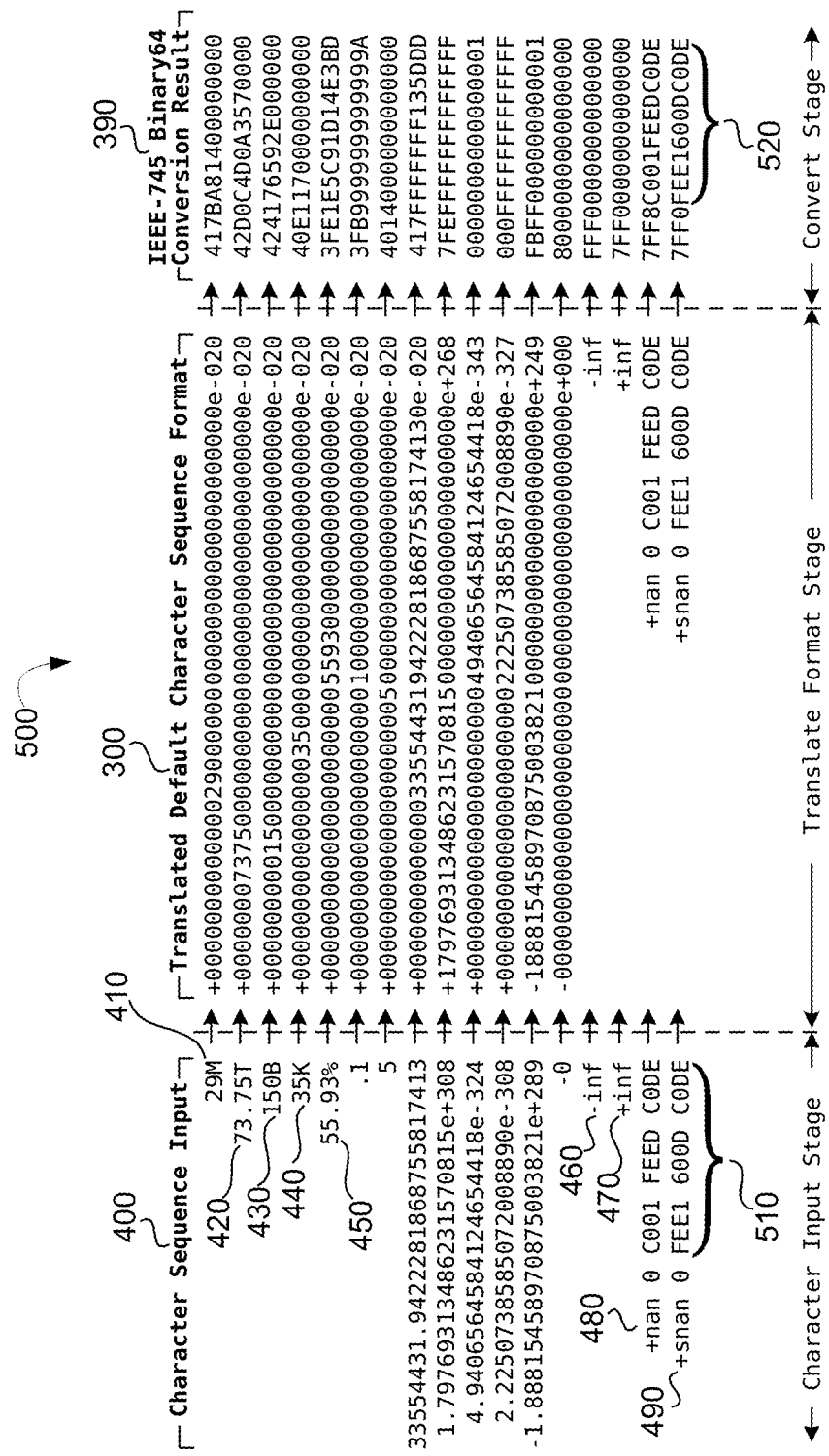
FIG. 5 is a diagram illustrating examples of various decimal character sequences, including some with token exponents, their translation to the default format, and their respective IEEE 754 binary64 equivalent representations in an exemplary embodiment of the present disclosure.

The Universal FMA operator directly accepts as input for operandA and operandB not only the default format 300, but also the formats 400 shown in FIG. 5, in addition to IEEE 754-2008 binary64, binary32, and binary16 formats, in any combination.

For input as a default format into either the stand-alone convertFromDecimalCharacter operator, if present, or the Universal FMA, the 47th character position of decimal character sequence 370 must be occupied by either a "+" character or a "−" character. Character position numbers 380 are shown for reference. The integer part 350 of the floating-point representation comprises 21 decimal characters. The 46th character position can only be occupied by either a 1 or a 0. The fraction part 340 comprises 20 decimal digits representing the fraction part of the floating-point representation. Character position 5 must be occupied by an "e" character 330. Character position 4 must be occupied by either a "−" or "+" character 320. Character positions 1 thru 3 must be occupied by a decimal character sequence representing the decimal exponent 310, relative to the decimal digit occupying character position 6. In the example decimal character sequence 370 shown, the actual decimal character floating point representation is: "9845913.87323175849002839455", which is 27 decimal digits long, 7 decimal digits greater in length than the minimum "H=20" mandated by IEEE 754-2008 for binary64 results. Since the decimal place is referenced relative to the last decimal digit at character position 6 and the exponent is "−020", the actual decimal place is determined by counting 20 digits to the left.

For inputting infinities and NaNs, both signaling and quiet, in the default decimal sequence format, refer to 300, 460, 470, 480, 490, and 510 of FIG. 5.

Universal FMA Input Formats

FIG. 5 is a diagram illustrating examples of various decimal character sequences, including some with token exponents, their translation to the default format, and their respective IEEE 754 binary64 equivalent representations in an exemplary embodiment of the present disclosure. The present disclosure's Universal Fused-Multiply-Add (accumulate) operator can accept as input for operandA and operandB IEEE 754-2008 "H=20" decimal-character sequences up to 28 decimal digits in length using the default decimal-character sequence format 300, as well as IEEE 754-2008 binary64, binary32, and binary16 formats. In addition to the default decimal-character sequence format 300, the Universal FMA can accept the character sequence formats 400 shown in FIG. 5. Among them are human-readable decimal character sequences comprising "token" exponents. Token exponents are often found in online financial and statistical reports. Token exponents presently supported by the present invention's Universal FMA include the capital letters "M", "T", "B", "K" and the character "%", representing exponents "e+006", "e+012", "e+009", "e+003" and "e−002" receptively. The Universal FMA can also accept decimal character sequences in scientific notation, integers, fractions, and other non-exponentiated character representations up to twenty-eight decimal digits in length as shown in character sequence formats 400. All of the above representations can be pushed directly into the Universal FMA in any combination.

Reference 410 is a representation for 29 million; 420 is a representation for 73.75 trillion; 430 is a representation for 150 billion; 440 is a representation for 35 thousand; 450 is a representation for 0.5593; 460 is a representation for negative infinity; 470 is a representation for positive infinity; 480 is a representation for a positive, quiet NaN with payload; 490 is a positive signaling NaN with payload; and 510 is an example payload in hexadecimal characters. Payloads for all NaNs must be formatted as shown, including case, prior to submission into the operator.

Other token exponents that could just as easily be implemented on the front-end or even on the back-end of the Universal FMA conversion (if a convertToDecimalCharacter circuit is incorporated into its pipeline) include the SI units (International System of Units). For example, yotta "Y" for "e+024", zetta "Z" for "e+021", exa "E" for "e+018", peta "P" for "e+015", tera "T" for "e+012" (same as "Trillion" above), giga "G" for "e+009", mega "M" for "e+006", kilo "k" for "e+003", hecto "h" for "e+002", deka "da" for "e+001", deci "d" for "e 001", centi "c" for "e−002", milli "m" for "e−003", micro "u" for "e−006", nano "n" for "e−009", pico "p" for "e−012", femto "f" for "e−015", atto "a" for "e−018", zepto "z" for "e−021" and yacto "y" for "e−024".

As can be seen, token exponents are a simple and useful way for reducing the number of characters needed to represent a human readable value used as either input or output in computation. Precisely which tokens to employ/support would most likely depend on target application and implementer objectives. This is important because most prior art machines can typically move data as either 1, 2, 4, 8 bytes per clock-best case. Using tokens allows for easier movement of more precise numbers in fewer clocks because more significant digits can be used that would otherwise be occupied by the "e+xxx" portion of the character sequence representation for a given 8, 16 or 32-byte character sequence representation.

The front-end to the Universal FMA detects if the operand(s) being pushed into it are default character sequence format, or an IEEE 754-2008 binary format. If not already in the default character sequence format, it will automatically translate such character sequence(s) 400 into the default format 300 prior to entering the Universal FMA pipeline. By way of example, Binary64 Result 390 shows the IEEE 754-2008 binary64 representation after conversion. NaN input payload 510 and NaN result payload 520 show that, in the instant implementation, NaN payloads are preserved and propagated during conversion.

CPU (Parent) Block Diagram

Figure 6:
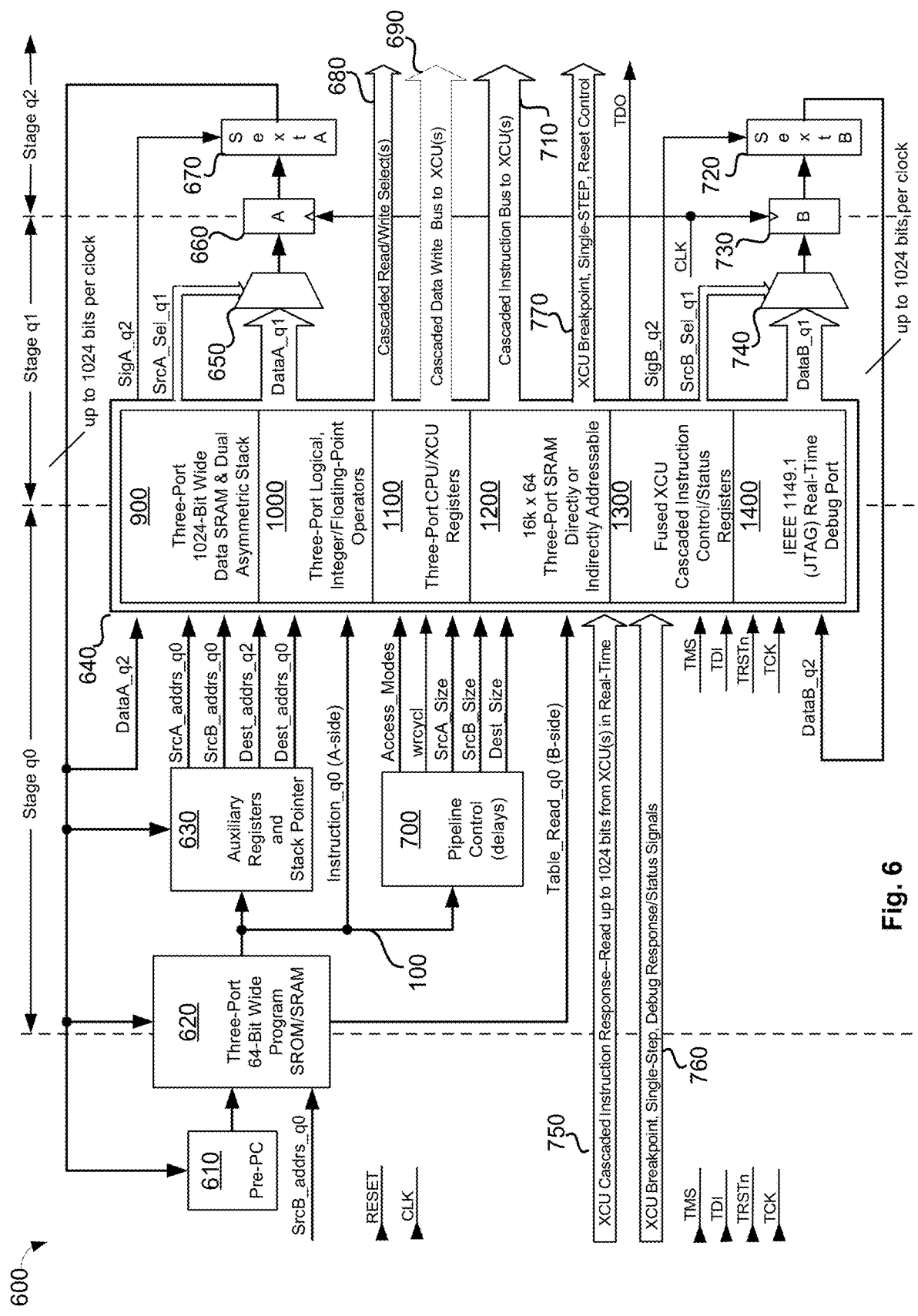
FIG. 6 is a block diagram of an exemplary embodiment of the basic architecture of the disclosed universal floating-point ISA, showing the CPU or parent processor.

FIG. 6 is a block diagram of an exemplary embodiment of the basic architecture 600 of the disclosed universal floating-point ISA, showing the CPU or parent processor. The basic architecture 600 is fully pipelined, meaning that instruction fetch, decode, and execution cycles overlap as do its program and data memory accesses. A pre-PC 610 (as opposed to an ordinary PC) is necessary for generating the physical instruction fetch address because program memory in this implementation comprises synchronous RAM (SRAM) blocks which register the read address on the rising edge of the processor's clock. Thus, the current instruction address must be presented early so it can be registered on the rising edge of the clock. The PC, unlike the pre-PC, registers the output of the pre-PC on the rising edge of the clock and thus its contents will generally match that of the program SRAM A-side internal address register.

In the instant implementation, the program resides in either synchronous ROM (SROM) or RAM (SRAM) that is three-port 620, having one write side and two read sides. The second read-side port is to accommodate @table-read operations, useful for reading constants, pointers, etc., in tabular form, from program memory. If an application never uses table-read operations, then program memory can be implemented in a purely two-port configuration, thereby reducing the amount of SRAM needed for program storage by 50%. Alternatively, if the target application requires only a relatively few locations for storage of constants in program memory, then program memory configuration can be a hybrid of three and two-port memory, with the first few thousand words implemented in three-port SRAMs and the rest implemented in two-port memory.

Ordinarily, child XCUs should be implemented in SRAM so that the parent CPU can push copies of threads into child XCU program memory for use in performing tasks. The parent CPU program memory will almost always comprise a small micro-kernel in SROM and the rest in SRAM.

In addition to @table-read (read-only) operations directly from the first 32k locations in program memory, in the present implementation, both parent CPU and child XCU entire program memory can be accessed "indirectly" for both read and write operations by simply setting the most significant bit (i.e., bit 31) of the Auxiliary Register being used as the pointer for such access. Setting this MSB maps program memory into data memory space, such that 0x80000000 of data memory space maps to 0x00000000 of program memory space, for both read and write operations from/to program memory. Caution should be exercised when performing write operations to program memory during run-time, in that, presently, there are no safeguards, such as lock, supervisor modes, etc., have been implemented to protect a thread from corrupting its own program memory, due to a spurious write or whatever.

Once the contents of the pre-PC has been registered into program memory 620 on the rising edge of the clock, the instruction 100 appears on the A-side output and is presented to the Auxiliary Register and Stack Pointer register bank 630. @Table-reads, if any, appear on the B-side output. All bits in the instruction output of program memory 100 are delayed one or more clocks by Pipeline Control block 700 for use by various operators. Some operators 1000, registers 1100, SRAM 900 and 1200, Cascaded Instructions 1300 and IEEE 1149.1-1990 JTAG Debug Port 1400 may require some or all bits of instruction 100. Cascaded instructions are monitor-read or monitor-write instructions issued by a parent CPU to a child XCU. Thus, the two terms are synonymous when such transactions involve a parent CPU and a child XCU. Note that it is also possible for a child XCU to also become a parent using the same approach and logic, but this may not be the best strategy, in that a better strategy might be employing two or more parent CPUs, each with their own child XCUs attached to them.

During Stage q0, instruction 100 is immediately presented to the Auxiliary Register and Stack Pointer bank 630. If any or all the IND 190 bits are set, then the Auxiliary Register and Stack Pointer register bank 630 logic substitutes the contents of the specified Auxiliary Register(s) for the DEST 120, srcA 130 and/or srcB 140 direct addresses. Otherwise, if IND 190 is not set for a given address field in 100, then the 15 bits for the respective "direct" address field in 120, 130 and/or 140 in instruction 100 is/are, after having been automatically zero-extended to 32 bits, used as the address for the respective push-pull operation of the instruction.

All processor programming model registers, operators and their result buffers, data memory, control and status register and JTAG real-time debug functions are mapped into the processor's data memory space 640. The beauty and elegance of having all registers, etc. mapped into data memory space, provided they are readable, is that they are all visible to the JTAG 1400 hardware without the need of special opcodes. Program memory, registers, operator input buffers, operator result buffers, etc., are accessed just as easily as accessing data memory, all without the use of any specialized opcodes.

Ideally, data RAM, operator result buffers, processor registers, etc., are implemented with two read-side ports, one for accessing operandA and the other for accessing operandB—simultaneously. Mux 650 selects operandA from the A-side outputs and is registered into register 660 during the rising edge of the Stage q1 clock and automatically sign-extended to 64 bits by SextA 670 if srcA SigA 170 (delayed) is set, otherwise zero-extended.

Likewise, mux 740 selects operandB from the B-side outputs and is registered into register 730 during the rising edge of the Stage q1 clock and automatically sign-extended to 64 bits by SextB 720 if srcB SigB 170 (delayed) is set, otherwise zero-extended.

The CPU can operate stand-alone or as a parent to one or more (up to sixteen) child XCUs connected to it by way of busses 680, 690, 710, 770, 750 and 760. Bus 680 comprises an encoded four-bit write select, encoded four-bit read select bus, and a "push-all" signal.

For a cascaded push of data from the parent to the memory-mapped child XCU, the four-bit write select bus portion of bus 680 specifies into which XCU data will be pushed. If data is pushed through the magic "push-all" memory-mapped window of the parent, the data will be pushed into all connected child XCUs simultaneously, in which case the "push-all" signal of bus 680 will be active. The "push-all" feature is handy for copying entire threads from the parent CPU program memory and pushing them into all the child XCUs program RAM in cases where the workload is divided among all XCUs executing the same thread. "Push-all" can also be used for pushing XCU data memory parameters that will be used for a given task. It can be used to preset all XCUs PCs to a known start location or even set a software breakpoint in all XCUs simultaneously.

The four-bit read bus portion of bus 680 is used for selecting which of the connected child XCUs is to be pulled. The parent CPU can pull data from anywhere with the target XCU's memory map. Since the parent CPU essentially treats any target XCU's memory-map as its own, it can employ its REPEAT operator to push or pull entire blocks of memory to/from the selected XCU, or in the case of program memory push, entire thread using the REPEAT instruction followed by the instruction that does the push.

There is a cascaded write data bus 690 to the XCUs. Presently bus 690 is only 64 bits wide, but can be enlarged to 1024 or more bits if application requires it.

A cascaded instruction bus 710 runs from the parent CPU to the child XCUs and is essentially "fused" to any attached child XCUs' instruction bus. Anytime the parent CPU wants to perform a real-time data exchange operation between a given XCU, the CPU forces the XCU to execute the cascade instruction instead of its own, all without the use of interrupts, opcodes, or DMA. This way, the parent CPU has complete visibility and writability into the target XCU's memory map.

The parent CPU's memory-mapped XCU control register generates output 770. With this register, the CPU can individually or altogether force a breakpoint, reset, single-step, or preempt the selected XCU(s).

There is a response data bus 750 from attached XCUs. Bus 750 may be the output of a mux that outputs one of up to sixteen XCU read buses, i.e., the read bus of the selected XCU. Alternatively, since the CPU is capable of reading 1024 bits onto its operandA data bus, the bus 750 may be configured to pull up to sixteen XCUs simultaneously with each XCU providing 64 bits, for a total 1024 bits.

Bus 760 includes DONE, Software_Break_Detect, XCU_BROKE, and SKIP_CMPLT status signals from each of up to sixteen XCUs connected to the parent CPU. DONE[15:0] are the XCU done bits (one for each XCU), which a given XCU uses to signal that it is done performing a task. Software_Break_Detect[15:0] indicate which, if any, XCUs have encountered a software breakpoint. XCU_BROKE[15:0] indicate which, if any, XCUs have hit a hardware breakpoint. SKIP_CMPLT[15:0] indicate which, if any, XCUs have completed a previously issued single-step command.

Figure 7:
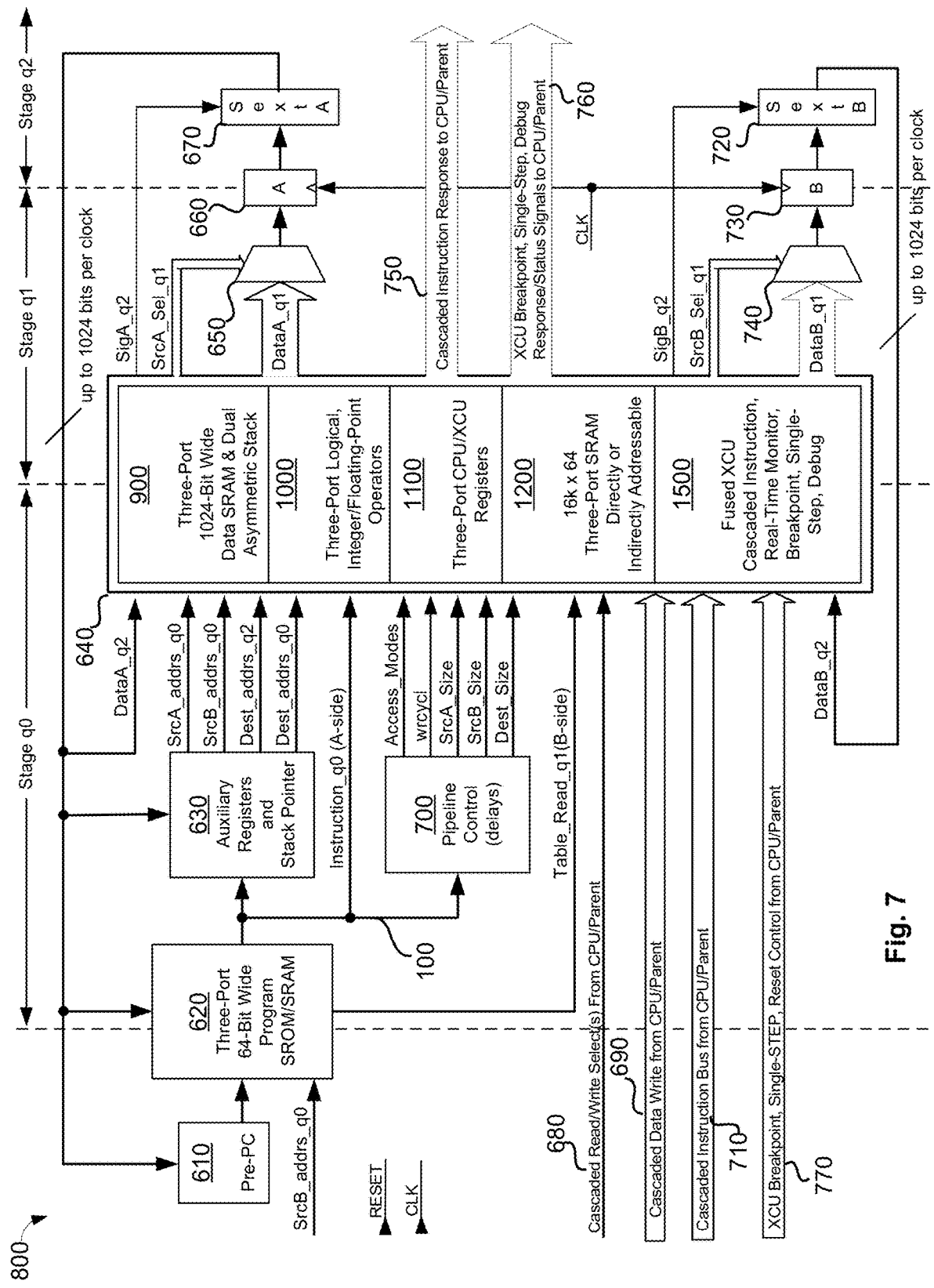
FIG. 7 is a block diagram of an exemplary embodiment of the basic architecture of an eXtra Processing Unit (XCU) or a child processor.

FIG. 7 is a block diagram of an exemplary embodiment of the basic architecture of a child XCU 800 and shows that the child XCU is virtually identical to the parent CPU except that cascaded instruction and related buses 750, 760, 680, 690, 710, and 770 are turned around. The illustrated XCU has no IEEE 1149.1 (JTAG) debug port, although one could easily be added and included in the same scan chain as the parent if desired. By way of a tiny micro-kernel running on the parent CPU, the CPU can operate as an intermediary between the external debug environment/hardware and any of the child XCUs attached to it, since the CPU has complete real-time visibility into any of them. This saves on the logic needed to implement in the XCUs logic a JTAG-accessible debug port like the CPU has.

It should be further understood that, like the CPU, the child XCUs can be implemented with a minimum suite of operators tailored for a specific application. For example one XCU can be configured with memory-mapped operators that are tailored for DSP applications. Another, or several, XCUs can be configured as Tensor Processing Units (TPUs) or GP-GPUs. Others can be configured as a general-purpose microcontrollers with few or no hardware floating-point operators. The major point here is, because the CPU and XCUs do not employ opcodes in the instruction set, such can be easily customized to perform virtually any task for virtually any application, with all using the same software development and debug tools. Stated another way, no new C compiler, assembler, debugger, development environment tools need to be developed just because this ISA has been targeted as a DSP, TPU, microcontroller, or floating-point processor, because, fundamentally, the core is just a push-pull shell that specific memory-mapped hardware operators, each with their own independent pipeline(s) are plugged into, the instruction set of which is optimized to do this push-pull function very efficiently and effectively.

Figure 8:
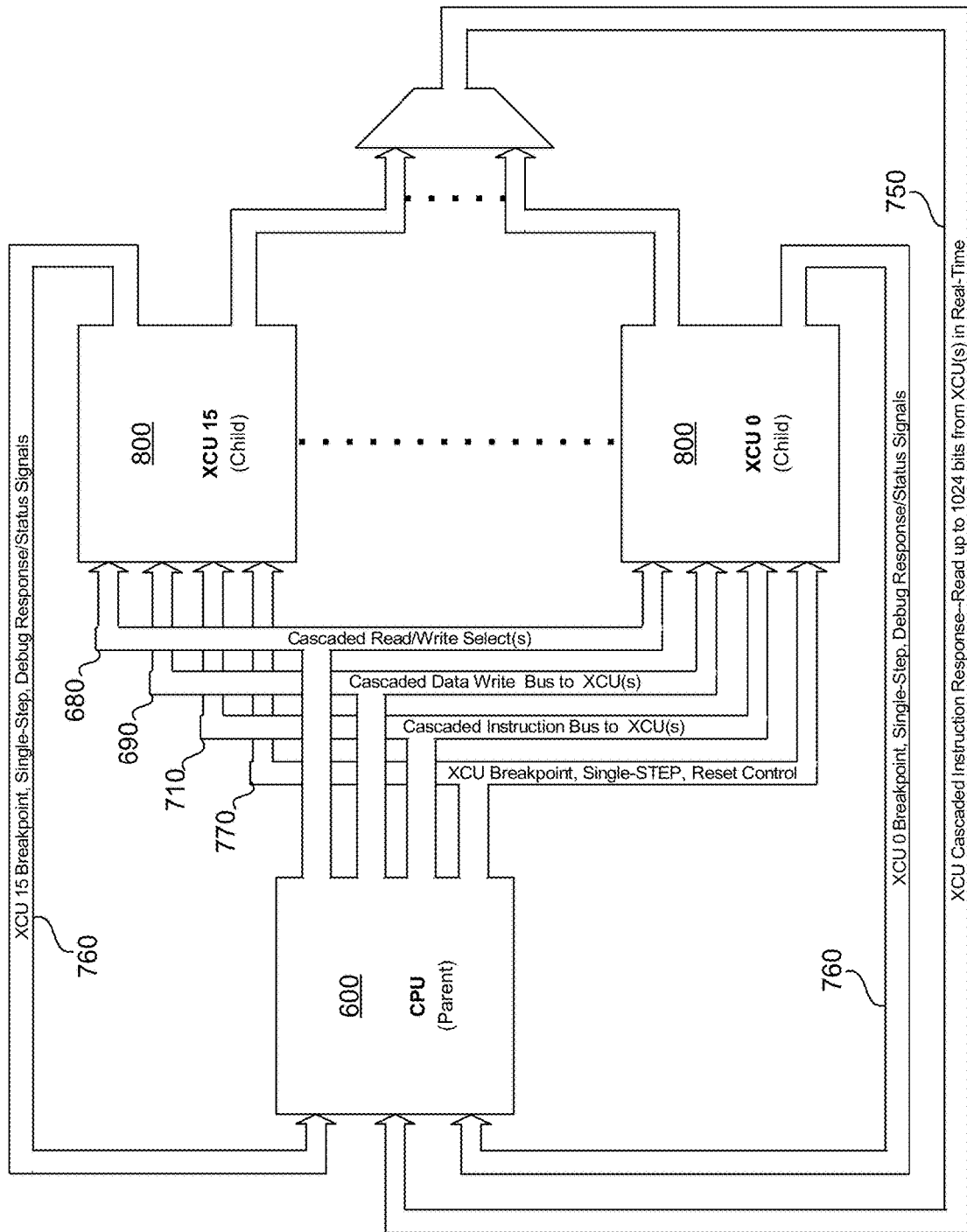
FIG. 8 is a block diagram illustrating an arrangement of a CPU/parent processor and one to sixteen XCU/child processors in an exemplary embodiment of the present disclosure.

FIG. 8 is a block diagram illustrating an arrangement of a CPU/parent processor 600 and one to sixteen XCU/child processors 800 in an exemplary embodiment of the present disclosure. FIG. 8 shows how the parent CPU 600 and child XCUs 800 are arranged when configured as a multi-core processor, including communication/control/status/response buses.

Figure 9:
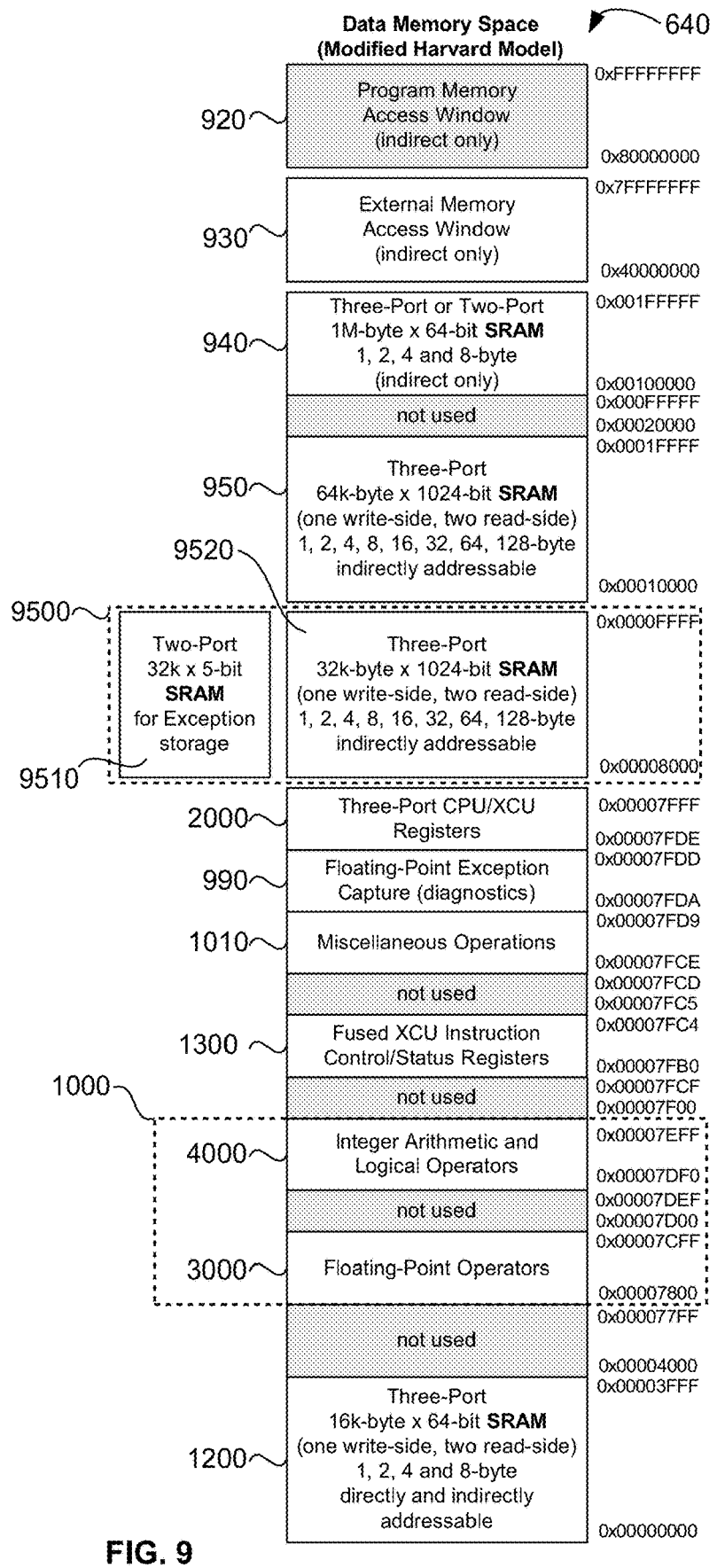
FIG. 9 is a modified Harvard model data memory-map employed by both the CPU and XCU(s) in an exemplary embodiment of the present disclosure.

FIG. 9 is a modified Harvard model data memory-map 640 employed by both the CPU and XCU(s) in an exemplary embodiment of the present disclosure. The first 16k bytes of data memory space is occupied by a three-port SRAM 1200 and is both directly and indirectly accessible on 1, 2, 4, and 8-byte boundaries. The contents of physical addresses 0x00000000 thru 0x00000007 in data memory space are always pulled as 0x00000000 no matter what has been previously written to them. Among the reasons for this is the case where the current instruction only has operandA, the B-side of data RAM will always read as 0x00000000 because when there is no operandB specified in the instruction, its bit field is filled with zeros, which maps as a direct access of byte location 0x00000000, which is zero-extended to 64 bits. Another use of this feature is it is a handy way of forcing a 0x00000000 on the A-side of the bus using a SrcA address of "0". This, in combination with the logical OR operator, can be used to transfer the contents of the B-side of the bus to the A-side by pushing location "0" and the B-side into the OR operator and reading the result out on the A-side.

Implemented memory-mapped hardware floating-point operators 3000 reside in directly-addressable data memory starting at data memory location 0x00007CFF and growing downward to location 0x00004000. For a complete map of IEEE 754-2008 mandated floating-point operators and their respective assembler labels, refer to FIG. 12A thru FIG. 12E.

These floating-point operators will produce exception "signals" that are automatically stored in the specified result buffer simultaneously with the result of the computation as the five most significant bits. Thus, for example, a binary64 result will be stored in the specified result buffer location as 69 bits because the five most significant bits are exception signals that may or not be set. These signals will not affect the processor's corresponding STATUS Register bits unless and until such floating-point result is actually pulled from the specified result buffer. The floating-point operator status bits within the STATUS Register abide in the IEEE 754-2008 mandated rules for signaling and flagging exceptions, depending on whether the processor at the time of the pull is operating in accordance with default exception handling or delayed exception handling for floating-point operations. This aspect is discussed in the STATUS Register section below.

Note that more floating-point operators can be included by growing the map downward from 0x00004000. Also note that the present invention employs IEEE 754-2008 double-precision hardware operators and each input buffer and corresponding result buffer output are mapped on single-location boundaries. If desired, double-precision floating-point operators can be substituted with single-precision operators. In such case, the mapping is still the same because the inputs are still mapped on single-location boundaries. For example, the floating-point addition operator presently has sixteen result buffers occupying sixteen consecutive locations starting from data memory address 0x00007800 and continuing upward to 0x0000780F. Such arrangement and strategy permits use of the REPEAT operator in combination with the indirect addressing auto-post-modify mode for performing up to sixteen floating-point addition operations in rapid succession, as well as for immediately turning around pulling the results out in rapid succession.

It should be understood that it is possible to shadow-map a double-precision, single-precision and half-precision floating-point operator at the same location without conflict. The method for doing that is to use the Size 180 field of the instruction to select to which operator operandA and operandB is to be pushed or from which operator the result will be pulled. The advantage of shadowing hardware operators like this is that the lower-precision versions of the same operator typically not only clock faster but also use substantially less logic. Thus, for some implementations, it may be advantageous in certain scenarios to employ the lower precision version of a given hardware operator shadowed behind the larger and higher precision operator at the same base location.

Integer arithmetic and logical operators 4000 are located as shown in the processor's data memory map. For a list of these operators, their mapped locations and corresponding assembler labels, refer to the table in FIG. 13. Integer arithmetic and logical operators 4000 residing in the processor's data memory map are the only ones that might affect the Z, C, N, and V flags within the processor's STATUS Register, but only when pulled from such operator's result buffer(s). The shaded area just below the integer arithmetic and logical operators 4000 shows the directly addressable memory locations that can be used for adding more integer and/or logical operators.

An exemplary range of Memory-mapped hardware operator locations for logical, integer arithmetic and floating-point operators are in the data memory range 1000. These operators can automatically affect certain bits within the processor's STATUS Register when a result is pulled from such operator's result buffer. Except for explicit operations on the STATUS Register itself, or any of its "shadow" operator locations, presently, pulling from any other location within the processor's memory map will have no effect on the bits within the STATUS Register. For instance, simply pulling from a data RAM location and pushing it to another or same data RAM location will have no effect on the STATUS Register.

The instant architecture employs magic memory-mapped "hot-spots" within block 1300 to effectuate real-time data exchange operations between the parent CPU and any child XCUs attached to it. Operation of these hot-spots is discussed in the XCU management section below.

Optional floating-point exception capture registers/buffers 990 (if present) may also be mapped in data memory as shown. If present, these registers can be configured to capture/intercept certain diagnostic information about a given computation when the result of that computation is pulled from its result buffer and is used when delayed exception handling is enabled by setting certain bits in the processor's STATUS Register. Use of this feature is discussed in the exception capture section below.

The processor's programming model registers such as PC, PC_COPY, STATUS Register, Auxiliary Registers AR0 thru AR6, Stack Pointer, etc. are mapped in data memory at address range 2000. These registers are directly-addressable. Note that location 0x00007FFF is the highest (last) directly-addressable location in the processor's memory map. Refer to FIG. 11 for a complete list of all the processor's programming model registers, their corresponding locations, assembler labels and state after reset 2000. Note that most processor programming model registers in 2000 can only be pushed using direct addressing mode, even though the general rule with this architecture is that anything that is directly addressable is also indirectly addressable, i.e., resides BELOW 0x00008000 in the processor's memory map. Objects residing ABOVE 0x00007FFF can only be accessed indirectly using Auxiliary Registers(s) or Stack Pointer.

Address range 9500 shows a dual asymmetric SRAM arrangement and their mapping in indirectly addressable memory space. This memory is special because it can be used as general-purpose data RAM for storage of up to 1024-bit wide data. It can be pushed and pulled in sizes of 1, 2, 4, 8, 16, 32, 64 or 128 bytes. It has one write-side, a read-side-A and a read-side-B so that up to two 128-byte gobs can be pulled from it simultaneously.

Address range 900 (see FIGS. 6 and 7) may include a 32k-byte by 1024-bit, three-port SRAM 9520 as explained above, as well as a two-port 32k by 5-bit SRAM 9510 mapped to the same location range as SRAM 9520. This 5-bit SRAM 9510, together with fat SRAM 9520 working in concert, can be employed as a special kind of stack for saving and restoring the contents of any operator's result buffers. For instance, there is logic that detects, in a given instruction, when the Stack Pointer (SP) is employed as the destination pointer pointing to 9500 and the source address, whether direct or indirect, is a memory-mapped hardware operator result buffer location. When this condition exists, the logic determines automatically that this is a result buffer push onto the stack. When this happens, the result pulled from the specified result buffer is pushed onto the stack and its corresponding exception/condition signals are pushed onto the 5-bit appendage SRAM at its corresponding location. The SP contents is then automatically decremented by the amount specified in the originating instruction.

Conversely, if this special logic detects in a given instruction that the SP is being used as a source pointer pointing to

9500 and the destination is a memory-mapped hardware logic, integer or floating-point input buffer location, such logic will determine that the operation is a stack pull, effectuating an operator result buffer restore operation that restores not only the original result but also the five exception/condition signals simultaneously.

Note that the 5-bit SRAM 9510 only accommodates five bits at a time, while the fat SRAM 9520 accommodates sizes of 1 byte to 128 bytes. SRAMs 9510 and 9520 share the same address buses. This means that, for example, if there are two consecutive pushes of 128 bytes each and the SP is decremented by 128 bytes each time, a total of 256 consecutive byte locations are written into 9520 while only a total of 10 bits are written into 9510, five bits at the initial location specified by the SP and five more bits specified by the SP now decremented by 128. Meaning, the contents of 9510 of the 127 locations between the first push and the second push remain unchanged.

It should also be noted that additional logic has been added to 9500 to make the contents of 9510 visible and changeable by the user and debuggers. This is discussed in the asymmetric stack section below.

Block 950 is an optional data SRAM block in indirectly-addressable data memory space. It can be implemented as two-port or three-port SRAM, as conventional 1, 2, 4, and 8-byte sizes or as fat 1, 2, 4, 8, 16, 32, 64, and 128-byte sizes. Alternatively, depending on the application, it can be omitted altogether.

Block 940 is optional. It may be implemented or omitted. It may be two-port or three-port, deeper, shallower, or wider, depending on the target application and desires/objectives of the implementer.

Block 930 may be mapped as an indirectly-addressable external memory access window, providing access to a gigabyte of external indirectly addressable memory. If required, block 930 can be made to grow downward towards block 940, thereby providing a two-gigabyte external access window. Alternatively, without too much problem, block 930 external access window logic may be modified to grow the access window towards block 920, thereby providing a four-gigabyte external access window if need be.

With the disclosed universal floating-point ISA being implemented as a modified Harvard memory model, it is desirable to be able to access tables and other data, including threads, stored in physical program memory 620 as if it were actually residing in data memory space 640 using the indirect address mode. Program Memory Access Window 920 in data memory space can be used by the processor to indirectly access the entire physical program memory space as if it were actually data memory. When data memory is accessed in the indirect range between 0x80000000 and 0xFFFFFFFF inclusive, memory block selection logic within the disclosed ISA will access program memory space instead of data memory space, such that, for example, pulling from indirect data address 0x80000000 will yield the 64-bit contents of program memory location 0x00000000. Each 64-bit value in program SRAM occupies one location. Thus, if attempting to perform a block transfer from program memory to data memory using the REPEAT instruction, the Auxiliary Register used as the source pointer must be incremented/decremented by 1, while the Auxiliary Register used as the destination pointer into data memory must be incremented/decremented by 8. This is because data SRAM is byte-addressable while program memory can only be accessed 8-bytes (64 bits) at a time. Stated another way, instructions in program memory are 64 bits and each occupies exactly one location. When pushed into data SRAM, the same program instruction or table data occupies exactly eight byte locations.

Figure 10:
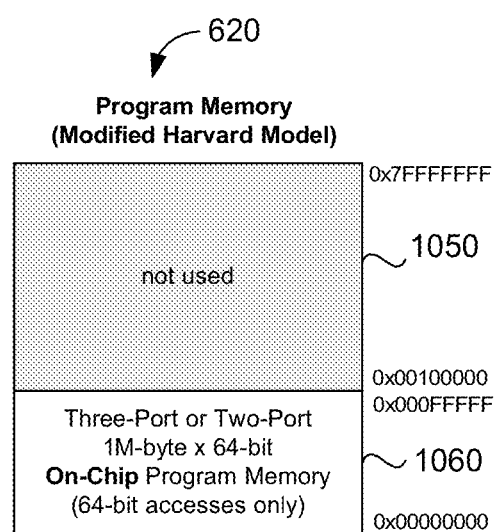
FIG. 10 is a modified Harvard model program memory-map employed by both the CPU and XCU(s) in an exemplary embodiment of the present disclosure.

FIG. 10 is a modified Harvard model program memory-map employed by both the CPU and XCU(s) in an exemplary embodiment of the present disclosure. Program memory space 620 may be two-ported or three-ported. All instructions are 64 bits wide and are fetched in a single clock cycle. Thus program memory must be 64 bits wide as shown. The depth of program memory can, in theory, be 2^64 locations. However, for practical reasons when the design is implemented in a Field-Programmable Gate Array (FPGA), program memory is limited to 2^20 64-bit words 1060. @Table-read operations from program memory are pulled on 64-bit (8-byte) boundaries only, one 8-byte word per location. Meaning, the PC increments by 1, not 8. Likewise, for @Table-read operations, if program memory is accessed using indirect addressing mode and the REPEAT operator for block transfers, the instruction used for such accesses Auxiliary Register must be specified to increment (or decrement) by 1. If the destination of such block transfer is data RAM, the Auxiliary Register used as a pointer to such data RAM must be specified in the instruction to increment by 8 and must start on a boundary evenly divisible by 8. This is because data RAM is accessible on byte boundaries, unlike program memory, which is only accessible on 8-byte boundaries.

FIG. 11 is an exemplary memory-map 2000 of the disclosed universal floating-point ISA's memory-mapped programming model register set in an exemplary embodiment of the present disclosure. The memory-map shows the memory-mapped processor programming model registers, their corresponding location in data memory space, their assigned assembler labels, reset state, and modes of access. Most of these registers may only be pushed using the direct addressing mode, even though, ordinarily, anything in this architecture that is directly addressable is also indirectly addressable, but not the other way around.

Figure 12A:
FIG. 12A is an exemplary memory-map of the disclosed universal floating-point ISA's hardware-implemented IEEE 754-2008 Mandated Computational floating-point Operators in an exemplary embodiment of the present disclosure.

FIG. 12A is an exemplary memory-map 3000 of the disclosed universal floating-point ISA's hardware-implemented IEEE 754-2008 Mandated Computational floating-point Operators in an exemplary embodiment of the present disclosure. For each of these hardware-implemented operators, a set of at least sixteen input/result buffer locations and the address of each operator's first input/result buffer location are provided in data memory space. Also shown are the assigned assembler labels unique to each input/result buffer. For operators that require more than sixteen clocks to complete, the number of input/result buffers is thirty-two. Also shown are the input sizes each operator will accept and the result sizes they can produce.

FIG. 12B is an exemplary memory-map of the disclosed universal floating-point ISA's hardware-implemented IEEE 754-2008 Mandated Comparison Predicates operators 3020, in an exemplary embodiment of the present disclosure. Unlike the operators in memory-map 3000, the hardware-implemented comparison predicates 3020 have no result buffer. Instead, operandA and operandB are pushed into the direct address in FIG. 12B corresponding to the comparison to be made using the corresponding assembler label or explicit direct address. If the comparison is TRUE, the "IEEE compare True" bit 5030 (i.e., bit-50 of the processor's STATUS Register 5000 of FIG. 18A), is set automatically. If the comparison is FALSE, then bit-50 is cleared as a result of the comparison. FIG. 12B also shows that the IEEE 754-2008 binary formats of operandA and operandB can be mixed and matched. This is because the logic behind the floating-point comparison hardware automatically converts binary16 and binary32 formatted numbers to binary64 before the comparison is made. Conversions from binary16 or binary32 to binary64 format, if any, are always exact.

FIG. 12C is an exemplary memory-map of the disclosed universal floating-point ISA's hardware-implemented IEEE 754-2008 Mandated dual-operand, non-computational, non-exceptional operators 3030 in an exemplary embodiment of the present disclosure. The non-exceptional operators work in a manner similar to the comparison predicates 3020 of FIG. 12B. The main difference is that the two non-exceptional operators 3030 produce no exceptions. When operandA and operandB are pushed into the "totalOrder" operator input located at the direct address "tOrd", i.e. 0x00007CE9, and the result of the total order test/comparison is TRUE, then the "total Order True" bit 5070 (i.e., bit-46) of the processor's STATUS Register (see FIG. 18A) is automatically set. If the result of total order test is FALSE, then bit-46 is automatically cleared.

The totalOrderMag hardware operator of 3030 works in the same manner as the totalOrder operator, except the operation tests/compares the absolute values (magnitudes) of operandA and operandB when pushed into the totalOrderMag operator input, tOrdM at direct data address 0x00007CE8. If the result of the totalOrderMag test is TRUE, then the total Order Mag True bit 5060 (bit-47) of the processor's STATUS Register (see FIG. 18A) is set; otherwise it is cleared.

FIG. 12D is an exemplary memory-map of the disclosed universal floating-point ISA's hardware-implemented IEEE 754-2008 Mandated single-operand, non-computational, non-exceptional operators 3040 in an exemplary embodiment of the present disclosure. Each of these hardware-implemented operators has its own input buffer into which operandA is pushed. For example, to test whether an operand is canonical, push the operand into the "isCanonical" input at direct address "isCanonical" (i.e., location 0x00007CD8). If canonical, the IEEE "is True" bit 5040 (bit-49) in the processor's STATUS Register (see FIG. 18A) is automatically set; otherwise it is cleared.

The last non-computational operator listed in 3040, "Class" works differently than the "is" tests listed above it, in that pushing an operand into the Class input at direct address, "clas" (location 0x00007FCE) sets one of the mutually exclusive Class bits 5080 in the processor's STATUS Register (see FIG. 18). For example, if the operand pushed into "clas" is a negative subnormal number, then the negative subNormal bit (bit-40) of the STATUS Register is set; otherwise it is cleared. Only one of these 5080 bits is set and all the others are cleared after each push. In addition, after each push into the Class operator, the class is encoded into a four-bit value corresponding to the class indicated in the STATUS Register when executed. This four-bit class code can be read at direct location 0x00007FD6. The Class encodings for this four-bit code have the following meanings:

| Code | Meaning |
| --- | --- |
| 0x1 | signaling NaN |
| 0x2 | quiet NaN |
| 0x3 | negative Infinity |
| 0x4 | negative Normal |
| 0x5 | negative Subnormal |
| 0x6 | negative Zero |
| 0x7 | positive Zero |
| 0x8 | positive Subnormal |// 
| 0x9 | positive Normal |
| 0xA | positive Infinity |

Thus, after pushing an operand into the Class operator, there are two ways to evaluate its resulting class. The first method is to simply test one of the ten 5080 bits of the STATUS Register corresponding to a specific class. The other method is to compare the value that was automatically stored at the class pull location 0x00007FD6 with one of the four-bit class codes listed in the table above. In other words, the four-bit code indicates the operand's class according to the Class code table above.

FIG. 12E is an exemplary memory-map of the disclosed universal floating-point ISA's hardware-implemented IEEE 754-2008 miscellaneous mandated operators 3050 in an exemplary embodiment of the present disclosure. Each of the hardware-implemented operators 3050 have a corresponding memory-mapped direct push location. See FIG. 12E far right column for examples of how to use the miscellaneous mandated operators 3050.

FIG. 12F is an exemplary memory-map of the disclosed universal floating-point ISA's hardware-implemented, stand-alone floating-point computational operators not mandated by IEEE 754-2008 in an exemplary embodiment of the present disclosure. The table of FIG. 12F gives a list of the implemented, but not mandated, computational operators 3060 along with their respective assembler labels and first and last direct input buffer addresses.

FIG. 13 is an exemplary table showing the disclosed universal floating-point ISA's hardware-implemented native logical and integer arithmetic operators 4000 in an exemplary embodiment of the present disclosure. The table further illustrates corresponding assembler labels, and direct addresses of the first input/result buffer location. Corresponding input and result sizes are also shown. The number of bytes shown for the result size is always zero-extended to 64-bits with the 4-bit condition code concatenated as the upper Most Significant Bits (MSBs), creating a 68-bit pull. When pulled, the 4-bit condition code resulting from the operation is automatically registered into the corresponding bits of the processor's STATUS Register. For instance, the condition signals that are pulled include integer/logical Z, C, N, and V, which are the integer/logical zero, carry, negative, and overflow signals, respectively. These condition code "signals" are automatically registered as condition code "flags" in the STATUS Register as a result of the pull.

Figure 14A:
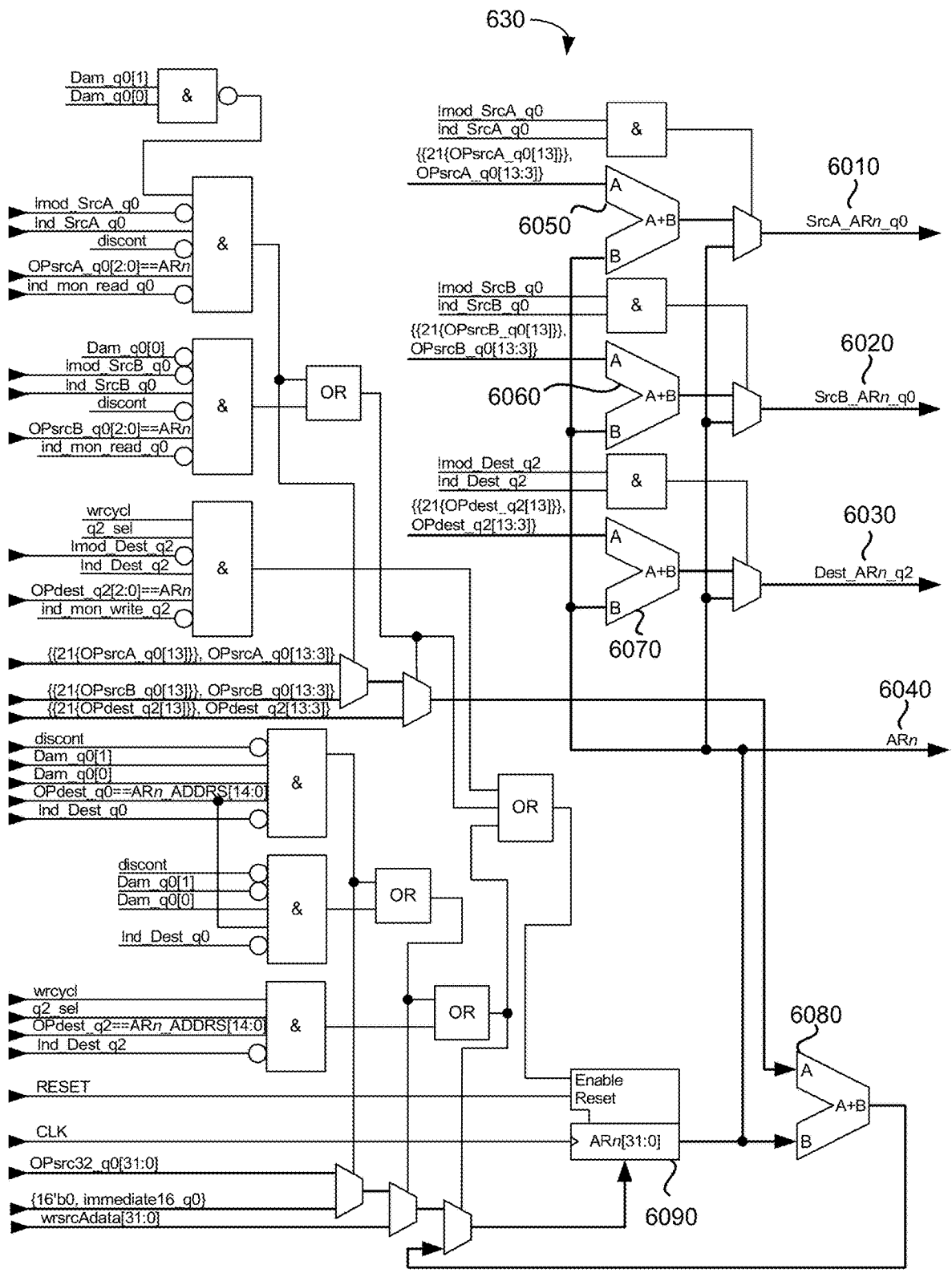
FIG. 14A is a simplified schematic diagram of an exemplary embodiment of a circuit used to implement the disclosed universal floating-point ISA's memory-mapped hardware Auxiliary Registers (ARn) for indirect addressing.

FIG. 14A is a simplified schematic diagram of an exemplary embodiment of a circuit 630 used to implement the disclosed universal floating-point ISA's memory-mapped hardware Auxiliary Registers (ARn) for indirect addressing. The contents of AR0 thru AR6 are primarily employed as indirect pointers for the ISA's indirect addressing mode. They can also be used to hold calculated amounts to be loaded into the processor's REPEAT counter in computed REPEAT scenarios. Stated another way, the REPEAT counter can only be loaded with an #immediate value in the instruction or directly with an amount being held in a ARn. #Immediate values in the instruction are not variable, while the contents in a given ARn are variable and thus can be computed amounts.

Example A

```
        _2:REPEAT = _2:#23
        _8:*AR0++[8] = _8:*AR1++[8]
```

In Example A above, REPEAT is loaded with the immediate value 23. Thus the instruction that follows it will be executed exactly 24 times. But when a routine requires that the repeat amount be variable, i.e., not fixed like it is in Example A, such a requirement can be satisfied by computing an amount and storing that amount in an ARn 6090 and then push that value into the REPEAT counter.

Example B

```
        _2:ADD.3 = (_2:work.7, _1:#4)
        _2:AR6 = _2:ADD.3
        _2:REPEAT = _2:AR6
        _8:*AR0++[8] = _8:*AR1++[8]
```

In Example B above, the REPEAT counter is loaded with a value previously computed and stored in AR6. It should be noted that pushing a value into the REPEAT counter behaves differently than pushing a value into data RAM, in that the value being pushed into the REPEAT counter is registered during the rising edge of Stage q1 rather than Stage q2. This is so that REPEAT counter can be immediately used by the following instruction. Otherwise, due to the instruction pipeline, the REPEAT counter will not have been actually loaded by the time the instruction that follows needs it. Thus, as shown in Example B above, REPEAT is "immediately" loaded with the contents of AR6 "as if" such contents were an #immediate value. As can be seen, ARns have uses beyond just indirect indexing into memory.

The circuit 630 shows that, like the REPEAT counter, #immediate loads of a ARn occur a clock early, i.e, during the rising edge of Stage q1. This is so that their contents can be immediately used as a pointer by the following instruction. Otherwise, another instruction would have to be inserted between the ARn load and the instruction that uses such ARn contents 6040 as a pointer for SrcA address 6010, SrcB address 6020, or Destination address 6030.

The circuit 630 further shows that the contents of a ARn can be automatically post-incremented or post-decremented by an amount specified in an instruction using the adder 6080 dedicated to that ARn.

For employment as pointers into indirect memory space, the circuit 630 shows that ARns 6090 provide two modes of carrying this out. The first mode is automatic post-modification mode as previously described using 6080. The second mode is variable offset with no post-modification mode. To implement this mode, hardware adders 6050, 6060 and 6070 are situated between ARn 6090 to provide the computed offset for SrcA address 6010, SrcB address 6020, or Destination address 6030. The IMOD 200 bit in DEST 120, srcA 130 and srcB 140 (see FIG. 1) determines which indirect addressing mode for each will be employed, but only if IND 190 bit for that is also set.

Figure 14B:
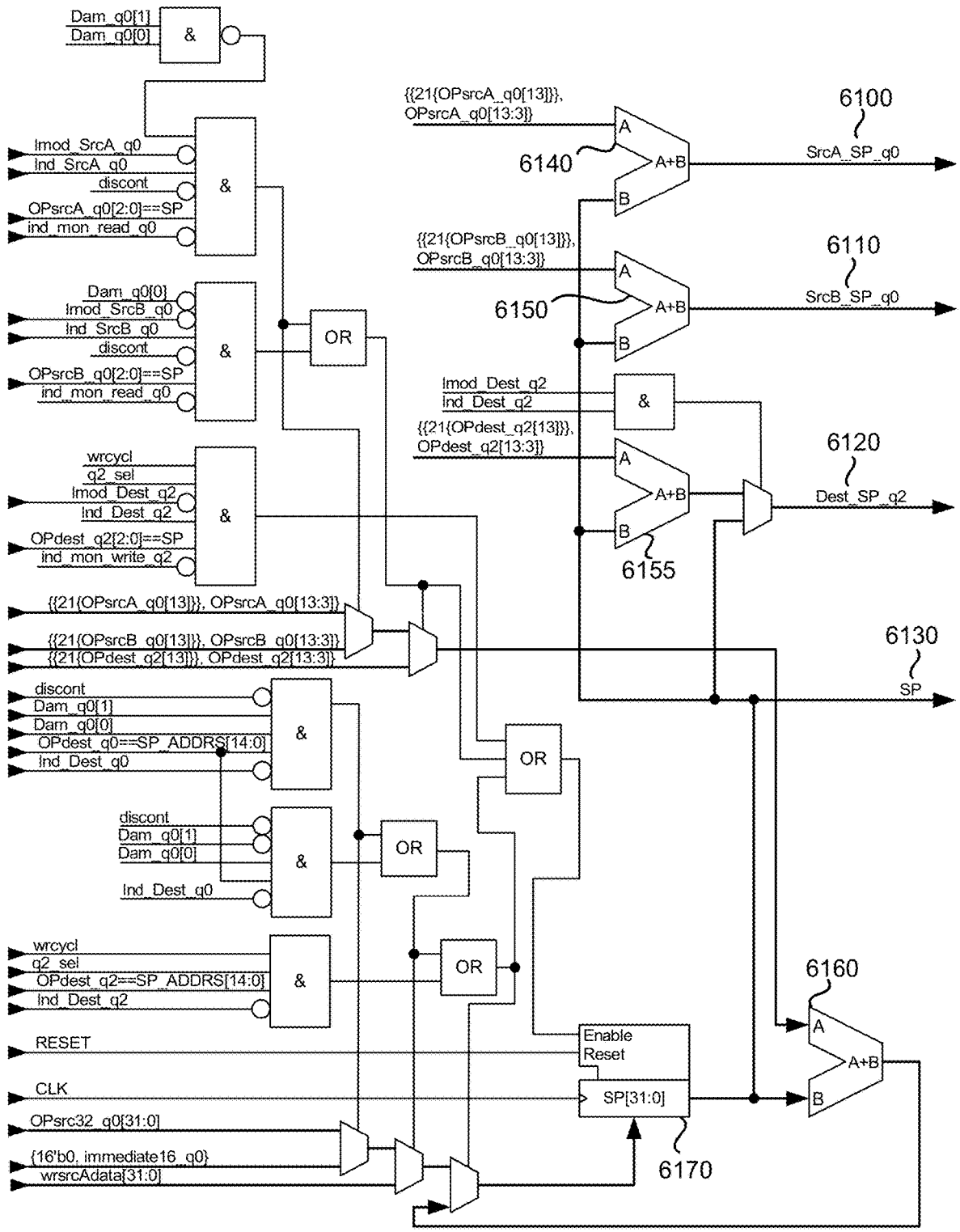
FIG. 14B is a simplified schematic diagram of an exemplary embodiment of the disclosed universal floating-point ISA's Stack Pointer (SP) for indirect addressing, which is part of the auxiliary register logic block of FIG. 14A.

FIG. 14B is a simplified schematic diagram of an exemplary embodiment of the disclosed universal floating-point ISA's Stack Pointer (SP) for indirect addressing, which is part of the auxiliary register logic block 630 of FIG. 14A. The circuit is very similar in operation to the ARn circuit 630 in the following ways. It has a register 6170 to hold the value of the SP 6130. It has an adder dedicated for automatic post-modification operations by a signed amount specified in the instruction. It has adders 6140, 6150, and 6155 situated between 6170 and SrcA_SP 6100, SrcB_SP 6110 and Dest_SP 6120 dedicated to computing an offset address for each of them. The SP differs slightly from ARns in that 6100 and 6110 are always a result of an offset amount, while 6120 can be either offset mode or the automatically post-modified amount (i.e, with no offset). Stated another way, like an ARn, the SP is employed as an indirect pointer for use as either a srcA address, srcB address, or Destination address (or any combination thereof).

The disclosed ISA allows for adopting the convention that a stack "push" pushes downward to a lesser address and that a stack "pop" pops upward to a greater address. To effectuate a stack "pop", the SP direct address must appear in a source operand field of the instruction. To effectuate a stack "push", the SP direct address must appear in the destination field of the instruction and must be automatically post-decremented by an amount equal to the size of the word just pushed so as to point to the next available location downward in the stack.

However, to effectuate a stack "pop", the indirect address must be "pre"-incremented by an amount equal to the size of the previous stack "push". This is where the SP and ARns differ and FIG. 14B shows this difference.

Example C

```
OVFL_:      _       s4:*SP--[8] = _4:PC_COPY
            _       _8:capt0_save = _8:CAPTURE0
            _       _8:capt1_save = _8:CAPTURE1
            _       _8:capt2_save = _8:CAPTURE2
            _       _8:capt3_save = _8:CAPTURE3
            _       _1:lowSig = _1:#overflow
            _       _1:razFlg = _1:#overflow
            _       _4:TIMER = _4:#60000
            _       s4:PC = _4:*SP++[8]
```

Example C above is a hypothetical exception interrupt service routine for floating-point overflow using alternate immediate exception handling. In the first line, the PC is pushed onto the stack using SP as a pointer and automatically post-decremented by 8. Note that a size of 4 could also have been used, but a size of 8 was chosen here to maintain size coherence with possible binary64 floating-point values that might also be pushed at some later point in the service routine. The last line in the routine shows SP effectuating a stack "pop" which restores the PC with program address it would have fetched from but for the interrupt, effectuating a return from interrupt operation. Note the signal "s"-bit for the destination is set for the first and last instruction of the above service routine. This is simply to show how the signal-bit of a given destination, operandA or operandB field can be used to "signal" something has happened or make a distinction of some kind. In this instance, it merely signals the processor has entered (first occurrence) and exited (second occurrence) a interrupt service routine, distinguishing it from a mere subroutine, for example.

Figure 14C:
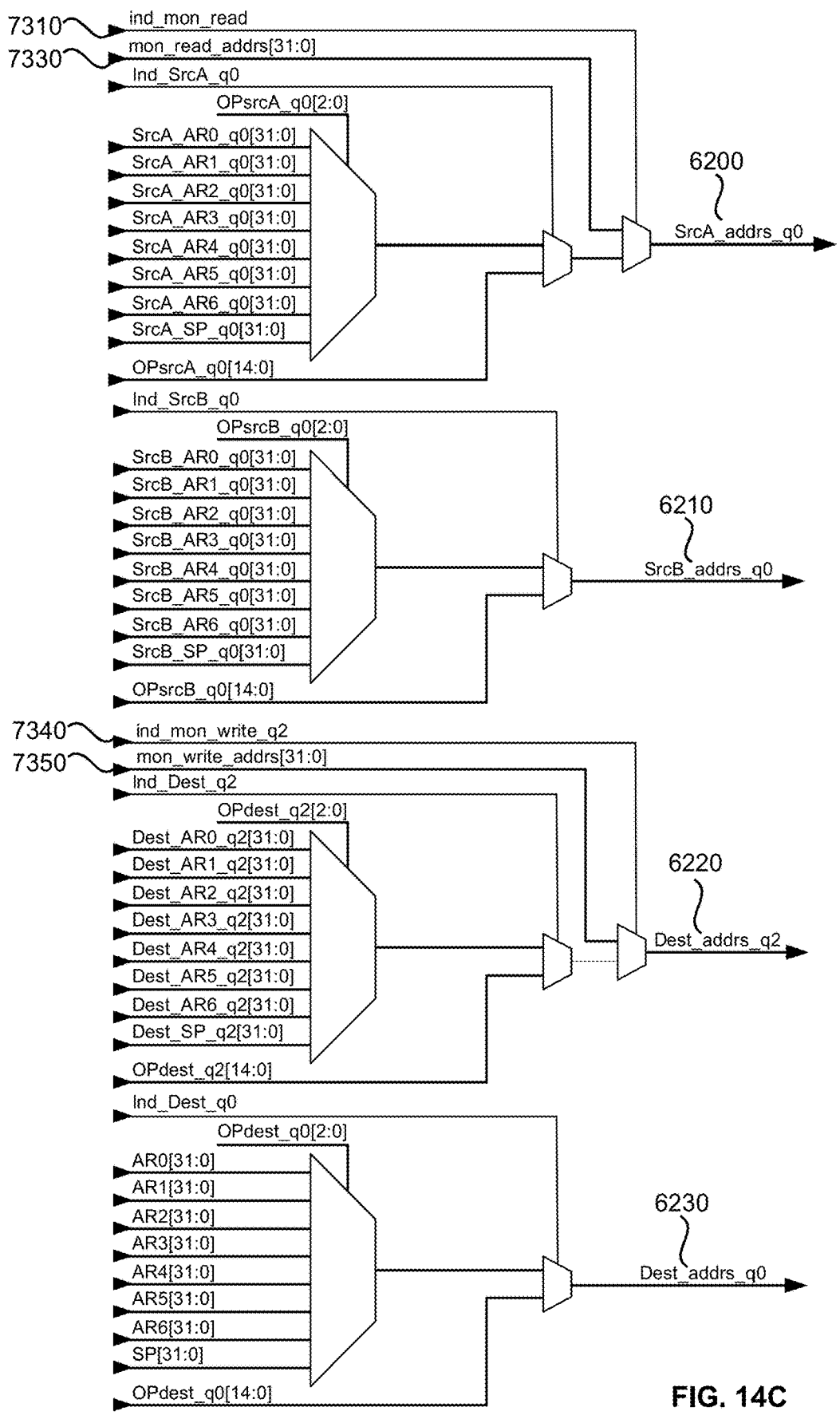
FIG. 14C is a simplified schematic diagram illustrating how SourceA, SourceB and Destination direct and indirect addresses are generated from the disclosed universal floating-point ISA's instruction in an exemplary embodiment of the present disclosure.

FIG. 14C is a simplified schematic diagram illustrating how SourceA, SourceB, and Destination direct and indirect addresses are generated from the disclosed universal floating-point ISA's instruction in an exemplary embodiment of the present disclosure. In particular, FIG. 14C shows how addresses corresponding to instruction 100 fields DEST, 120 srcA 130 and srcB 140 are selected. In the schematic, "ind_SrcA_q0" is IND 190 of srcA 130 field, OpsrcA_q0 [14:0] is 210 of srcA 130 field and OpsrcA_q0[2:0] is 250 of srcA field. If Ind_SrcA_q0 (IND 190) is a "1" then SrcA_addrs_q0 6200 is chosen from among the contents of one of ARn or the Stack Pointer SP, depending on the value of OpsrcA_q0[2:0] 250 in the instruction. Otherwise, if ind_SrcA_q0 is a "0", then the zero-extended direct address OpsrcA_q0[15:0] is used as the srcA q0 address. The logic for determining the addresses SrcB_addrs_q0 6210 srcB q0 address, Dest_addrs_q2 6220 destination q2 address, and Dest_addrs_q0 6230 destination q0 address is the same as for SrcA_addrs_q0, except they each use their own respective IND 190 bits in their respective instruction fields.

Note that pulls from memory occur before pushes. Thus, srcA and srcB addresses must be produced during Stage q0. Pushes occur during the rising edge of Stage q2, thus the destination address must be delayed by two clocks before use as a push address. There are a couple exceptions to this general rule. The first exception is the case where a parent CPU needs to perform a real-time data exchange between it and a XCU connected to it. In such case, the destination address for the real-time data exchange must be pushed simultaneously with the srcA address into the XCU data exchange "hot-spot" in the parent processor's memory map, in that they are both used by the target XCU's cascaded instruction logic to synthesize a new instruction on-the-fly that is substituted and executed instead of the one that was just fetched from the XCU's own program memory during that cycle.

The other exception is for use by the processor's logic for selecting between fat stack or 5-bit signal stack portions of the dual asymmetric stack during a read of either. For more information on this, refer to "fat stack" block 9500 in FIG. 44.

For real-time-data-exchange operations between a debug interface such as JTAG and the CPU or real-time-data-exchange operations between a parent CPU and child XCUs, an extra level of address selection is included on the SrcA_addrs_q0 output 6200 and on the Dest_addrs_q2 output 6220 by way an additional mux. Thus, during q0 of a real-time-data-exchange operation, if the monitor read address 7330 is greater than 0x00007FFF, ind_mon_read 7310 will be driven high by logic in the hardware breakpoint module 7300 of debug module 7000 of FIG. 47A, indicating a indirect monitor read cycle, in which case the monitor read address 7330 is driven onto srcA_addrs_q0 output 6200. Likewise, if the monitor write address 7350 is greater than 0x00007FFF, ind_mon_write 7340 will be driven high by logic in the hardware breakpoint module 7300 of debug module 7000, indicating a indirect monitor write cycle, in which case the monitor write address 7350 is driven onto Dest_addrs_q2 output 6220.

Figure 15:
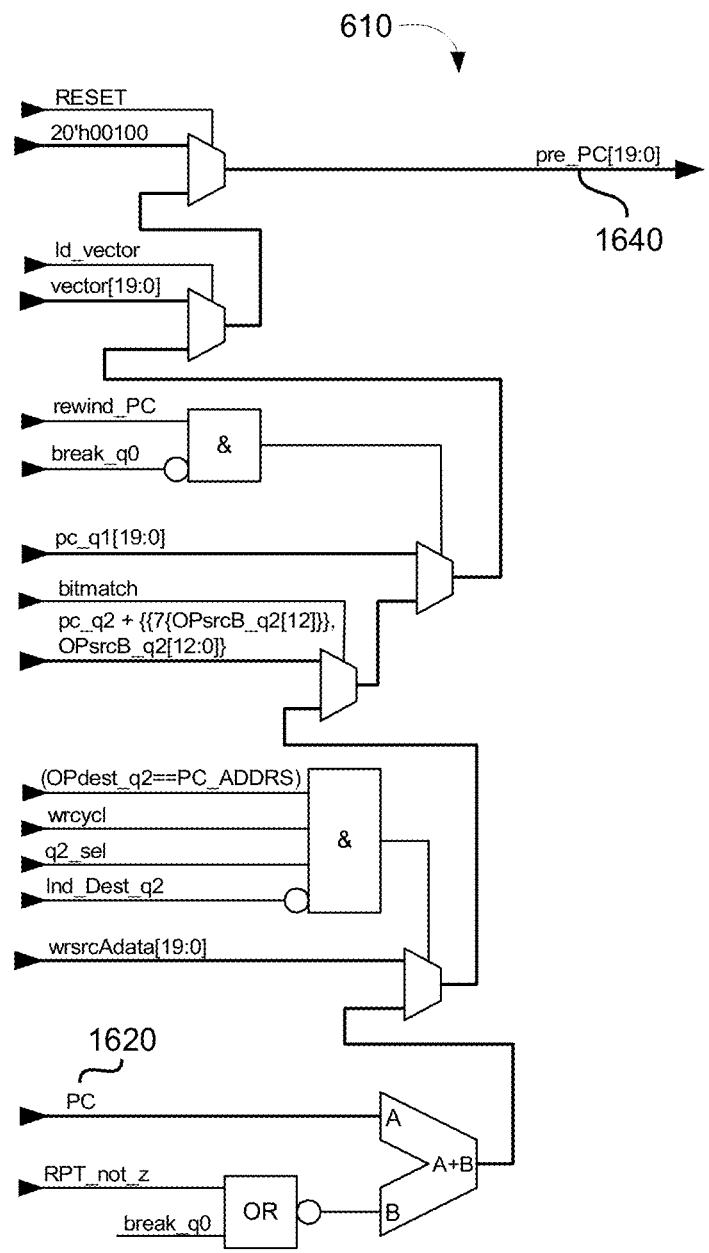
FIG. 15 is a schematic diagram of an exemplary embodiment of the CPU and XCU pre_PC used for accessing the next instruction.

FIG. 15 is a schematic diagram of an exemplary embodiment of the CPU and XCU pre_PC used for accessing the next instruction. FIG. 15 shows the logic 610 for implementing the pre_PC 1640, which requires the contents of the processor's program counter (PC) 1620 as input, along with several other inputs. As mentioned previously, a "pre" _PC is required because the SRAM blocks in modern FPGAs are synchronous, thus the read address into program memory must be registered internally a clock cycle ahead of the time the contents are actually needed. It can be seen from the pre_PC 1640, that in the disclosed embodiment, the pre_PC and, consequently the PC, has an address reach of one megawords (eight megabytes) and, consequently, a 20-bit program counter. This, of course, can be increased to as much as 64-bits if desired, but such would provide excess capability for implementations fully embedded in an FPGA. The pre_PC is not directly readable by software.

Figure 16:
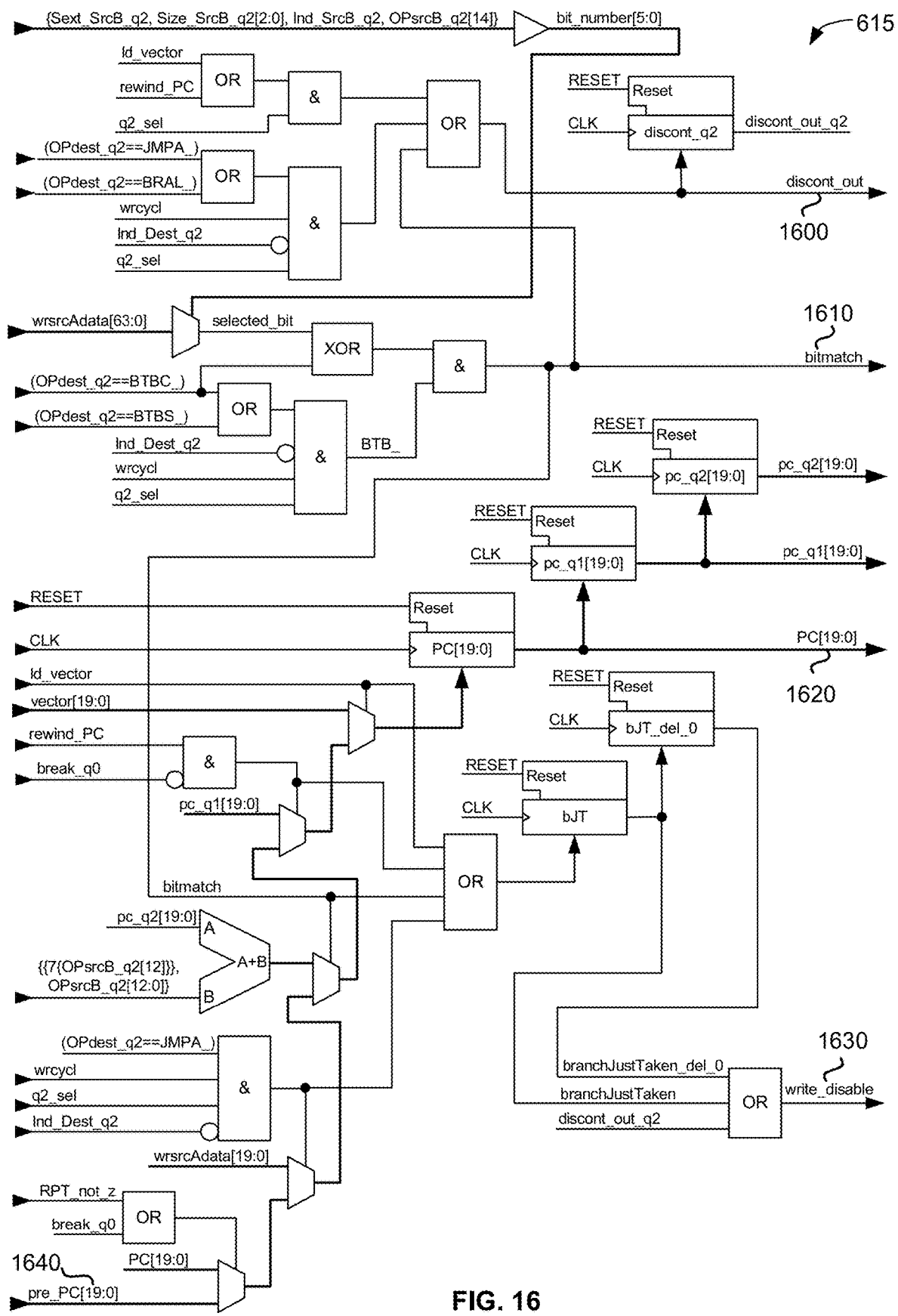
FIG. 16 is a schematic diagram of an exemplary embodiment of the CPU's and XCU's memory-mapped program counter (PC) operator.

FIG. 16 is a schematic diagram 615 of an exemplary embodiment of the CPU's and XCU's memory-mapped program counter (PC) operator 1620, which is directly readable and writable by software. As shown, the PC can be loaded from a number of sources, most of them driven by prioritized events that do not include a direct, unconditional write operation. For example, "Id_vector" when an interrupt is being acknowledged is, apart from an active RESET, the highest priority. If "Id_vector" is active, PC will automatically be loaded with the presented vector[19:0].

Next in priority is "rewind_PC". If rewind_PC is active and no breakpoint is active, then the PC 1620 is automatically loaded with the previous PC value. Rewind_PC is usually the result of a write-side collision or a not-ready condition.

Next in priority is a "bitmatch" 1610 condition as a result of bit-test logic that can only go active "true" if and only if the specified bit of the data being pulled corresponds to the PC conditional load destination address of the instruction. For example, a bit test is "true" if the bit being tested is a "1" AND the destination address is PCS (load-Program-Counter-if-Set address). A bit test is also "true" if the bit being tested is a "0" AND the destination address is PCC (load-Program-Counter-if-Clear address). If the test is "true", the PC is loaded with the sum of the signed relative displacement specified in the instruction and the PC value at the time of the fetch delayed by two clocks (i.e., pc_q2). Note, in terms of direct addresses, "BTBC_ and BTBS_" are synonymous with "PCC" and "PCS", respectively. "JMPA_" and "BRAL_" are synonymous with "PC" and "PCR" respectively.

Next in priority is direct, unconditional write of the PC 1620 in software employed as a long absolute jump.

Last in priority, when not in an active break state or an active REPEAT cycle, the PC is loaded with the contents of the pre_PC 1640 of FIG. 15. If the REPEAT counter is not zero or a break condition is active, the PC remains unchanged.

Anytime the PC 1620 is loaded with a discontinuous value (i.e., a value not exactly equal to PC+1), "discont_out" 1600 goes active "1" to indicate a PC discontinuity. The discount_out 1600 is used by the debug logic block's PC discontinuity trace buffer, if present. The discount_out 1600 is also used by the logic needed to kill/disable the processor's write signal that would have otherwise occurred two clocks later in the processor's push-pull pipeline, effectuating a pipeline flush. This is necessary because, by the time a branch actually executes, there are still two previously-fetched instructions in the pipeline that are about to execute with a corresponding active write. "Write-disable" 1630 is necessary to kill the corresponding writes of the instruction pipeline when a discontinuity occurs.

Further note that, like the pre_PC 1640, the PC 1620 is preset to 0x00100 during reset. This allows the first 100hex locations (i.e., first 2048 bytes) in program memory to be used for storage of constants, if needed.

Figure 17:
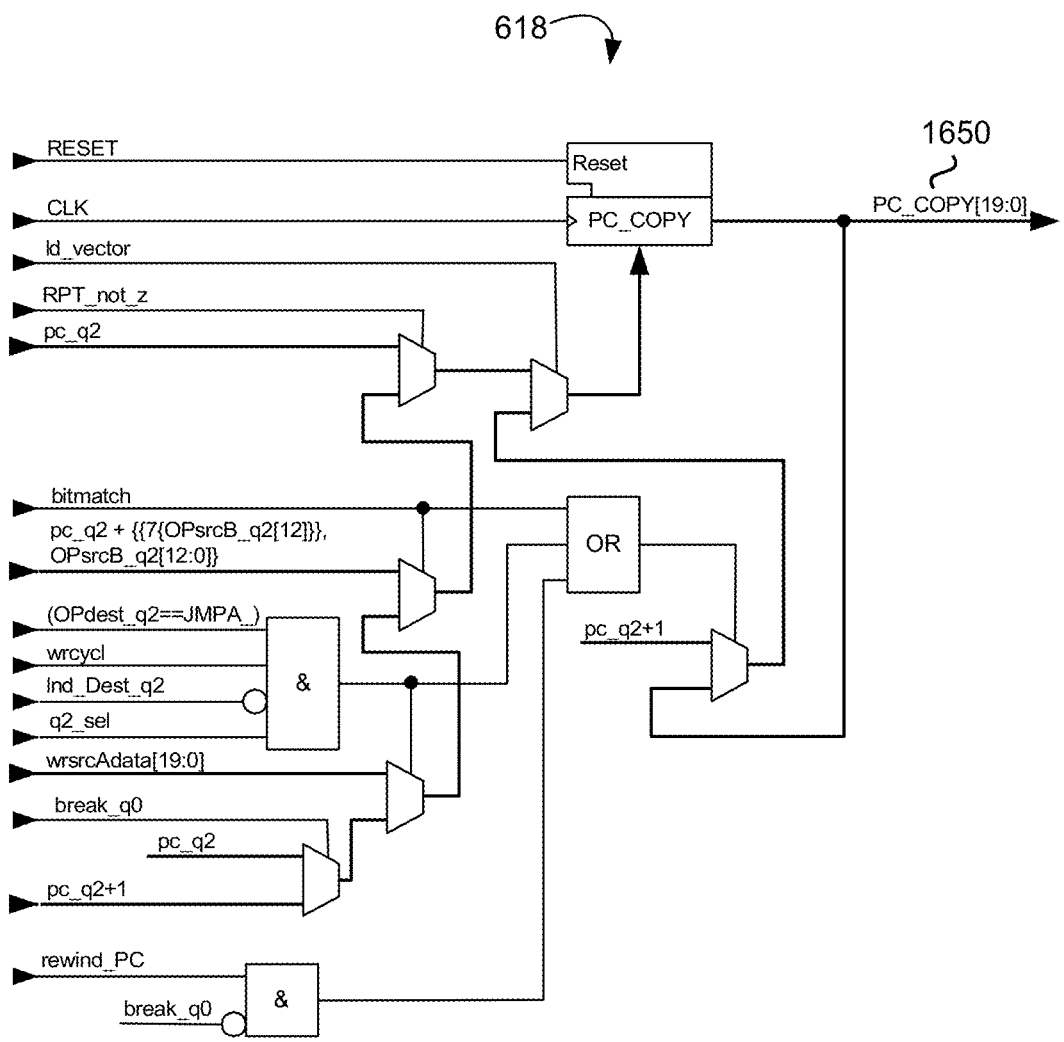
FIG. 17 is a schematic diagram of an exemplary embodiment of the CPU's and XCU's memory-mapped PC-COPY register.

FIG. 17 is a schematic diagram of an exemplary embodiment of the CPU's and XCU's memory-mapped PC-COPY register 618. On RESET, PC_COPY 1650 is preset to 0x00100, the same as PC 1640 and pre_PC 1620. The main purpose of PC_COPY is to provide a return address anytime an interrupt or subroutine call is made. Thus, upon entry into a subroutine or service routine, PC_COPY (and not the PC, per se) must be pushed onto the system stack to preserve the return address. Once the subroutine or service routine is complete, then a return can be effectuated by popping the top of the stack into the PC, as the last step. Thus PC_COPY 1650 only changes when an event occurs that causes a PC discontinuity.

PC_COPY 1650 is readable and is located at location 0x00007FF2 in the processor's data memory among the other programming model registers 2000 of FIG. 11.

FIGS. 18A and 18B are an exemplary table illustrating the bits of the CPU's and XCU's memory-mapped STATUS register/operator and their respective functions in an exemplary embodiment of the present disclosure. FIG. 18A shows bits 63 thru 16, and FIG. 18B shows bits 15 thru 0. Taken together, FIG. 18A and FIG. 18B show all the bits and their functional names comprising the processor's memory-mapped, 64-bit STATUS Register 5000. Most of these bits enable carrying out in hardware all the default and alternate modes mandated or recommended in the IEEE 754-2008 floating-point specification.

As shown, most of the bits are grouped, and these grouped bits have a common bit-set and bit-clear address, such that when a "1" for the corresponding bit position is written to the group's bit-set address, that bit position is set. If a "1" for that bit position is written to that group's bit-clear address, that bit is cleared. In this manner, any combination of bits within a group can be easily and efficiently set or cleared with a single push. For example, bits 0 thru 5 (FIG. 18B) are the "processor integer arithmetic flags (condition code), status and control bits" group 5190, and bits 16 thru 20 (FIG. 18A) are the IEEE 754-2008 exception signals group 5120, and so on.

The main purpose for grouping the bits in this manner is that they can easily be manipulated in hardware, as a group. The bits 0 thru 5 comprise "processor integer arithmetic flags (condition code), status and control bits" that really have nothing to do with floating-point operations, per se, but rather relate to integer and logical operations. Like the other groups, dedicated logic within certain memory-mapped locations that shadow the STATUS Register has been added to make manipulating them together as a group a simple operation. Without this special logic in hardware, manipulating these bits as a group is a cumbersome process.

The following example code shows a conventional, yet cumbersome, way to clear the C flag and set the Z flag using the logical AND and OR operators:

| demoG: | _ | _8:work.9 = _8:STATUS |
| --- | --- | --- |
| | _ | _1:AND.0 = (_1:work.9, _1:#0x3D) |
| | _ | _1:OR.0 = (_1:AND.0, _1:#0x01) |
| | _ | _1:work.9 = _1:OR.0 |
| | _ | _8:STATUS = _8:work.9 |

Another conventional method for setting and clearing individual bits is to use the processor's memory-mapped BSET and BCLR operators, which can only manipulate one bit at a time. For example:

| demoH: | _ | _8:BCLR.0 = (_8:STATUS, _1:#C) |
| --- | --- | --- |
| | _ | _8:BSET.0 = (_8:BCLR.0, _1:#Z) |
| | _ | _8:STATUS = _8:BSET.0 |

While cumbersome, both demoG and demoH work fine. The main problems with using them is that, due to pipeline issues regarding intermediate results not being immediately ready for use in subsequent steps, a pipeline stall will be incurred after each step in the process. Not only that, but demoH is slightly more efficient than demoG and eventually becomes less efficient than demoG when more than one bit needs to be set or cleared at a time because the BSET and BCLR operators presently only operate on one bit at a time.

To solve this problem and make manipulation of bit groups within the present invention's STATUS Register easier and more efficient to carry out, special logic has been added to it, making the memory-mapped STATUS Register an operator in its own right. The following code demonstrates bit group manipulation within the STATUS Register itself:

| demoJ: | _ | _1:0x7CDD = _1:#0x05 |
| --- | --- | --- |
| demoK: | _ | _1:0x7CDC = _1:#0x32 |

In the "demoJ" example above, the Z flag and the N flag of the STATUS Register are simultaneously set using a single instruction. Other bits that may be already set, remain set, i.e., undisturbed. Referring to FIG. 18B for those bits, notice that there is a column in the table corresponding to a "setBit" address and a "clearBit" address. Thus, in demoJ, the single-byte location 0x7CDD is the destination for the "set-bit(s)" operation within the STATUS Register itself. The #immediate value of 0x05 corresponds to the bit respective bit positions of the 5190 bit group. For example, 000101 binary corresponds to the relative bit positions of the Z flag and the N flag within the 5190 bit group. If setting all the bits within the group is desired, then 111111 binary (or 0x3F hex) would be used.

Likewise, demoK shows how to clear desired bits within the 5190 group. The method is identical to setting bits as shown in demoJ, except the pattern of bits specifying which bits to clear are pushed into location 0x7CDC (the "clearBit" address) instead of 0x7CDD. Bits unspecified in the value being pushed remain undisturbed.

Some bits within 5000 are read-only, meaning they cannot be directly written to. For example, bit 6, when set, means A>B as shown at 5180. Bit 7, when set, means A<=B as shown at 5170. Bit 8, when set, means A>=B as shown at 5160. A test of bits 6, 7, 8 should be tested only after a COMPARE (integer compare) operation. For example:

| demoL: | _ | _8:COMPARE = (_8:work.10, _8:workx.11) |
| --- | --- | --- |
| | _ | _4:PCS = (_8:STATUS, 6, skip1) |
| | _ | _8:ADD.7 = (_8:ADD.7, _1:#0x01) |
| skip1: | _ | _8:work.12 = _8:ADD.7 |

Bit 9, the "exception Source" bit 5150 indicates which result bus (i.e., read-side A or read-side B), caused a floating-point exception, if any. A "1" in bit 9 may indicate that a pull from the B-side of the floating-point operator block caused the instant exception. A "0" may indicate that the exception, if any, was caused by a pull from the floating-point operator block A-side.

Bit 10 is a read-only bit that reflects the state of the interrupt request IRQ 5140 input of the processor. A "1" may indicate that an interrupt is being requested. If bit 5, the interrupt enable bit in group 5190, is "1" at the time of the request, and that interrupt or non-maskable interrupt (NMI) is not already in service, the PC is automatically loaded with the address of that interrupt's service routine. If bit 5 is "0", interrupts are disabled and any request on the IRQ bit 5140 is ignored. Note that in the disclosed embodiment, interrupt vectors must be loaded into their respective registers during power-up initialization. The vector register locations are given in table 2000 of FIG. 11.

Bits 11 thru 15 are spare bits 5130 that are presently unused.

Bits 16 thru 20 are the IEEE 754-2008 exception "signal" bits 5120 implemented in hardware. Anytime a result is pulled from a floating-point result buffer, if an exception occurred during its computation, under alternate immediate exception handling, the corresponding exception will be signaled automatically in bits 5120 as a result of the pull.

Under default exception handling, if an overflow condition is indicated as a result of a pull from a floating-point operator, only the inexact signal (bit 20 of group 5120) and overflow Flag (bit 23 of group 5110) will be automatically set, in that overflows are always inexact. If an underflow is indicated as a result of a pull from a floating-point operator under default exception handling, only the inexact signal in bit 20 is automatically set, but only if the underflowed result is also inexact. Under default exception handling for underflow, if the underflowed result is exact, underflow is not flagged and inexact is not signaled.

Bits 21 thru 25 are the IEEE 754-2008 exception "flags" 5110 implemented in hardware. Under default exception handling, anytime a result is pulled from a floating-point result buffer, if an exception occurred during its computation, the exception will be flagged (set="1") automatically in bits 5110, provided that its corresponding "razNoFlag" bit in group 5100 is not enabled.

Under alternate immediate exception handling, it is up to the corresponding exception interrupt service routine to explicitly set the corresponding exception flag in group 5110 and explicitly clear the corresponding exception signal in group 5120 that was automatically raised, causing the floating-point exception interrupt.

Bits 26 thru 30 are the IEEE 754-2008 "raise no flag" bits 5100 implemented in hardware. Under the standard's default exception handling, if a corresponding "razNoFlag" bit is enabled, any result pulled from a floating-point result buffer that experienced an exception during its computation, such exception will be ignored by the 5110 logic. Note that upon reset of the processor, bit 30 of group 5100 is preset to "1". This is because, under default exception handling for inexact, the inexact "flag" is not raised. Under alternate immediate exception handling for inexact, it is up to the implementor's inexact exception interrupt service routine to explicitly raise the inexact flag, if signaled in group 5120, and such does not necessarily depend on the state of bit 30 in group 5100.

It should be noted that bit groups 5120, 5110, 5100, and 5090 can be manipulated as a group in the same manner as bit group 5190 described previously.

Bits 36 thru 45 are the mutually exclusive "one-of" "class" bits 5080 that, together, indicate the IEEE 754-2008 class of the number pushed into the Class hardware operator "clas" at direct location 0x7FCE (see FIG. 12D). Stated another way, after executing the Class operation, only one of these ten bits will be a "1", while all the others will be "0".

Bit 46 stores the result 5070 of this processor's IEEE 754-2008 hardware total Order operator (see FIG. 12C).

Bit 47 stores the result 5060 of this processor's IEEE 754-2008 hardware total Order Mag operator (see FIG. 12C).

A "1" in 5050 (bit 48) indicates whether any of the 5110 flags are presently raised as a result of either a "testSavedFlags" or "testFlags" push. A "0" in 5050 indicates no flags are presently raised. Table 3050 of FIG. 12E gives the direct address of these two hardware operators, as well as examples of how to use them.

Bit 49 stores the result 5040 of this processor's IEEE 754-2008 hardware "Is" operators in 3040 of FIG. 12D. For example, to test a number to see if it is a normal number, push it into the "isNormal" operator located at 0x00007CD1. If it is in fact a normal number, when the operation is completed, the "isTrue" bit (bit 49) will be a "1", otherwise it will be cleared to "0".

Bit 50 stores the result 5030 of this processor's IEEE 754-2008 comparison predicates operators shown in 3020 of FIG. 12B. If the comparison is true, then 5030 is set; otherwise it is cleared. For example, to perform an IEEE 754-2008 "compareSignalingGreaterEqual" operation, push the two operands into cmpSGE (location 0x00007CF9). Then simply perform a bit-test and branch operation as follows:

```
demoM:    _    _8:cmpSGE = (_8:bin64A, _8:bin64B)
          _    _4:PCS = (_8:STATUS, 50, true1)
          _    _8:FSUB.0 = (_8:bin64A, _8:bin64B)
true1:    _    _8:FMUL.0 = (_8:FSUB.0, _8:FSUB.0)
```

Bits 51 thru 54 are the disclosed processor's hardware implementation of the IEEE 754-2008 directed rounding mode attributes. These bits 5020 can be configured with a single write to direct address 0x00007FD8. With bit 53 (the enable RM attribute bit) set to "1" the rounding mode specified in bits 52 and 51 overrides the static rounding mode specified in bits 63 and 62 in the instant instruction. Below is a table showing the four rounding modes according to bits 52 and 51 (assuming bit 53 is set):

| Code | Rounding Mode Attribute |
| --- | --- |
| 00 | Use "default" rounding mode |
| 01 | Round towards positive infinity |
| 10 | Round towards negative infinity |
| 11 | Round towards zero (i.e., truncate) |

Bit 54 ("Away") determines the default rounding mode for both the dynamic round mode attributes specified by bits 51 and 52 of the STATUS Register when the enable RM attribute bit (bit 53) is set ("1") and the static rounding mode (i.e., the rounding mode specified in the instant instruction) when bit 53 is clear ("0"). If Away is "0", then the default rounding mode is round to nearest even. If Away is "1", then the default rounding mode is round away from zero.

Bit 55 is the "overide RM bits" control bit. It is intended for use as an aid in debugging. When set, it will force the rounding direction to nearest even, no matter what modes are specified in group 5020.

Bits 56 thru 63 are for use as the substitute enable bits 5010 recommended in IEEE 754-2008 for resuming alternate exception handling. During an exception service routine under resuming alternate exception handling, these bits can be tested for determining whether a result should be substituted, depending on the exception in service. Like bit groups 5190, 5120, 5110, 5100, and 5090, the bits in 5010 can be manipulated in like manner as a group using a single instruction.

Figure 18C:
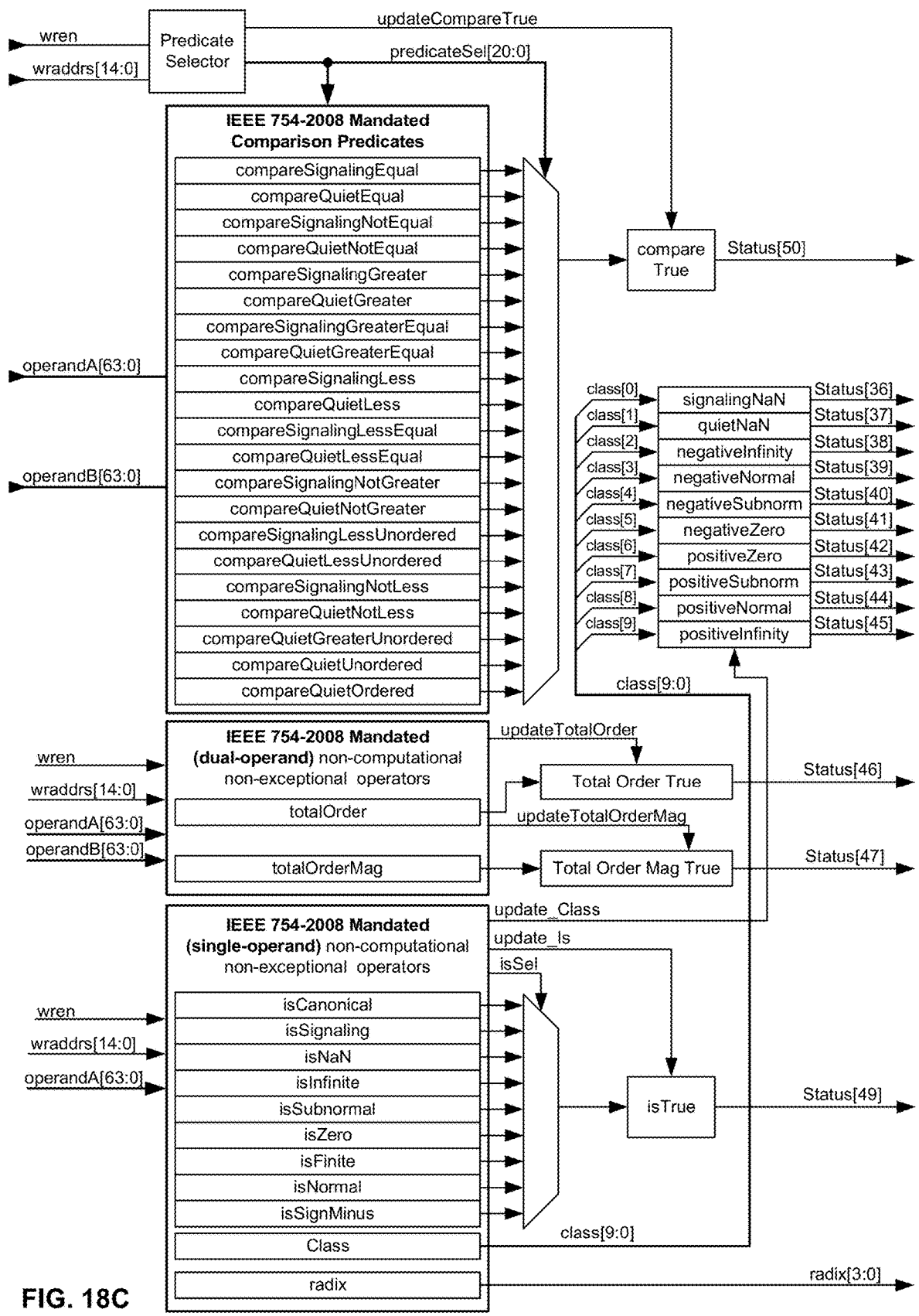
FIG. 18C is a block diagram illustrating an exemplary embodiment of an arrangement, mapping, and implementation of IEEE 754-2008 mandated Comparison Predicates, dual-operand and single-operand non-computational, non-exceptional operators in relation to their respective bits in the CPU's and XCU's memory-mapped STATUS register/operator.

FIG. 18C is a block diagram illustrating an exemplary embodiment of an exemplary arrangement, mapping, and implementation of IEEE 754-2008 mandated Comparison Predicates, dual-operand and single-operand non-computational, non-exceptional operators in relation to their respective bits in the CPU's and XCU's memory-mapped STATUS register/operator 5000 (FIGS. 18A-18B).

FIG. 18D thru FIG. 18O are exemplary schematic diagrams of the present invention's memory-mapped multi-function STATUS Register hardware operator. The STATUS Register is, in itself, an operator because all the logic necessary to carry out not only the IEEE 754-2008 comparison predicates, dual and single-operand non-computational non-exceptional operations, integer compare, and efficient manipulation of bit groups is all part of the STATUS Register operator's logic, in that each operator has a unique memory-mapped input address that shadows the STATUS Register's primary programming model direct address at location 0x00007FF1 in data memory. For efficient context save/restore operations, this primary programming model direct address can be used to save/restore the entire 64-bit contents of the STATUS Register with a single pull/push.

Figure 18D:
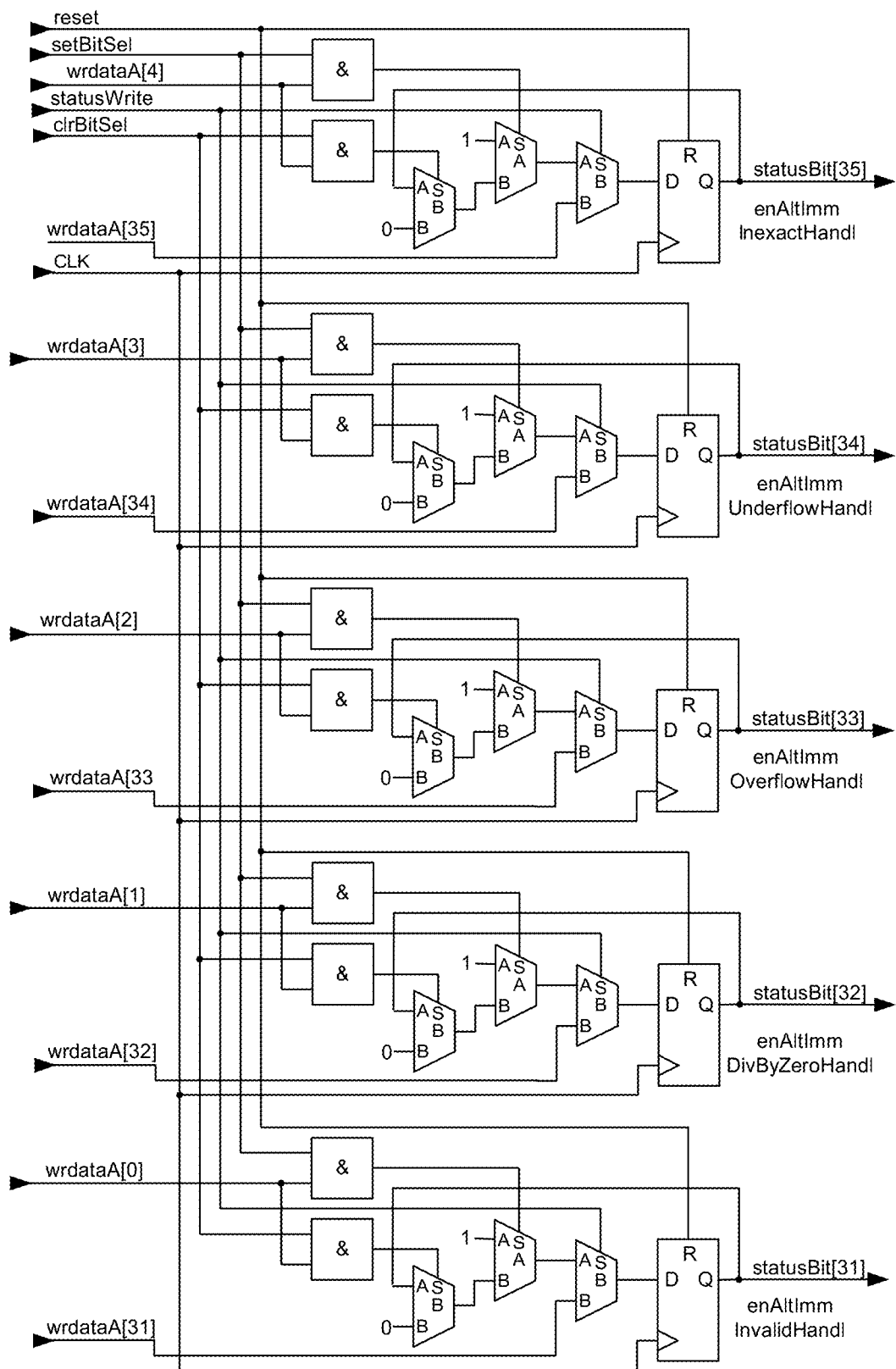
FIG. 18D is a schematic diagram illustrating, along with their respective bit positions, exemplary logic for carrying out in hardware, bit manipulation of the Enable Alternate Immediate exception handling (bits 31-35) as a "group" within the memory-mapped STATUS register/operator in an exemplary embodiment of the present disclosure.

FIG. 18D is a schematic diagram illustrating, along with their respective bit positions, exemplary logic for carrying out in hardware, bit manipulation of the Enable Alternate Immediate exception handling (bits 31-35) as a "group" within the memory-mapped STATUS register/operator in an exemplary embodiment of the present disclosure.

Figure 18E:
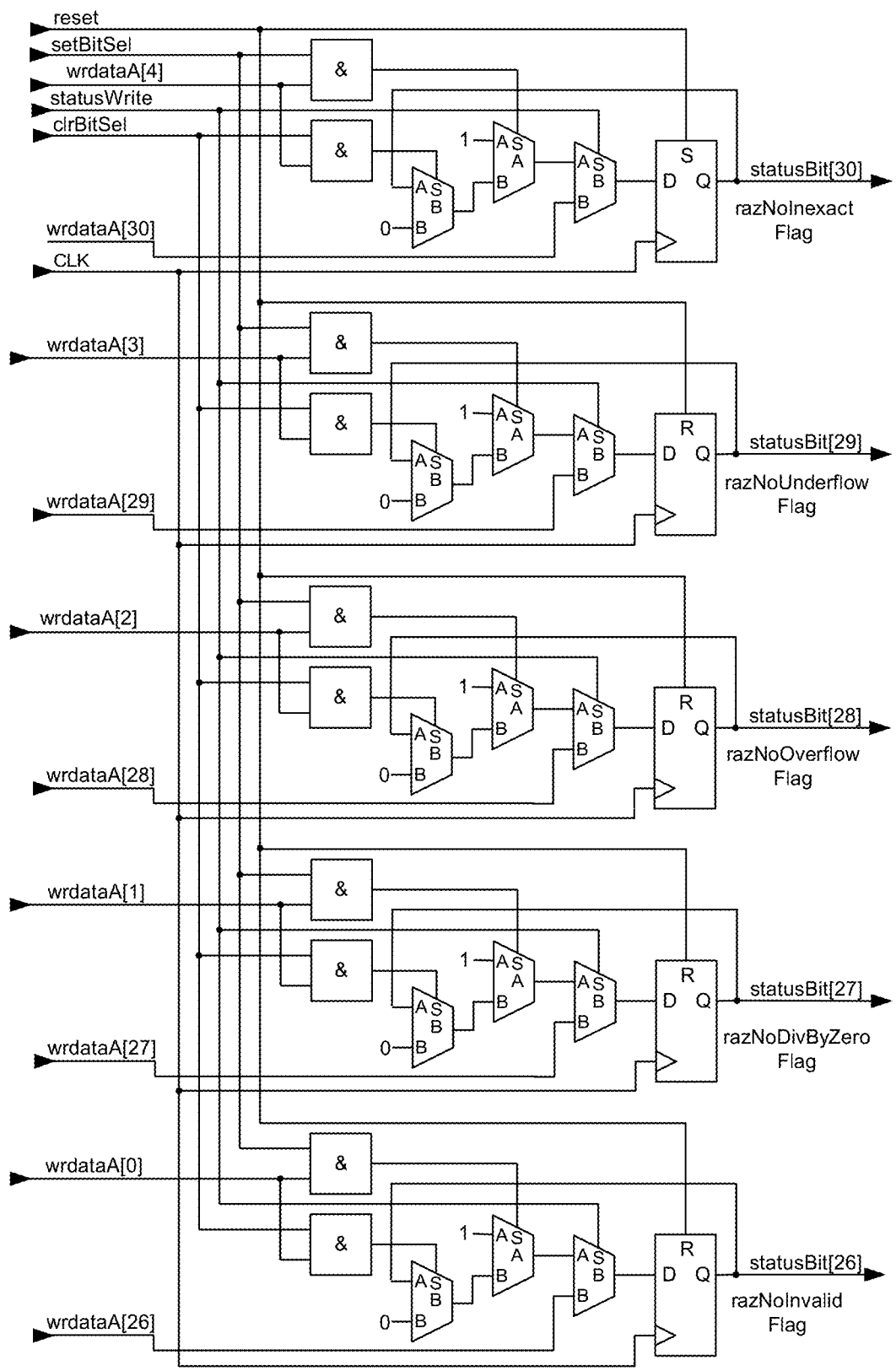
FIG. 18E is a schematic diagram illustrating, along with their respective bit positions, exemplary logic for carrying out in hardware bit manipulation of the Raise No Flag specifiers for the five IEEE 754-2008 exceptions (bits 26-30) as a "group" within the memory-mapped STATUS register/operator in an exemplary embodiment of the present disclosure.

FIG. 18E is a schematic diagram illustrating, along with their respective bit positions, exemplary logic for carrying out in hardware bit manipulation of the Raise No Flag specifiers for the five IEEE 754-2008 exceptions (bits 26-30) as a "group" within the memory-mapped STATUS register/operator in an exemplary embodiment of the present disclosure.

Figure 18F:
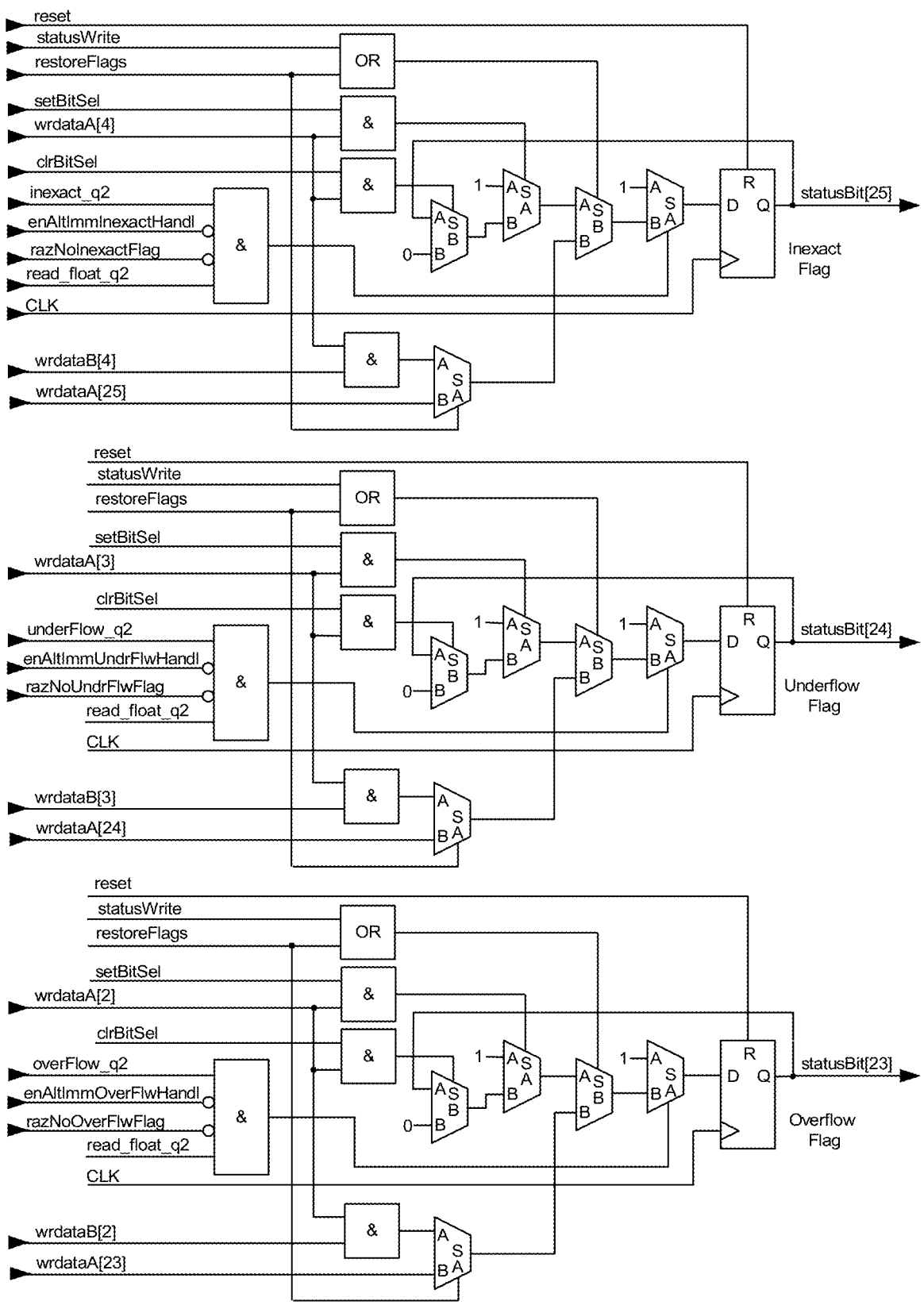
FIG. 18F is a schematic diagram illustrating, along with their respective bit positions, exemplary logic for carrying out in hardware bit manipulation for the IEEE 754-2008 Inexact, Underflow, Overflow, Divide-by-Zero and Invalid flags (only the first three bits, bits 23-25, are shown due to space limitations) as a "group" within the memory-mapped STATUS register/operator in an exemplary embodiment of the present disclosure.

FIG. 18F is a schematic diagram illustrating, along with their respective bit positions, exemplary logic for carrying out in hardware bit manipulation for the IEEE 754-2008 Inexact, Underflow, Overflow, Divide-by-Zero and Invalid flags (only the first three bits, bits 23-25, are shown due to space limitations) as a "group" within the memory-mapped STATUS register/operator in an exemplary embodiment of the present disclosure.

Figure 18G:
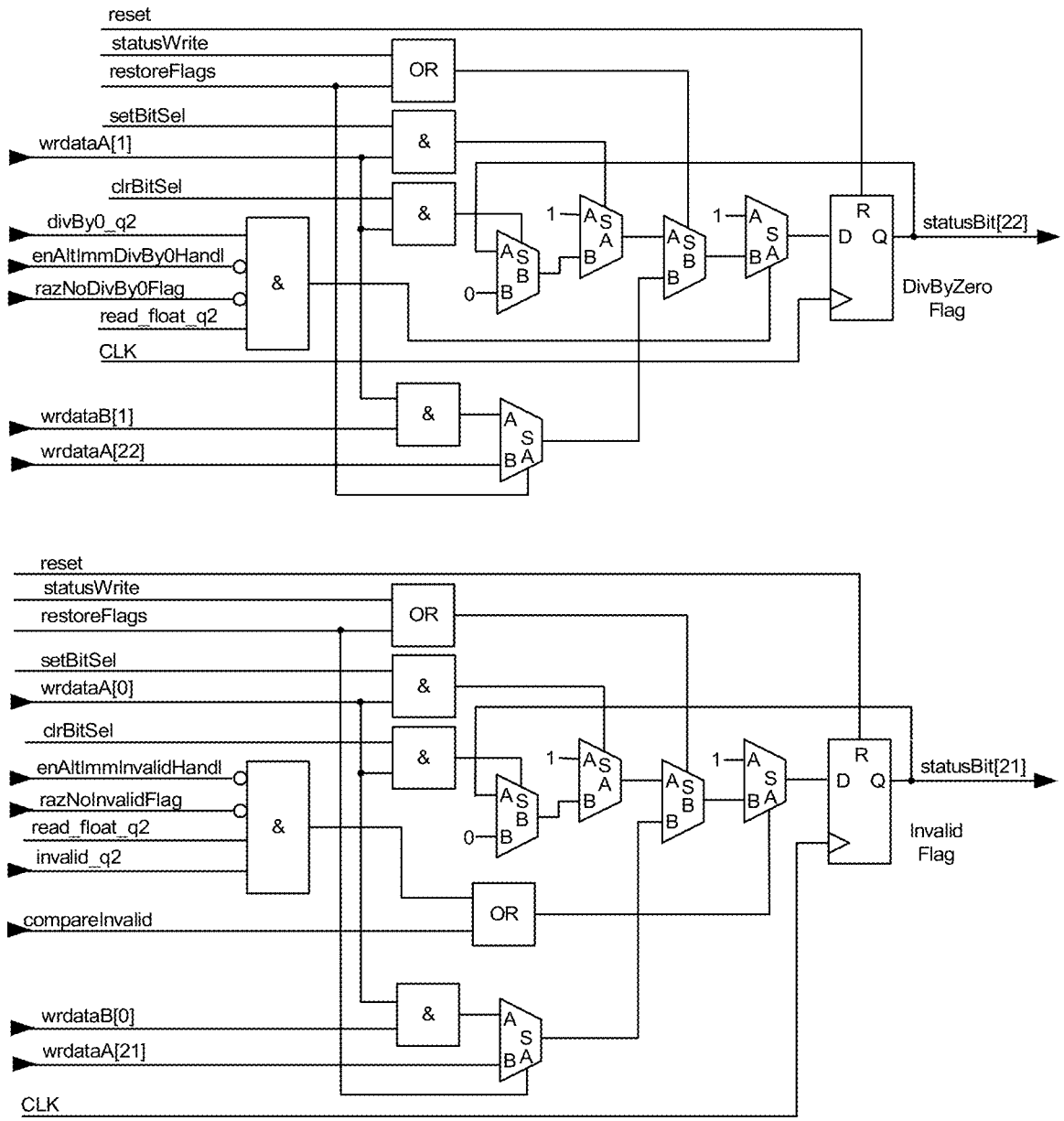
FIG. 18G is a schematic diagram illustrating, along with their respective bit positions, exemplary logic for carrying out in hardware bit manipulation for the IEEE 754-2008 Inexact, Underflow, Overflow, Divide-by-Zero and Invalid flags (only the last two bits, bits 21 and 22, are shown due to space limitations) as a "group" within the memory-mapped STATUS register/operator in an exemplary embodiment of the present disclosure.

FIG. 18G is a schematic diagram illustrating, along with their respective bit positions, exemplary logic for carrying out in hardware bit manipulation for the IEEE 754-2008 Inexact, Underflow, Overflow, Divide-by-Zero and Invalid flags (only the last two bits, bits 21 and 22, are shown due to space limitations) as a "group" within the memory-mapped STATUS register/operator in an exemplary embodiment of the present disclosure.

Figure 18H:
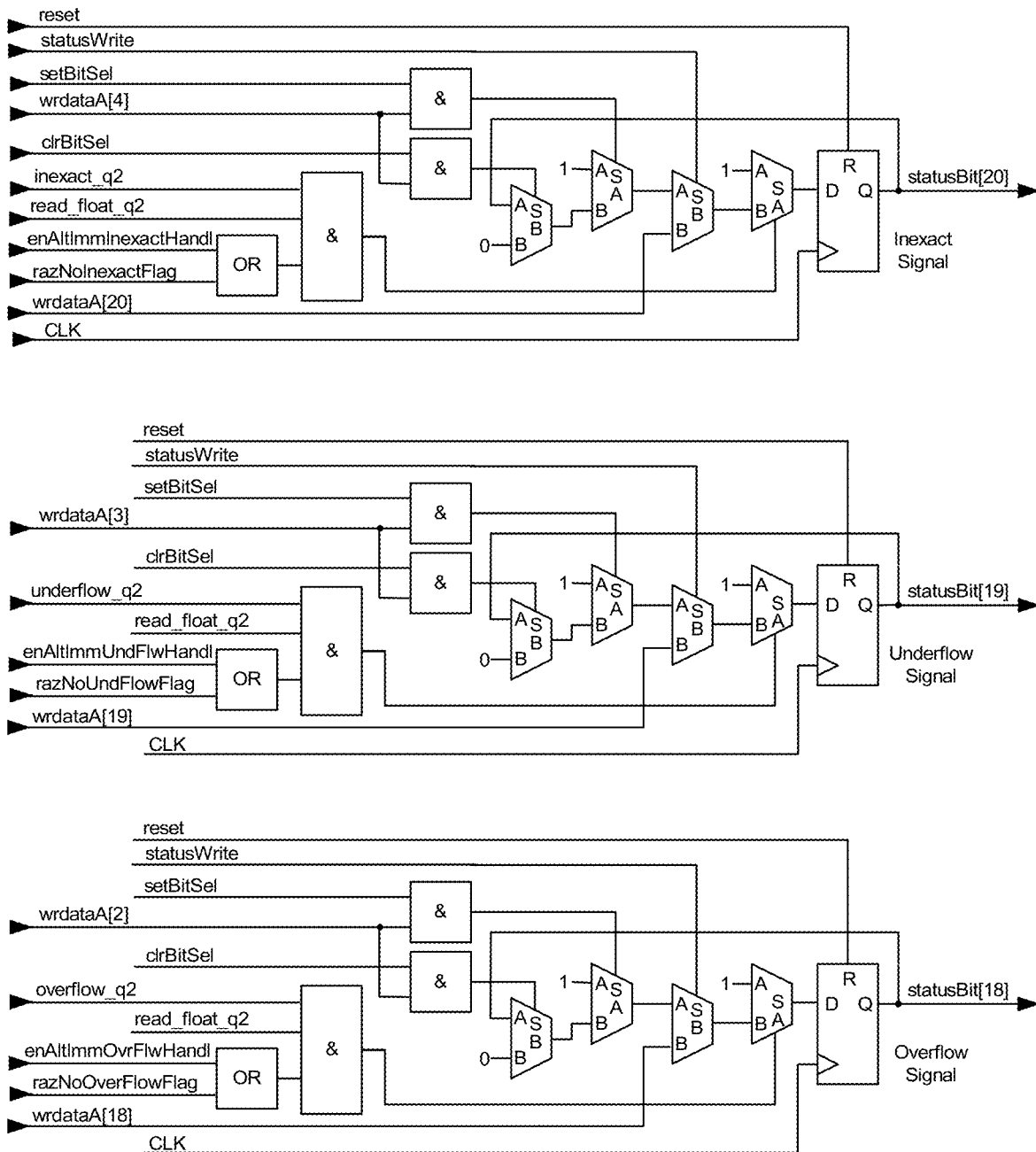
FIG. 18H is a schematic diagram illustrating, along with their respective bit positions, exemplary logic for carrying out in hardware bit manipulation for the IEEE 754-2008 Inexact, Underflow, Overflow, Divide-by-Zero and Invalid "signals" (only the first three bits, bits 18-20, are shown due to space limitations) as a "group" within the memory-mapped STATUS register/operator in an exemplary embodiment of the present disclosure.

FIG. 18H is a schematic diagram illustrating, along with their respective bit positions, exemplary logic for carrying out in hardware bit manipulation for the IEEE 754-2008 Inexact, Underflow, Overflow, Divide-by-Zero and Invalid "signals" (only the first three bits, bits 18-20, are shown due to space limitations) as a "group" within the memory-mapped STATUS register/operator in an exemplary embodiment of the present disclosure.

Figure 18I:
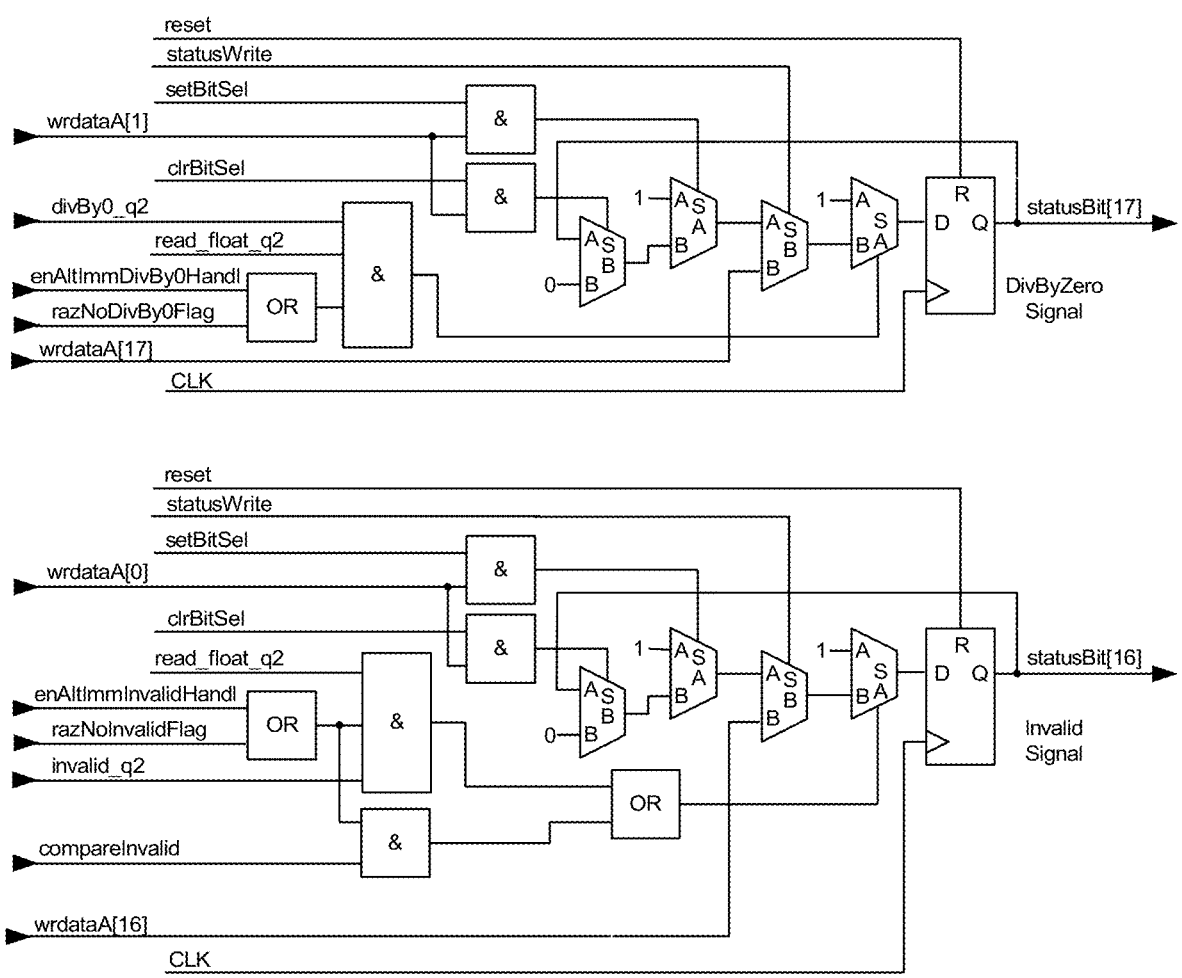
FIG. 18I is a schematic diagram illustrating, along with their respective bit positions, exemplary logic for carrying out in hardware bit manipulation for the IEEE 754-2008 Inexact, Underflow, Overflow, Divide-by-Zero and Invalid "signals" (only the last two bits, bits 16 and 17, are shown due to space limitations) as a "group" within the memory-mapped STATUS register/operator in an exemplary embodiment of the present disclosure.

FIG. 18I is a schematic diagram illustrating, along with their respective bit positions, exemplary logic for carrying out in hardware bit manipulation for the IEEE 754-2008 Inexact, Underflow, Overflow, Divide-by-Zero and Invalid "signals" (only the last two bits, bits 16 and 17, are shown due to space limitations) as a "group" within the memory-mapped STATUS register/operator in an exemplary embodiment of the present disclosure.

Figure 18J:
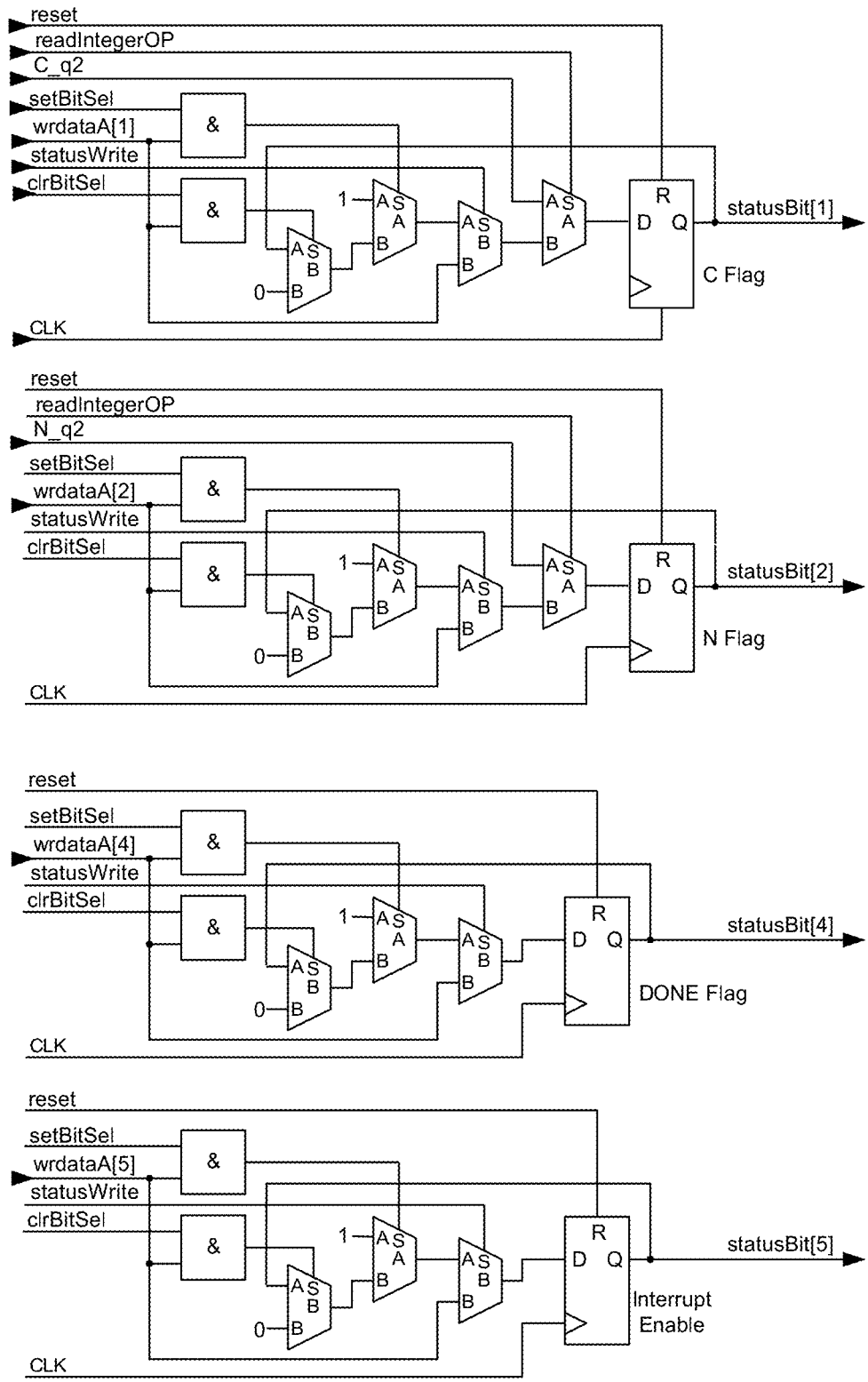
FIG. 18J is a schematic diagram illustrating, along with their respective bit positions, exemplary logic for carrying out in hardware bit manipulation for the CPU and XCU logical and integer arithmetic Carry ("C"), Negative ("N"), Done, Interrupt Enable ("IE"), Zero ("Z"), and Overflow ("O") flags (only bits 1, 2, 4, and 5 are shown due to space limitations) as a "group" within the memory-mapped STATUS register/operator in an exemplary embodiment of the present disclosure.

FIG. 18J is a schematic diagram illustrating, along with their respective bit positions, exemplary logic for carrying out in hardware bit manipulation for the CPU and XCU logical and integer arithmetic Carry ("C"), Negative ("N"), Done, Interrupt Enable ("IE"), Zero ("Z"), and Overflow ("O") flags (only bits 1, 2, 4, and 5 are shown due to space limitations) as a "group" within the memory-mapped STATUS register/operator in an exemplary embodiment of the present disclosure.

Figure 18K:
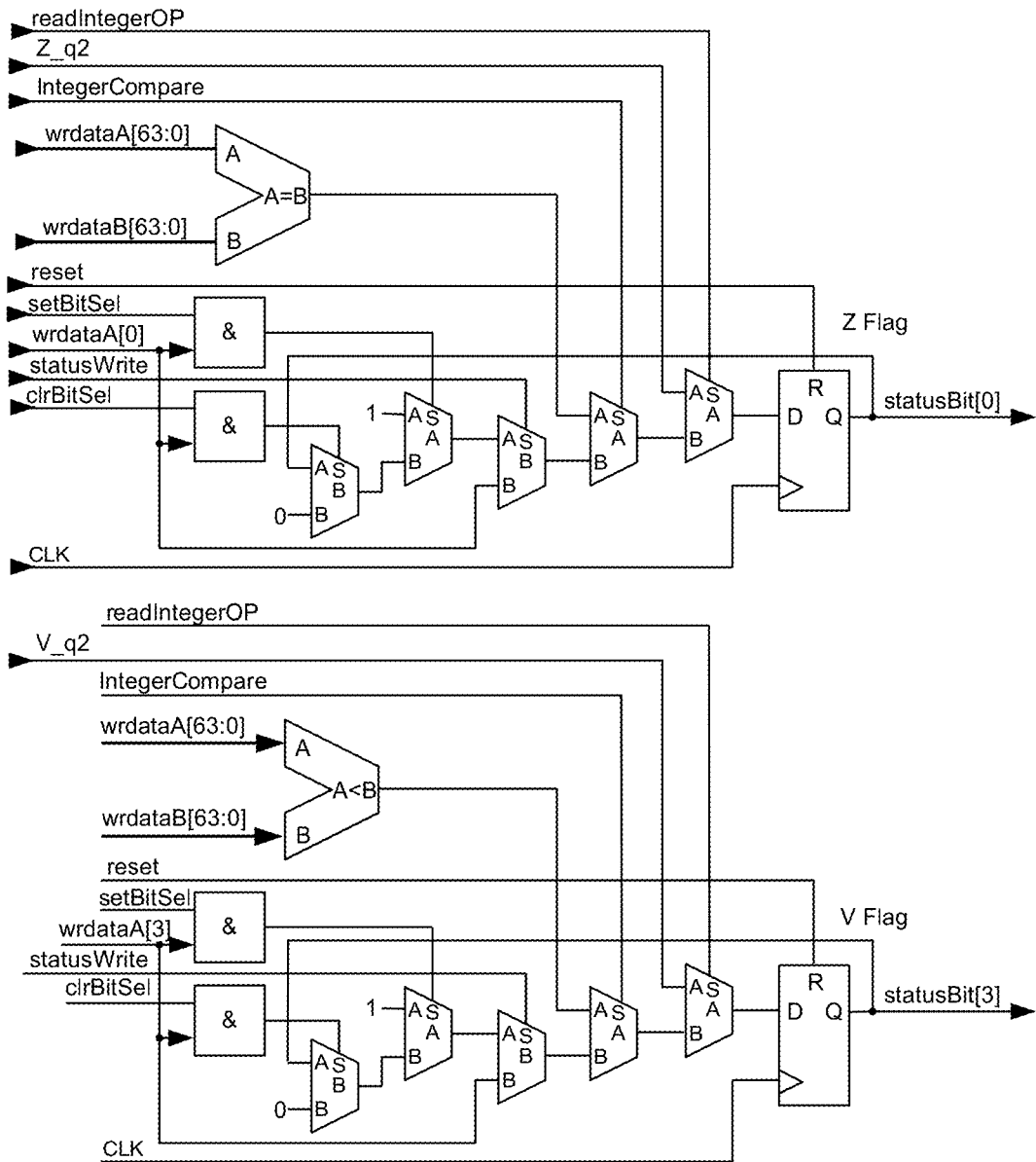
FIG. 18K is a schematic diagram illustrating, along with their respective bit positions, exemplary logic for carrying out in hardware integer comparisons in addition to bit manipulation for the CPU and XCU logical and integer arithmetic Zero ("Z") and Overflow ("O") flags (bits 0 and 3) as a "group" within the memory-mapped STATUS register/operator in an exemplary embodiment of the present disclosure.

FIG. 18K is a schematic diagram illustrating, along with their respective bit positions, exemplary logic for carrying out in hardware integer comparisons in addition to bit manipulation for the CPU and XCU logical and integer arithmetic Zero ("Z") and Overflow ("O") flags (bits 0 and 3) as a "group" within the memory-mapped STATUS register/operator in an exemplary embodiment of the present disclosure. Note that the Z and V flags can be bit-manipulated with N, Done, IE, and C as a group, but the Z and V flags have additional logic to support integer comparisons within the memory-mapped STATUS register/operator.

Figure 18L:
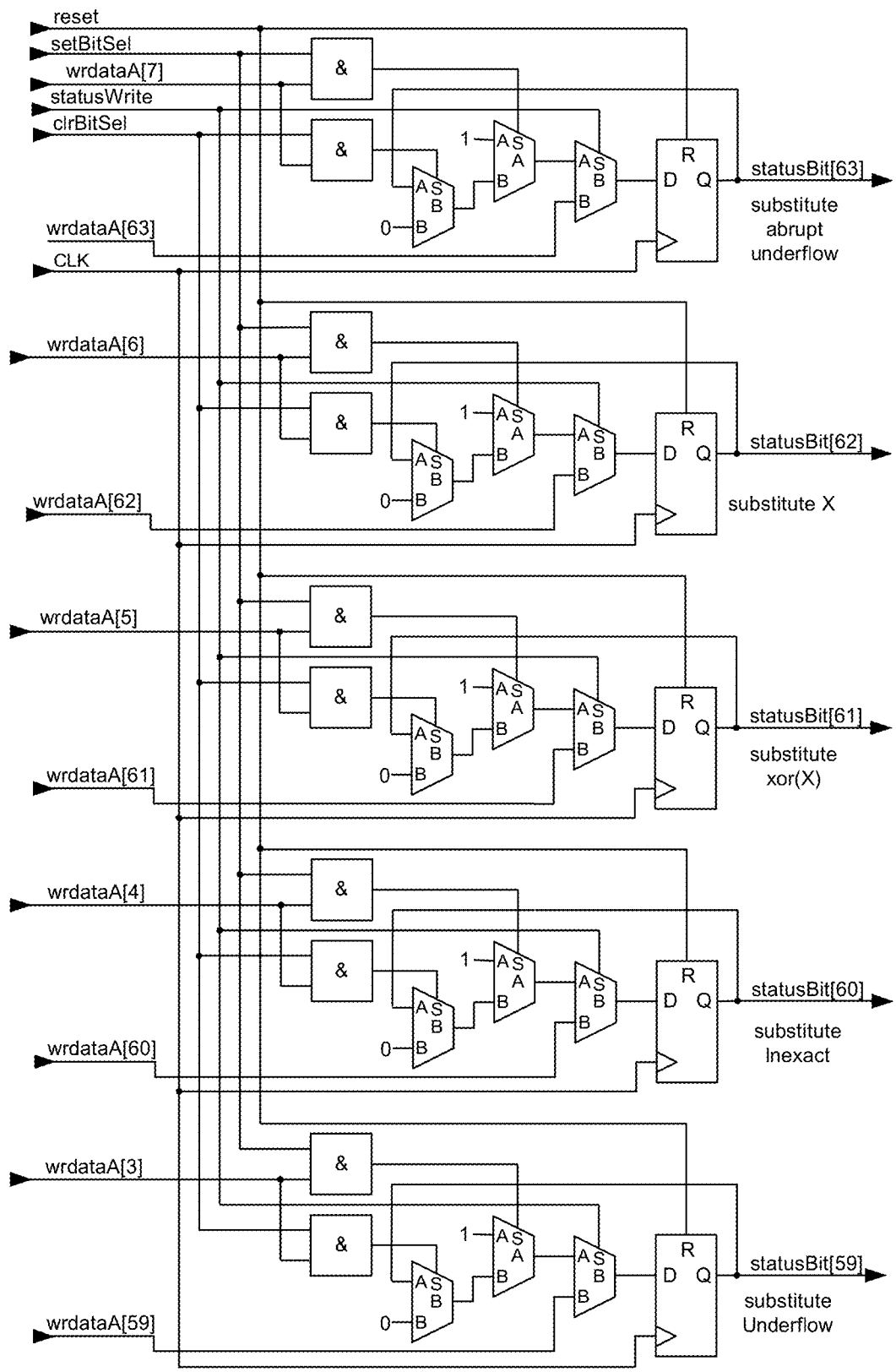
FIGS. 18L and 18M are a schematic diagram illustrating, along with their respective bit positions, exemplary logic for carrying out in hardware bit manipulation for the IEEE 754-2008 "recommended" substitutions for abrupt underflow, substitute X, substitute xor(X), inexact, underflow, overflow, substitute overflow, divide-by-zero, and invalid exceptions (bits 56-58) as a "group" within the memory-mapped STATUS register/operator in an exemplary embodiment of the present disclosure.

FIG. 18L is a schematic diagram illustrating, along with their respective bit positions, exemplary logic for carrying out in hardware bit manipulation for the IEEE 754-2008 "recommended" substitutions for abrupt underflow, substitute X, substitute xor(X), inexact, underflow, overflow, divide-by-zero and invalid exceptions as a "group" within the memory-mapped STATUS register/operator in an exemplary embodiment of the present disclosure (only the first five bits, bits 59-63 are shown due to space limitations).

Figure 18M:
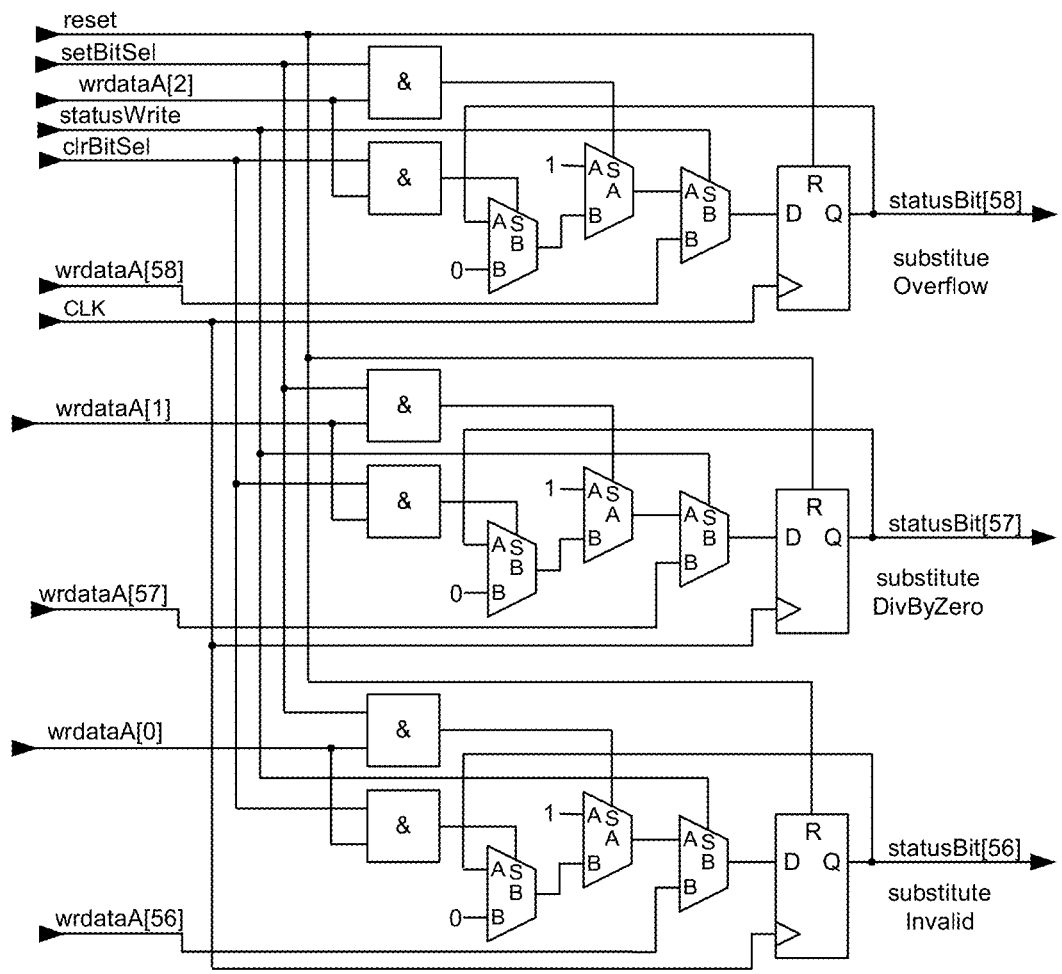

FIG. 18M is a continuation of FIG. 18L above illustrating schematics for the substitute overflow, divide-by-zero and invalid exceptions (bits 56-58).

Figure 18N:
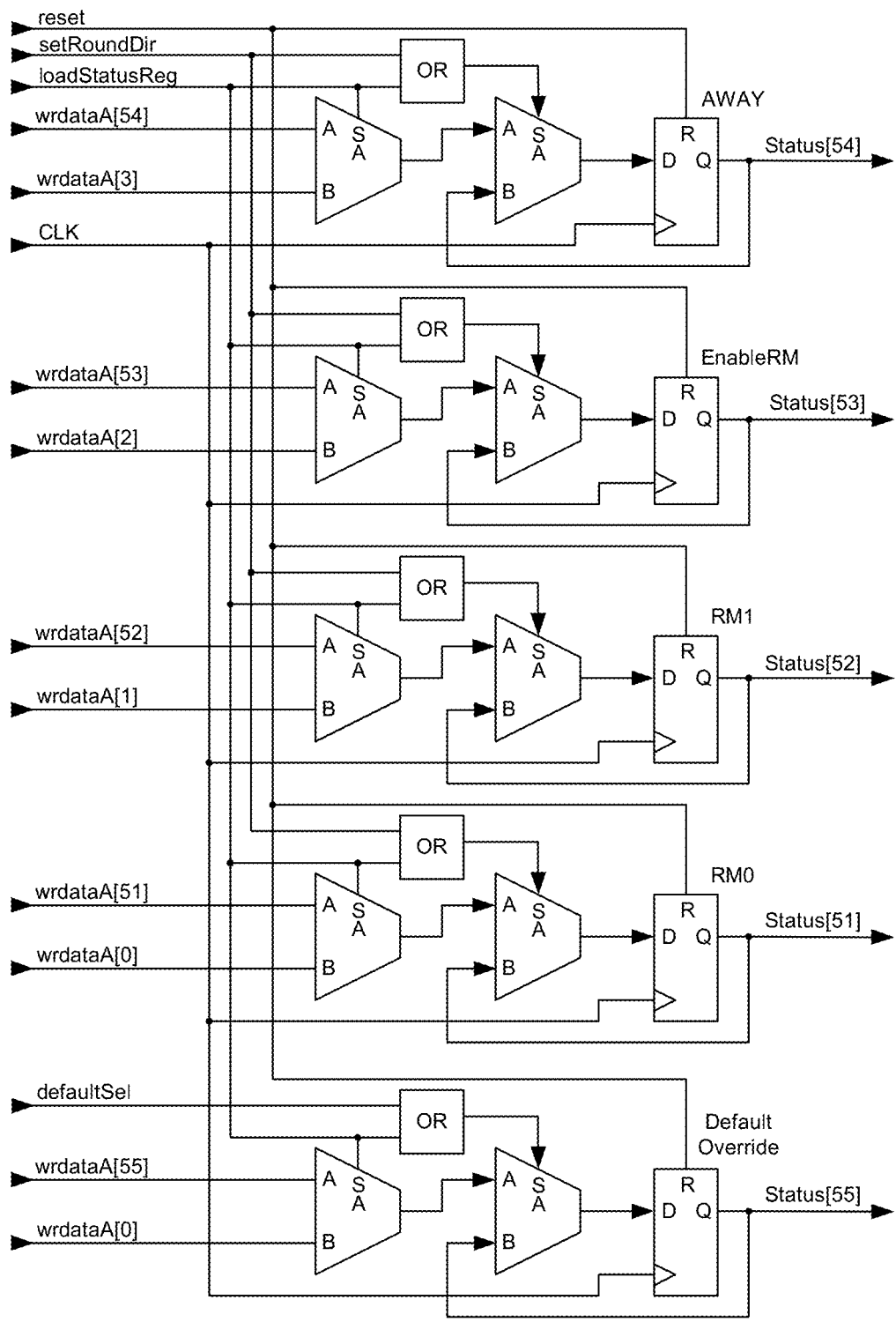
FIG. 18N is a schematic diagram illustrating, along with their respective bit positions in the STATUS register/operator, exemplary logic for carrying out in hardware bit manipulation as a group, dynamic rounding mode attributes mandated by IEEE 754-2008, namely, the encoded Rounding Mode bits 1 and 0, Away bit, Enable dynamic rounding mode, and default override bit (bits 51-55) in an exemplary embodiment of the present disclosure.

FIG. 18N is a schematic diagram illustrating, along with their respective bit positions in the STATUS register/operator, exemplary logic for carrying out in hardware bit manipulation as a group, dynamic rounding mode attributes mandated by IEEE 754-2008, namely, the encoded Rounding Mode bits 1 and 0, Away bit, Enable dynamic rounding mode, and default override bit (bits 51-55) in an exemplary embodiment of the present disclosure.

Figure 18O:
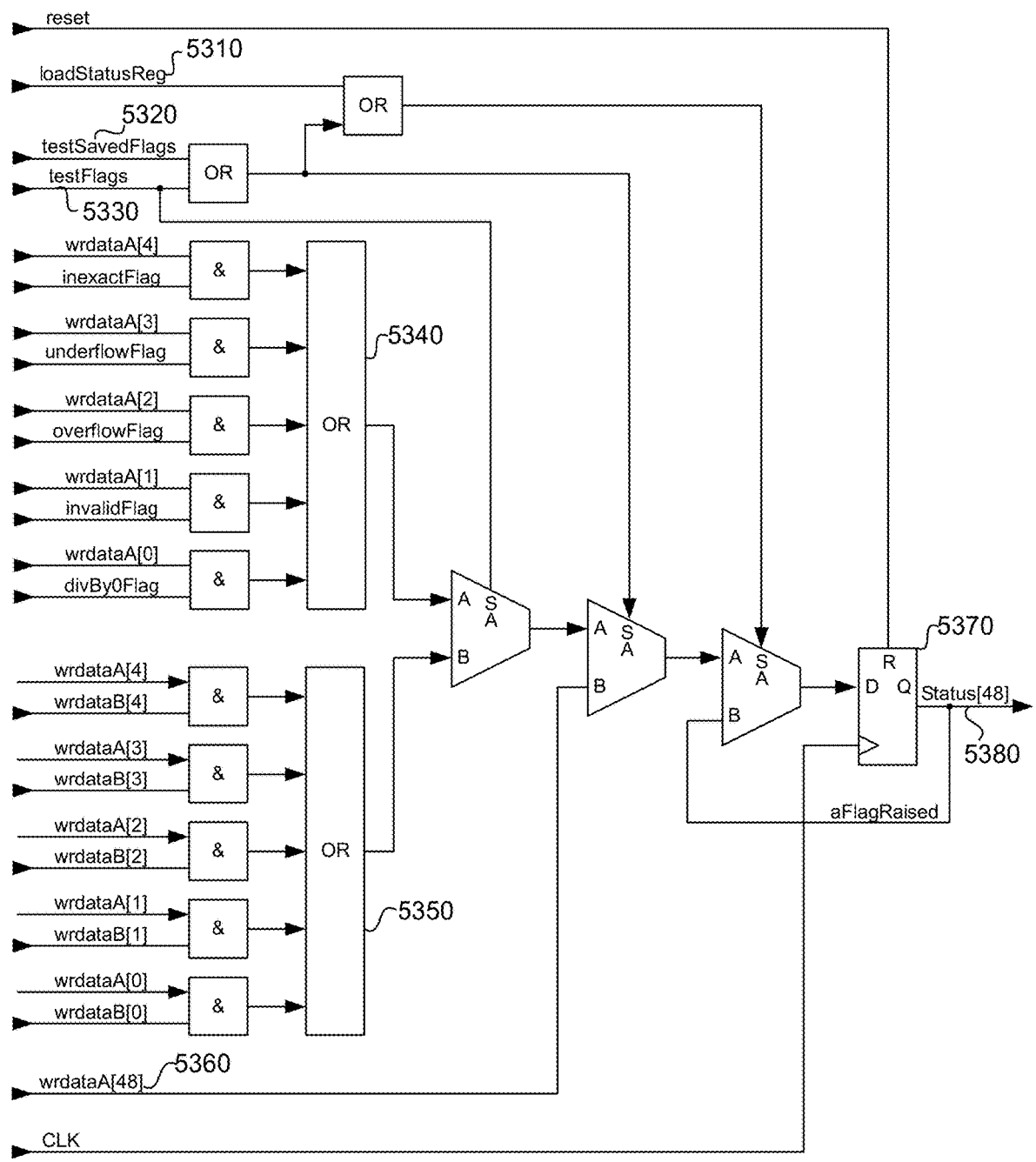
FIG. 18O is a schematic diagram illustrating an exemplary embodiment of memory-mapped logic for carrying out in hardware the IEEE 754-2008 mandated testing for, as a group, an exception flag raised condition using a "testSavedFlags" or "testFlags" memory decode, as well as restoring this status bit using the "loadStatusReg" memory decode logic for these memory-mapped operators.

FIG. 18O is a schematic diagram illustrating an exemplary embodiment of memory-mapped logic for carrying out in hardware the IEEE 754-2008 mandated testing for, as a group, an exception flag raised condition using a "testSavedFlags" 5320 or "testFlags" 5330 memory decode, as well as restoring this status bit using the "loadStatusReg" 5310 memory decode logic for these memory-mapped operators that either set or clear the single-bit register 5370, "aFlagRaised", which is Status Register bit [48] 5380. As can be from this schematic, whenever the CPU writes directly to the Status Register to restore all restorable bits in it, 5370 is loaded with bit wrdata[48] 5360 of the write data bus.

To perform an IEEE 754-2008 "testFlags" operation, simply push a 5-bit value, whose "1" bits correspond in position to the exception flag to be tested, into the "testFlags" operator "tstFlg" location 0x7CE3 in data memory (FIG. 12E for examples on use). As can be seen from FIG. 18O, OR gate 5340 will be driven high if any combination of one or more Status Register exception flags is high AND write-data bit corresponding to such flag is also high. Thus, if anything is pushed into direct byte location "tstFlg" 0x7CE3, signal "testFlags" 5330 will go high and the output of OR gate 5340 will be registered into the "aFlagRaised" register 5370.

Similarly, "testSavedFlags" 5320 compares respective bit positions of exception flags that were previously saved and later read back to do the bit test as a group. In this instance, when the previously saved exception bits are read back, they will be on the five LSBs of the wrdataA (operandA) bus and are compared with the corresponding bits on the wrdataB (operandB) bus. If any operandA bit and corresponding operandB bit matches are both "1", this condition is registered in 5370. Thus, the instant circuit provides an efficient means in hardware to test saved exception flags as a group using a single push into location tstSavFlg operator direct data location 0x7FCE. Refer to FIG. 12E for an example on how to use this operator.

Figure 19:
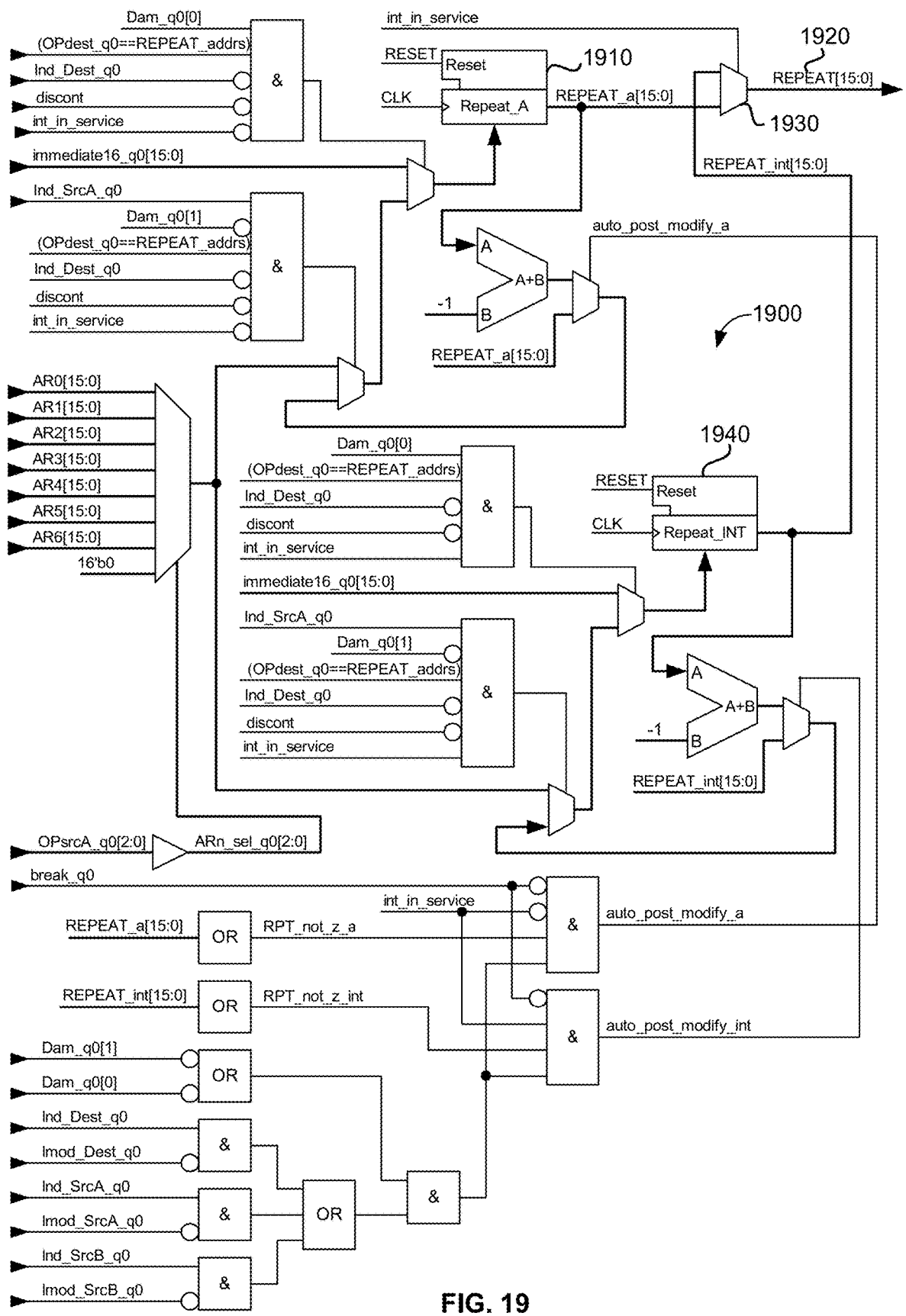
FIG. 19 is a schematic diagram illustrating an exemplary embodiment of the disclosed universal floating-point ISA's memory-mapped hardware REPEAT counter circuit.

FIG. 19 is a schematic diagram illustrating an exemplary embodiment of the disclosed processor's memory-mapped hardware REPEAT counter circuit 1900, which is mapped at location 0x000007FEF in directly addressable data memory space. Once loaded, it begins to decrement by one every clock cycle until it reaches zero. During the time it is not zero, the pre_PC and the PC remain frozen, causing the current instruction to execute a total of REPEAT+1 times.

As shown, there are actually two repeat counters, not just one. This is because an instruction being repeated using the repeat counter is non-atomic with respect to enabled interrupts. This means that if an enabled interrupt is asserted and acknowledged, the "REPEAT_a" counter 1910 suspends down-counting until the interrupt service routine is completed, at which time it automatically resumes down-counting until it reaches zero.

There are two virtually identical REPEAT counters: "REPEAT_a" 1910 and "REPEAT_int" 1940. "REPEAT_a" is automatically selected for use "outside" of interrupt service routines. "REPEAT_int" is automatically selected for use "inside" interrupt service routines. This strategy allows instructions being repeated to be interrupted. If an enabled interrupt is acknowledged, counting of REPEAT_a is temporarily suspended automatically and its contents remains undisturbed during service of the interrupt.

While inside an interrupt service routine, REPEAT_int may be loaded and used in the same way as using REPEAT outside an interrupt service routine. Since the described embodiment does not permit nested interrupts, only one REPEAT_int counter is required. If the implementer incorporates an interrupt controller that permits nested interrupts, then a REPEAT_int counter for use by each interrupt should be included. Alternatively, a state-machine can be employed to suspend decrementing REPEAT upon acknowledgment of an interrupt, allowing time for the current contents of REPEAT to be preserved by pushing it onto the stack. This process is tricky and the process of preserving and restoring REPEAT cumbersome, which is among the reasons the strategy of having two separate REPEAT counters that shadow each other was chosen for the described embodiment.

Encountering a breakpoint will suspend decrementing of the REPEAT operator until the processor exits the breakpoint. The current repeat count 1920 may be pulled during an active breakpoint. If the breakpoint occurs during an interrupt service routine, then the current contents of REPEAT_int 1940 is read as the current repeat value 1920. If the breakpoint occurs outside an interrupt service routine, then the current contents of REPEAT_a 1910 is read as the current repeat value 1920.

A parent CPU can read the contents of a child XCU REPEAT counter. The JTAG real-time debug module, if present, can read the contents of the CPU REPEAT counter, anytime, on-the-fly or during a breakpoint.

From FIG. 19, it can be seen that the REPEAT counter can only be loaded using #immediate addressing mode or using the contents of one of the Auxiliary Registers (ARn). The reason for this is because the immediate value is immediately available within the instant instruction and does not need to be read out of RAM. As such, the REPEAT counter is loaded one clock early so that it is ready to start down-counting by the time the following instruction executes.

The main disadvantage to loading the REPEAT counter with an #immediate value is that such value is fixed and cannot be changed or made variable, due to it being in program memory, which is to say, loading REPEAT with an #immediate value does not permit "computed" repeats, wherein the REPEAT amount is variable. Loading the REPEAT counter using the contents of one of the Auxiliary Registers enables computed repeat amounts. This works because the contents of Auxiliary Registers are immediately available for this purpose. To implement a computed/variable repeat amount, perform the computation and push the result into one of Auxiliary Registers (ARn), then push the contents of the same ARn into the REPEAT counter. For example:

```
demoN:      _   _2:REPEAT = _2:#31
            _   _8:*AR1++[8] = _8:*AR2++[8]
demoP:      _   _8:ADD.0 = (_8:work.2, _1:work.7)
            _   _8:AR3 = _8:ADD.0
            _   _2:REPEAT = _2:AR3
            _   _8:*AR1++[8] = _8:*AR2++[8]
```

In the "demoN" example above, REPEAT is loaded with the #immediate value #31, causing the instruction following it to execute a total of thirty-two times.

In the "demoP" example above, an amount is computed by adding the contents of work.7 to the contents of work.2, with the result of the ADD operation being pushed into AR3. The contents of AR3 is then pushed into the REPEAT counter, with the following instruction executing the previously computed number of times+1.

It should be understood that the REPEAT counter will only decrement if DEST 120, srcA 130 or srcB 140 in the following instruction employ the indirect (auto-post modify) addressing mode. If none of the addressing mode fields in the instruction that follows the REPEAT load are indirect (auto-post modify) addressing mode, then the value previously loaded into the REPEAT counter will not decrement. Stated another way, the REPEAT counter is intended to be used only for repeating indirect, auto-post-modify instructions.

Figure 20:
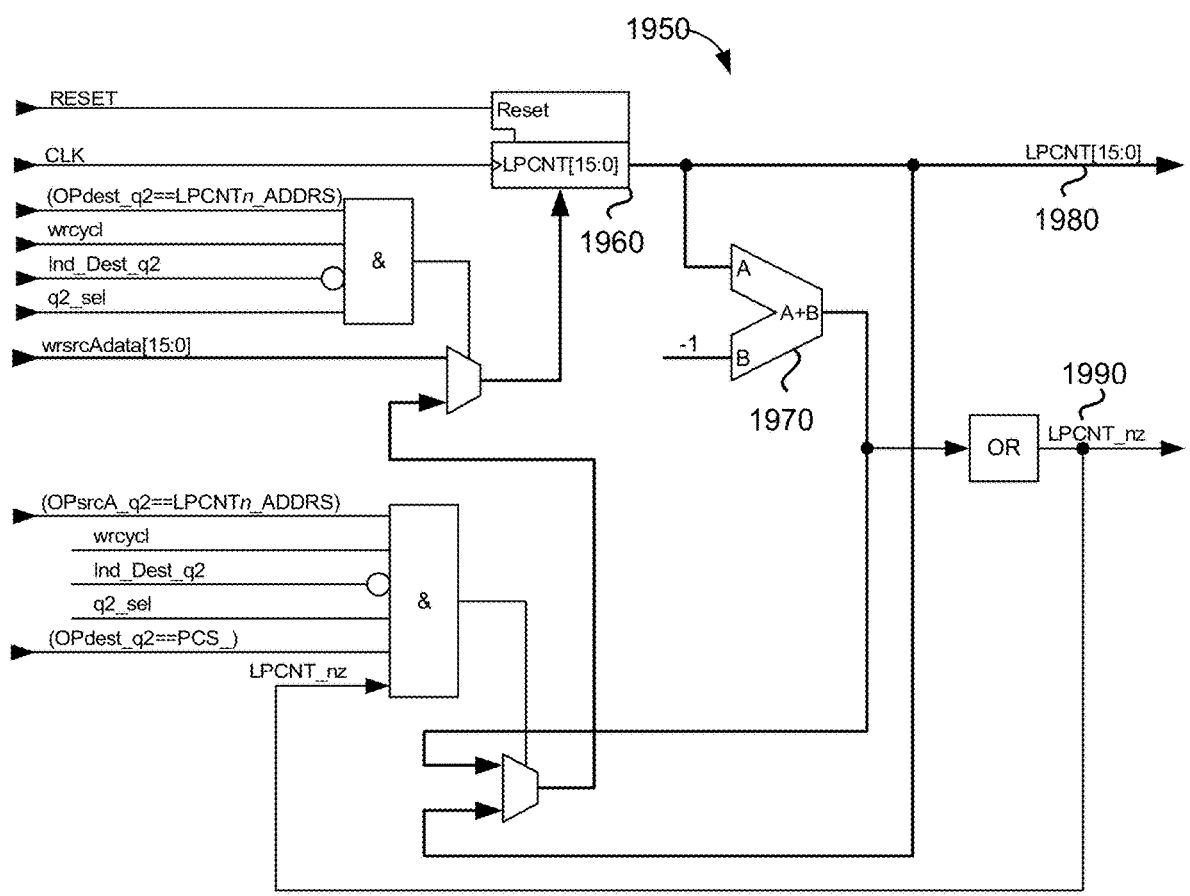
FIG. 20 is a schematic diagram illustrating an exemplary embodiment of the disclosed universal floating-point ISA's memory-mapped hardware loop-counter operators.

FIG. 20 is a schematic diagram illustrating an exemplary embodiment of the disclosed universal floating-point ISA's memory-mapped hardware loop-counter operators 1950. In the disclosed embodiment, there are two hardware loop-counters, LPCNT1 and LPCNT0 that employ identical hardware loop-counter logic 1950. LPCNT1 and LPCNT0 may be sixteen bits wide and may be implemented as down-counters using adder 1970 that adds a −1 to the current contents of the LPCNT 1960. Each loop counter circuit 1950 has logic that detects when the current value of its respective counter is not zero and outputs a signal LPCNT_nz 1990 that is read simultaneously with the current count value, with LPCNT_nz being the most significant bit. Stated another way, when a loop counter is pulled, LPCNT[15:0] value 1980 occupies the first sixteen LSBs and LPCNT_nz 1990 occupies the MSB position of the 17-bit word being read.

Either loop counter may be read/pulled anytime and can be written anytime, but only with the direct addressing mode. Once loaded with a non-zero value, the loop counter automatically decrements, but only as a result of a read/pull, wherein the direct destination address (PCS_) is the PCS operator, and the direct srcA address is the desired loop counter address, effectuating a conditional load of the PC when the tested bit is set (i.e., "1").

Employment of the hardware loop counters is much more efficient for tight looping scenarios than conventional methods that involve initializing a memory location with a start value, then manually subtracting one from it, pulling the result out of the SUBtract operator to register its condition signals in the STATUS Register, and then manually testing the Z flag in the STATUS Register to determine if a branch should be taken, each of these steps being done for each iteration. Such methods work fine for routines that are average or longer length.

However, for tight looping scenarios where the sequence of instructions in the loop is only three or four instructions, a hardware loop counter is much more efficient and desirable.

The following example shows a conventional memory-based loop counter in software.

```
DemoQ:       _    _2:work.0 = _2:#24
loop3:       _    _2:SUB.0 = (_2:work.0, _2:#1)
             :
             :    <hypothetical code>
             :
             _    _2:work.0 = _2:SUB.0
             _    _4:PCS = (_4:STATUS, 0, loop3)
```

The following is an example using one of the instant invention's memory-mapped hardware loop counters.

```
DemoR:       _    _2:LPCNT0 = _2:#24
loop3:       :
             :    <hypothetical code>
             :
             _    _4:PCS = (_4:LPCNT0, 16, loop3)
```

In the "DemoR" example above, each time the last line is executed, the LPCNT_nz 1990 is tested to see if it is set ("1"). If set, i.e., the LPCNT value is not zero, the PC will branch to "loop3". If clear, it will exit the loop. Each time LPCNT0 is tested, such test automatically decrements that counter by 1 if the pre-registered value immediately on the output of 1970 is not already 0.

Figure 21:
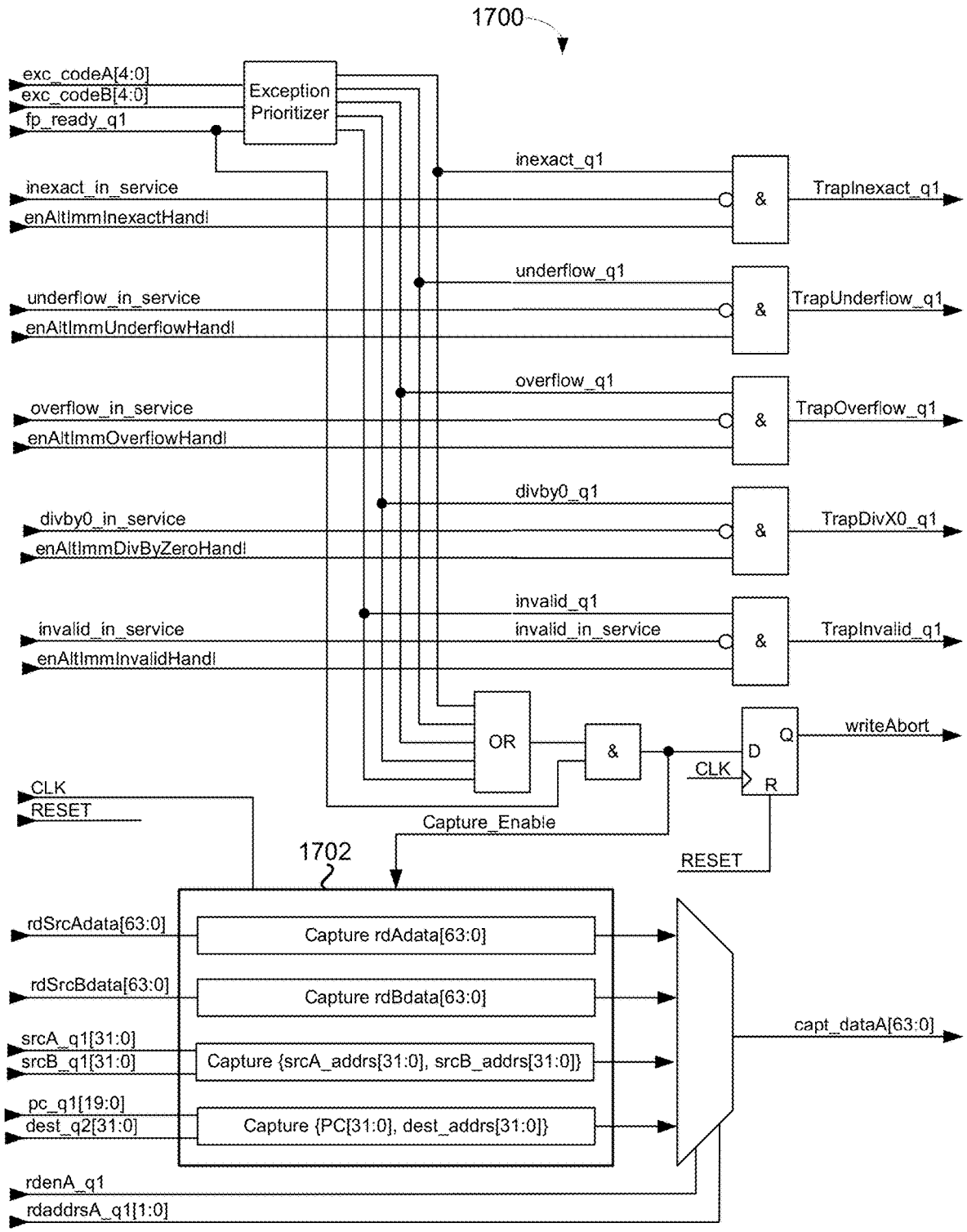
FIG. 21 is a schematic diagram illustrating an exemplary embodiment of the disclosed universal floating-point ISA's optional floating-point exception capture module.

FIG. 21 is a schematic diagram of an exemplary embodiment of the disclosed universal floating-point ISA's optional floating-point exception capture module 1700 that can be used for capturing diagnostic information related to a particular floating-point result and any exception that may be signaled when pulled from a floating-point result buffer when alternate immediate exception handling is enabled for that exception. The disclosed embodiment of the exception capture module comprises four, 64-bit registers 1702 that simultaneously capture the operator's A-side result, B-side result (if any), srcA address of the A-side operator being pulled, srcB address of the B-side operator being pulled, the PC value of the instruction that caused the pull, and the destination address of where the pulled results were to be pushed as a result of the instruction.

These 64-bit capture registers are mapped into the processor's programming model block 2000 shown in FIG. 11 and can be read in software by the exception service routine.

FIG. 21 shows, among other things, that whenever an alternate exception handler is enabled via the corresponding bits in 5090 of the STATUS Register 5000 (FIGS. 18A-18B) and a floating-point exception interrupt occurs as a result, the exception capture logic of the exception capture module kills (by way of "writeAbort") the processor's write cycle to prevent the excepted result from being written to the destination address specified in the instruction that did the pull. Instead, the pulled result is automatically captured by the capture register. This is so the exception service routine can perform a substitution, if desired, in software and then perform the write to the destination from within the service routine using the captured destination address.

Figure 22A:
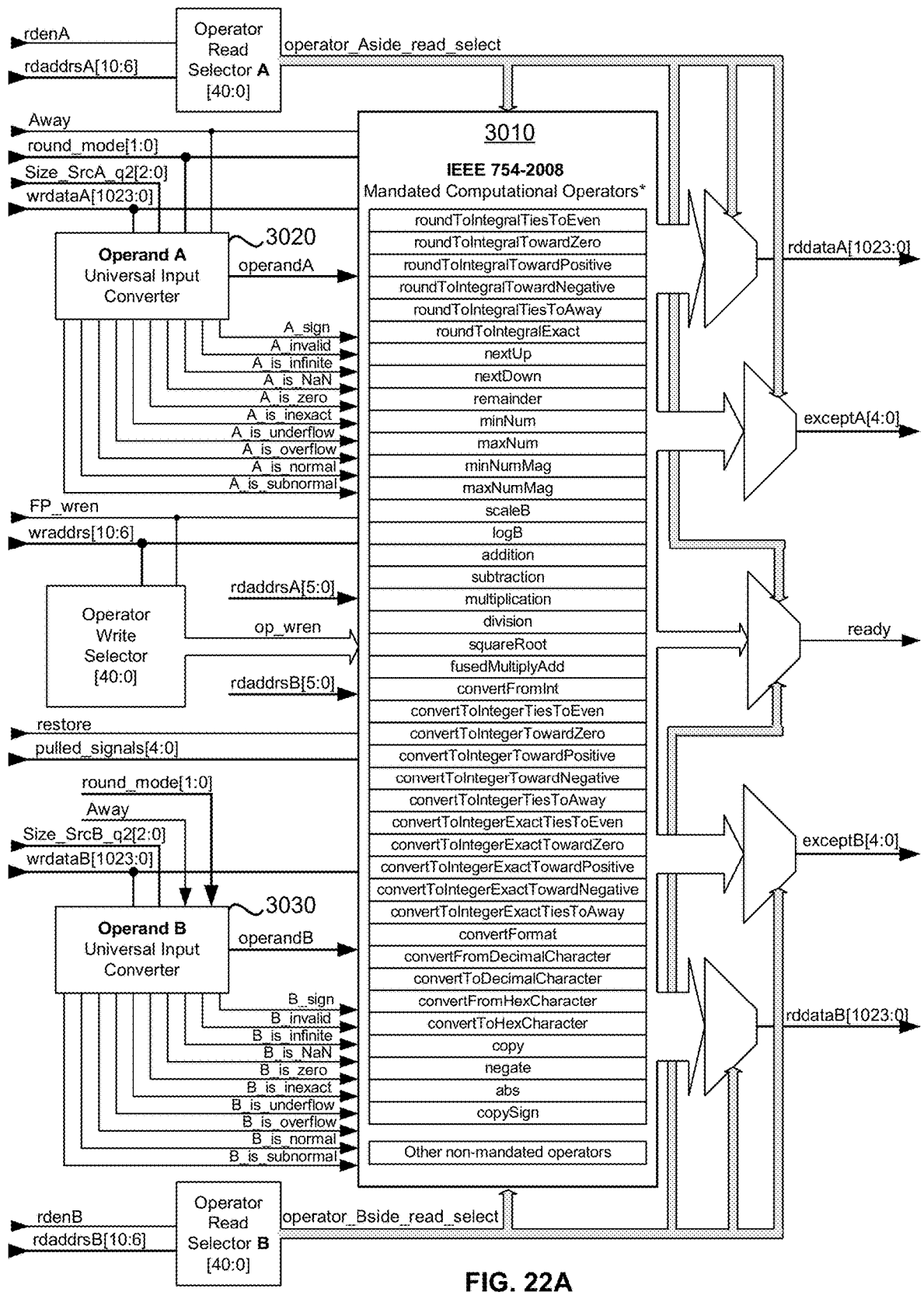
FIG. 22A is a block diagram illustrating an exemplary embodiment of the disclosed universal floating-point ISA's hardware implementation of IEEE 754-2008 mandated computational operator module showing dual operand inputs, their exception signals, dual result outputs and ready semaphore output.

FIG. 22A is a block diagram illustrating an exemplary embodiment of the disclosed universal floating-point ISA's hardware implementation of IEEE 754-2008 mandated computational operator module 3010 showing dual operand inputs, their exception signals, dual result outputs and ready semaphore output. Module 3010 implements in hardware, all the IEEE 754-2008 mandated computational operators. These operators can input and output in binary64, binary32, and binary16 formats, in any combination. The core operators can be double, single, or half precision or any floating-point operator or combination of operators that together can simultaneously accept up to 1024 bits on the A side and up to 1024 bits on the B side. Some operators can directly input decimal character sequences up to 28 decimal digits in length on both operandA and operandB simultaneously and such inputs can be mixed and matched with binary64, binary32, and binary16 formats in any combination, all without having to explicitly convert from one format to another.

In some implementations, operand A and operandB universal input converters 3020 and 3030, respectively, can convert binary16, binary32, and binary64 format numbers to FP1262 format numbers having a sign bit, a 12-bit exponent, and a 62-bit fraction. Some implementations may not need double-precision and in such cases, converters 3020 and 3030 would convert to a smaller FPxxxx format. For instance, instead of the base operators of module 3010 being FP1262 format (sufficient for computing with double-precision subnormal numbers), an application may only require the ability to compute with single-precision numbers, including their subnormal representations, thus FP928 (9-bit exponent, 28-bit fraction) operators in module 3010 would be sufficient.

In other applications, converters 3020 and 3030 not only automatically convert binary16, binary32, and binary64 numbers to the target hardware binary format of the installed hardware operators of module 3010, but also automatically convert decimal character sequences to the binary format of the installed hardware operators of module 3010.

In still other applications, there may not be any binary conversion or decimal character sequence conversions by converters 3020 and 3030 at all.

Still further, there may be some implementations where only a select few of the installed operators require the ability to directly accept mixed formats, such as, for example operandA being a binary32 representation and operandB being a H=20 decimal character sequence. In such implementations, it may be more advantageous for that operator to have its own dedicated conversion circuits embedded in that operator module.

From FIG. 22A, it can be seen that there is a rddataA bus for reading the A side of an operator's result buffer and a rddataB bus for simultaneously reading the B-side of an operator's result buffer. Such simultaneous reads for A-side and B-side can be from the same or different operators or RAM. It can also be seen that both A-side and B-side buses also comprise a 5-bit exception bus that contains the exception signals (divide-by-zero, invalid, overflow, underflow, and inexact) that were stored along with the result in the result buffer for the operator results being pulled.

Also shown is a "ready" semaphore that signals to the main processor pipeline that the result being pulled is ready. Both the A-side result and the B-side result must be complete, otherwise "ready" will be low ("0"), indicating a not-ready state, which will cause the processor's PC to rewind and make another attempt at pulling the result(s) by re-fetching and executing the instruction at the original fetch address, which will continue until a ready state is signaled as being ready.

Figure 22B:
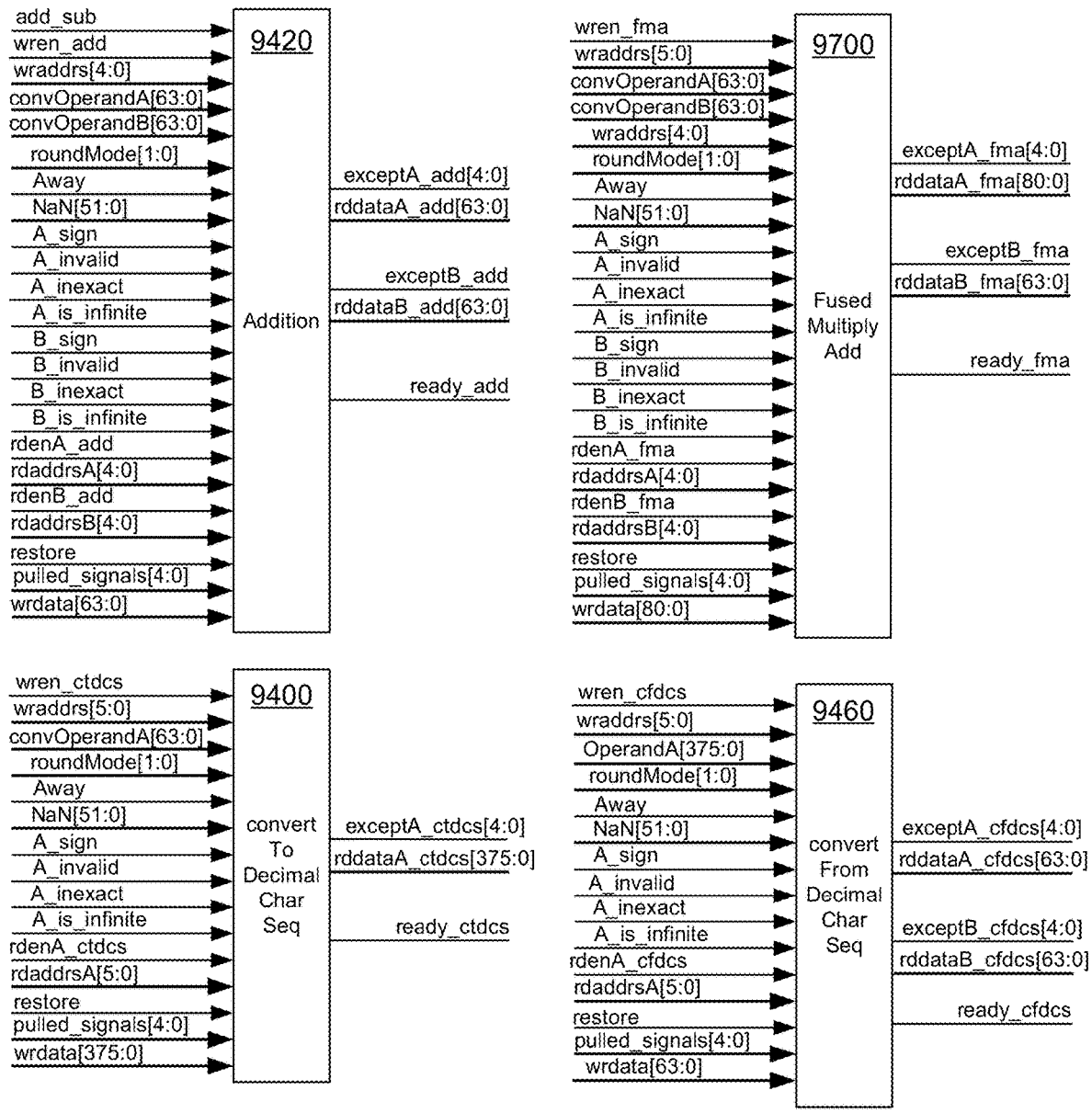
FIG. 22B illustrates exemplary memory-mapped hardware implementations of IEEE 754-2008 convertToDecimalCharacter, Addition, Fused-Multiply-Add 9440, and convertFromDecimalCharacter operator module inputs and outputs in an exemplary embodiment of the present disclosure.

FIG. 22B illustrates exemplary memory-mapped hardware implementations of IEEE 754-2008 convertToDecimalCharacter 9400, Addition 9420, Fused-Multiply-Add 9700, and convertFromDecimalCharacter 9460 operator module inputs and outputs implemented in module 3010 in an exemplary embodiment of the present disclosure. The memory-mapped floating-point operator hardware implementations are in the form of modules that can be easily and conveniently included or excluded in a particular implementation, depending on that implementation's specific requirements.

For example, one implementation may require that the parent CPU contain the full and complete repertoire of IEEE 754-2008 mandated computational and non-computational operators while any child XCUs attached to it contain only a small subset of such operators. Thus, if a given XCU will never employ a hardware "remainder" operation, for example, then logic or routing resources on the chip are not wasted implementing the remainder operation in that particular XCU.

Another example is the case where the parent CPU implements a full or partial repertoire of floating-point operators, while a first child XCU attached to it is implemented as a general-purpose micro-controller to handle a given communications protocol with the host system and, consequently, includes no floating-point hardware at all, while a second child XCU is implemented as a general-purpose fixed-point DSP for speech recognition and, consequently, includes no floating-point operators, while third and fourth child XCUs are implemented with only the floating-point hardware necessary to carry out deep learning algorithms for web-based artificial intelligence applications.

Figure 23:
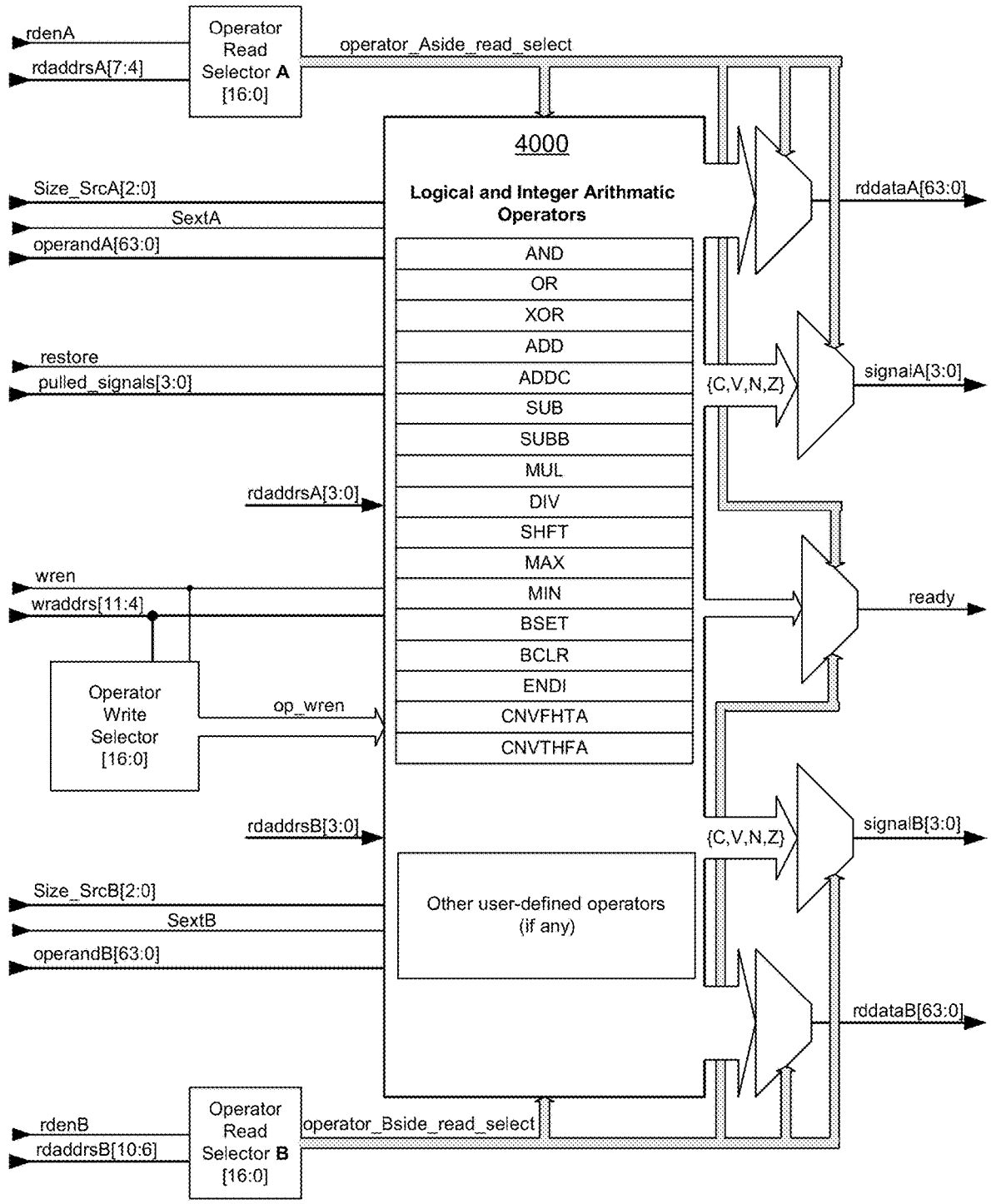
FIG. 23 is a block diagram illustrating an exemplary embodiment of the disclosed universal floating-point ISA's logical and integer arithmetic operator module illustrating dual operand inputs, their signals, dual result outputs and ready semaphore output.

FIG. 23 is a block diagram illustrating an exemplary embodiment of the disclosed universal floating-point ISA's logical and integer arithmetic operator module 4000 illustrating dual operand inputs, their signals, dual result outputs and ready semaphore output. Like the memory-mapped IEEE 754-2008 floating-point module 3010 described in conjunction with FIG. 22A, module 4000 has an A-side rddataA bus and a B-side rddataB bus and corresponding signalA and signalB bus, respectively. Note that the signal bus carries the four condition code signals (C, V, N, and Z) that were stored simultaneously with the result of the computation in the selected result buffer for that operator. Just like the floating-point module 3010, module 4000 has a "ready" semaphore indicating that the selected results are ready. Like the result buffers in the floating-point operator module 3010, the integer arithmetic and logic operator module 4000 result buffers are also fully restorable.

ConvertFromDecimalCharacter Circuit

Figure 24:
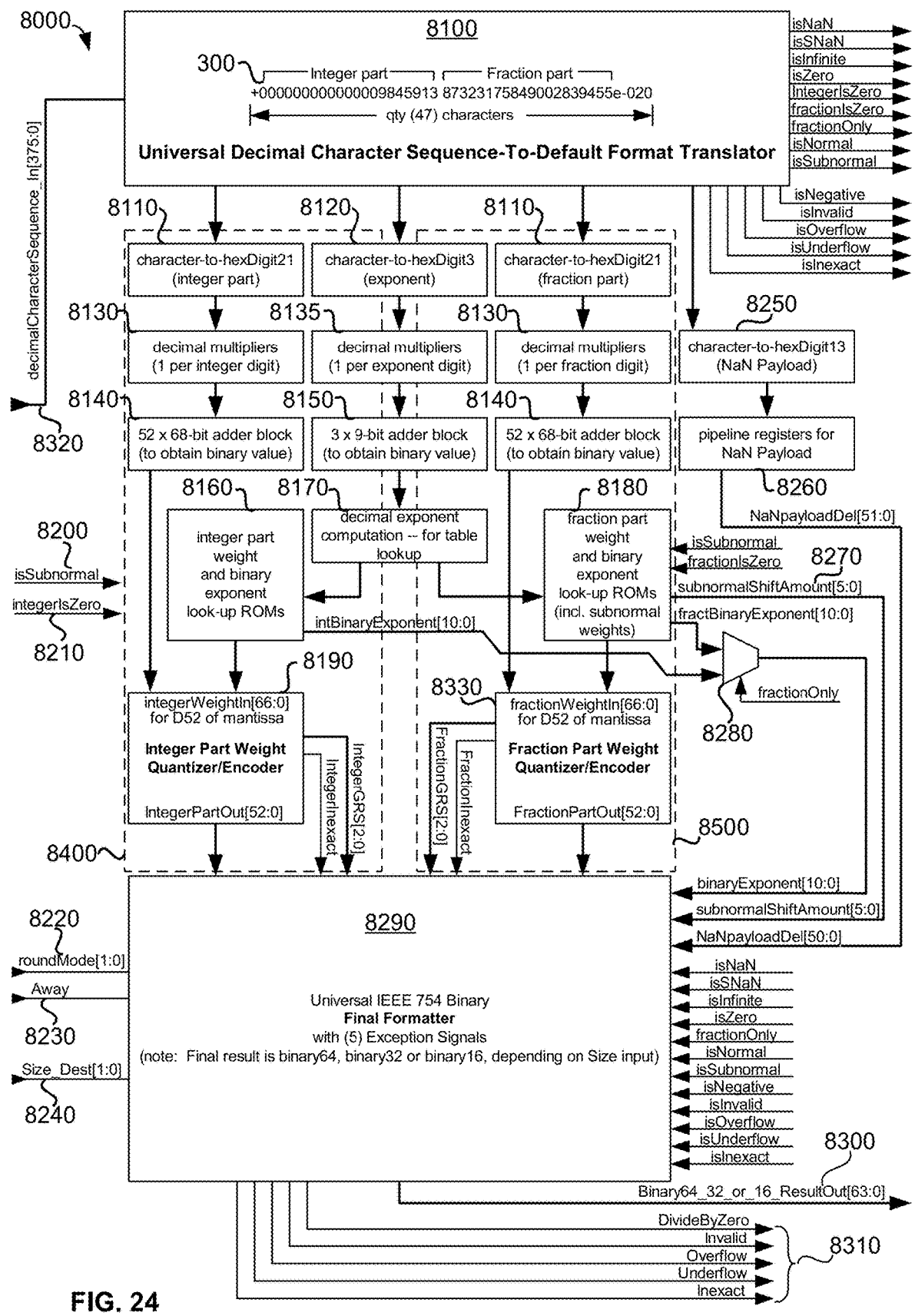
FIG. 24 is a block diagram illustrating an exemplary embodiment of the disclosed universal floating-point ISA's hardware implementation of a double-precision IEEE 754-2008 H=20+convertFromDecimalCharacter operator illustrating a virtually identical dual half-system approach.

FIG. 24 is a block diagram illustrating an exemplary embodiment of the disclosed universal floating-point ISA's hardware implementation of a double-precision IEEE 754-2008 H=20+ convertFromDecimalCharacter circuit 8000 illustrating a virtually identical dual half-system approach. The circuit converts decimal character sequence inputs 8320 up to 28 decimal digits in length to IEEE 754 binary64, binary32, or binary16 formats 8300. On the front-end is a universal decimal character sequence-to-default format translator 8100, which translates character sequence 400 (see FIG. 5) inputs to the default character sequence format 300 (see FIG. 4), the translated sequence still being in character form.

The function of the translator 8100 is to separate the integer part and the fraction part of the input character sequence 8320, placing the characters comprising such parts into their assigned default positions. The translator 8100 also translates the exponent and places it in its assigned default position 310 (FIG. 4). If the character sequence input 400 (FIG. 5) has no explicit exponent or if the input has only a token exponent, the translator 8100 creates the correct character sequence exponent for it and places it in its assigned default position within sequence format 300. In the process, the translator 8100 produces a 21-character integer part 350, a 20-character fraction part 340, a 5-character exponent (e.g., "e+009") 310, NaN input payload 510 (if any) and some exception and class-like signals (e.g., isInfinite, isZero, isInvalid, isInexact, etc.) that are propagated alongside the conversion pipeline via a series of delays for later use in determining a final result, if needed.

The circuit 8000 includes half-systems 8400 and 8500, which are virtually identical in terms of the steps and process the decimal characters comprising the integer part and the characters comprising the fraction part go thru to arrive at an encoded 53-bit floating-point mantissa, one for the integer part and one for the fraction part. In cases where the significand of the intermediate result comprises both an integer part and a fraction part, the appropriate upper bits of the integer part mantissa are concatenated with the appropriate upper bits of fraction part mantissa, for a total of fifty-three bits, with the fifty-third bit (MSB), i.e., the hidden bit, being later discarded, which is why in IEEE 754 parlance it is commonly referred to as the "hidden" bit. The process for determining and encoding the two intermediate mantissas (one for integer part and one for fraction part) are virtually identical, except for subnormal fractions, which is explained later. Block 8190 of integer half-system 8400 carries out the integer part intermediate mantissa encoding and block 8330 of the fraction part half-system 8500 carries out the fraction part intermediate mantissa encoding.

It should be understood that the exemplary circuit 8000 shown in FIG. 24 is for producing an IEEE 754-2008 "H=20" result that satisfies that standard's minimum requirement for double-precision representations, i.e., a binary64 format result with a minimum 20-decimal character representation for twenty significant digits on the character sequence input. This same process and method can be used for converting IEEE 754-2008 "H=12" (i.e., 12-significant-digit decimal character sequences) for producing a single-precision binary32 format result; IEEE 754-2008 "H=8" (i.e., 8-significant-digit decimal character sequences) for producing a half-precision binary16 format result; or virtually any "H=n" value required. This is done by simply scaling the components, such as ROMs, look up tables, adders, etc., described herein, sufficiently to produce the desired result format. In implementations that do not require double-precision capability, it is much cheaper to implement this converter as an H=12 (single-precision) circuit, because it is less than half the size of an H=20 circuit. By comparison, an H=8 (half-precision) circuit would be very small in comparison to an H=20 circuit.

Converter 8110 of the integer part half-system 8400 converts each 8-bit character comprising the 21-character integer part to a 4-bit hex digit representation. Likewise, converter 8110 of the fraction part half-system 8500 converts each 8-bit character comprising the 20-character fraction part to a 4-bit hex digit representation. The three 8-bit decimal characters representing the exponent value each get converted by converter 8120 to three 4-bit hex digit sequence that represents the exponent at this stage.

Next, the 21-hex-digit sequence of the integer part is computed by decimal multipliers 8130 of the integer part half-system to produce an equivalent binary value, according to each digit's position. For example, the least significant hex digit is multiplied by 1, the second hex digit is multiplied by 10, the third hex digit is multiplied by 100, and so on, until all twenty-one hex digits of the integer part are computed. Thus, at this stage, for the integer part, there will be twenty-one intermediate results that will eventually be added together by that half-system's adder block 8140 to compute a total binary value for the integer part. The same is done by the fraction part half-system for the twenty hex digit intermediate values of the fraction part. Likewise, for the three hex-digit intermediate representation for the exponent, decimal multipliers 8135 and adder block 8150 compute the total value of the exponent of the default format input.

At this stage, the total value of the exponent is adjusted in a decimal exponent computation block 8170 so that the adjusted exponent result can be used as a table look up index into integer part ROMs 8160 and fraction part ROMs 8180 of their respective half-systems. Rather than show a schematic for the decimal exponent computation block 8170, the actual Verilog RTL source code used for performing this adjustment in the instant implementation is included here:

```
always @(*) //for adjusting integer part exponent for look-up
    if (intIsZero) decExpForLookUp = 0;
    else if (decExp_del_2 > 38) decExpForLookUp = decExp_del_2 + 39;
    else if (|intLeadZeroDigits_q2 && expIsMinus_q2) decExpForLookUp =
        (decExp_del_2 - 20) + (20 - intLeadZeroDigits_q2);
    else decExpForLookUp = (decExp_del_2 + 20) + (20 - intLeadZeroDigits_q2);
//for adjusting fraction part exponent for look-up
wire [8:0] fractExp_q2;
assign fractExp_q2 = (intLeadZeroDigits_q2 != 21) ? 9'b0 : (decExp_del_2 - 19);
```

The original exponent value input must be adjusted because the default input format exponent is referenced relative to the last decimal digit character position of the default character sequence input format and the exponent value needed for ROM look-up needs to be referenced relative to the least significant integer part decimal character digit. Thus, in the above example RTL source code, two adjusted exponents are computed: one for the integer part weight ROM look-up and one for the fraction part weight ROM look-up.

The integer part half-system 8400 also includes two look-up table ROMs 8160. One ROM is a 67-bit by 309-entry ROM wherein each entry corresponds to the greatest weight for D52 (the hidden bit) of the previously computed integer part significand indexed by the previously-adjusted exponent value. The other look-up table ROM in 8160 comprises quantity 309-entry 11-bit unsigned biased binary exponent values corresponding to the same previously adjusted decimal exponent value used for the integer part look-up. These biased binary exponent values correspond to the greatest weight simultaneously indexed from the integer part greatest weight ROM. It should be noted here that, at this stage, twenty-one decimal digits require 67 bits to represent its value and that the 21st decimal digit of the integer part will never be greater than 1.

Block 8160 also comprises interpolation and other logic described in more detail below.

The fraction part half-system 8500 also includes four look-up table ROMs 8180 including various interpolation logic. Like the integer part ROMs 8160, a previously-adjusted decimal exponent value is used as an index into the ROM 8180 for looking up the greatest weight corresponding to that adjusted decimal exponent as well as interpolation logic, described below. Also like the integer part 8160 block, the fraction part 8180 block includes a quantity 309-entry 11-bit unsigned biased binary exponent look-up table indexed by the same adjusted decimal exponent value used to index the fraction part weights ROM.

Finally, to enable support of IEEE 754-2008 mandated subnormal numbers, ROM block 8180 also includes a separate 67-bit, 17-entry weight ROM and a 6-bit, 17-entry "shift amount" ROM for the greatest weight corresponding to, and indexed by, the adjusted fraction part decimal exponent input. The subnormal weight has its own interpolation logic, explained later. In the case of subnormal fractions, since the binary exponent is always zero, the subnormal shift amount specifies the number of places the subnormal result is to be shifted right to denormalize the final result according to the adjusted decimal exponent input.

From ROM block 8160, the interpolated 67-bit integer part weight for D52 (the hidden bit) of the integer part mantissa then enters the integer part quantizer/encoder block 8190, while the integer part unsigned and unbiased binary exponent value from the integer part look-up table enters a first input of result exponent selector 8280.

At the same time, from ROM block 8180, the interpolated 67-bit fraction part weight for the MSB of the fraction part mantissa enters the fraction part quantizer/encoder block 8330, while the fraction part unsigned and unbiased binary exponent value from the fraction part look-up table enters a second input of the exponent selector 8280. It can be seen that if the original character sequence is fraction-only (i.e., the integer part is zero), then 8280 selects the fraction part exponent as the binary exponent for the final result. If the original character sequence comprises a non-zero integer part, then the integer part binary exponent is selected as the final result binary exponent.

Logic in circuit 8000 determines whether the original character sequence input is subnormal. If so, isSubnormal 8200 is asserted to logic "1" to indicate that the input is subnormal. If the integer part of the character sequence input is zero then integerIsZero 8210 is asserted to logic "1" to indicate that the integer part is zero. If input 8200 indicates a subnormal input or 8210 indicates the integer part is zero, the integer part weight and exponent ROM block 8160 outputs 0 for each. If the fraction part is zero, 8180 outputs zero for the fraction part weight and exponent.

To handle NaNs, converter 8250 converts the ASCII hex characters ("0" thru "F") of the NaN's payload to 4-bit equivalent hex values. These are, in turn, delayed by use of pipeline registers 8260 to maintain coherency for later use by a Universal IEEE 754 final formatter 8290.

As the final stage, Universal IEEE 754 binary final formatter 8290 receives the computed intermediate 53-bit mantissa for the integer part from integer part half-system 8400, which also supplies a Integerinexact signal and three integer GRS bits (IntegerGRS[2:0]) to the final formatter 8290. Likewise, fraction part half-system 8500 supplies a computed intermediate 53-bit mantissa, fraction inexact signal (Fraction Inexact) and three fraction GRS bits (FractionGRS[2:0]) to the final formatter 8290.

Here it should be understood that if the integer part is not zero and the binary exponent from ROM block 8160 is within a range so that there could also be a fraction part, the integer part will always be exact. Stated another way, the integer part inexact signal can only be active in the range of exponents that have no fraction part. Similarly, if the integer part is zero, then the final result will be fraction-only (assuming the result is not zero, NaN, etc.). Thus, if the decimal character sequence contains a non-zero fraction, then the fraction inexact signal will be used; otherwise, the integer inexact signal will be used for producing the final inexact exception signal in signal group 8310. DivideByZero in signal group 8310 will always be 0. The final output states of exception signals Invalid, Overflow, and Underflow depend on what happened in the translation process of translator 8100. Additionally, Overflow also depends on whether or not the directed rounding step in the final formatter 8290 caused the intermediate result of the final formatter to overflow.

The integer part GRS bits are used for directed rounding of the integer part. If the final result has a non-zero fraction part, the integer part GRS bits will always be {0, 0, 0}, meaning the integer part in such cases will always be exact and the fraction part GRS bits are used for directed rounding of the final result.

The final formatter 8290 uses inputs roundMode[1:0] 8220, Away 8230 (if active), Size_Dest[1:0] and all the other inputs shown to do the final formatting to the IEEE 754 binary format specified by the size input 8240. If size="01", then a binary16 format representation is output with forty-eight zeros padded in the most significant bits to create a 64-bit result 8300. If size is ="10", then a binary32 format representation is output with thirty-two zeros padded in the most significant bits. If size="11" then a 64-bit binary64 format representation is output.

If the decimal character sequence input is integer-only, then IntegerPartOut[51:0] is used as the mantissa for the unrounded intermediate result. If the decimal character sequence input is fraction-only and not subnormal, then Fraction PartOut[51:0] is used as the mantissa for the unrounded intermediate result.

If the decimal character sequence input comprises both a non-zero integer part and a non-zero fraction part, i.e., the interpolated binary exponent of ROM block 8160 is less than 52, then n most-significant bits (not counting the hidden bit) of the integer part intermediate mantissa and 52-n most significant bits (counting the hidden bit) of the fraction part intermediate mantissa are concatenated to form the mantissa of the unrounded result. Here, n is the interpolated binary exponent value from ROM block 8160.

For subnormal fraction-only numbers, there is no "hidden" bit, meaning bit 52 of the mantissa becomes visible and will occupy bit position 51 of the unrounded result for subnormal numbers having a decimal exponent of −308, meaning the fraction part mantissa is shifted right one bit position to appropriately denormalize it. For subnormal numbers having a decimal exponent of less than −308, e.g. −309, −310, etc., more shifts are required for proper denormalization of the unrounded result mantissa. The subnormal shift amount is supplied by the subnormal shift amount look-up ROM 8180, which is indexed by the previously adjusted decimal exponent of the decimal exponent computation block 8170.

Figure 25:
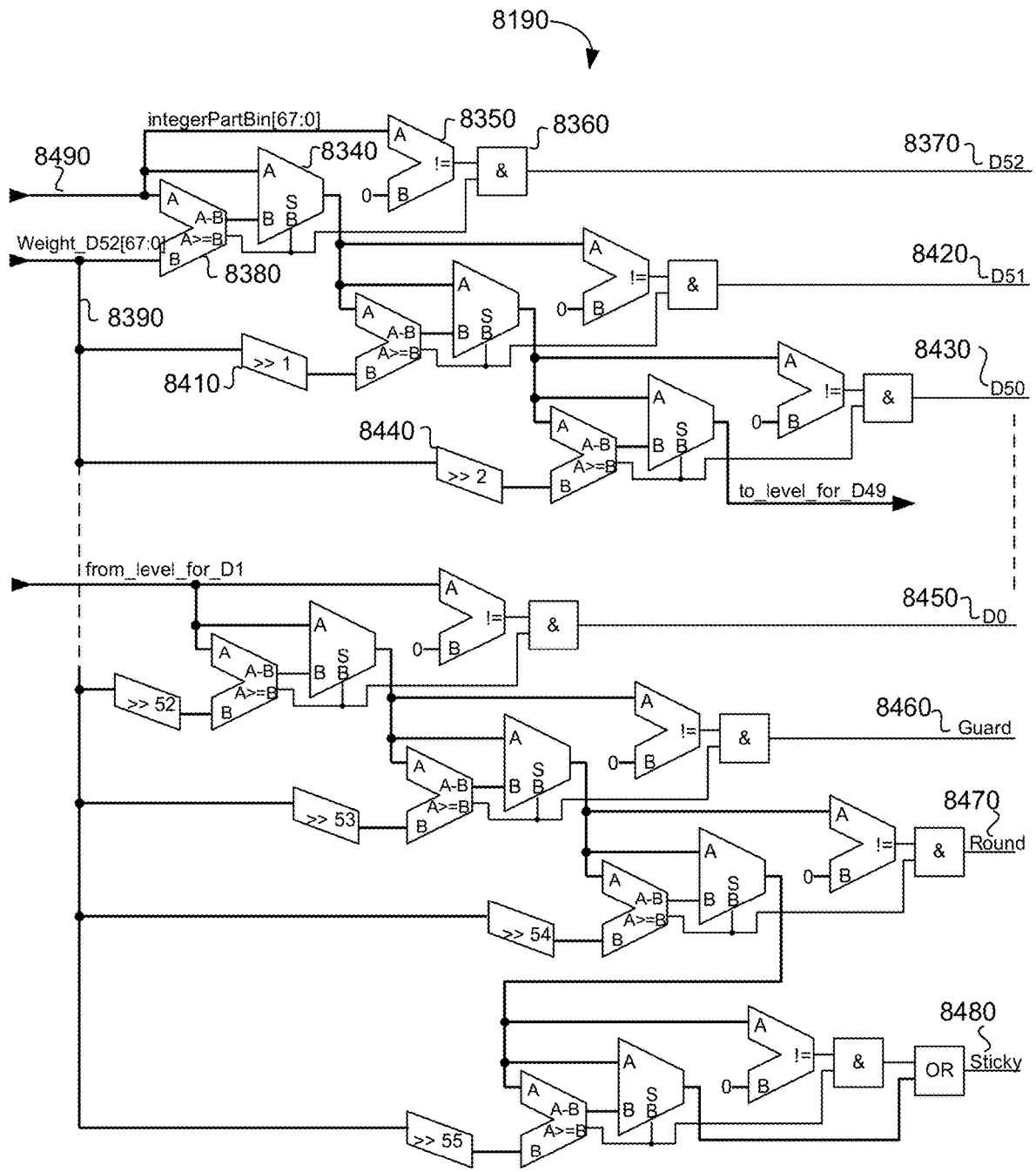
FIG. 25 is a schematic diagram illustrating an exemplary embodiment of a circuit employed by the integer part quantizer/encoder of FIG. 24 to compute/encode the integer part intermediate mantissa.

FIG. 25 is a schematic diagram illustrating an exemplary embodiment of a circuit employed by the integer part quantizer/encoder 8190 of FIG. 24 to compute/encode the integer part intermediate mantissa using a first input 8490 and a second input 8390. The circuit includes subtractors, comparators, and shifters arranged in series with the level that immediately follows the previous level.

With reference to FIGS. 24 and 25, the first level receives the first input (integerPartBin[67:0]) 8490, which carries the binary value computed by the adder block 8140. The second input (Weight_D52[67:0]) 8390, is the weight received from the ROM block 8160. This interpolated weight corresponds to the weight value for the most significant bit for the interpolated binary exponent computed by the decimal exponent computation block 8170.

Next, the Weight_D52[67:0] is subtracted from the integerPartBin[67:0] with the result of such subtraction entering the B input of data selector 8340 while the integerPartBin[67:0] enters the A input of the data selector 8340. If it is determined at subtractor/comparator 8380 that the the integerPartBin[67:0] is greater than or equal to the Weight_D52 [67:0], then the subtracted value propagates to the next level subtractor/comparator A input. Otherwise, the unsubtracted value of the previous subtractor/comparator A input propagates to the next level subtractor/comparator A input. First level comparator 8350 tests to see if the first level input binary value is not equal to 0. AND gate 8360 will yield a logic one for integer part intermediate mantissa bit D52 8370 if the integerPartBin[67:0] is greater than or equal to the looked-up and interpolated Weight_D52[67:0], but only if the integerPartBin[67:0] is not zero.

This same process continues for the next sequential level for determining the logic state of integer part intermediate mantissa bit D51 8420, except for the B input of that level's subtractor, the looked-up and interpolated weight 8390 is divided by two using a logic right shift of one bit. Thus, except for the divide by two of the B input for that level, the logic for determining the logic state of the corresponding intermediate mantissa bit is identical to the that of the level that preceded it.

Note that for each next level B input to that level's subtractor, the number of shifts increases by one. Thus for the level that determines the state of D50 8430, the B input to that level's subtractor, the weight 8390 must be divided by 4, which is two shifts to the right as shown in 8440. This same logic, except for the number of shifts that increases by 1 for each subsequent level, continues down past D0 8450 and includes the same logic for determining the state of the integer part guard, round, and sticky bits 8460, 8470, and 8480, respectively. The integer part guard, round, and sticky bits are used by the final formatter 8290 (FIG. 24) for directed rounding. Note that the logic for determining the state of the sticky bit 8480 is slightly different than the logic in the levels that precede it, in that it includes an OR gate at the end that drives the sticky bit 8480. The purpose of this OR gate is to ensure that if there is a remainder after all the subtractions that precede it, the sticky bit will reflect this condition. Thus, if guard bit 8460, round bit 8470, or sticky bit 8480 are ever a logic "1", the integer part intermediate result is inexact.

Figure 26:
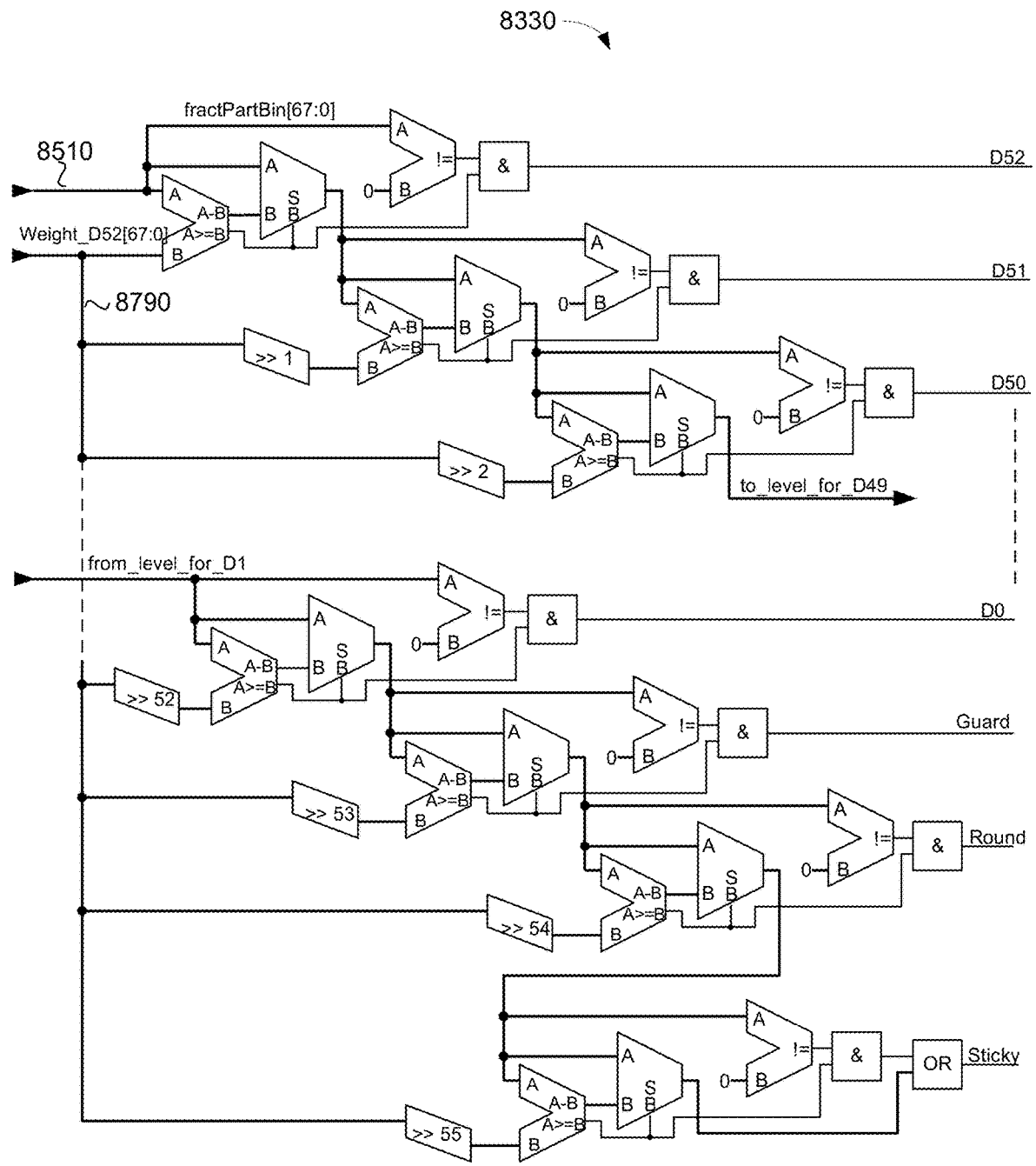
FIG. 26 is a schematic diagram of an exemplary embodiment of a circuit employed by the fraction part quantizer/encoder of FIG. 24 to compute/encode the fraction part intermediate mantissa.

FIG. 26 is a schematic diagram of an exemplary embodiment of a circuit employed by the fraction part quantizer/encoder 8330 of FIG. 24 to compute/encode the fraction part intermediate mantissa using a first input 8510 and a second input 8790. The circuit includes subtractors, comparators, and shifters arranged in series with the level that immediately follows the previous level.

The illustrated circuit is identical to the integer part circuit shown in FIG. 25, except for the inputs. The first level receives the first input (fractPartBin[67:0]) 8510, which carries the binary value computed by the fraction part adder block 8140. The second input (Weight_D52[67:0]) 8790, is the weight received from the ROM block 8180. This interpolated weight corresponds to the weight value for the most significant bit for the interpolated binary exponent computed by the decimal exponent computation block 8170. Like the integer part 8190 circuit (FIG. 25), the fraction part (FIG. 26) computes its own guard, round, and sticky bits.

FIGS. 25 and 26 and certain others in this disclosure do not explicitly show pipeline registers for storing intermediate results, but they are there in the circuit. For example, in both FIGS. 25 and 26, there is a rather large register that temporarily holds the intermediate results of the D52, D51, and D50 bits computation, the input weight, the fraction part binary input value, and the like. With respect to these first three levels of logic, this could be called "stage 1" for that part of the circuit. A second rather large register would then temporarily hold the intermediate results of D52(stage 1), D51(stage 1), D50(stage 1), D49, D48, D47 bits computation, etc., which could be called "stage 2", and so on. Thus the pipelines of FIGS. 25 and 26 would be roughly 18 stages deep if intermediate results are registered every three levels/bits of computation. Registers are not explicitly shown here because an implementor will more likely than not want to re-time the operator to clock faster (by registering every two levels instead of three) or re-time the operator to clock slower by registering every four levels instead of three. Re-timing to clock faster will be at the expense of more registers. Re-timing to run slower, frees up registers. It should be understood that the main processor is just a push-pull shell whose pipeline is completely decoupled from the pipelines of any installed operators in its memory map. Thus the implementer is free to decide whether to re-time (and by how much) a given operator.

Figure 27:
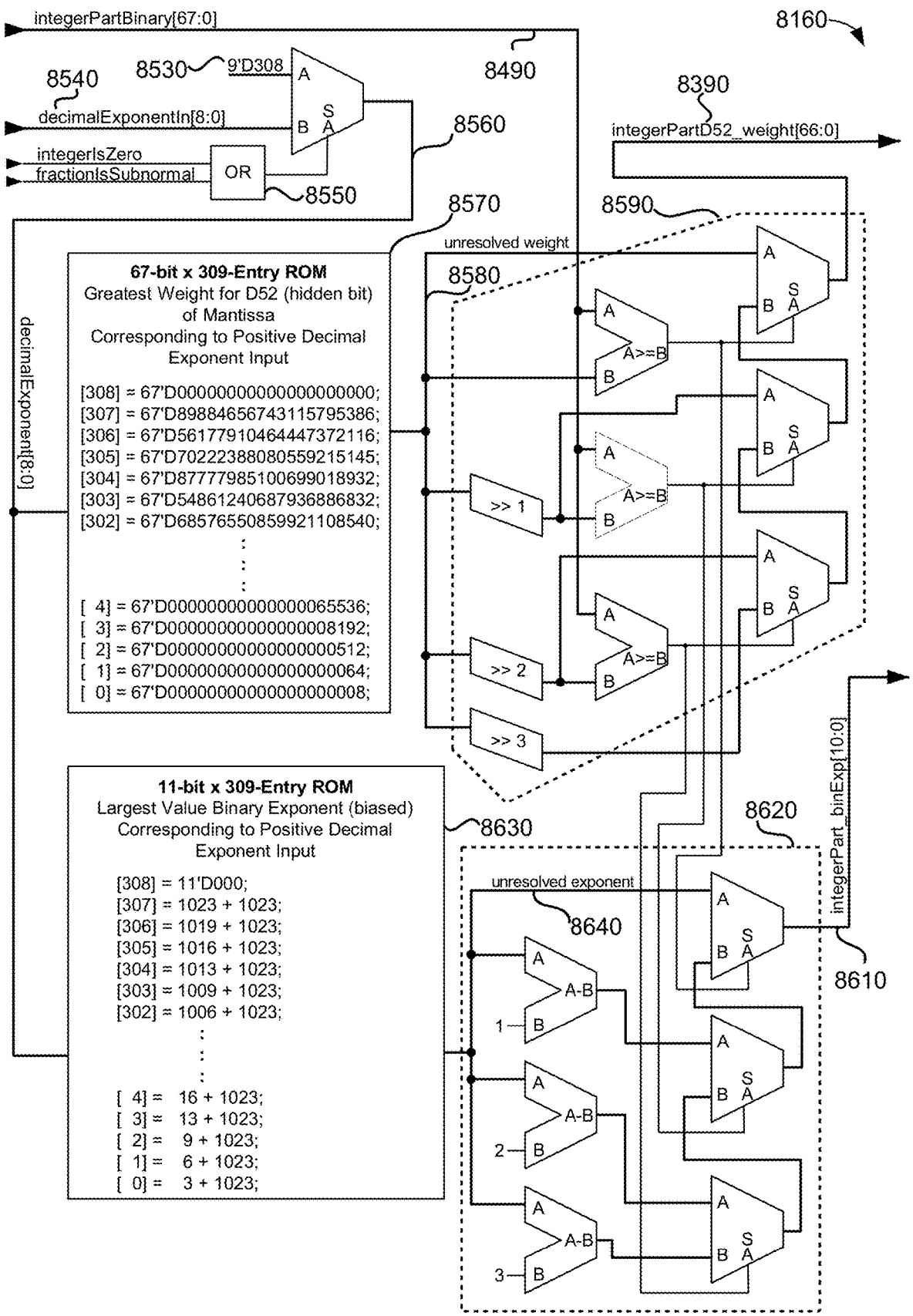
FIG. 27 is a schematic diagram illustrating an exemplary embodiment of the disclosed universal floating-point ISA's convertFromDecimalCharacter operator's look-up ROMs for the integer part, showing the interpolation method for determining the weights and binary exponents derived from a decimal exponent input obtained from the original decimal character sequence input.

FIG. 27 is a schematic diagram illustrating an exemplary embodiment of the disclosed universal floating-point ISA's convertFromDecimalCharacter operator's look-up ROMs 8160 for the integer part, showing the interpolation method for determining the weights and binary exponents derived from a decimal exponent input obtained from the original decimal character sequence input. FIG. 27 shows, among other things, an excerpted 67-bit×309-entry look-up ROM 8570 holding the greatest weight for D52 (hidden bit) of integer part intermediate mantissa that corresponds to the adjusted decimal exponent input, the unresolved weight 8580 output of which is fed into an interpolation circuit 8590 that interpolates a 67-bit integer part D52 weight based on a integer part binary value 8490 and a decimal exponent 8560.

Input 8540 is the previously adjusted 9-bit decimal exponent that is fed into a selector so that when the integer part being input is zero or the fraction part is subnormal as detected by OR gate 8550, the decimal value 9'D308 (8530) is substituted for decimalExponentIn 8540. In the weight look-up ROM 8570, the weight residing at address "[308]" is 0 (67'D00000000000000000000).

If the decimal exponent input value 8560 is 9'D307, then the weight residing at location "[307]" in ROM 8570 (i.e., 67'D89884656743115795386) will be output on 8580. The weights output on 8580 are the greatest weight for integer part intermediate mantissa D52 and are unresolved at this point. These weights are unresolved at this point because the unbiased exponent 8560 used to look up the unresolved weight 8580 is decimal and, as such, there could be three or four binary exponents (and thus weights) that correspond to that same decimal exponent. To compute a correct weight corresponding to a decimal exponent input using ROM look-up table 8570, the instant invention employs an interpolation circuit 8590, which resolves a correct weight for the integer part by first comparing the integer part binary value 8490 with unresolved weight 8580. If the integer part binary value 8490 is greater than or equal to the unresolved weight 8580, then the unresolved weight 8580 becomes resolved and is selected as the integer part D52 weight 8390.

If the integer part binary value 8490 compares less than unresolved weight 8580, then unresolved weight 8580 is divided by two using a single right shift as shown in the interpolation circuit 8590. This first scaled weight is then compared with the integer part binary value 8490 to determine if the integer part binary value is greater than or equal to it. If so, the first scaled weight is selected to be output as 8390. If not, the integer part binary value 8490 is compared with a second scaled weight, the second scaled weight being the unresolved weight 8580 divided by four using two right shifts. Another comparison is made using the second scaled weight and if the integer part binary value 8490 is greater than or equal to the second scaled weight, then the second scaled weight is selected as the 8390 output. Otherwise, a third scaled weight is selected as the 8390 output, this third scaled weight being unresolved weight 8580 divided by eight using three right shifts.

Look-up ROMs 8160 also include an 11-bit×309 entry ROM 8630 containing the largest value biased binary exponent corresponding to the previously adjusted decimal exponent 8560, along with interpolation logic 8620 to determine the correct binary exponent 8610 according to the decimal exponent 8560 and the integer part binary value 8490. As shown, unresolved biased binary exponent 8640 is looked-up from entry ROM 8630 using the previously adjusted decimal exponent 8560 as an index simultaneously and in same manner as the unresolved weight 8580. Exponent interpolation circuit 8620 computes a resolved binary exponent by simultaneously subtracting 0, 1, 2, and 3 from the unresolved biased binary exponent 8640, the result of each subtraction going to a selector that selects the correct biased binary exponent 8610 using the results of comparisons from interpolation circuit 8590 as the input selector, such that unresolved exponent 8640 is resolved as the correct binary exponent 8610 and correctly corresponds to the correct integer part D52 weight 8390.

Figure 28A:
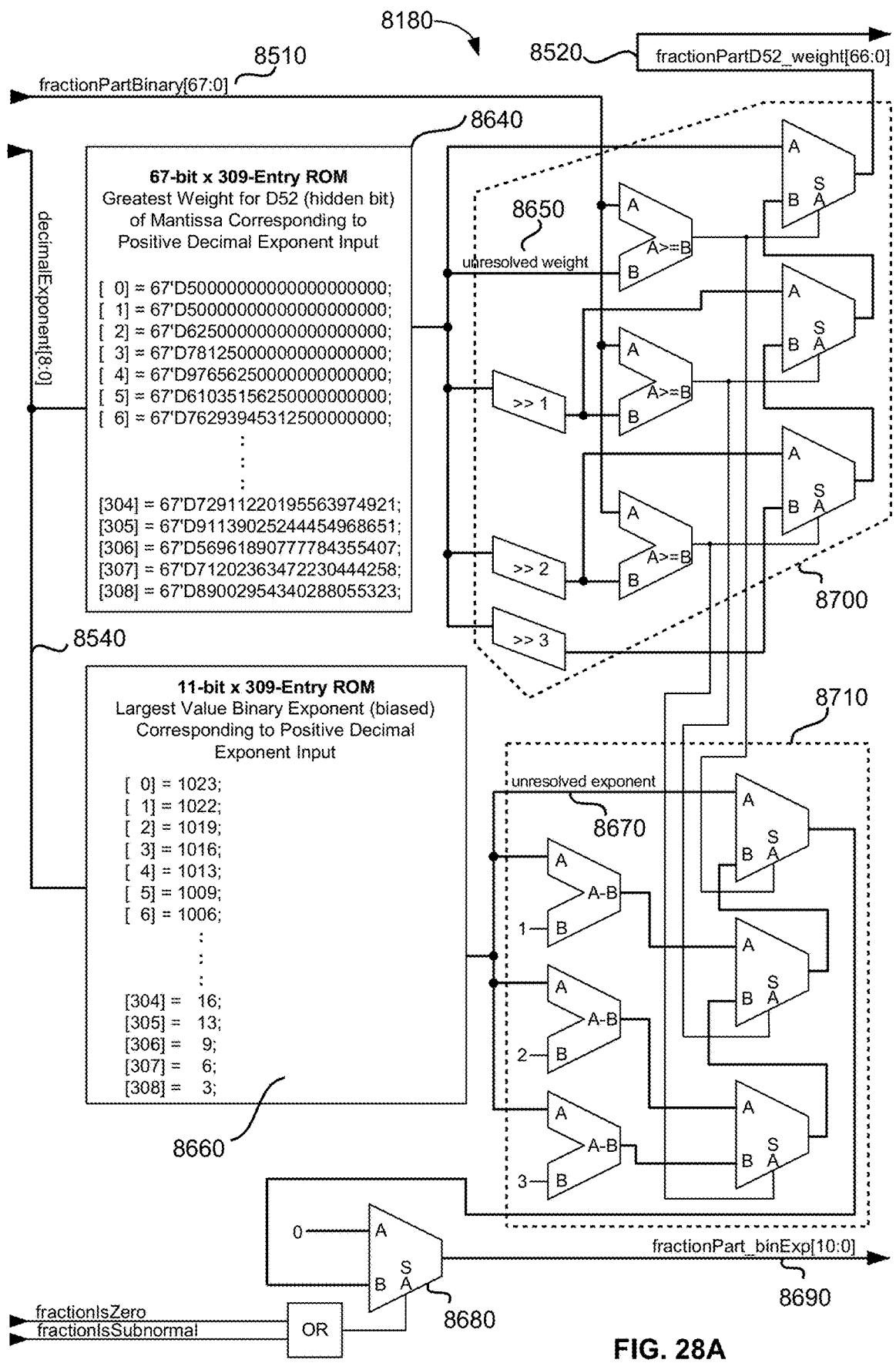
FIG. 28A is a schematic diagram illustrating an exemplary embodiment of the disclosed universal floating-point ISA's convertFromDecimalCharacter operator's look-up ROMs for the fraction part, illustrating the interpolation method for determining the weights and binary exponents derived from a decimal exponent input obtained from the original decimal character sequence input.

FIG. 28A is a schematic diagram of the disclosed processor's convertFromDecimalCharacter operator's look-up ROMs 8180 for the fraction part 8500, illustrating the interpolation method for determining the weights and binary exponents derived from a decimal exponent input obtained from the original decimal character sequence input. The fraction part ROM block 8180 is essentially the same in function as the integer part ROM block 8160, except for the actual contents of their respective ROMs and additional logic 8680 in the fraction part ROM block, which substitutes a 0 for the binary exponent resolved by interpolation logic 8710, such substitution occurring when the fraction part character sequence is zero or subnormal. Fraction part D52 weight output 8520 is resolved from unresolved weight 8650 by interpolation circuit 8700 in the same manner the integer part D52 weight is resolved. The fraction part's greatest weight look-up ROM begins with the 67-bit (20-decimal-digit) value "50000000000000000000" corresponding to the biased decimal exponent of 0 used to index into ROM 8640. "50000000000000000000" is the greatest weight for the fraction part intermediate mantissa D52 when decimal exponent 8540 is 0 or 1. If the decimal exponent 8540 is 2, then the unresolved weight 8650 is "62500000000000000000" and so on. Likewise, the fraction part binary exponent ROM 8660 outputs an unresolved exponent 8670 based on the decimal exponent 8540 as index into ROM 8660. Fraction part exponent interpolation circuit 8710 resolves the correct binary exponent based on the fraction part binary value 8510 and the decimal exponent 8540 as inputs, with such being substituted with a zero if the fraction part character sequence input is zero or subnormal.

Figure 28B:
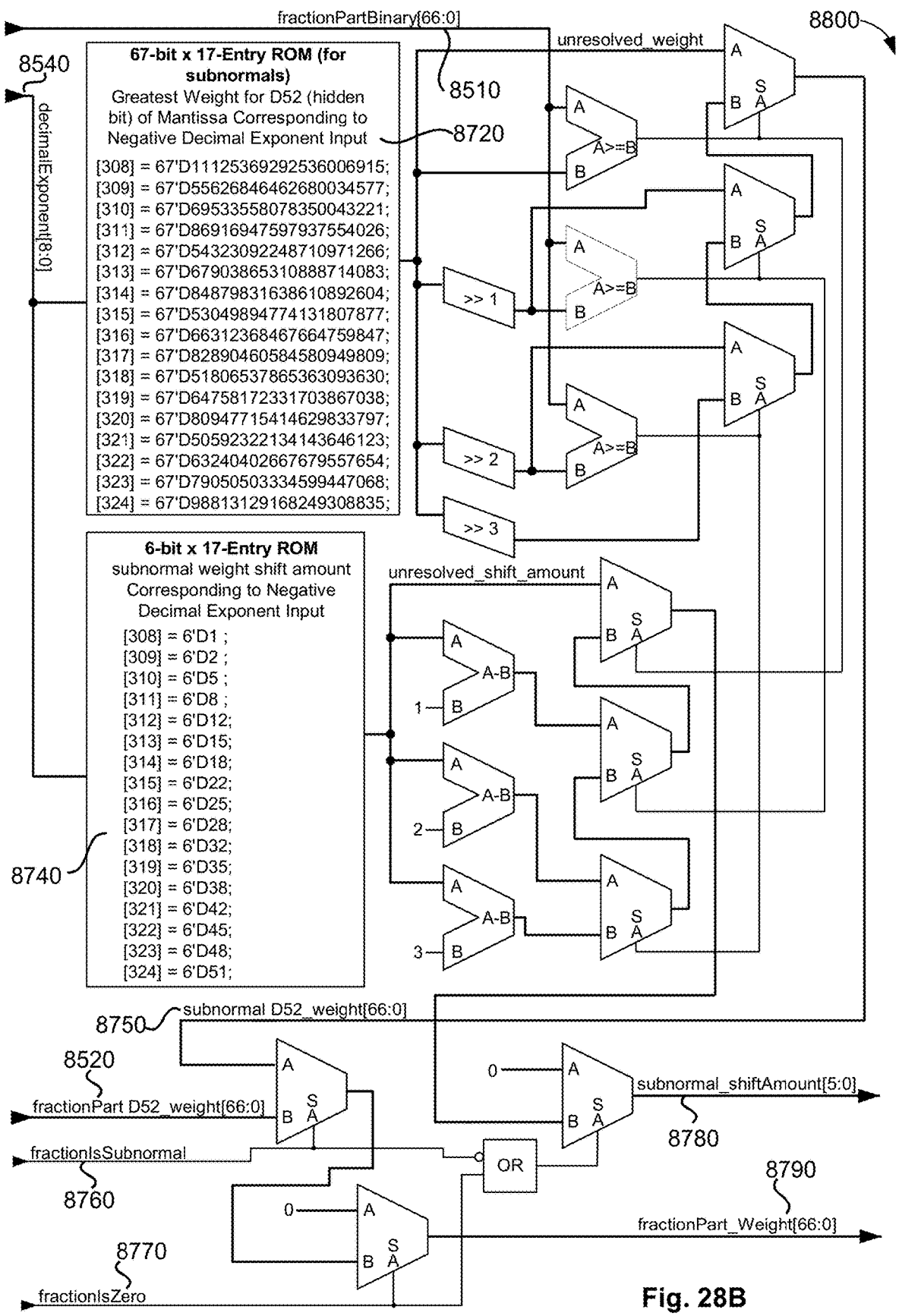
FIG. 28B is a schematic diagram illustrating an exemplary embodiment of the disclosed universal floating-point ISA's convertFromDecimalCharacter operator's look-up ROMs for the fraction part subnormal exponent inputs, illustrating the interpolation method for determining the weights and binary exponents derived from a decimal exponent input obtained from the original decimal character sequence input.

FIG. 28B is a schematic diagram illustrating an exemplary embodiment of the disclosed universal floating-point ISA's convertFromDecimalCharacter operator's look-up ROMs 8180 for the fraction part subnormal exponent inputs, illustrating the interpolation method for determining the weights and binary exponents derived from a decimal exponent input obtained from the original decimal character sequence input. IEEE 754-2008 mandates operability with subnormal numbers. To satisfy this requirement, circuit 8800 includes two additional but much smaller ROMs (8720 and 8740), along with an interpolation circuit.

As shown, when the fraction part character sequence input is zero as indicated at 8770, the fraction part weight output 8790 is also zero. If the fraction part character sequence input is subnormal as shown at 8760, the interpolated subnormal weight 8750 is output as the fraction part weight 8790, otherwise fraction part D52 weight 8520 is output at 8790.

Because the "binary" exponent for all subnormal numbers is 0, a shift amount must be looked-up and interpolated in the same way as the unresolved exponent of 8670, i.e., using the decimal exponent 8540 as an index into shift amount ROM 8740. In the case of subnormal numbers, the computed intermediate fraction part result must be denormalized by right-shifting the entire 53-bit fraction part mantissa by the number of bit positions determined by the decimal exponent 8540. For example, for a decimal exponent of −308, the computed intermediate fraction part mantissa must be right-shifted one bit position to the right to denormalize it. For a decimal exponent of −309, it must be shifted right two bit positions, etc. If the fraction part character sequence input is not subnormal the subnormal shift amount 8780 will be 0, otherwise the interpolated shift amount from the shift amount ROM 8740 will be output at 8780.

At this point, the formation of the final result should be straightforward: concatenate the sign of the decimal character sequence sign with the 11-bit binary exponent and final mantissa formed as previously described. For normal numbers, if the decimal character sequence input is fraction-only, then the interpolated fraction part binary exponent 8690 is used as the exponent, otherwise the integer part binary exponent 8610 is used as the exponent. If the decimal character sequence input is subnormal, then the binary exponent is zero and the final mantissa is denormalized by shifting it right the number of bits specified in the interpolated shift amount 8780, then correctly rounded using the fraction part's GRS bits described earlier.

ConvertToDecimalCharacter

Figure 29:
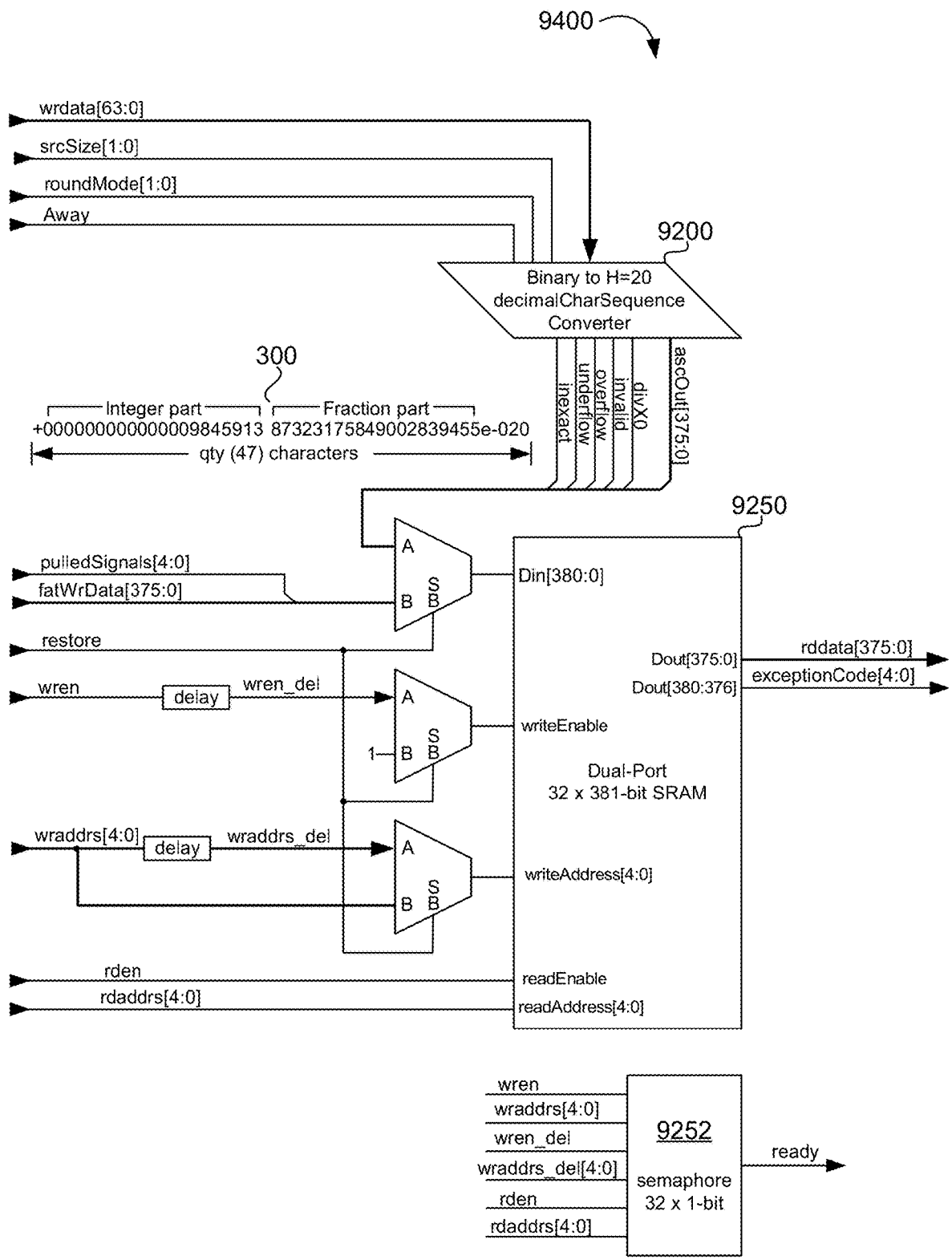
FIG. 29 is a block diagram illustrating an exemplary embodiment of the disclosed universal floating-point ISA's hardware implementation of a stand-alone, fully pipelined, memory-mapped H=20+ convertToDecimalCharacter component/module mandated by IEEE 754-2008.

FIG. 29 is a block diagram illustrating an exemplary embodiment of the disclosed universal floating-point ISA's hardware implementation of a stand-alone, fully pipelined, memory-mapped H=20+ convertToDecimalCharacter component/module 9400 that performs the "convertToDecimalCharacter" operation mandated by IEEE 754-2008 (the standard), including 32-entry by 381-bit SRAM result buffer, restore capability, and ready semaphore. Features of the disclosed embodiment not mandated by the standard include universal binary format input and quantity (32) fully restoreable result buffers into which results automatically spill.

A binary64 to H=20 decimal character sequence converter 9200 accepts as input, binary16, binary32, or binary64 formatted numbers and converts them into the default decimal character sequence format 300 (see FIG. 4) before being automatically stored into result buffer 9250. As shown, result buffer 9250 may be a 32-entry by 381-bit, dual-port SRAM, which is wide enough to accept and/or read out a 47-character sequence and the five exception bits every clock cycle.

Like all the other operators whose pipeline depth is greater than one clock, it has a semaphore memory 9252 that produces a ready signal when the selected result is selected for reading. If the result being selected is not yet complete, then the ready signal for it will remain low "0" when being referenced, otherwise it will be high "1" if ready/complete.

Figure 30:
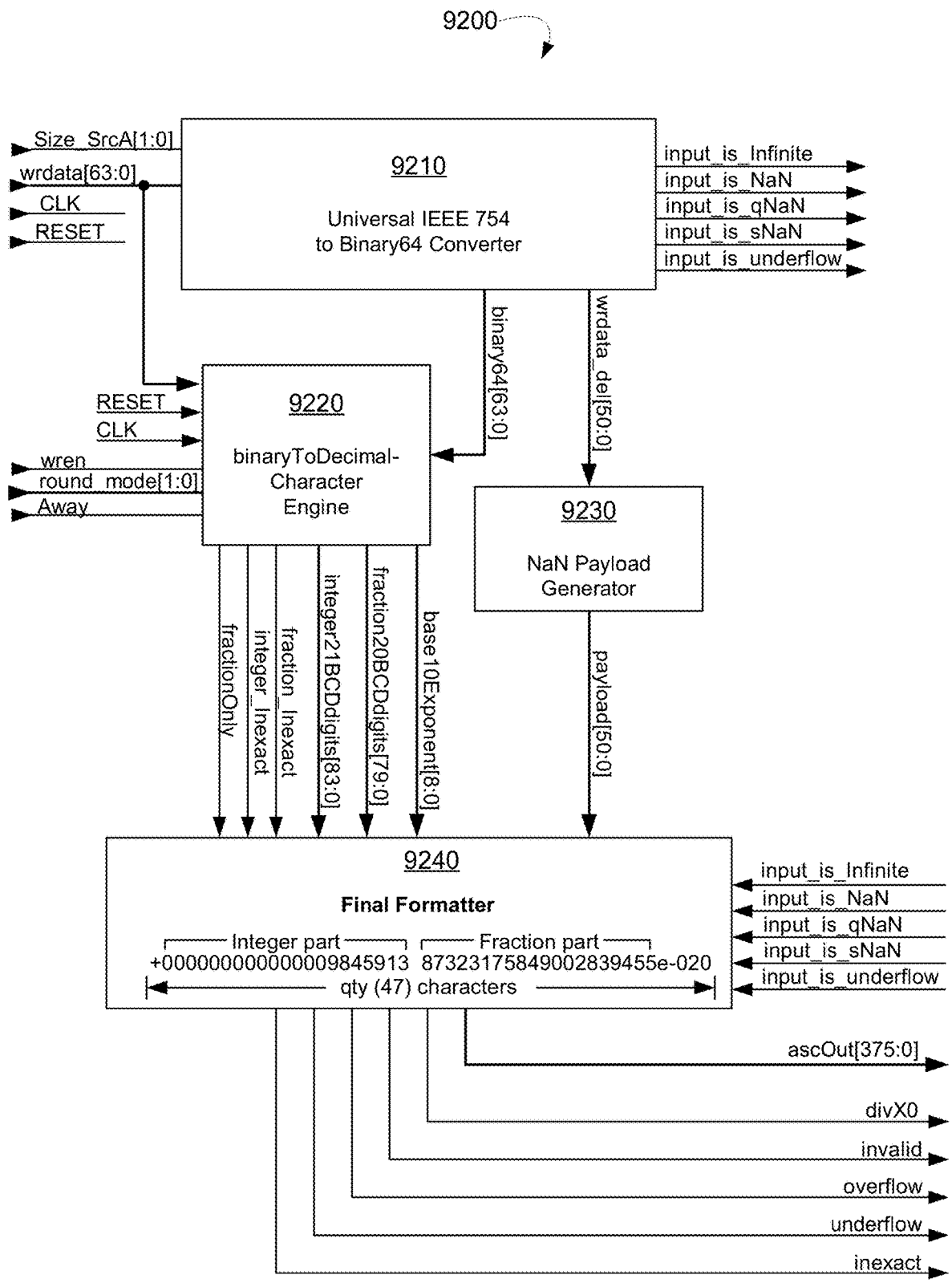
FIG. 30 is a block diagram illustrating an exemplary embodiment of the binary64 to H=20 decimal character sequence converter of FIG. 29.

FIG. 30 is a block diagram illustrating an exemplary embodiment of the binary to H=20 decimal character sequence converter 9200 of FIG. 29. The converter includes a universal IEEE 754 to binary64 converter 9210, a fully pipelined binary-to-decimal-character conversion engine 9220, NaN payload generator 9230, and final formatter 9240 that formats the decimal character sequence intermediate result into the default format 300 and, if appropriate, asserts exceptions invalid, overflow, underflow, and/or inexact, with divX0 always remaining "0".

The binary-to-decimal-character conversion engine 9220 produces a 21-character integer part, a 20-character fraction part, a 9-bit base-10 exponent, a fraction-only signal, a integer inexact signal, and a fraction inexact signal. The NaN payload generator 9230 simply propagates the payload of any NaNs entering the operator for later use by the final formatter 9240. Note that the "input_is_ . . . " signals from the universal IEEE 754 to binary64 converter 9210 are delayed so as to walk alongside the pipeline of the converter's intermediate results so that they are presented to the final formatter 9240 simultaneously with the output of the binary-to-decimal-character conversion engine 9220.

Figure 31:
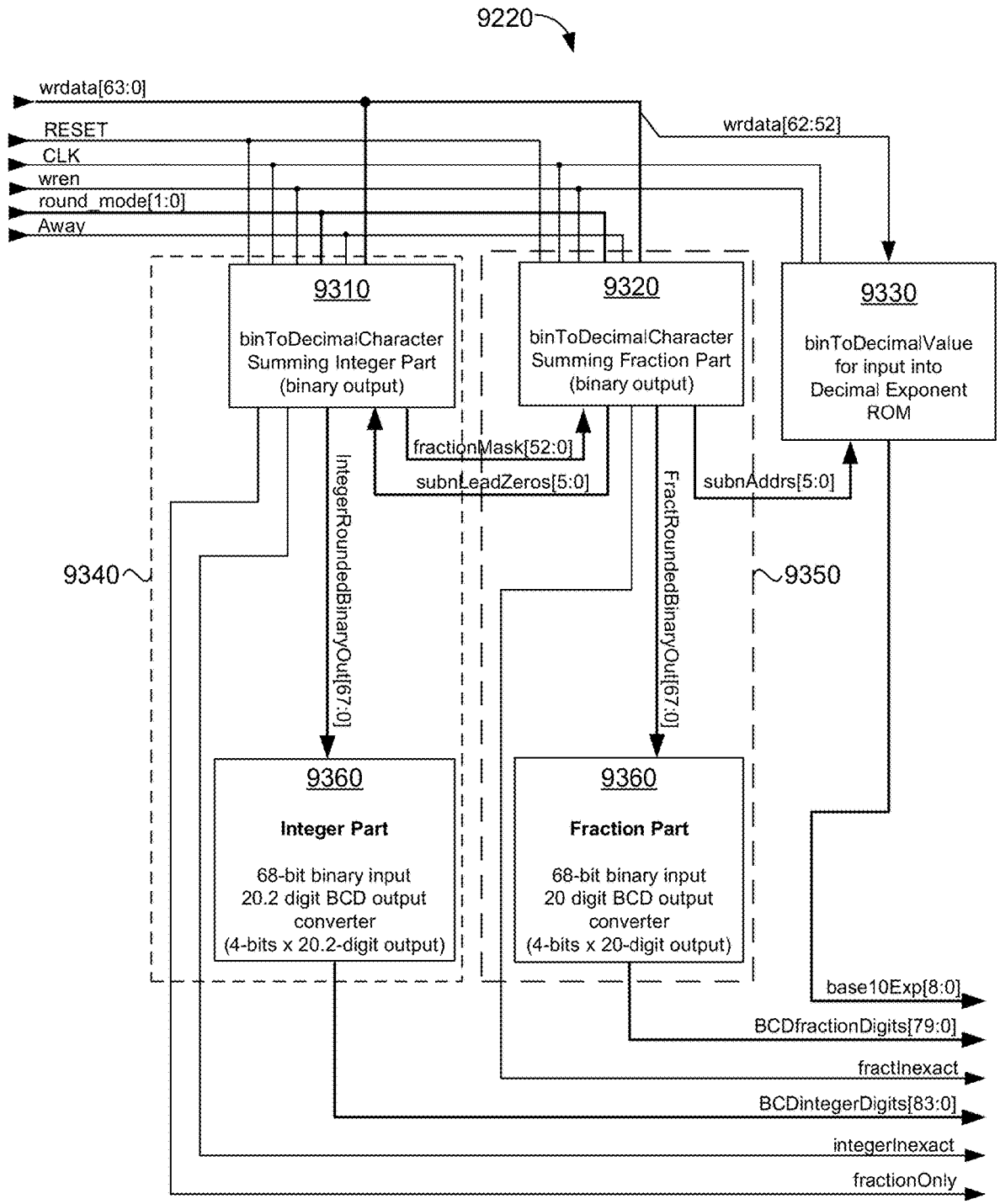
FIG. 31 is a block diagram illustrating an exemplary embodiment of the binary-to-decimal-character conversion engine of FIG. 30 illustrating virtually identical dual half-systems, one for the integer part and one for the fraction part.

FIG. 31 is a block diagram illustrating an exemplary embodiment of the binary-to-decimal-character conversion engine 9220 of FIG. 30 illustrating virtually identical dual half-systems, one for the integer part 9340 and one for the fraction part 9350. The binary-to-decimal-character conversion engine accepts as input, a 64-bit binary64 format number. The binary-to-decimal-character conversion engine also includes a binary-to-decimal exponent look-up ROM block 9330 that converts a 11-bit binary exponent to a 9-bit decimal exponent. To do the binary exponent to decimal exponent conversion, two ROMs are employed in the ROM block 9330: one 2048-entry by 9-bit ROM for normal numbers and one 52-entry by 9-bit ROM for subnormal numbers. The value output from ROM block 9330 is a 9-bit base10 representation of the exponent. More detailed peration of the ROM block 9330 is described below.

Integer part half-system 9340 includes a binary-to-decimal-character summing circuit 9310 and a integer part 68-bit binary value to 20.2 digit BCD converter 9360 that converts the 68-bit binary value computed by the integer part summing circuit 9310 to a 4-bit by 20.2 digit BCD representation.

Fraction part half-system 9350 includes a binary-to-decimal-character summing circuit 9320 virtually identical to integer part summing circuit 9310, and a fraction part 68-bit binary value to 20 digit BCD converter 9360 that converts the 68-bit binary value computed by fraction part summing circuit 9320 to a 4-bit by 20.2 digit BCD representation. Converters 9360, used by 9340 and 9350, are identical. Bits 83 to 80 of bus "BCDintegerDigits[83:0]" are the most significant BCD digit, which will always be either a 4-bit "0000" or "0001". For the fraction part converter 9360, these bits are not used, hence bus "BCDfractionDigits[79:0]" is only 80 bits.

As shown, the fraction part binary-to-decimal-character summing circuit 9320 supplies the integer part summing circuit 9310 with the number of leading zeros by way of bus "subnLeadZeros[5:0], which the look-up ROM block of the integer part summing circuit 9310 uses to form a 52-bit fraction mask that it provides to the fraction part summing circuit 9320. The function of this 52-bit fraction mask is described below.

Fraction part summing circuit 9320 also supplies a 6-bit "subnAddres[5:0]" to the binary-to-decimal exponent look-up ROM block 9330, which it uses to look up a decimal exponent value in the case of a subnormal number being converted.

The integer part binary-to-decimal-character summing circuit 9310 feeds a computed and correctly rounded 68-bit binary value "IntegerRoundedBinaryOut[67:0]" to the input of the integer part 68-bit binary value to 20.2 digit BCD converter 9360 for conversion to a 4-bit by 20.2-BCD-digit representation for the integer part.

The fraction part binary-to-decimal-character summing circuit 9320 feeds a computed and correctly rounded 68-bit binary value "FractRoundedBinaryOut[67:0]" to the input of the fraction part 68-bit binary value to 20.2 digit BCD converter 9360 for conversion to a 4-bit by 20-BCD-digit representation for the fraction part.

Figure 32:
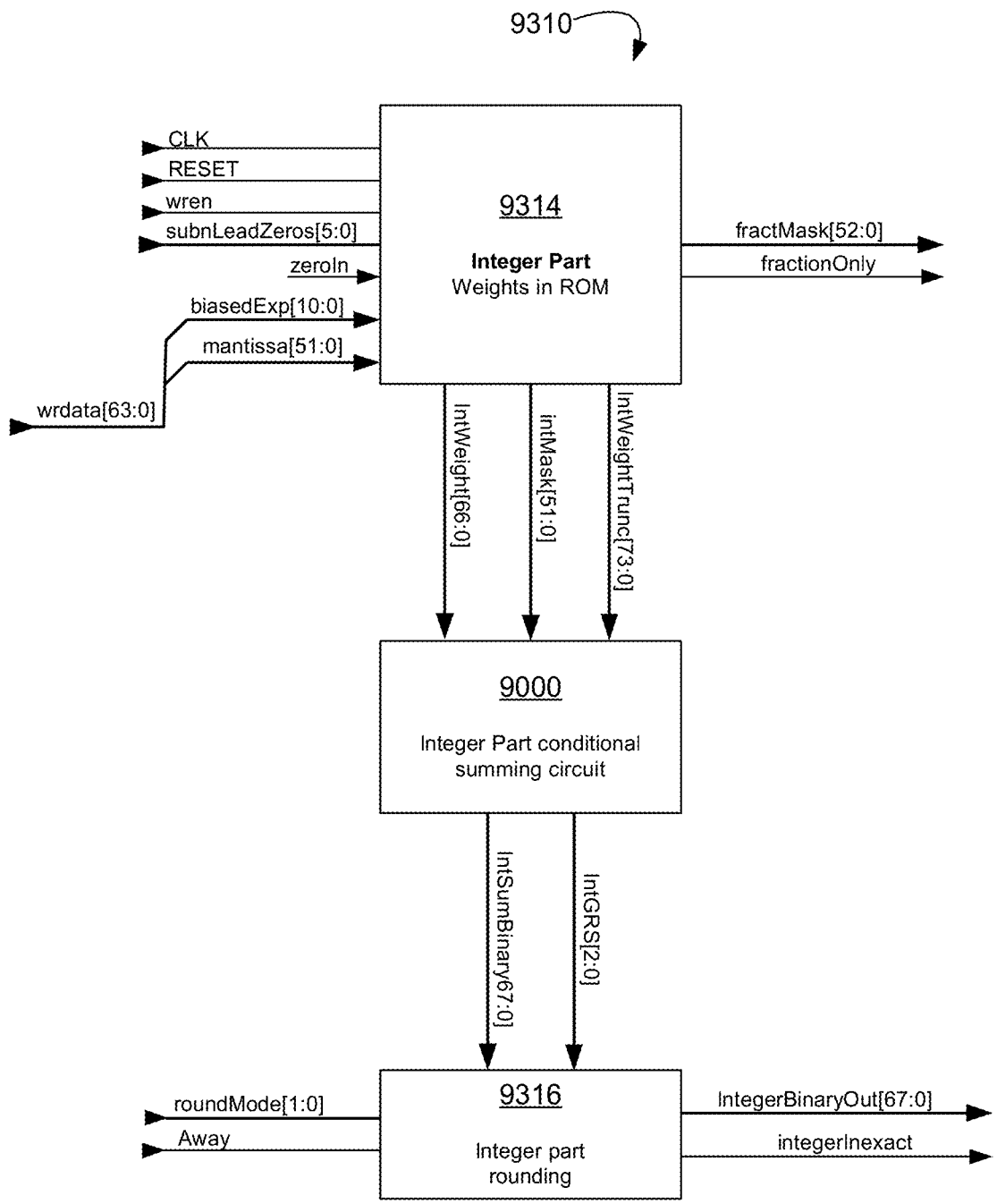
FIG. 32 is a block diagram illustrating an exemplary embodiment of the integer part binary-to-decimal-character summing circuit of FIG. 31, including integer part weights look-up ROM block, conditional summing circuit, and rounding circuit.

FIG. 32 is a block diagram illustrating an exemplary embodiment of the integer part binary-to-decimal-character summing circuit 9310 of FIG. 31, including integer part weights look-up ROM block 9314, conditional summing circuit 9000, and rounding circuit 9316. ROM block 9314 includes a 1024-entry by 141-bit integer part weight look-up ROM containing the weight for D52 of the mantissa according to the binary exponent value for normal non-zero input numbers. ROM block 9314 also includes logic for forming an integer part mask and a fraction part mask. These masks are provided to each half-system's conditional summing circuit 9000. ROM block 9314 also provides a fraction-only signal to the final formatter 9240 (FIG. 30).

The 141-bit integer weight looked up by ROM block 9314 is split into two parts: a 67-bit value representing the 20 most significant decimal digits of the looked-up weight "IntWeight[66:0]" for integer part mantissa D52 (the hidden bit) and a 74-bit value representing the 22 least significant digits (truncated part) of such weight "IntWeightTrunc[73:0]". These split weights and mask are used by the integer part half-system summing circuit 9000 to compute a sum "IntSumBinary[67:0]" and GRS bits "IntGRS[2:0]" representing the integer part that are in turn correctly rounded by the integer part rounding circuit 9316 according to the direction indicated by inputs "roundMode[1:0]" and "Away".

Integer part rounding circuit 9316 produces an intermediate binary value "IntegerBinaryOut[67:0]" that gets converted by the integer part 68-bit binary value to 20.2 digit BCD converter 9360 to a 4-bit by 20.2 digit BCD representation. The integer part rounding circuit 9316 also supplies a integer inexact signal to final formatter 9240 (FIG. 30). Integer inexact signal is set "1" when, in the conditional summing circuit 9000, any of the chaff GRS bits 9090 are "1" or if any of the truncated GRS bits 9149 are "1" (see FIGS. 34A and 34B).

FIG. 33 is a partial detail of an exemplary embodiment of the contents of the integer part binary-to-decimal-character mantissa D52 weight look-up ROM 9314 illustrating the first 20 decimal digits and the second 22 digits (truncated part of the weight), along with the actual Verilog RTL source code employed to obtain a mantissa mask used during the hardware computation. As can be seen, each of the 1024 entries comprise a total 141 bits, which are further broken down into the a 67-bit field representing the first (most significant) 20 decimal digits of that weight, and a 74-bit truncated field representing the second (least significant) 22 decimal digits of that weight. The unbiased and unsigned binary exponent of the binary64 format input is used as an index into the look-up integer part ROM.

Figure 34A:
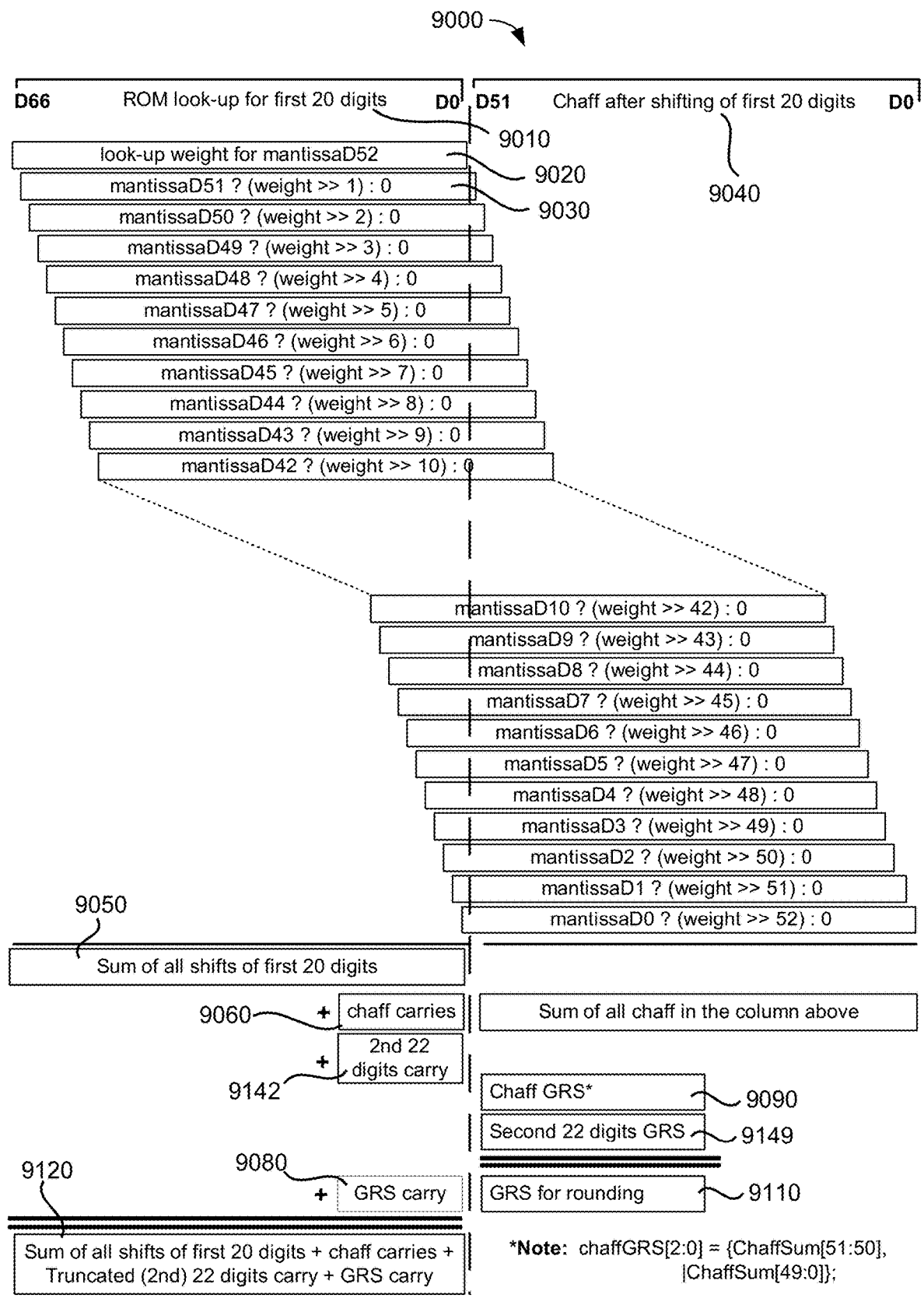
FIG. 34A is a diagram illustrating an exemplary embodiment of the method/algorithm used for computing both the integer part intermediate value and fraction part intermediate value that are submitted to their respective BCD converter circuits, including the method for obtaining a Guard, Round, and Sticky bit for each part, of the disclosed universal floating-point ISA's double-precision IEEE 754-2008 H=20+ convertToDecimalCharacter operator.
Figure 34B:
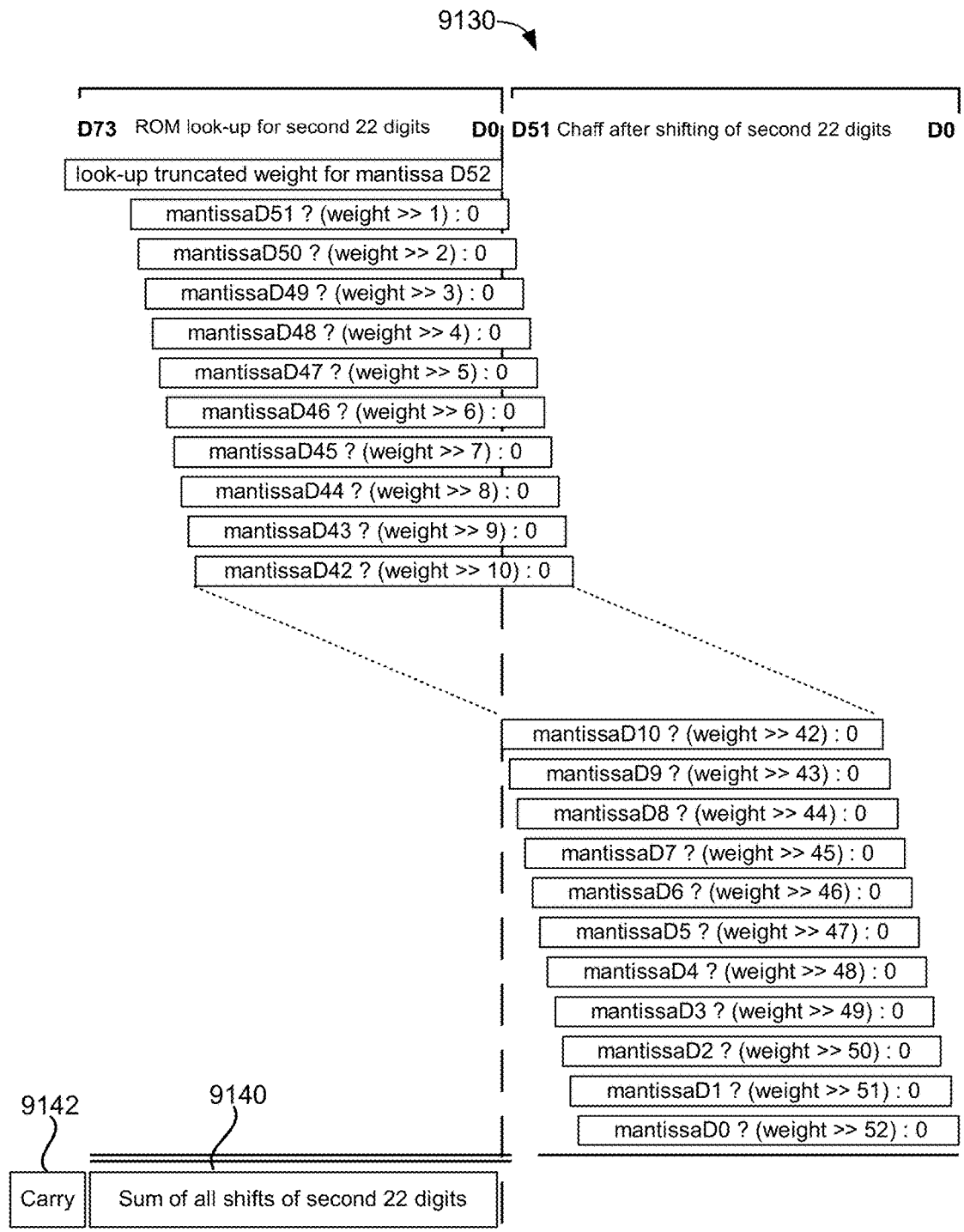
FIG. 34B is a diagram illustrating an exemplary embodiment of the method/algorithm used for computing the sum of the truncated part (i.e., second 22 digits) used in the computation of the respective integer part intermediate value and fraction part intermediate value of the disclosed universal floating-point ISA's convertToDecimalCharacter operator, including a method for deriving a truncated part GRS used in the final sum.

FIGS. 34A and 34B together show the algorithm used by the disclosed processor to compute the integer part intermediate binary value according to the bits that are set in the integer part mask supplied by the integer part weights look-up ROM block 9314. It should be noted that in the case of an integer-only number, the integer part mask will be identical to the mantissa of the binary64 format number and for the integer part, D52 (the hidden bit) will always be "1". Thus, mantissa D52 does not have a corresponding mask bit, because it is always a "1" when the integer part is non-zero.

FIG. 34A is a diagram illustrating an exemplary embodiment of the method/algorithm 9000 used for computing both the integer part 9310 intermediate value and fraction part 9340 intermediate value that are submitted to their respective BCD converter circuits, including the method for obtaining a Guard, Round, and Sticky bit for each part, of the disclosed universal floating-point ISA's double-precision IEEE 754-2008 H=20+ convertToDecimalCharacter operator.

It should be understood that for the computation in the conditional summing circuit 9000, "mantissaD51" in block 9030, "mantissaD50", etc., means "masked-mantissaD51" and so on. In the case of numbers that have both a non-zero integer part and a non-zero fraction part, at least one of the LSBs of the mantissa will be masked off (as determined by the exponent input) by the integer part weights look-up ROM block 9314 so that their corresponding scaled weights are not added to the total sum of the integer part. This is because those bits that are masked off will be used by the fraction part computation.

Block 9030 shows the intermediate computation used for each of the bits "mantissaD51" thru "mantissaD0" to compute a scaled weight for that bit based on the looked-up input weight 9020 for mantissa D52. The looked-up input weight 9020 is the same as the ROM look-up for the first 20 digits 9010 showing that the 67-bit representation is the first (most significant) 20 decimal digits. Block 9030 specifies that if "mantissaD51" is a "1", then divide the ROM look-up for the first 20 decimal digits 9010 by 2 with a single right shift to arrive at the scaled weight for that bit, otherwise use "0" as the weight for that bit. For "mantissaD50", if that bit is "1", then divide the ROM look-up for the first 20 decimal digits 9010 by 4 with two shifts to the right to arrive at the scaled weight for that bit, otherwise use "0" as the weight for that bit. The foregoing process continues until a scaled weight is computed for each bit down to "mantissaD0".

Observe that with each shift for each intermediate computation in determining a scaled weight for each of the mantissa bits D51 thru D0 (thereby effectuating a divide by 2 for each shifted bit position to determine the scaled weight corresponding that mantissa bit number), the least significant bits fall off the end. These are referred to as "chaff" bits 9040. The chaff bits must be preserved with registers so they can be used later in computing an overall intermediate sum and intermediate chaff GRS bits 9090.

Once all the corresponding weights for mantissa bits D51 thru D0 have been computed, they are all added to the looked-up input weight 9020 to arrive at an intermediate sum 9050 for the integer part. At the same time, all the chaff from bits D51 thru D0 intermediate computation are added together and the chaff carries 9060 out of the chaff sum D51 are added to the intermediate sum 9050. Also at the same time, a single carry bit 9142 out of D73 of the sum of all truncated weight computations shown in 9130 is added to the intermediate sum 9050. As shown, the three chaff GRS bits 9090 are added to the three second-22-digits GRS bits 9149, with the single-bit GRS carry 9080 also being added to the intermediate sum 9050, all the foregoing arriving at a second intermediate sum 9120 for the integer part. Finally, GRS 9110 is used to correctly round the intermediate integer part result according to "round_mode[1:0]" and "Away" as shown in the rounding circuit 9316 (FIG. 32). Note that, although not explicitly shown, the LSB of GRS 9110 is "sticky", meaning that if the sticky bit of the chaff GRS 9090 or the sticky bit of the three second-22-digits GRS bits 9149 is "1", even after the two have been added together to arrive at GRS 9110, the sticky bit of GRS 9110 should be a "1". This can be be accomplished by simply logically ORing the sticky bit of the chaff GRS 9090 with the sticky bit of the three second-22-digits GRS bits 9149 and using that output as the GRS sticky bit (LSB) for GRS 9110. For some implementations requiring less precision, it may be more advantageous to omit the computation of the truncated part value and its single carry bit for each of the integer and fraction parts altogether. By doing so, the 22-decimal-digit (74-bit) truncated part weights can be omitted, making the weight look-up ROMs for the integer part and fraction parts much smaller. In such cases, only the chaff GRS bits are used for directed rounding.

FIG. 34B is a diagram illustrating an exemplary embodiment of the method/algorithm 9130 used for computing the sum of the truncated part (i.e., second 22 digits) used in the computation of both the integer part 9310 of half-system 9340 and fraction part 9350 of half-system 9350 of the disclosed universal floating-point ISA's convertToDecimalCharacter operator, including a method for deriving a truncated part GRS used in the final sum. FIG. 34B shows the intermediate computations 9130 involving the second 22 digits (truncated part) of the looked-up ROM weight. Note that the chaff bits from the shifts of the truncated weight are discarded. The sum of all the computed weights for each bit of the 74-bit truncated mantissa input is shown at 9140. Note that the weight for mantissa D52 has a shift of zero, meaning it is not shifted, but it also is included in the sum 9140. A carry bit 9142 is the carry bit out of bit 73 of the sum 9140.

To determine the GRS bits of the truncated part intermediate sum, magnitude comparisons are made for each of them. Truncated part guard bit "Trunc_G" 9144 is determined by comparing the truncated part sum "TruncSum[73:0]" to twenty-two decimal digit value "5000000000000000000000". If "TruncSum[73:0]" is greater than or equal to "5000000000000000000000", then Trunc_G is set to "1", otherwise it is cleared to "0".

Truncated part round bit "Trunc_R" 9146 is determined by first subtracting twenty-two decimal digit value "5000000000000000000000" from "TruncSum[73:0]", then comparing the result of that subtraction to twenty-two decimal digit value "0500000000000000000000". If the result of that subtraction is greater than or equal to "0500000000000000000000", then Trunc_R is set to "1", otherwise it is cleared to "0".

Truncated part sticky bit "Trunc_S" 9148 is determined by first subtracting twenty-two decimal digit value "5500000000000000000000" from "TruncSum[73:0]", then comparing the result of that subtraction to twenty-two decimal digit value "0000000000000000000001". If the result of that subtraction is greater than or equal to "0000000000000000000001", then Trunc_S is set to "1", otherwise it is cleared to "0".

Finally, the 3-bit representation "Trunc_GRS" 9149 is formed by concatenating "Trunc_G", "Trunc_R", and "Trunc_S" as shown.

Figure 35:
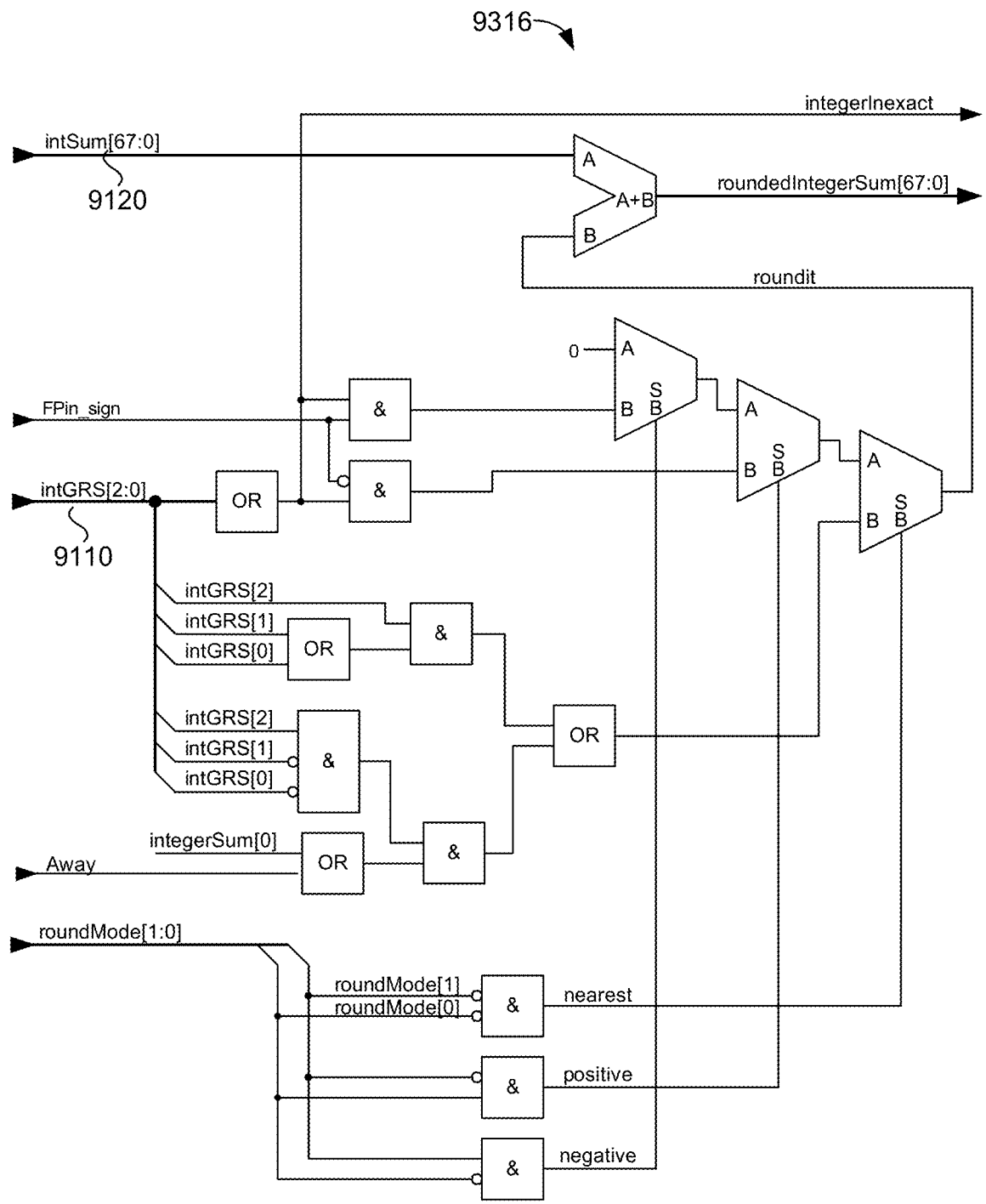
FIG. 35 is a schematic diagram illustrating an exemplary embodiment of an integer part rounding circuit that correctly rounds the integer part intermediate result prior to submission of the intermediate result to the BCD conversion circuit.

FIG. 35 is a schematic diagram 9316 illustrating an exemplary embodiment of an integer part rounding circuit that correctly rounds the integer part intermediate result 9120 according to the integer part GRS bits 9110, sign, Away, and roundMode[1:0] prior to submission of the intermediate result to the BCD conversion circuit 9360 (FIG. 31).

Figure 36:
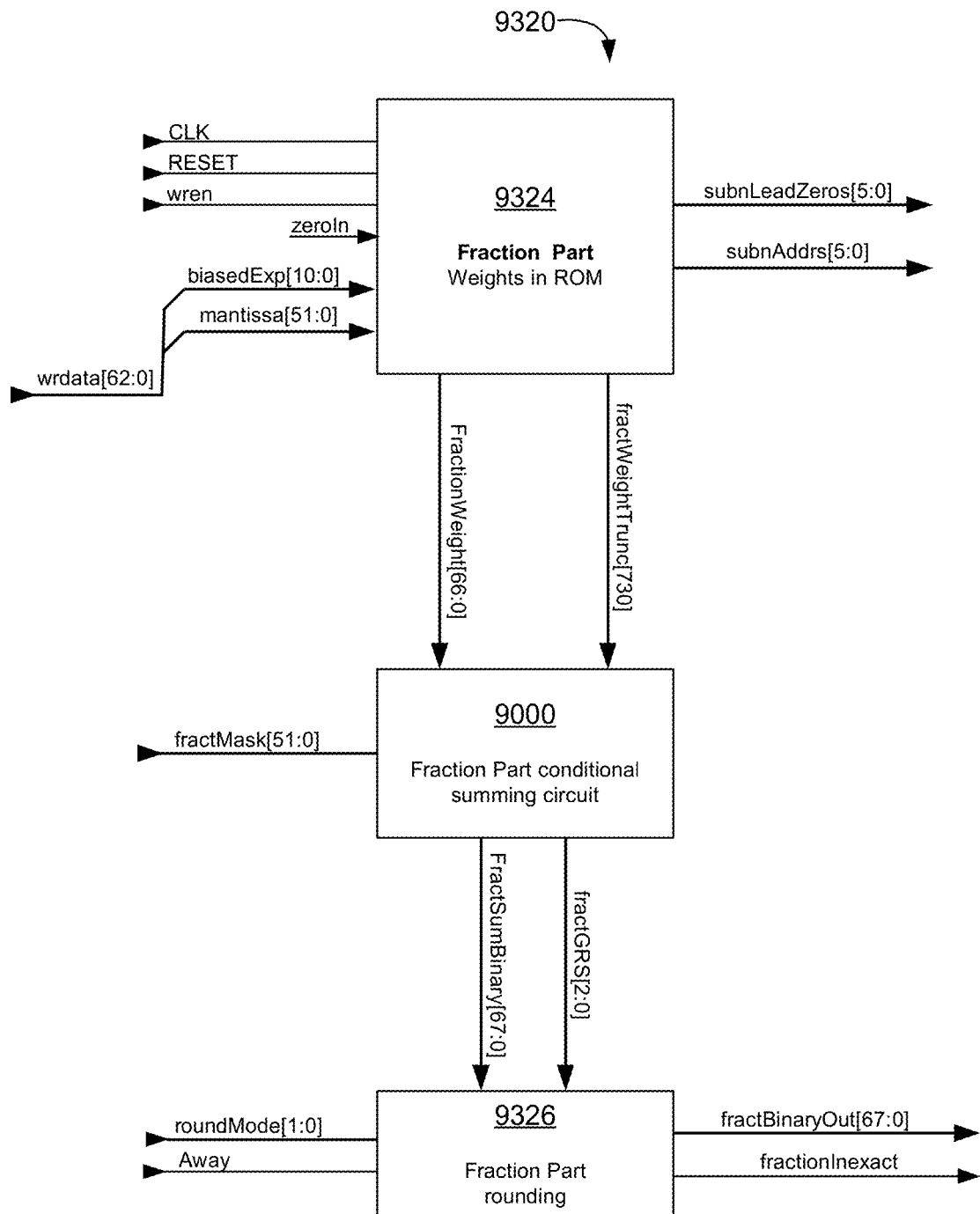
FIG. 36 is a block diagram illustrating an exemplary embodiment of the fraction part binary-to-decimal-character summing circuit of the fraction-part half-system, comprising a fraction part weights look-up ROM block, conditional summing circuit, and rounding circuit.

FIG. 36 is a block diagram illustrating an exemplary embodiment of the fraction part binary-to-decimal-character summing circuit 9320 of half-system 9350, comprising fraction part weights look-up ROM block 9324, conditional summing circuit 9000, and rounding circuit 9326.

ROM block 9324 includes a 1024-entry by 141-bit fraction part weight look-up ROM containing the weight for D52 of the mantissa according to the binary exponent value for normal input numbers that have a non-zero fraction part. Since the fraction part must also be able to handle subnormal numbers, ROM block 9324 also includes a 52-entry by 141 bit subnormal fraction part look-up ROM containing the weight for the most significant "set" bit of the mantissa, since subnormal numbers are denormal, i.e., D52 (the hidden bit) of the mantissa is never "1" for subnormal numbers.

FIG. 37 is a partial detail illustrating an exemplary embodiment of the convertToDecimalCharacter fraction part ROM weight look-up contents 9324 illustrating the first 20 decimal digits and the second 22 decimal digits (truncated part of the weight), along with the actual Verilog RTL source code employed to obtain a mantissa mask used during the hardware computation. The casex statement at the center of FIG. 37 loads 6-bit registers "subnAddrs" and "subnLeadZeros" with a value between "0" and "51" inclusive, based on the first non-zero bit in the mantissa. This is for special handling in the case of subnormal numbers. In the case of subnormal numbers, "subnAddrs" is used as an index into the subnormal look-up ROM (ROMB). If the input exponent is normal, i.e., not zero, then the weight from fraction part ROMA is output from the fraction part weights look-up ROM block 9324; otherwise, if the input exponent is zero (indicating a subnormal number), then the weight from fraction part ROMB is output from the fraction part weights look-up ROM block 9324. Note that in the case of subnormal numbers, "subnLeadZeros" is used by the integer part weights look-up ROM block 9314 of FIG. 32 to produce the fraction part's fraction mask "fractMask[52:0]", which in turn is used by the fraction part half-system conditional summing circuit 9000 to compute the fraction part binary sum/value.

The fraction part summing circuit 9000 is identical to the integer part summing circuit 9000, except that the weight for "mantissaD52" 9020 is "0" if mantissaD52 is "0", otherwise the weight for "mantissaD52" 9020 is the same as the ROM look-up for the first 20 digits 9010. Like the integer part half-system 9340, the intermediate result 9120 computed by fraction part half-system 9350 summing circuit 9000 is correctly rounded by fraction part rounding circuit 9326 to arrive at "FractRoundedBinaryOut[67:0]", which is then input into fraction part 20-digit BCD converter 9360 of the fraction part half-system 9350 to produce a 4-bit by 20-BCD-digit sequence representing the fraction part as shown in FIG. 31. Like the integer part computational block 9310 of integer part half-system 9340, the fraction part computational block 9320 of fraction part half-system 9350 produces a fraction inexact signal that is asserted to "1" when the fraction part is inexact.

FIG. 38 is a partial detail illustrating an exemplary embodiment of the look-up ROM block 9330 and actual Verilog RTL source code used by the convertToDecimal-Character operator for converting the adjusted binary exponent input to an adjusted decimal exponent for both normal and subnormal numbers. Included in the RTL are normal exponent look-up table ROM (RAMA) 9334 and subnormal exponent look up table ROM (RAMB) 9336. Note that RAMA 9334 uses the unbiased binary exponent input as the index to the adjusted decimal exponent being looked up. Also note that the decimal exponents of RAMA 9334 corresponding to binary exponents with binary values in the range 2046 to 1087 are pre-adjusted by subtracting 19 from them. This is to satisfy the default binary-to-decimal-character format on the output, in that the default format references the decimal place relative to the last digit position as shown in FIG. 4. Also observe in RAMA 9334 that for binary exponents in the range 1086 to 1023, the adjusted decimal exponent is 0, for the same reason. Further, binary exponents in the range 1022 to 1, their looked-up decimal values are negative, meaning that the final formatter 9240 will place a "e-" instead of "e+" character string in front of the decimal exponent characters in the final result.

Figure 39:
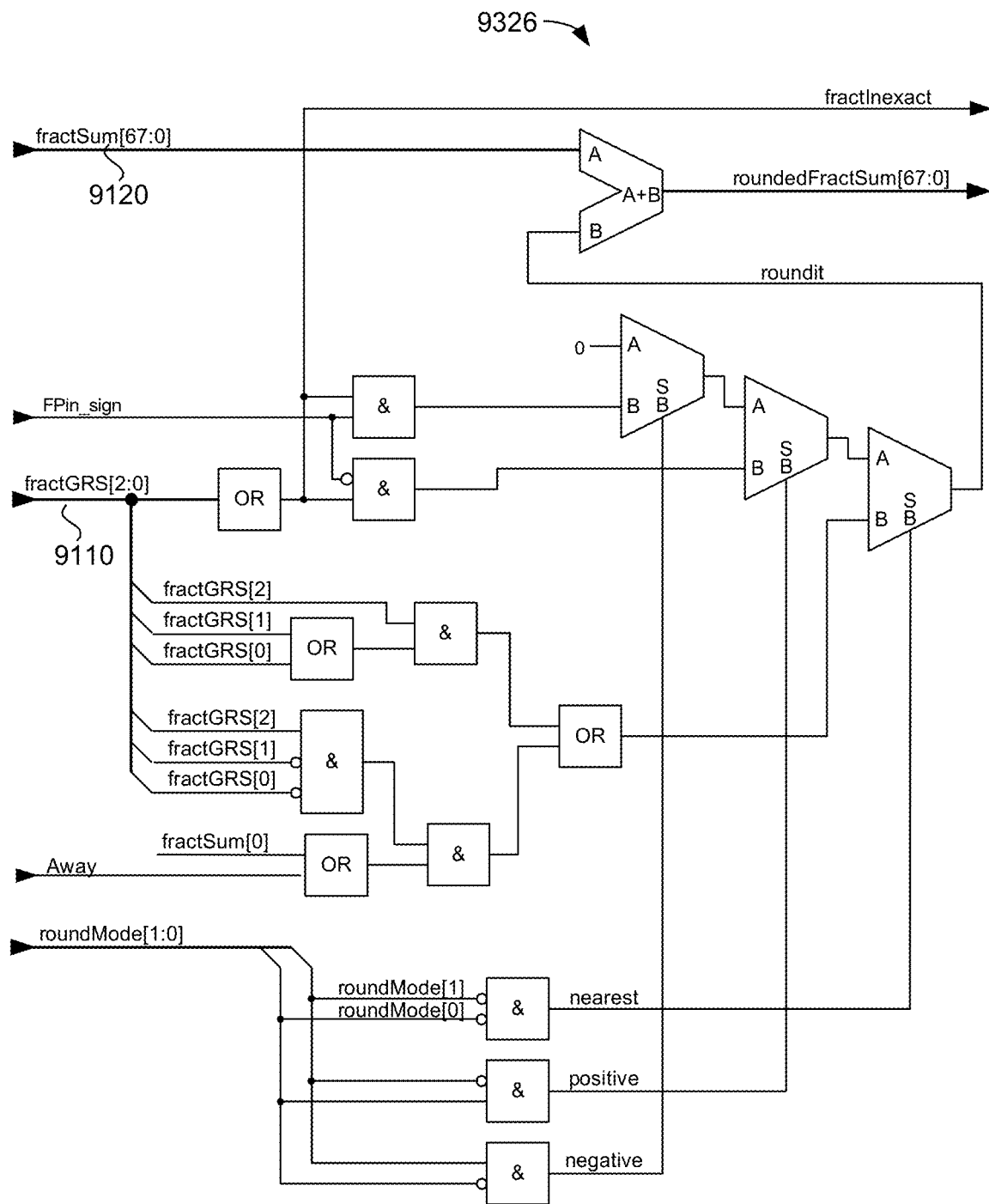
FIG. 39 is a schematic diagram illustrating an exemplary embodiment of the rounding circuit used for rounding the fraction part intermediate result prior to submission of the intermediate result to the BCD conversion circuit used in the disclosed universal floating-point ISA's convertToDecimalCharacter hardware operator.

FIG. 39 is a schematic diagram illustrating an exemplary embodiment of the fraction part rounding circuit 9326 that correctly rounds the fraction part intermediate result 9120 according to the fraction part GRS bits 9110, sign, Away and roundMode[1:0] prior to submission of the intermediate result to the BCD conversion circuit used in the disclosed processor's convertToDecimalCharacter hardware operator 9360 (FIG. 31).

Figure 40A:
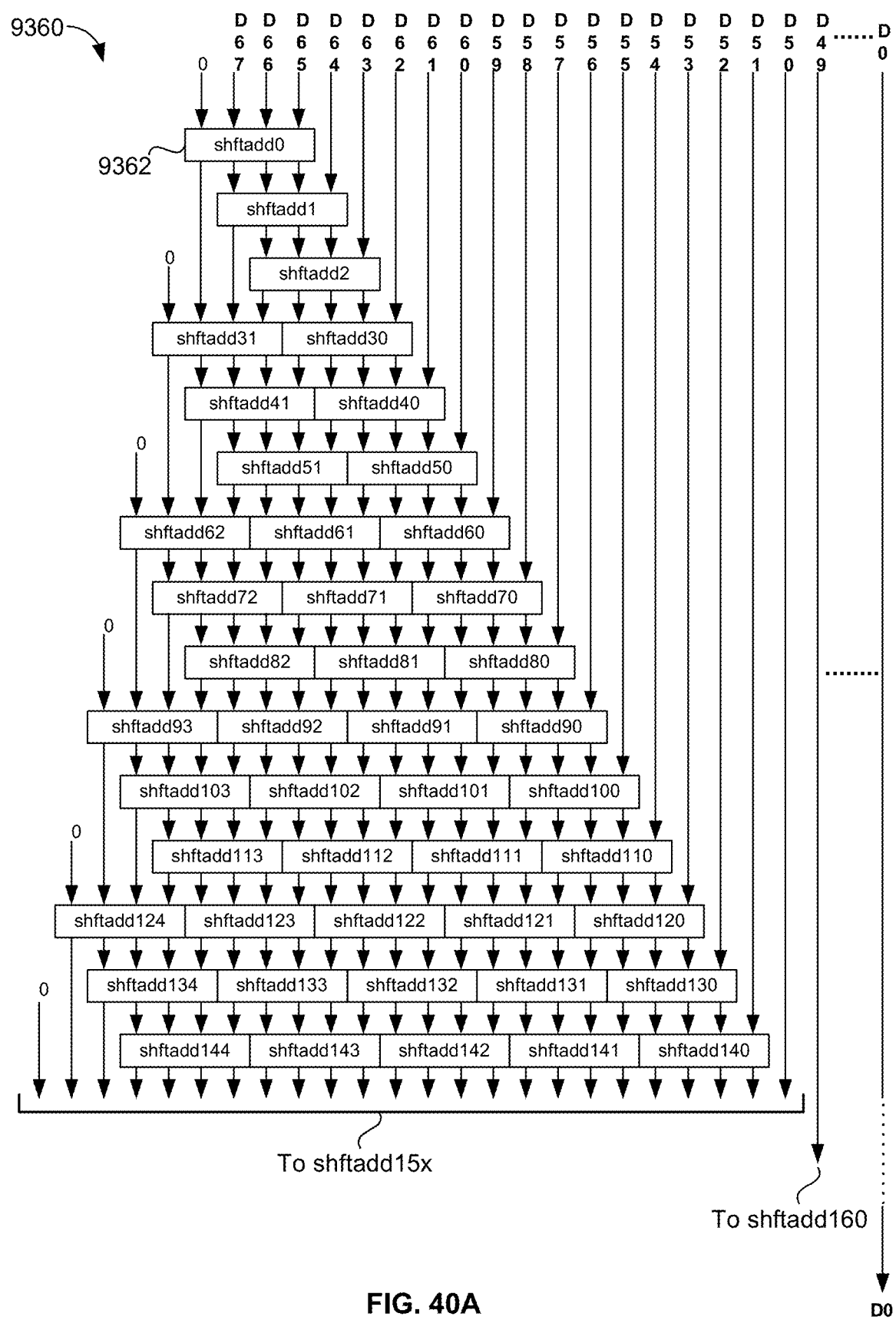
FIGS. 40A, 40B, and 40C are block diagrams that together show, respectively, the upper left-most, lower right-most, and lower left-most sections of the fully pipelined binary-to-binary-coded-decimal (BCD) conversion block used by the integer part half-system and the fraction part half-system to convert their respective rounded 68-bit binary outputs to BCD.
Figure 40B:
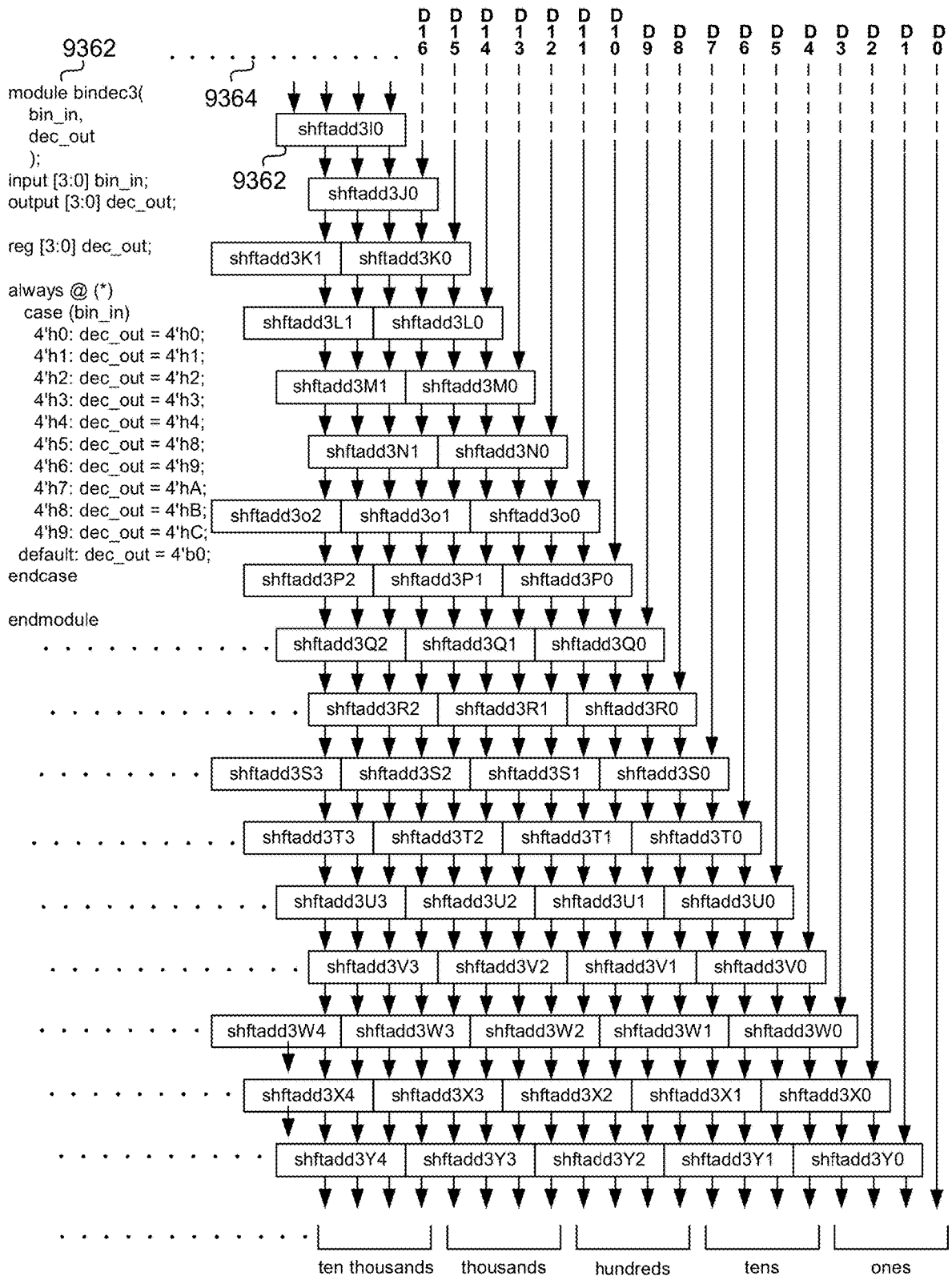
Figure 40C:
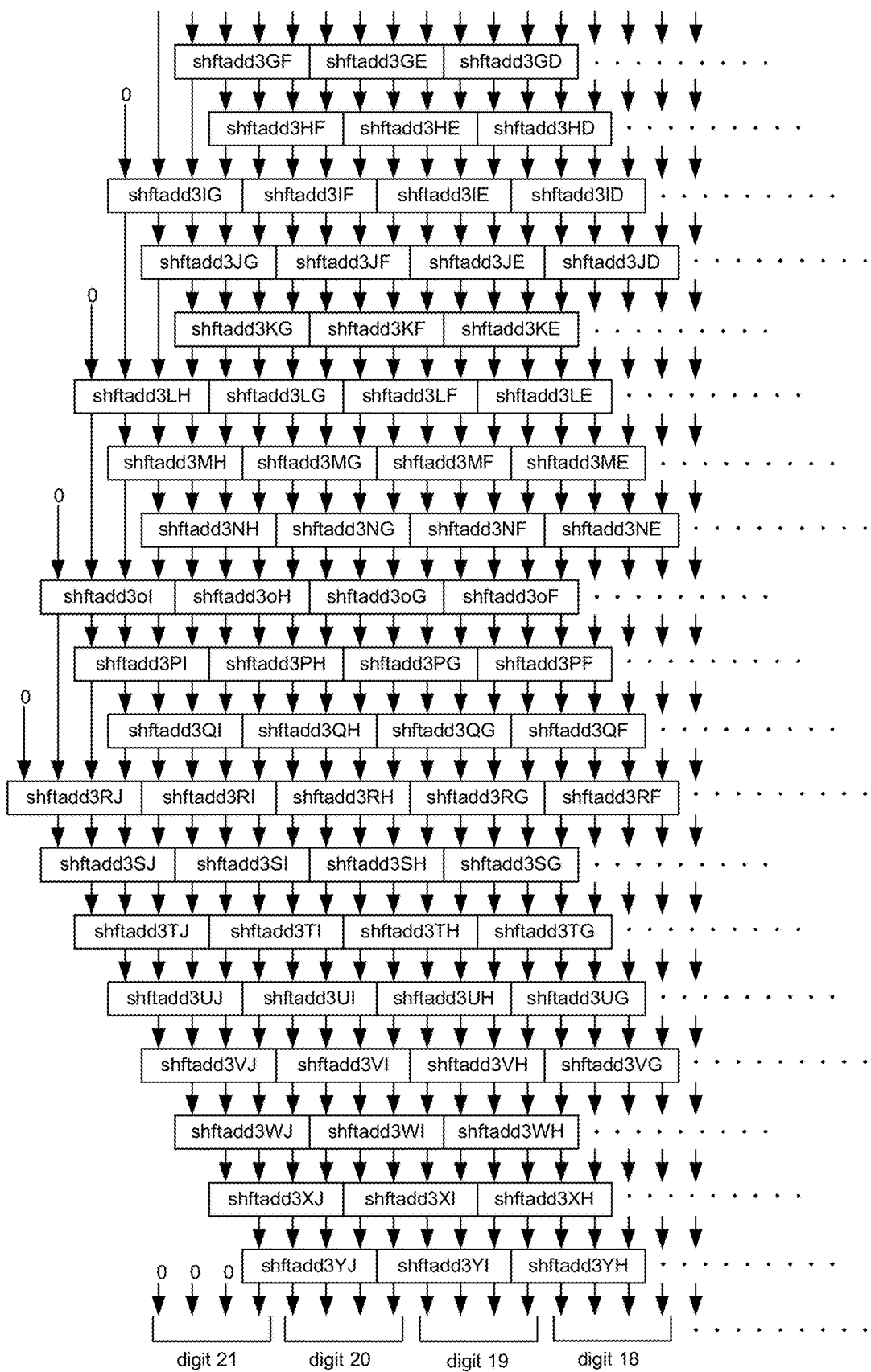

FIGS. 40A, 40B, and 40C are block diagrams that together show, respectively, the upper left-most, lower right-most and lower left-most sections of the fully pipelined binary-to-binary-coded-decimal (BCD) conversion block 9360 used by integer part half-system 9340 and fraction part half-system 9350 to convert their respective rounded 68-bit binary outputs to BCD. The BCD conversion block 9360 accepts as input, a computed 68-bit binary value and converts it to a 4-bit by 20.2-digit BCD representation. Note that for the integer part, the most significant 4-bit BCD digit of the output BCD representation will always be either a "0001" or "0000" binary. For the fraction part, the most significant 4-bit BCD digit of the output BCD representation will always be "0000" binary.

In the disclosed exemplary embodiment, the BCD conversion block 9360 consists entirely of 4-bit-in-4-bit-out look-up tables 9362 that emulate a 4-bit BCD shift-add operation. FIGS. 40A, 40B, and 40C show how to arrange the 4-bit-in-4-bit-out look-up tables to create the overall 68-bit binary-to-20.2-decimal-character-digit BCD conversion. The disclosed BCD circuit includes 65 rows of look-up tables, meaning it is 65 logic levels deep. Thus, every eight logic levels (rows) the outputs are registered, such that it requires eight clocks to perform the BCD conversion. FIG. 40B indicates by a dotted line 9364 that inputs D17 thru D67 continue across and/or repetitions of 9362 continue across the required number of positions so as to accommodate a 68-bit input to BCD converter 9360 starting from D0 and continuing to D67.

Once the BCD conversion for both integer part and fraction part half-systems are complete, those intermediate results, along with the looked-up decimal exponent, respective inexact signals, and fraction-only signal are passed the the final formatter 9240, as shown in FIG. 30. The final formatter 9240 converts the 4-bit BCD digits to characters by simply adding to each 4-bit BCD digit, the 8-bit ASCII hex value for character "0", which is 30 hex. Thus, BCD 0 becomes 30h, 1 becomes 31h, and so forth. The looked-up decimal value exponent is converted to BCD using a much smaller version of the BCD conversion block 9360 comprising just a few look-up tables 9362 sufficient for a 9-bit input and 3 decimal digit BCD (12-bit) output, which in turn are also converted to characters.

Finally, logic within the final formatter 9240 evaluates all the inputs into it and concatenates the character sign of the binary input, the integer part decimal character sequence, the fraction part decimal character sequence, an "e-" or "e+" character sequence (depending on sign of the exponent) and the converted decimal character sequence exponent, forming the 376-bit, correctly rounded, final decimal character sequence result in the default format shown in 300 (FIG. 4). At the same time, the five exception signals, divX0, invalid, overflow, underflow and inexact are set or cleared depending on exceptions that may have arisen during the conversion process.

Figure 41:
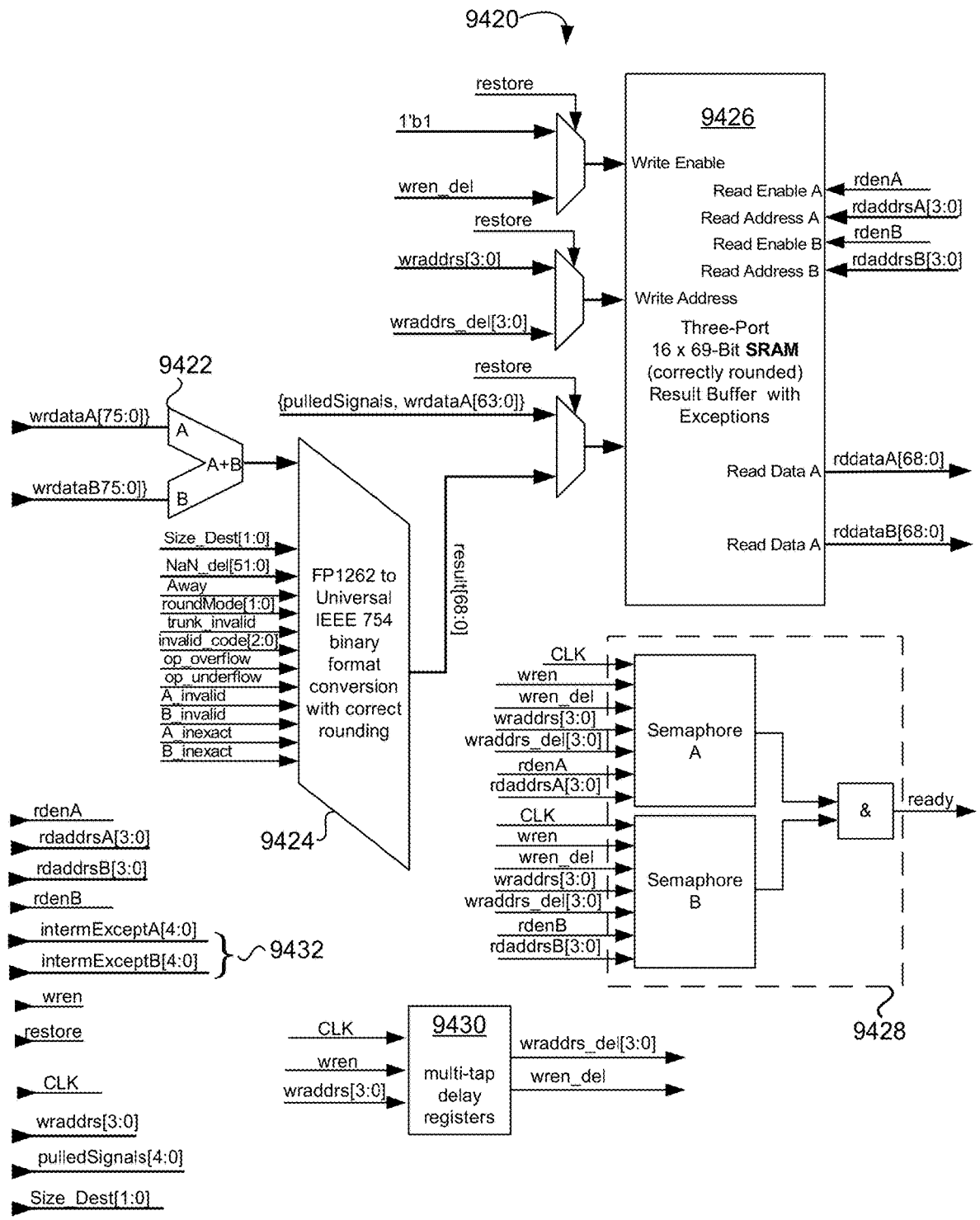
FIG. 41 is a block diagram illustrating an exemplary embodiment of a memory-mapped, fully restoreable, hardware-implemented, double-precision floating-point "addition" operator module, including 16-entry by 69-bit SRAM result buffer, restore capability, and ready semaphore.

FIG. 41 is a block diagram illustrating an exemplary embodiment of a memory-mapped, fully restoreable, hardware-implemented, double-precision floating-point "addition" operator module 9420, including 16-entry by 69-bit SRAM result buffer 9426, restore capability, and ready semaphore 9428. The addition operator module 9420 includes a floating-point adder 9422 that accepts 76-bit inputs for both operands A and B. The 76-bit operand A and operand B inputs are the results of their respective upstream "universal input converter" shown in FIG. 22A, which converts binary16, binary32 or binary64 format numbers to binary76 format used by the floating-point adder 9422 and provides interim exception signals 9432 if any occur during the process of the upstream conversion. Because binary16, binary32 and binary64 formats convert "up" to the larger binary76 format, such conversions will always be exact.

This binary76 format comprises a sign bit as the MSB, a 12-bit exponent and a 62-bit fraction (FP1262). The use of larger binary format number in this and various other hardware floating-point operators is to support computations using subnormal numbers, in that the larger format floating-point adder 9422 will never overflow or underflow as a result of the computation. If overflow or underflow occur at all, it occurs as a result of conversion from FP1262, the output format of the floating-point adder 9422.

The result that gets stored in the SRAM result buffer 9426 is 69 bits. This is because the five MSBs are the five exception signals divX0, invalid, overflow, underflow, and inexact. If the target result size specified by the Size_Dest [1:0] input is binary16 or binary32, the most significant bits (not including the exception bits) are padded with zeros by a binary format converter 9424. The number of levels of delay in multi-tap delay registers 9430 is determined by the combined number of clocks the floating-point adder 9422 and the binary format converter 9424 require to complete. Like all the hardware floating-point operators of the floating-point operator module 3010 shown in FIG. 22A, the addition operator module 9420 includes a semaphore block 9428 to signal that the computation is complete when being accessed.

It should be understood that some applications may not need or want a "universal" converter to automatically convert the FP1262 intermediate result of the floating-point adder 9422 to binary16 or binary32 formats, but may prefer instead to do so with a separate and explicit conversion operation once a final result is obtained and stored in the SRAM result buffer 9426. In such cases, the binary format converter 9424 can be substituted with a FP1262 to binary64 (FP1152) converter. Furthermore, some implementers may prefer employing a multiplier that is FP1252 (12-bit exponent with 52-bit fraction) format as opposed to the FP1262 format shown for the floating-point adder 9422, in that an FP1252 will be less expensive to implement than the FP1262 version. In so doing, implementors should take care to provide faithful GRS bits to the binary format converter 9424 for correct rounding purposes.

Figure 42:
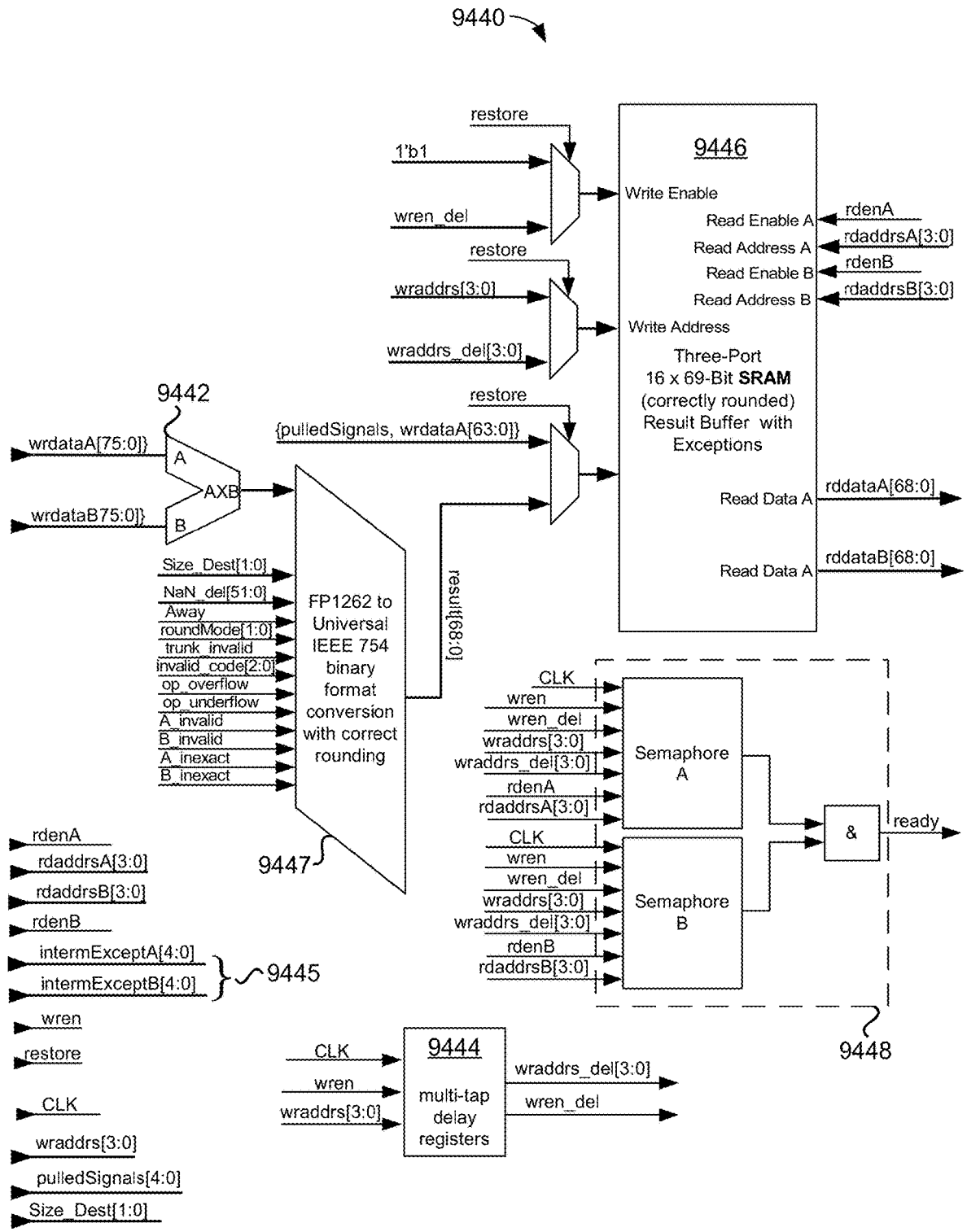
FIG. 42 is a block diagram illustrating an exemplary embodiment of a memory-mapped, stand-alone, fully restoreable, hardware-implemented, double-precision floating-point "multiplication" operator module including 16-entry by 69-bit SRAM result buffer, restore capability, and ready semaphore.

FIG. 42 is a block diagram illustrating an exemplary embodiment of a memory-mapped, stand-alone, fully restoreable, hardware-implemented, double-precision floating-point "multiplication" operator module 9440 including 16-entry by 69-bit SRAM result buffer 9446, restore capability, and ready semaphore 9448. A floating-point multiplier 9442 accepts 76-bit inputs for both operands A and B. The 76-bit operand A and operand B inputs are the results of their respective upstream "universal input converter" shown in FIG. 22A, which converts binary16, binary32 or binary64 format numbers to binary76 format used by the floating-point multiplier 9442 and provides interim exception signals 9445 if any occur during the process of the upstream conversion. Because binary16, binary32 and binary64 formats convert "up" to the larger binary76 format, such conversions will always be exact.

This binary76 format comprises a sign bit as the MSB, a 12-bit exponent and a 62-bit fraction (FP1262). The use of this larger binary format number in this and various other hardware floating-point operators is to support computations using subnormal numbers, in that the larger format floating point multiplier 9442 will never overflow or underflow as a result of the computation due to the extra bit in the exponent. If overflow or underflow occur at all, it occurs as a result of conversion from FP1262, the output format of the floating-point multiplier 9422.

The result that gets stored in the SRAM result buffer 9446 is 69 bits. This is because the five MSBs are the five exception signals divX0, invalid, overflow, underflow and inexact. If the target result size specified by the Size_Dest [1:0] input is binary16 or binary32, the most significant bits (not including the exception bits) are padded with zeros by a binary format converter 9447. The number of levels of delay in multi-tap delay registers 9444 is determined by the combined number of clocks the floating-point multiplier 9442 and the binary format converter 9447 require to complete. Like all the hardware floating-point operators of the floating-point operator module 3010 shown in FIG. 22A, the multiplication operator module 9440 includes a semaphore block 9448 to signal that the computation is complete when being accessed.

It should be understood that some applications may not need or want a "universal" converter to automatically convert the FP1262 intermediate result of the floating-point multiplier 9442 to binary16 or binary32 formats, but may prefer instead to do so with a separate and explicit conversion operation once a final result is obtained and stored in the SRAM result buffer 9446. In such cases, the binary format converter 9447 can be substituted with a FP1262 to binary64 (FP1152) converter. Furthermore, some implementers may prefer employing a multiplier that is FP1252 (12-bit exponent with 52-bit fraction) format as opposed to the FP1262 format shown for the floating-point multiplier 9442, in that an FP1252 will be a little bit cheaper to implement than the FP1262 version. In so doing, implementors should take care to provide faithful GRS bits to the binary format converter 9447 for correct rounding purposes.

Figure 43:
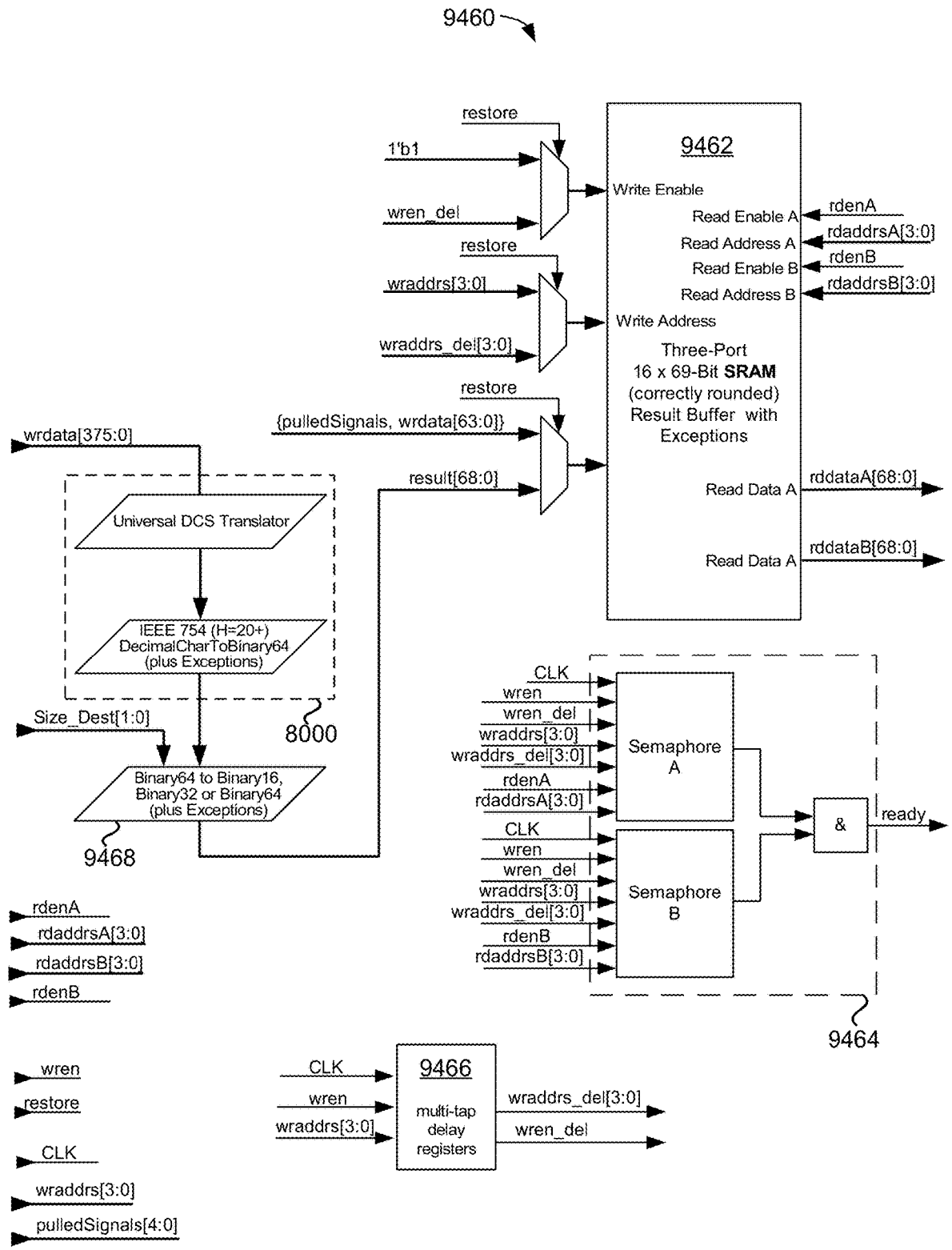
FIG. 43 is a block diagram of an exemplary embodiment of a memory-mapped, fully restoreable, stand-alone, double-precision (H=20), hardware-implemented double-precision floating-point "H=20" convertFromDecimalCharacter operator module, including 32-entry by 69-bit SRAM result buffer, restore capability, and ready semaphore.

FIG. 43 is a block diagram of an exemplary embodiment of a memory-mapped, fully restoreable, stand-alone, double-precision (H=20), hardware-implemented double-precision floating-point "H=20" convertFromDecimalCharacter operator module 9460, including 32-entry by 69-bit SRAM result buffer 9462, restore capability, and ready semaphore 9464. The convertFromDecimalCharacter operator module 9460 includes the convertFromDecimalCharacter circuit 8000 (FIG. 24), 32-entry SRAM result buffer 9462, semaphore circuit 9464, multi-tap delay block 9466 for delaying the write enable and write address the required number of clocks, and optional binary64 to universal binary output block 9468.

The convertFromDecimalCharacter circuit 8000 accepts a 376-bit (47-character sequence) input that is fed into optional Universal DCS Translator 500 (FIG. 5) that translates non-default character sequence inputs 400 to the 47-character default character sequence shown 300 (FIG. 4). The Universal DCS Translator may be omitted if the end application will never need to compute directly with non-default character sequences. In other words, if the application will always perform translation in software, then the Universal DCS Translator circuit can be omitted such that the input is fed directly into the decimalCharToBinary64 circuit of the convertFromDecimalCharacter circuit 8000. The output of the decimalCharToBinary64 circuit is then fed into the binary64 to binary16, binary32 or binary64 converter 9468 that converts the output to binary16, binary32, or binary64 format, depending on the two-bit Size_Dest[1:0] input. Note that if size is specified for 8 bytes, then there is no actual conversion. Furthermore, if the end application only requires binary64 as the target binary format, then the binary64 to binary16, binary32 or binary64 converter 9468 may be omitted. Finally, the output of the binary64 to binary16, binary32 or binary64 converter 9468 is supplied to one input of a selector whose output enters the SRAM result buffer 9462 for storage at the same address it was input on the front end, meaning that when the character sequence was originally pushed into the convertFromDecimalCharacter operator module 9460 for conversion, the address it was pushed into, including its wren state, is delayed in the multi-tap delay block 9466 the same number of clocks as the pipeline of the convertFromDecimalCharacter circuit 8000, such that by the time the character string is converted, the delayed write address and write enable are presented to the SRAM result buffer 9462 simultaneously with the output of the selector.

Note that the convertFromDecimalCharacter operator module 9460, like all the other floating-point operators shown in block 3010 (FIG. 22A), is fully restoreable. This means that results and corresponding exception signals of conversions can be pulled out and pushed into the fat SRAM 9520 of dual asymmetric stack 9500 shown in FIG. 44 for preservation during subroutine calls and interrupt service routines and then pulled from the fat SRAM and pushed directly back into their originating result buffers. This is so the convertToDecimalCharacter operator can be used by the called routine or interrupt service routine without corrupting previously computed results or having to re-compute them upon return. Also note that the five exception signals that were simultaneously pulled from the result buffer are pushed into the signal stack 9510 simultaneously with the push of the converted result into fat SRAM 9520 and pulled simultaneously with same during the restore. All floating-point operators of block 3010 and integer arithmetic and logic operators of block 4000 (FIG. 23), including their respective exception/condition signals, may be preserved and restored in this manner, so long as the destination address is specified by the SP for a stack "push" and SP specifies the source address for a stack "pop" within the address range of the fat dual asymmetric stack 9500.

Note further, that the SRAM result buffer 9462 is 32 entries deep. The main reason why 32-entry memory was chosen over a 16-entry operator is that the pipeline of the convertFromDecimalCharacter circuit 8000 is roughly 28 levels deep. Thus, when using the REPEAT instruction to convert a block of 32 decimal character sequences to binary format, by the time the $32^{nd}$ decimal character sequence is pushed into the convertFromDecimalCharacter operator module 9460 for conversion, the results can immediately be pulled out with the REPEAT instruction without incurring a single stall in the process, thereby hiding latency, "as if" the conversion for each decimal character sequence actually only consumed 0 clocks to complete, making it virtually free.

Figure 44:
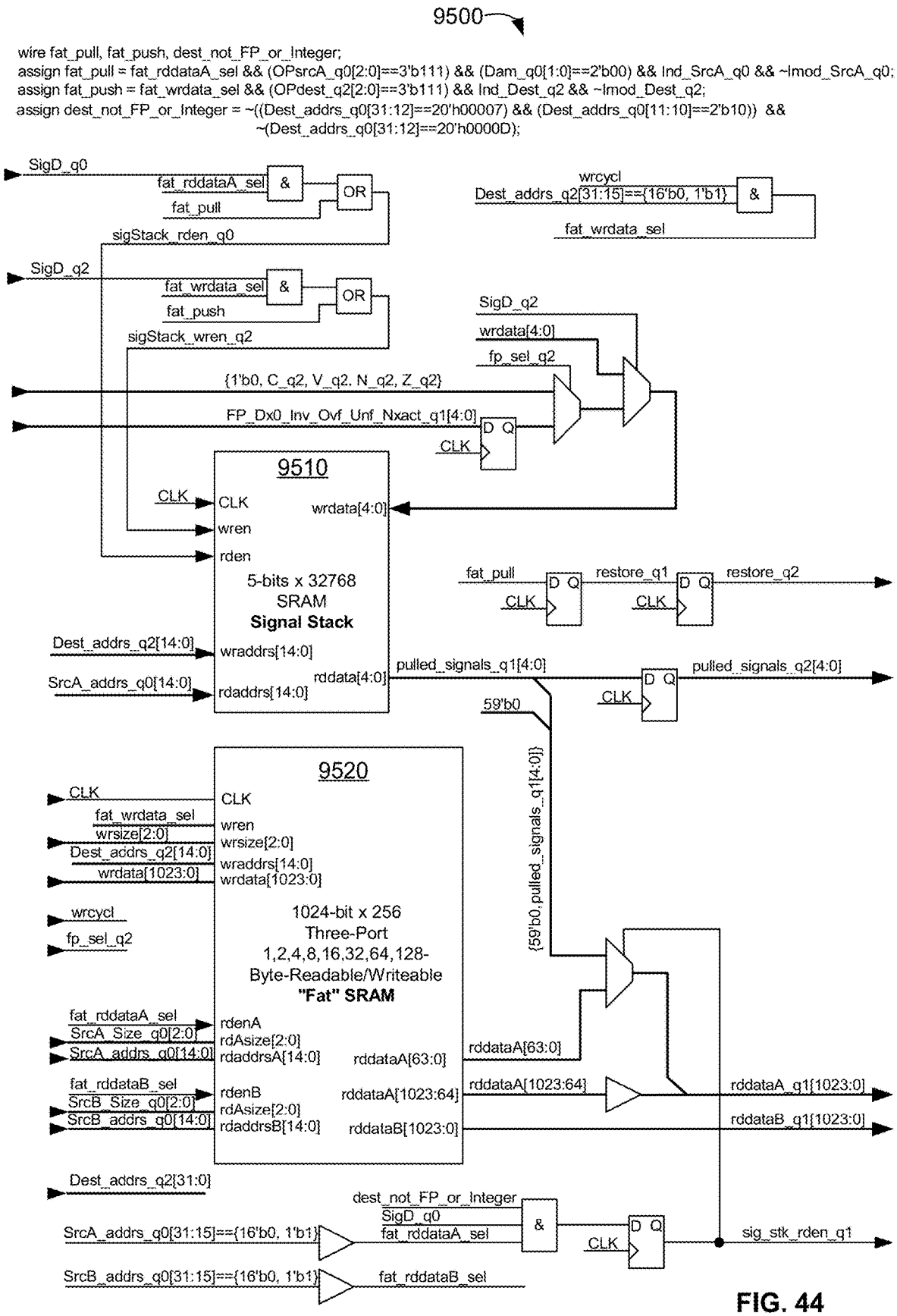
FIG. 44 is a block diagram of an exemplary embodiment of a multi-function dual asymmetric "fat" stack and "fat" SRAM block used for operator context save-restore operations and other general-purpose functions.

FIG. 44 is a block diagram of an exemplary embodiment of a multi-function dual asymmetric "fat" stack and "fat" SRAM block 9500 used for operator context save-restore operations and other general-purpose functions. Among the problems associated with implementing a opcodeless processor (wherein its memory-mapped floating-point, integer arithmetic and logical operators are completely decoupled from the processor's instruction pipeline, and wherein these operators have their own block of SRAM that results automatically spill into), is that there needs to be a way to save and restore results that may already be stored in one or more of a given operator's memory-mapped result buffers. The main reason for this is so that interrupt service routines and called subroutines can use these operators without corrupting these results that may already be residing inside the result buffer the service routine or subroutine needs to use.

One problem is that the five exception signals of a given floating-point operator and the four condition signals of integer arithmetic and logical operators need to be preserved simultaneously with its actual computed result. If the computed result is 32 bits wide, there is no room to store these signals within the standard-sized word. If the result is 64 bits, there is still no room. This is because the processor can only read or write in groups of 8, 16, 32, 64, 128, 256, 512 or 1024 bits at a time. It would be possible to store a 32-bit result, along with its 5-bit exception signals, in a 64-bit location, but this is exceedingly inefficient in that almost half the bits are wasted. For example, when a 512-bit result, along with its 5-bit exception, needs to be saved, this would imply that 507 bits of the 1024-bit write would be wasted just to preserve the exception signals. Furthermore, the logic to handle all possibilities of sizes would be exceedingly complicated.

The circuit shown in FIG. 44 solves this problem. When a result is pulled from its result buffer and pushed into the address range of where this block is mapped in the processor's data RAM using the stack pointer (SP) as the destination address, the computed result is stored in fat SRAM 9520 at the byte address specified in SP and the exception signals are simultaneously stored in the separate signal stack SRAM 9510 at the address specified in SP.

It should be understood that for 8-bit results, such may be pushed anywhere within the fat SRAM 9520 because it is one-byte aligned, meaning it can be written anywhere within the SRAM. A 16-bit result being pushed into the fat SRAM 9520 must be aligned on 2-byte address boundaries; a 32-bit result must be aligned on 4-byte address boundaries; and so forth.

Note that the signal stack SRAM 9510 is only five bits wide, which is just wide enough to accommodate the 5-bit exception signals of floating-point operators and 4-bit condition signals of integer arithmetic and logical operators. If multiple single 8-bit bytes are pushed into the fat SRAM 9520 in consecutive locations, so will their respective signals be pushed into the signal stack SRAM 9510 into consecutive locations. But suppose there are multiple pushes of 8-byte (64-bit) results into consecutive locations on proper boundaries of the fat SRAM 9520. In such case, the exception signals will be simultaneously pushed into the signal stack SRAM 9510 every eight locations, leaving the locations between them undisturbed. This is because, when performing the push of the 64-bit result into the fat SRAM 9520, the address for the next push must be incremented by eight, because the fat SRAM 9520 is byte-addressable.

When performing the push of a result into the fat SRAM 9520, the user need not be concerned with the signal stack SRAM 9510, in that the simultaneous push of the exception or condition code into the signal stack SRAM 9510 is automatic.

It should be understood that the fat SRAM 9520 is randomly accessible and can be used as ordinary SRAM if desired. This block of SRAM is useful for storage of decimal character sequences because it can be written to 128 characters at a time. Because it has two read-side ports, it can be read up to 256 characters at a time, 128 characters from side A and 128 characters from side B. This comes in handy when computing directly with decimal character sequences where the target operator, such as the instant invention's Universal Fused-Multiply-Add operator allows two decimal character sequence operands as input.

While the circuit 9500 can be used as general-purpose SRAM for storage decimal character sequences as described above, it's other main purpose is for use as a stack that is wide enough to save and restore results of operators such as convertToDecimalCharacter, convertToHexCharacter, the instant invention's Universal FMA, and certain future tensor operators that have "gobs" of data as a result comprising multiple parallel results from multiple parallel operators that can be read and written in a single clock.

As described earlier, contents of result buffers, along with their exception/condition code signals, are pushed into the dual asymmetric stack made up of the signal stack SRAM 9510 and the fat SRAM 9520 using the SP as the destination, such that when the result is written into the fat SRAM 9520, its corresponding exception/condition code signals are automatically and simultaneously written into the signal stack SRAM 9510 at the location specified in SP.

To restore the saved result and its corresponding exception/condition code back into the same or different operator result buffer, the SP is used as the source address, such address abiding in the aligned boundary requirement mentioned previously. When the SP is used as the source address and such address fall within the range of where the circuit 9500 is mapped, not only will the result buffer be restored, but also its corresponding exception/condition code signals simultaneously along with it.

At the top of FIG. 44 is shown the Verilog source code used to create the special logic that detects when the SP is used as either the source or destination address, wherein the address falls within the range of where the circuit 9500 is mapped in the processor's data memory.

As mentioned previously, the fat SRAM 9520 can be used as data 1, 2, 4, 8, 16, 32, 64, 128-byte-readable/writeable data RAM, provided that such reads and writes occur on boundaries evenly divisible by the number of bytes being read or written. As such, debuggers can easily modify the contents of the computed results of a given result buffer by first pushing such results into the dual asymmetric stack memory of circuit 9500.

Since the signal stack SRAM 9510 shadows the fat SRAM 9520 within the same address range, one problem arises from such configuration is, how to modify the exception/condition code signals saved in the signal stack SRAM 9510 after an operator result buffer save operation. Stated another way, it is desirable for debuggers to easily access and modify the contents of the signal stack SRAM 9510 during debugging operations. The circuit 9500 solves this problem with the use of the SigD bit 170 of the instruction. When overwriting the contents of a given location within the signal stack SRAM 9510 with a new value, simply set the SigD bit 170 by use of the "s" character for the destination field 120 of the instruction 100. Thus, with SigD="1", any write to an address within the address range of circuit 9500 will be written to the signal stack SRAM 9510 instead of the fat SRAM 9520. Likewise, if it is desired to randomly read the contents of a location within the signal stack SRAM 9510, simply precede the size field 180 of destination field 120 with a "s" character, thereby setting destination 120 SigD bit to a "1", such that when that address is accessed, the contents of the signal stack SRAM 9510 at that address is driven onto the five LSBs of the A-side read bus instead of the fat SRAM 9520. Thus, the SigD bit 170 of the destination 120 field is used to select from which memory (the fat SRAM 9520 or the signal stack SRAM 9510) data will be read or written outside of context save/restore operations.

It should be further understood that the size (address range) of circuit 9500 can be increased as much as the application requires by substituting the 64k-byte version of circuit 9500 for the optional data SRAM block 950 in FIG. 9. If an even larger version is required, such can be accomplished by mapping a 128k-byte version beginning at data memory location 0x00020000, and so forth.

Figure 45:
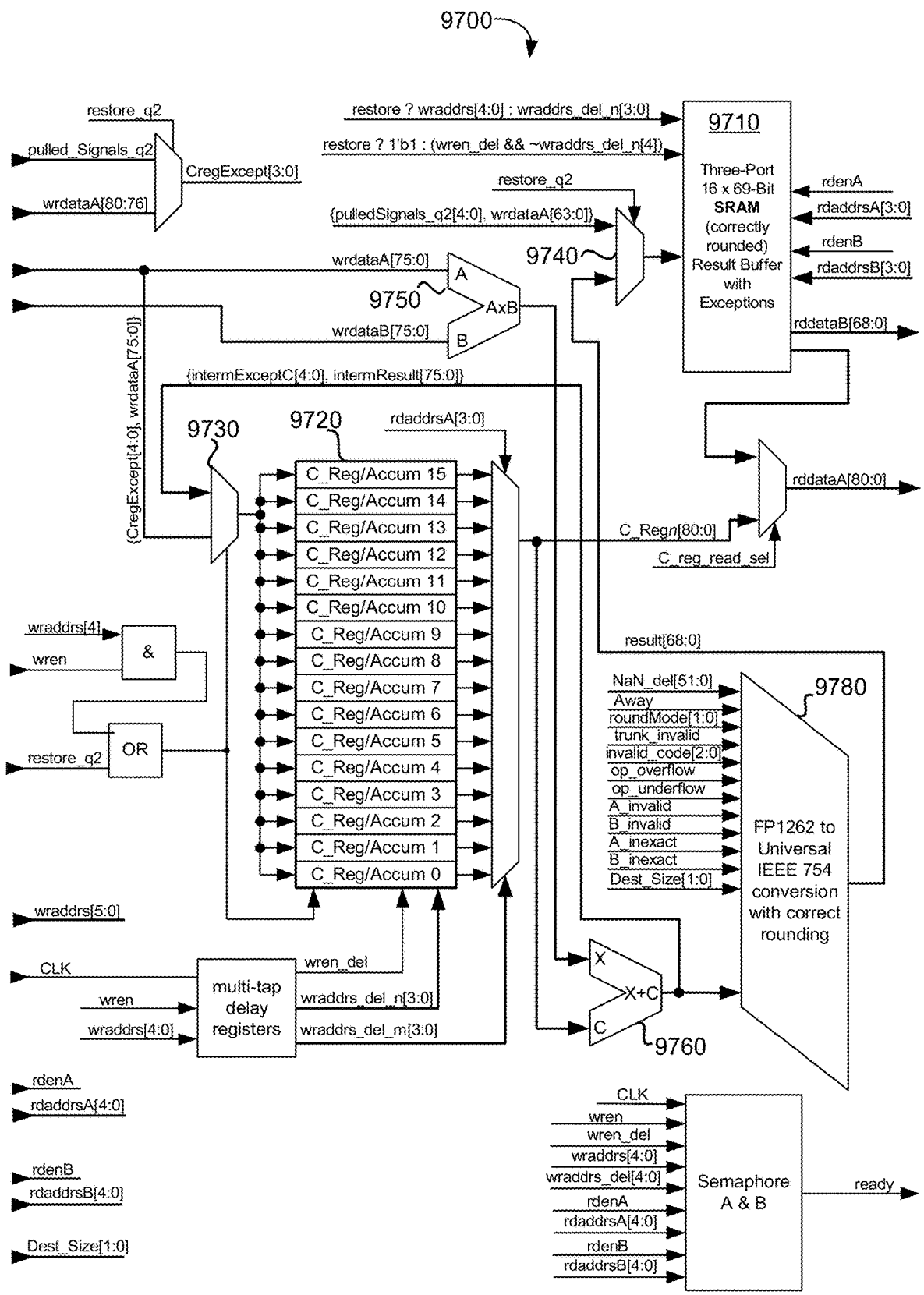
FIG. 45 is a block diagram of an exemplary embodiment of a memory-mapped, fully restoreable, stand-alone, double-precision floating-point "fusedMultiplyAdd" (FMA) operator module, which is designed to also operate as a sum-of-products operator.

FIG. 45 is a block diagram of an exemplary embodiment of a memory-mapped, fully restoreable, stand-alone, double-precision floating-point "fusedMultiplyAdd" (FMA) operator module 9700, which is designed to also operate as a sum-of-products operator. The FMA operator module 9700 includes a 16-entry by 69-bit SRAM result buffer 9710, restore capability, and ready semaphore, presented here without universal decimal character front end. The FMA operator module 9700 also includes a floating-point multiplier 9750 that accepts 76-bit inputs for both operands A and B. The 76-bit operand A and operand B inputs are the results of their respective upstream "universal input converter" shown in FIG. 22A, which converts binary16, binary32, or binary64 format numbers to binary76 format used by the a floating-point multiplier 9750 and provides interim exception signals seen entering FP1262-to-universal-IEEE-754 converter 9780 during the process of the upstream conversion. Because binary16, binary32, and binary64 formats convert "up" to the larger FP1262 format, such conversions will always be exact.

The binary76 format comprises a sign bit as the MSB, a 12-bit exponent and a 62-bit fraction (FP1262). The purpose of the 12-bit exponent (as opposed to 11-bit exponent of binary64 format numbers) is to support computation with subnormal numbers, as mandated by IEEE 754-2008, when the FMA operator module 9700 is employed as a pure FMA. The extra 10 bits in the fraction part is to help absorb underflows when the FMA operator module 9700 is employed as a sum-of-products operator in extended series computations involving small numbers.

The FMA operator module 9700 also includes quantity (16) 81-bit C-register/accumulators 9720, one for each of this operator's inputs. Note that the five MSBs of a given C-register/accumulator are the exception signal bits divX0, invalid, overflow, underflow, and inexact. The lower 76 bits are the FP1262 representation that was automatically converted upstream by the same universal IEEE 754-to-FP1262 converter (see FIG. 22A) used for converting operandA. For initialization to positive zero, a single one-byte write may be used, since the upper bits of a zero value, no matter the size, is automatically zero-extended during the write operation.

The C-registers' addresses are offset from their respective FMA inputs by 16 locations. Refer to table 3010 of FIG. 12A for the input addresses of the FMA input buffers and their respective C-register/accumulators. Before computing with the FMA operator module 9700 as a pure FMA, the C-register corresponding to the desired FMA input buffer number must be initialized with a value for operandC of the R=(A*B)+C equation. Once the C-register(s) corresponding to the FMA input buffers that are to be used have been initialized, the FMA operation can be performed by simply pushing operandA and operandB (using a dual-operand push) into the corresponding FMA input buffer location.

Once operandA and operandB are simultaneously pushed into the FMA operator module 9700, the FP1262 floating-point multiplier 9750 multiplies them together, producing an un-rounded FP1262 result comprising a sign bit, 12-bit exponent, 62-bit fraction and the three GRS bits. For a FP1262 multiplier, this intermediate result can usually be accomplished in a single clock, thus after the first clock, the intermediate result is fed into a FP1262 floating-point adder 9760, which in turn computes the sum of the product of the floating-point multiplier 9750 just computed and the current value of its corresponding C-register/accumulator in C-register bank 9720. Depending on the design of the floating-point adder 9760, the addition operation can be achieved in one to three or four clocks for an FP1260 adder. The output of the adder then enters data selector 9730 and universal IEEE 754 converter 9780. At this point, the intermediate result from the floating-point adder 9760 remains un-rounded. The other input to data selector 9730 is only used for initializing and restoring a given C-register in C-register bank 9720. Thus, at all other times, the intermediate result from the floating-point adder 9760 enters data selector 9730 so that it will automatically update the selected C-register/accumulator of C-register bank 9720 for use in the next FMA computation involving it, hence the C-register now becomes an accumulator.

Stated another way, for pure FMA operations, the C-register is always initialized as operandC before operandA and operandB are simultaneously pushed into the corresponding FMA input buffer and, hence, it remains a C-register for holding a operandC value for use in a single R=(A*B)+C computation. For use as a sum-of-products operator, the corresponding C-register is initialized only once, usually with a 0, followed by a series of pushes of operandA and operandB. It can be seen that every time the floating-point adder 9760 produces an intermediate, un-rounded result, the pertinent C-register in C-register bank 9720 is automatically updated with such results and thus becomes an accumulator, the contents of which are used in the next sum-of-products iteration.

Simultaneous with the C-register/accumulator being updated, the intermediate FP1262 results of the floating-point adder 9760 are automatically converted to either binary16, binary32, or binary64 format by the universal IEEE 754 converter 9780 as specified by the Dest_Size[1:0] input, such also being correctly rounded according to the rounding direction specified by inputs roundMode[1:0] and Away. The converted and correctly rounded final result then enters data selector 9740 before being automatically written, along with its five exception bits, into 16-entry SRAM result buffer 9710. Note that for binary16 and binary32 final result formats, the MSBs are automatically zero extended to 64 bits, with bits D68 thru D64 being occupied by the five exception signals, for a total of 69 bits. It should be noted here that the other input of the data selector 9740 is for use in result buffer restore operations so that results in the SRAM result buffer 9710 do not have to be re-computed during context save/restore operations typical of subroutine calls or interrupt service routines. Like the other floating-point operators shown in block 3010 of FIG. 22A, the FMA operator module 9700 also comprises a SRAM-based semaphore circuit for generating a ready signal to indicate when a given result is ready when being read by the processor.

Also like the other operators in block 3010 (FIG. 22A), it should be understood that some applications may not need or want a "universal" converter to automatically convert the FP1262 intermediate result of the universal IEEE 754 converter 9780 to binary16 or binary32 formats, but may prefer instead to do so with a separate and explicit conversion operation once a final result is obtained and stored in the SRAM result buffer 9710. In such cases, the universal IEEE 754 converter 9780 can be substituted with a FP1262 to binary64 (FP1152) converter.

An important consideration regarding the stand-alone FMA operator module 9700 is the fact that if the floating-point adder 9760 takes more than one clock to complete, the time between successive pushes to the same FMA input buffer must be delayed by the number of extra clocks beyond the first. This is because floating-point adder 9760 will not have otherwise completed the computation of the previous result in time to be available for use as an operandC. Thus, if only one FMA input is to be used for successive FMA computations, as might be the case when the FMA operator module 9700 is used as sum-of-products of products operator, NOPs or some other instruction must be executed before subsequent pushes into the same FMA input buffer location. Stated another way, do not use the REPEAT instruction to perform multiple successive pushes to the same input buffer location, because the result of the floating-point adder 9760 will not have time to complete before the next push.

For sum-of-products operations involving multiple vectors, this should not be a problem, because, when employing the REPEAT instruction, the destination address in an Auxiliary Register can be made to automatically index into the adjacent FMA input buffer location. Thus, up to 16 vectors of any length can be computed rapidly using the REPEAT instruction inside a hardware loop counter loop to index into C-register bank 9720 using indirect addressing mode with auto-post-modification, such that, when the 16th buffer is reached (i.e., the REPEAT counter has reached 0), a branch back to the beginning of the loop is taken and the REPEAT counter re-initialized to 15 to begin the next iteration. Stated another way, by the time the next sum-of-products iteration begins, intermediate results from the floating-point adder 9760 will be available for use as operandC in that iteration. Some examples are provided below:

```
demoS:   _8:C.0 = _8:PI
         _8:FMA.0 = (_8:workA, _8:workB)
demoT:   _8:C.0 = _1:#0 //this will NOT work for above reasons
         _4:AR1 = _4:#vectA
         _4:AR2 = _4:#vectA +8
         _4:AR3 = _4:#FMA.0
         _2:REPEAT = _2:#45
         _8:*AR3++[0] = (_8:*AR1++[16], _8:*AR2++[16])
```

The first example above, demoS, is a simple FMA operation using direct addressing mode. Location PI contains a binary64 representation for the value of PI. WorkA contains the binary64 value for operandA, and workB contains the binary64 value for operandB. As can be seen, C-register at location C.0 is initialized with the contents of location PI, followed by a dual-operand push of the contents of location workA and workB.

The second example above, demoT, shows what NOT to do using the FMA operator module 9700 as a sum-of-products operator. First, C.0 is initialized with an immediate 0. Then AR1 is initialized with the immediate pointer to the first binary64 format operandA in the vector. AR2 is initialized with the immediate pointer to the first binary64 format operandB in the vector. AR3 is initialized with the immediate pointer to the first FMA input buffer location, FMA.0. Next, the REPEAT counter is loaded with the immediate value 45, causing the next instruction to be executed 46 times. Note that the destination address in AR3 never changes because it is being incremented by zero, because the original intent was to do a sum-of-products on a single vector. The problem with this instruction sequence is that after the second fetch of the instruction following the REPEAT instruction, the execution of the first fetch has not yet completed, because the floating-point adder 9760 requires more than one clock to complete and, consequently, its addition result is not yet available for use as the next operandC in the equation, R=(A*B)+C, on the very next clock.

To employ the present disclosure's stand-alone, hardware FMA operator module 9700 as a sum-of-products operator, where the push of the two operands is always to the same input buffer location, use one of the processor's hardware loop counters in a software loop instead of the REPEAT instruction. Doing so gives time for the floating-point adder 9760 to complete before the next pair of operands are pushed into that operator. Here is an example routine that uses the FMA operator module 9700 as a sum-of-products operator where the push of the two operands is always to the same input buffer location:

```
demoU:      _   _8:C.0 = _1:#0
            _   _4:AR1 = _4:#vectA
            _   _4:AR2 = _4:#vectA +8
            _   _4:AR3 = _4:#FMA.0
            _   _2:LPCNT0 = _2:#46
loopU:      _   _8:*AR3++[1] = (_8:*AR1++[16], _8:*AR2++[16])
            _   _4:PCS = (_2:LPCNT0, 16, loopU)
```

In demoU above, instead of loading the REPEAT counter with an immediate 45, the hardware loop counter LPCNT0 is loaded with an immediate 46. The loop comprising just two instructions is executed 46 times and intermediate results are accumulated in FMA.0 C-register/accumulator (C.0) after each iteration, resulting in a final, correctly rounded result being automatically stored in FMA result buffer, FMA.0, which can be pulled out of either the A side or B side of the SRAM result buffer 9710.

The example loopU works for use with a single FMA input buffer because the fetch of the PCS instruction will not execute until two clocks later, for a total of three clocks, due to the processor's three-stage instruction pipeline. The above assumes that the floating-point adder 9760 pipeline is no more than two clocks deep because it takes one more clock to actually write the 81-bit intermediate result into the specified C-register/accumulator of C-register bank 9720. If a given implementation's floating-point adder 9760 requires more than two clocks to complete, then NOPs should be inserted just before the branch as shown in the following example, which is for a 4-clock adder circuit. Note that a "_" character standing alone (except for optional label) on the assembly line effectuates a NOP because it assembles into machine code 0x0000000000000000, which, when executed, reads data RAM location 0x00000000 from both side A and side B and writes it back into location 0x00000000, further noting that location 0x00000000 in data RAM is always read as 0, no matter what value was previously stored there.

```
loopUa:   _    _8:*AR3++[1] = (_8:*AR1++[16], _8:*AR++[16])
          _
          _    _4:PCS = (_2:LPCNT0, 16, loopUa)
```

It should be understood that a correctly rounded intermediate result is automatically stored in the SRAM result buffer 9710 at the completion of each iteration and can be read anytime. It should be further understood that simultaneous with the automatic storage of a correctly rounded result in the SRAM result buffer 9710 at completion of each iteration, so too is a un-rounded, 81-bit intermediate result stored in the corresponding C-register/accumulator (C.0 in this case) in C-register bank 9720 upon completion of each iteration, which can be pulled out of the A side any time.

One application for using the hardware FMA operator module 9700 as a sum-of-products operator is a very efficient computation of multi-vector tensors. In the following example, both the hardware loop counter and REPEAT counter are used. In this example, it is ok to use the REPEAT counter because the destination FMA input buffer changes with each push/clock. In the hardware FMA operator module 9700, logic and delay registers correctly and automatically distribute for storage in C-register bank 9720, the intermediate result of the floating-point adder 9760, as well as a correctly rounded final result into result buffer SRAM 9710, all corresponding to their original push locations. In the following example, there are quantity (16) double-precision, dual operand vectors of quantity (32) entries each. Each vector has its own FMA input location. For instance, vector0 operand pairs are pushed into FMA.0, vector1 operand pairs are pushed into FMA.1 and so on, all the way up to FMA.15 for vector16.

```
demoV:    _    _4:AR5 = _4:#C.0
          _    _2:REPEAT = _2:#15
          _    _8:*AR5++[1] = _2:#0
          _    _4:AR3 = _4:#vectB
          _    _4:AR2 = _4:#vectB + 8
          _    _2:LPCNT0 = _2:#32
loopV:    _    _4:AR0 = _4:#FMA.0
          _    _2:REPEAT = _2:#15
          p    _8:*AR0++[1] = (_8:*AR3++[16], _8:*AR2++[16])
          _    _4:PCS = (_2:LPCNT0, 16, loopV)
```

The first three instructions of demoV above initialize all 16 C-registers in C-register bank 9720 to 0. Next, Auxiliary Registers AR3 and AR2 are initialized with the pointers to the first operand A and first operandB of the first vector, wherein, vector data is arranged sequentially in SRAM such that the first operandA and the first operandB of the second vector follow the first, and continues in a round-robin fashion, such that the second operandA of the first vector immediately follows the the first operandB of the 16th vector in SRAM. The data is arranged in SRAM this way so that the pointers into the vectors need be initialized only one time.

Next, hardware loop counter LPCNT0 is loaded with the immediate value 32, which is the number of operand pairs in each of the 16 vectors. LoopV is the entry point for the software loop, wherein, on each entry, Auxiliary Register is loaded with address of the first FMA input buffer, which corresponds to the first vector sum-of-products. Once AR0 is loaded, then the REPEAT counter is loaded with the number of additional times the next instruction is to execute. In this case, the instruction following the REPEAT instruction will be executed a total of 16 times. Note that the mnemonic is the "p" character, which signals the universal IEEE 754 converter 9780 to correctly round each final result towards positive infinity before storing it into the SRAM result buffer 9710. The PCS instruction is a conditional load of the PC. In this case, bit 16 (the "not_zero" flag) of LPCNT0 is tested to see if it is not zero. If not zero, the PC performs a relative branch to loopV. If zero, then the PC continues incrementing (exits the loop).

Like all the other operators of blocks 3010 (FIG. 22A) and 4000 (FIG. 23), the result buffers of the FMA operator module 9700 and C-register/accumulators of C-register bank 9720 are fully restoreable. It should be noted that the C-register/accumulators are 81 bits wide, thus when pulling and pushing them from/to the asymmetric memory stack 9500 (FIG. 44) or the fat SRAM 9520 or optional data SRAM 950 (FIG. 9), a size of 16 (128 bits) is to be used for the source and destination sizes. When pushed into the dual asymmetric stack using SP as the destination address, the corresponding exception bits of the C-register/accumulator will automatically be pushed into the signal stack 9510 of the asymmetric memory stack 9500. When pulled using SP as the source address with the FMA operator module 9700 as the destination, the exception bits will be automatically and simultaneously restored from the signal stack 9510.

Figure 46A:
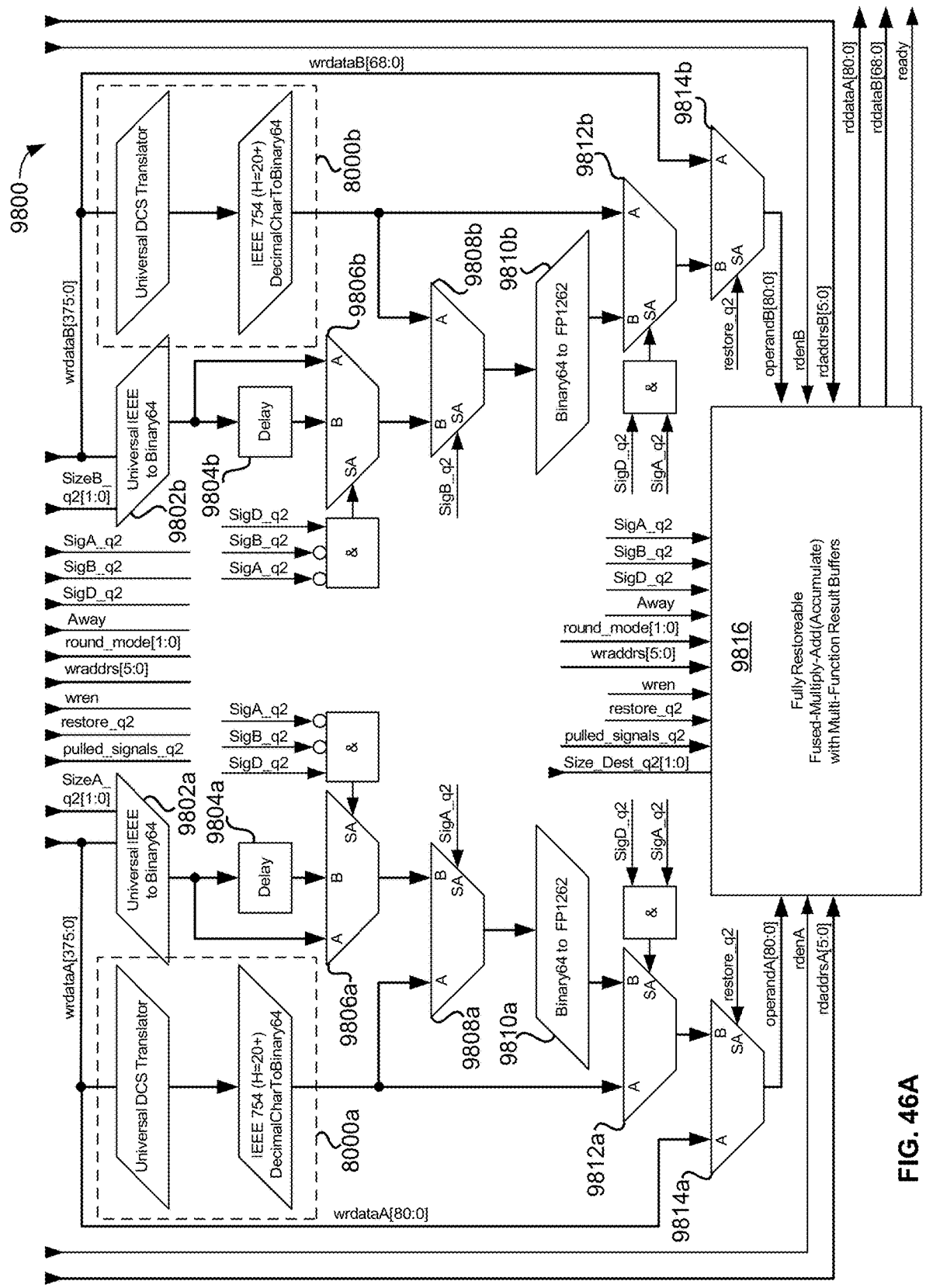
FIG. 46A is a top-level block diagram of an exemplary embodiment of the present disclosure's memory-mapped, stand-alone, fully restoreable, multi-function, Universal Fused-Multiply-Add (FMA) (and accumulate) operator module, including dual convertFromDecimalCharacter converters on the input.

FIG. 46A is a high-level block diagram of an exemplary embodiment of the present disclosure's memory-mapped, stand-alone, fully restoreable, multi-function, Universal Fused-Multiply-Add (FMA) (and accumulate) operator module 9800, including dual convertFromDecimalCharacter converters on the input.

The multi-function universal FMA operator module 9800 is multi-function because it can be employed as an FMA operator, a sum-of-products operator, or a dual IEEE 754-2008 "H=20" convertFromDecimalCharacter sequence operator. The multi function universal FMA operator module 9800 is universal because it can directly accept as input binary16, binary32, binary64 format numbers, and/or decimal character sequence numbers up to 28 decimal digits in length in any combination, without first having to explicitly convert them to binary beforehand and can output correctly rounded results in binary16, binary32, or binary64 format according to the destination size specified in the size field 180 of instruction 100 (FIG. 1), again without having to explicitly convert the result with an separate operation.

Operands wrdataA[375:0] (operandA) and wrdataB[375:0] (operandB) can each be up to 376 bits wide and each may propagate to an FMA operator 9816 via one of several paths in the pipeline as determined by inputs {SigD_q2, SigA_q2 and SigB_q2}, collectively, and in that order ("SIGNALS"). Referring to instruction format 100 of FIG. 1, SigD_q2 is the size 180 of the DEST 120 delayed by two clocks, SigA_q2 is the size 180 of the srcA 130 delayed by two clocks and SigB_q2 is the size 180 of the srcB 140 delayed by two clocks. The purpose of the 2-clock delay is to align those inputs with the execution cycle of the processor, which happens during Stage q2 (see FIG. 6).

At this point, it should be understood that inputs such as SigA_q2, SigB_q2, wraddrs[5:0], wren, etc., must be delayed internally by the multi-function universal FMA operator module 9800 the appropriate number of clocks to maintain coherency with its overall pipeline and, as such, some of these will have more than one tap because some are needed at various stages within the pipeline.

When SIGNALS is "000" at the time of the push of operandA and operandB into the multi-function universal FMA operator module 9800, the operands both follow the route that goes thru the universal IEEE 754-to-binary64 converters 9802a and 9802b, respectively, that convert the binary format numbers from the format specified by their respective size input to binary64 format. Since the range of binary16 and binary32 numbers are smaller format than binary64, such conversions are always exact. Thus, except for maybe signaling NaN, no exceptions are produced at this point.

The output of converters 9802a and 9802b then enter their respective delay blocks 9804a and 9804b, respectively. The number of sequential registers in the delay block must equal the number of stages in the IEEE 754 decimalCharToBinary64 converters of 8000a and 8000b so that pipeline coherency is maintained in cases where input formats are a mix of binary format and decimal character sequence formats, or in cases where the previous or subsequent push into 9800 contains a decimal character format number. The outputs of 9804a and 9804b then enter the B input of data selector 9806a and 9806b then the input of binary64-to-FP1262 converter 9810a and 9810b, respectively, in that the FMA circuit in 9816 only operates on FP1262 binary format numbers, which have a sign bit, 12-bit exponent and 62-bit fraction. FP1262 formatted numbers have one more bit in the exponent and ten more bits in the fraction than binary64 format numbers. The purpose of the extra bit in the exponent is to prevent underflow and overflow in single iteration computations. The purpose of ten extra bits in the fraction is to help absorb underflows during relatively long series sum-of-products computations involving small numbers.

The output of binary64-to-FP1262 converters 9810a and 9810b then enter the B input of data selector 9812a and 9812b, respectively, then the B input of data selector 9814a and 9814b, respectively, finally arriving at their respective inputs to FMA block 9816 (FIG. 46B), where they are operandA and operandB of the computation to be performed by the FMA block 9816.

When SIGNALS is "100" this means that both operands are binary format, as in the case above for when SIGNALS is "000", except delay blocks 9804a and 9804b are to be bypassed, thereby substantially reducing the overall pipeline latency of 9800 by roughly 28 clocks in the instant implementation. Beyond this point in the 9800 pipeline, the operands follow the same path as for when SIGNALS is "000" as described above.

This mode can be used in cases where 9800 is being employed as a pure FMA or sum-of-products operator and no decimal character sequences are involved at any stage in the overall computation, for example, a single FMA computation or a sum-of-products computation involving shallow vectors. Otherwise, when employing 9800 as a FMA for a single computation involving binary format operands, the processor will stall for period of time roughly equal to the pipeline depth of 8000 when attempting to immediately pull a result from 9800's result buffer.

When SIGNALS is "010", "001" or "011", the operand input with a logic "1" for its respective SigA_q2 and/or SigB_q2 input is treated as a decimal character sequence and thus propagates thru converter 8000a and/or 8000b where it is first translated to the default decimal character input format 300 if in a format shown in 400 of FIG. 5. Once translated to the default character sequence input format, it is then converted to binary64 format by the IEEE 754 decimalCharacterToBinary64 converter 8000a and/or 8000b, respectively, and then, from this point forward, follows the same path as described above when SIGNALS is "000".

Figure 46B:
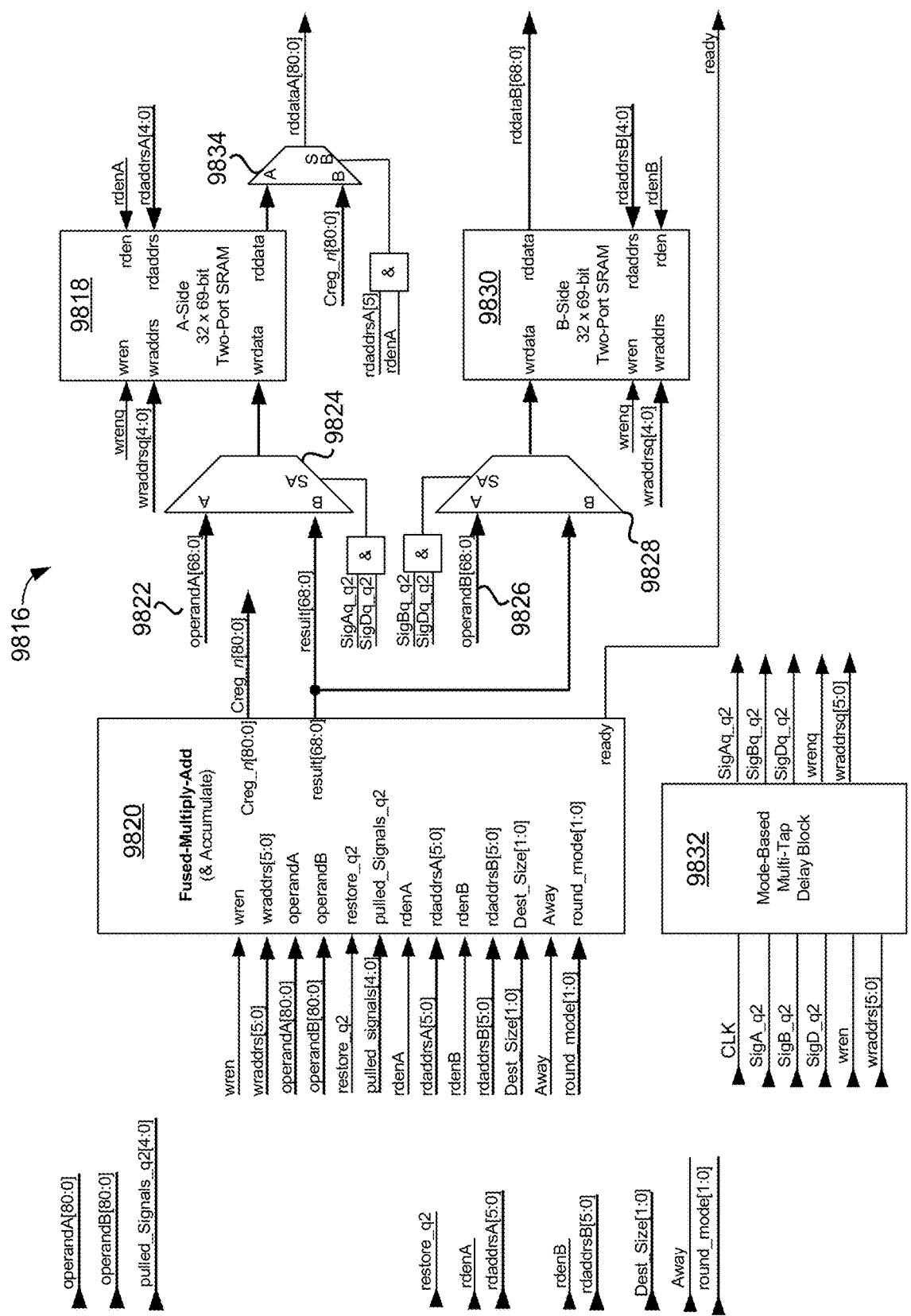
FIG. 46B is a block diagram illustrating an exemplary embodiment of the Universal FMA (and accumulate) circuit and "split" SRAM block for storage of either dual convertFromDecimalCharacter results, FMA or sum-of-products results, readable on side A and side B.

When SIGNALS is "111", "110" or "101", either one or both operands are decimal character sequences, but no FMA computations are involved. Rather, the multi function universal FMA operator module 9800 is to be used as solely as a single or dual IEEE 754-2008 H=20 convertFromDecimalCharacter converter. Thus, in this mode, the FMA circuit 9820 of FIG. 46B is bypassed and the result of the conversion by converters 8000a and/or 8000b is automatically stored in their respective result buffer 9818 and/or 9830, respectively. The main idea here is, considering the fact that the conversion circuit 8000 employed by converters 8000a and 8000b are rather large, in many implementations it may not be feasible to incorporate yet a third conversion circuit 8000 just to handle routine convertFromDecimalCharacter operations. With just a little bit more logic, the multi function universal FMA operator module 9800 is now able to be employed not only as a universal pure FMA operator and/or sum-of-products operator, but also as a single or dual IEEE 754-2008 H=20 convertFromDecimalCharacter operator. In this mode, when used in combination with the REPEAT instruction, the multi-function universal FMA operator module 9800 can effectively convert quantity (64) decimal character sequences, each up to 28 decimal digits in length, in roughly 64 clocks, which includes the clocks required to push them into, and pull them out of, the multi-function universal FMA operator module 9800. Stated another way, the apparent latency to convert quantity (64) decimal character sequences to binary is zero, meaning it is free.

FIG. 46B is a block diagram illustrating an exemplary embodiment of the FMA (and accumulate) circuit 9820 and "split" SRAM block 9818 and 9830 for storage of either dual convertFromDecimalCharacter results, FMA or sum-of-products results, readable on side A and side B. The split SRAM block includes side-A data selector 9824, side-A SRAM 9818, side-B data selector 9828, side-B SRAM 9830, and a mode-based delay block 9832, which together form the middle and back-end of the multi-function universal FMA operator module 9800. The SRAMs 9818 and 9830 form a "split" SRAM block for storage of either dual convertFromDecimalCharacter results, FMA results, or sum-of-products results, readable on side A and side B.

The FMA circuit 9820 is bypassed by operandA and operandB when SIGNALS is "111", which configures the multi-function universal FMA operator module 9800 as a dual convertFromDecimalCharacter converter. In this configuration, the outputs of data selectors 9814a and 9814b (i.e., operandA 9822 and operandB 9826, respectively) are routed directly to the write data inputs of A-side result buffer SRAM 9818 and B-side result buffer SRAM 9830 via the A inputs of data selectors 9824 and 9828, respectively. Note that unlike the previously described mandated computational floating-point operators of block 3010 (FIG. 22A), which each employ a simple three-port (one write side and two read side) SRAM as a result buffer, the multi-function universal FMA operator module 9800 employs two true dual-port SRAM blocks arranged as a true four-port SRAM to function as a dual result buffer for simultaneous storage of two results when the multi-function universal FMA operator module 9800 is configured to operate as a dual convertFromDecimalCharacter converter. At all other times, the result buffer of FIG. 46B is configured to function as a three-port result buffer, in that in those cases, there is only one result coming from FMA circuit 9820 via the B inputs of data selectors 9824 and 9828 that is to be stored.

An advantage of being able to convert two decimal character sequences simultaneously, is that both binary format results can be simultaneously pulled out and then immediately pushed back into any dual-operand operator as operandA and operandB. For example, in the disclosed embodiment, only the Universal FMA operator can directly accept decimal character sequences as operandA and operandB. However, an application may need to divide one vector by another, but the data in the vectors are all decimal character sequence format. With the multi-function universal FMA operator module 9800 configured for use as a dual convertFromDecimalCharacter converter, and assuming there are at least 28 elements in each vector, using the REPEAT instruction the decimal character sequence data of both vectors can be simultaneously pushed into the multi-function universal FMA operator module 9800 and the converted results of both can be immediately pushed into the floating-point division operator, again using the REPEAT instruction. Thus, in this example, the cost or apparent latency for converting two decimal character sequences is only one clock per operand pair, which is the clock needed to push an operator pair into the multi-function universal FMA operator module 9800 in the first place, thus the apparent latency to actually convert them is zero, meaning it is free.

Just like all the floating-point operators of block 3010, the multi-function universal FMA operator module 9800 is fully restoreable, meaning that result buffers 9818 and 9830, in addition to all 32 of the FMA C-register/accumulator bank 9844 (shown in FIG. 46C) must be randomly readable and writable to support save/restore operations, such as during a subroutine call or interrupt service routine. Thus, data selector 9834 enables selection between result buffer 9818 data on data selector 9834 input B and the 81-bit C-register/accumulator contents specified by rdaddrs[4:0] when rdaddrs[5] and rden are both "1", such that, when result buffer 9818 is selected, the selected data is driven onto A-side read data bus rddataA[80:0] (with its data bits [80:64] padded with zeros), and when an element in the FMA C-register/accumulator bank 9844 is selected, all 81 bits of the specified C-register/accumulator are driven to the A-side data bus. The format of the C-register/accumulators are the same as that previously described for the C-register bank 9720 (FIG. 45).

The mode-based, multi-tap delay block 9832 does what its name suggests. Because the multi-function universal FMA operator module 9800 is universal and multi function, each operational mode has its own number of delays for required inputs such as wren (write enable), wraddrs (write address), etc., which must arrive at various places at the right time in the pipeline, depending on the mode of operation.

Figure 46C:
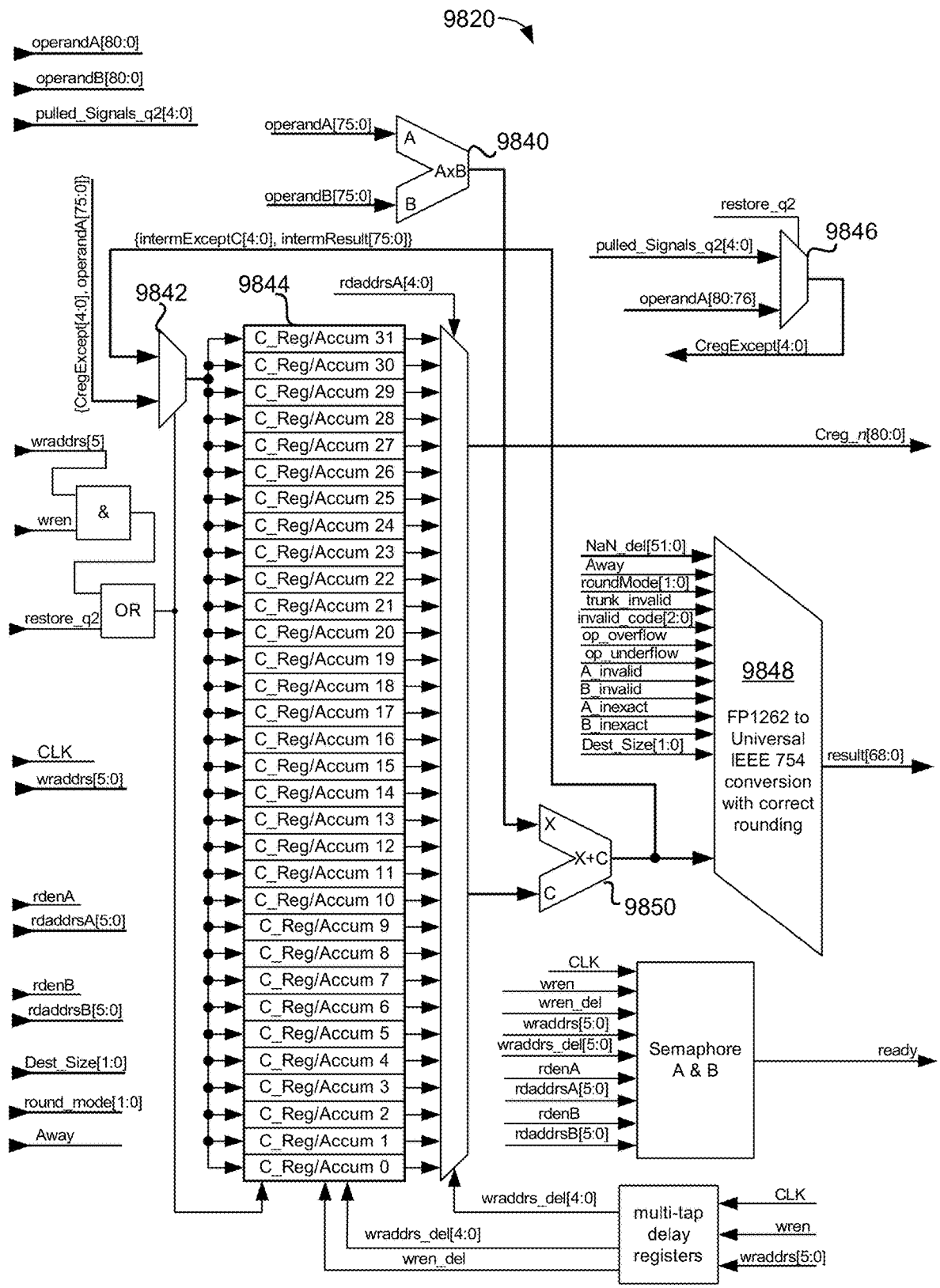
FIG. 46C is a block diagram illustrating an exemplary embodiment of the FMA circuit employed by the multi-function universal FMA operator module to perform both pure FMA and sum-of-products computations.

FIG. 46C is a block diagram illustrating an exemplary embodiment of the FMA circuit employed by the multi-function universal FMA operator module to perform both pure FMA and sum-of-products computations. The FMA circuit is presented here without universal decimal character front end, and is employed in the disclosed universal floating-point ISA's multi-function, universal FMA (& accumulate) operator.

Note that with the exception of the number of C-register accumulators in C-register bank 9844, the function of the FMA circuit 9820 is identical to the respective computation portions of the FMA operator module 9700 of FIG. 45. For more information on the operation of the FMA circuit 9820, refer to the section of the instant specification that pertains to the FMA operator module 9700.

Figure 47A:
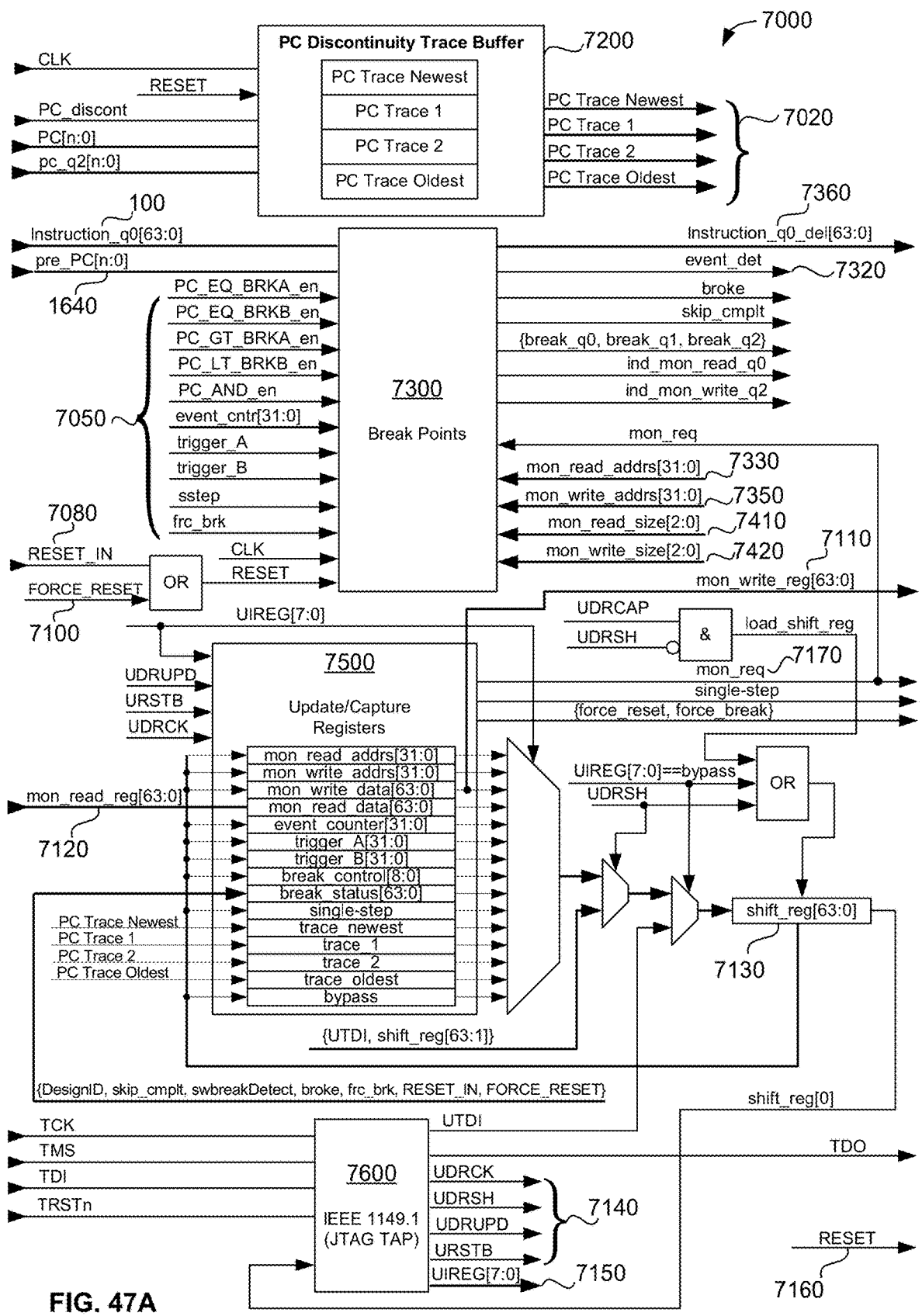
FIG. 47A is a block diagram of an exemplary embodiment of an optional hardware JTAG-accessible, breakpoint, trace buffer, and real-time monitor/debug module that enables on-the-fly, real-time-data-exchange operations between the parent CPU and up to quantity (16) child XCUs attached to it within the same device.

FIG. 47A is a block diagram of an exemplary embodiment of the present disclosure's optional hardware JTAG-accessible, breakpoint, trace buffer, and real-time monitor/debug module 7000 that enables on-the-fly, real-time-data-exchange operations between the parent CPU 600 and up to quantity (16) child XCUs 800 attached to it within the same device. In addition to real-time-data-exchange operations, the hardware debug module 7000 provides a PC discontinuity trace buffer 7200 and hardware breakpoint module 7300 that accepts as inputs debug control bits and PC comparison values for use as breakpoint triggers, along with their respective enables 7050 (collectively).

PC discontinuity trace buffer 7200 captures all bits of the implemented program counter (PC) anytime there is a discontinuity, meaning, anytime the PC is loaded, such load is detected and the PC value just before and after the discontinuity are captured and stored in the first-in, last-out queue of the PC discontinuity trace buffer 7200, such that the exit and entry addresses of the PC into program memory are recorded and visible to the host workstation by way of update/capture register block 7500, with such being shifted out via shift register 7130 to the host JTAG interface connected to IEEE 1149.1 JTAG state machine Test Access Port (TAP) 7600. The PC discontinuity trace buffer 7200 may record two PC discontinuity events, where each event comprises the PC value just before the discontinuity (the exit point) and the PC value immediately after the discontinuity (the entry point). Thus, the PC trace record comprises PC Trace Oldest (the previous PC exit point in history), PC Trace 2 (the previous PC entry point in history), PC Trace 1 (the most recent PC exit point in history) and PC Trace Newest (the most recent PC entry point in history) 7020 (collectively).

The main idea behind tracing only PC discontinuities instead of every PC value in history is to have at least a minimal processor program execution recordation capability for debugging and monitoring purposes without the expense of implementing a full trace buffer, understanding that the host debug station can reconstruct execution path in the software based on just the PC entry points and exit points and compiled program listing file. Note that 7020 can be sampled by the update/capture register block 7500, which is then loaded into shift register 7130 and scanned out thru via JTAG state machine TAP 7600 transmit data out (TDO).

Various methods and operations involved with employing an IEEE 1149.1 TAP for basic microprocessor debugging operations is well understood in the industry, including its use with a PC discontinuity trace buffer and certain aspects of implementing hardware breakpoints by way of update/capture registers 7500 and JTAG state machine TAP 7600 that provides an update data register clock (UDRCK), update data shift register enable (UDRSH), update data register enable (UDRUPD), update register strobe (URSTB) 7140 (collectively) and a 8-bit JTAG instruction register output 7150 that contains the JTAG instruction corresponding to the operation that is to be performed by the update/capture register block 7500 and the shift register 7130.

Among the functions that the hardware debug module 7000 can carry out include, resetting the parent CPU (which also resets any child XCUs attached to it when FORCE_RESET 7100 is active or global external RESET_IN 7080 is active), force hardware breakpoint on the parent CPU, single-stepping the CPU after it has encountered a software or hardware breakpoint, programming up to two PC comparison addresses and the type of comparison to be made and enabling same, event detection 7320 based on such comparison and event counting. Further, the hardware debug module 7000 provides a means for a host debug station to obtain status information such as whether the CPU is in a reset state, whether the CPU has encountered a software or hardware breakpoint and whether the CPU has completed a single-step command, which are all common and well know debug functions that an IEEE 1149.1 interface can be used for.

What sets the CPU's hardware debug module 7000 apart from prior art debug and monitoring capability is that the hardware debug module 7000 gives a host debug and development workstation the ability to monitor and exchange data in real-time with the target CPU (and any XCU included in the same or other JTAG scan chain) without the use of specialized processor opcodes, interrupts and their service routines, debug micro-kernel or DMA cycles.

As described above, the present disclosure does not employ opcodes of any kind in the instruction set. Instead, all processor registers and operators, including operators that carry out real-time monitoring and data exchange operations, are memory mapped and reside at specific locations designated for them in the processor's data memory space.

Figure 47B:
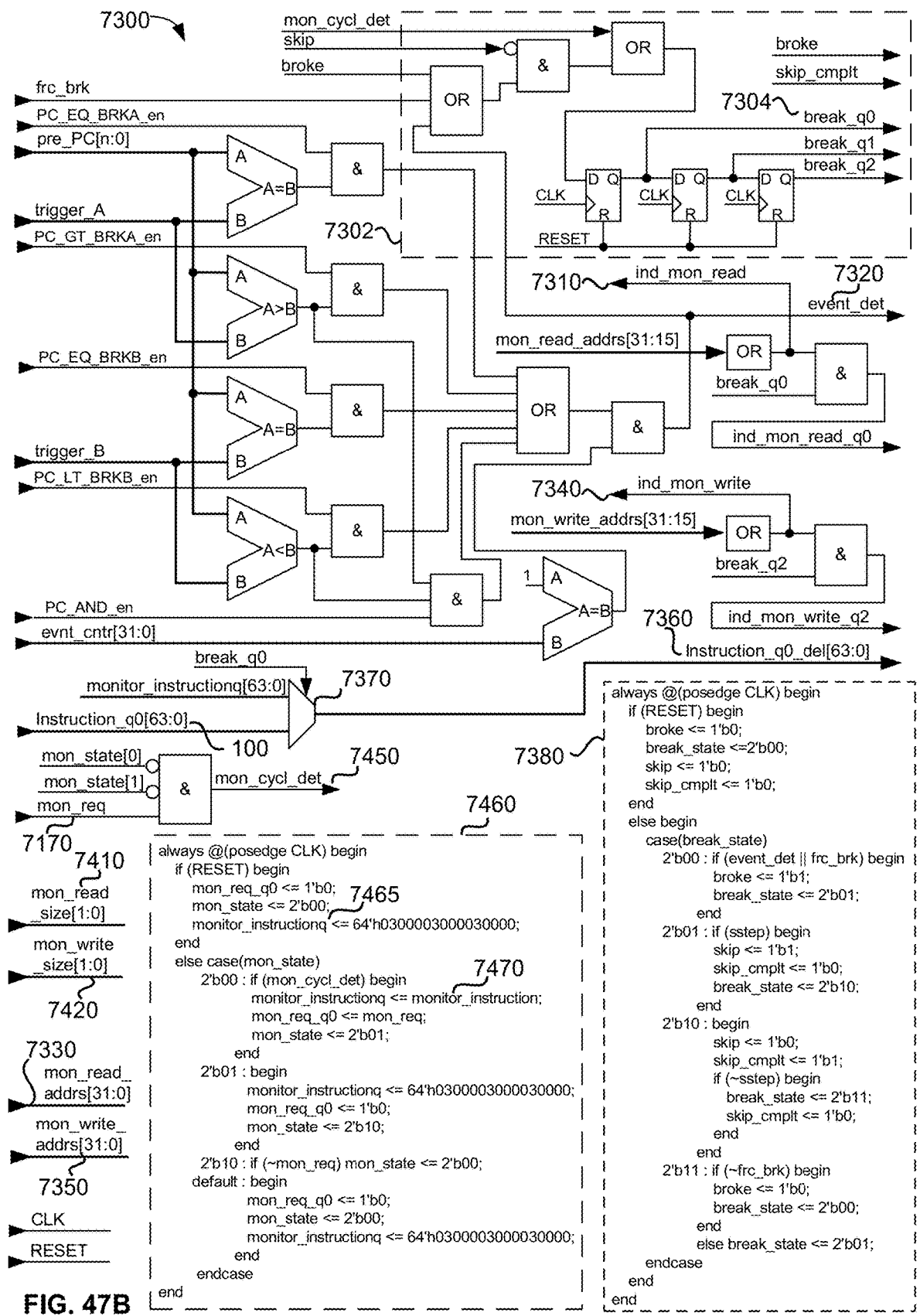
FIG. 47B is a block diagram illustrating an exemplary embodiment of a breakpoint, single-step and real-time monitor/debug module.

FIG. 47B is a block diagram illustrating an exemplary embodiment of a breakpoint, single-step and real-time monitor/debug module 7300. With reference to both FIGS. 47A and 47B, to carry out real-time data exchange operations between a host debug station and the target processor via a JTAG interface, the present invention makes use of dedicated "hot-spots" at specific locations in the processor's memory map. For performing a real-time monitor data READ operation, wherein the host debug station desires to read a specific location out of the target processor, the host debug station first scans into the update/capture register block 7500 via JTAG state machine TAP 7600 the monitor read address 7330, monitor write address 7350, and the size 7410 for the read access cycle and the size 7420 of write access cycle, for example "000" for one byte, "001" for two bytes, "010" for four bytes or "011" for eight bytes, and so on. Next, via the JTAG state machine TAP 7600, the host debug station initiates a real-time data exchange operation in the target processor by scanning a "1" into the monitor request bit (bit 3 of the break control register in the update/capture register block 7500), which brings mon_req 7170 to a logic "1" at completion of the JTAG update data register state. Once set in this manner, logic AND gate 7450 detects it, causing state machine 7460 (FIG. 47B) to register a single-operand monitor instruction 7470 assembled on-the-fly by simply concatenating buses mon_write_size[2:0] 7420, mon_write_address[14:0] 7350, mon_read_size[2:0] 7410, and mon_read_address[14:0] 7330, ind_mon_read 7310 and ind_mon_write 7340 into 64-bit register monitor_instructionq 7465 as shown in the following example:

wire [63:0] monitor_instruction={5'b000000, mon_write_size[2:0], ind_mon_write, mon_write_address[14:0], 1'b0, mon_read_size[2:0], ind_mon_read, mon_read_address[14:0], 20'b00000000000000000000};

Note that the above example monitor_instruction 7470 (and thus monitor_instructionq 7465) conforms to processor instruction format 100 in FIG. 1. What makes this a monitor instruction is the fact that it is registered in 64-bit register monitor_instructionq 7465 and is substituted, by way of data selector 7370 when break_q0 7304 is active, for program instruction 100. Notice that break_q0 7304 can be triggered to active "1" by inputs "broke", "force_break" or "event_det" 7320 when input "skip" is inactive "0", and is also triggered by "mon_cycl_det" 7450 as a result of a monitor cycle request "mon_req" 7170 when "mon_state[1:0]" is "00".

Referring to state machine 7460 of FIG. 47B, during state "00", if "mon_cycl_det" goes active "1", the assembled 64-bit monitor_instruction 7470 is clocked into monitor_instructionq 7465 and simultaneously triggers one-shot mon_req_q0 to indicate this happened and is presently only used for simulation purposes. Next, state machine 7460 enters state "01" which registers an instruction equivalent to a NOP instruction in register 7465 on the rising edge of the very next clock, ensuring the processor executes the previous assembled monitor instruction only once. Note that state-machine 7460 remains in state "10" until "mon_req" 7170 is brought to inactive "0" low by the update/capture register block 7500 as a result of it being cleared by way of JTAG scan initiated by the host debug environment.

To perform a monitor read operation, the desired monitor read address is scanned into the mon_read_addrs data register, along with the size of the data to be read, in the update/capture register block 7500 via JTAG by the host debug environment. The debug environment then scans into the mon_write_addr data register of the update/capture register block 7500 the value 0x00007FEB, which is the address of the Real-Time Monitor Data register (see Table 2000 of FIG. 11). The value "011" binary is scanned in as the size of the data to be written into the Real-Time Monitor Data register, even though this might not match the size of the data that is read during the monitor cycle, because the size of the Real-Time Monitor Data register in the present disclosure has a fixed width of 64-bits. The host debug station then makes a monitor request by setting the mon_req bit in the update/capture register block 7500 to a "1".

When break_q0 7304 goes active as a result of mon_req 7170 going active, data selector 7370 drives monitor_instructionq 7465 onto processor instruction bus 7360 and thus enters the processor's instruction pipeline for processing as if it had been an actual instruction fetch from program memory. Upon execution, the processor's pipeline will have read the specified number of bytes from the srcA address specified in instruction_q0_del 7360 and written it to the Real-Time Monitor Data register (FIG. 11) at location 0x0007FEB, as specified in the assembled monitor instruction. The host workstation then performs a JTAG capture of the Real-Time Monitor Data register (mon_read_reg[63:0] 7120) and scans out the captured data via JTAG state machine TAP 7600. As a final step, the host debug station then scans a "0" into the mon_req bit of the update/capture register block 7500 to remove the monitor request, causing state machine 7460 go back to state "00" and wait for another monitor request.

As can be seen from state machine 7460, monitor_instructionq 7465 is driven onto Instruction_q0_del bus 7360 for only one clock cycle. During this one clock cycle the PC is frozen and the pre-PC is rewound to the previous fetch address so it can re-fetch the instruction that was being fetched when the monitor request was made (refer to FIG. 15 and FIG. 16).

To perform a monitor write operation, the data to be written is scanned into the 64-bit monitor_write_reg in the update/capture register block 7500 via JTAG state machine TAP 7600 by the host debug station. Next, the monitor write address along with the size of the data to be written is scanned into their respective registers in the update/capture register block 7500. Next, the value 0x0007FEB (which is the address in data memory where the contents of monitor_write_register can be read by the processor), along with the size "011" binary, is scanned into the monitor read address and monitor read size registers in the update/capture register block 7500. Once all the foregoing elements of the monitor write instruction are scanned in, the host workstation scans a "1" into the mon_req bit of the update/capture register block 7500. When the processor executes the assembled monitor instruction, the processor will have read the contents of the monitor_write_reg in 7110 (which is visible to the processor at location 0x0007FEB in its data memory space) and written this data to the location specified in the assembled monitor instruction. Again, as a final step, the host debug station then scans a "0" into the mon_req bit of the update/capture register block 7500 to remove the monitor request, causing state machine 7460 go back to state "00" and wait for another monitor request.

Observe that the read and write address fields in the instruction 100 format can accommodate only 15 bits of direct address and thus only the lower 15 bits of the monitor read address 7330 and monitor write address 7350 scanned into the update/capture register block 7500 are used in the assembled monitor instruction, mon_write_addrs[14:0] for DEST 120 direct address field 210 and mon_read_addrs[14:0] for srcA 140 direct address field 210 (instruction 100 bits 34 thru 20). Also notice that ind_mon_write 7340 and ind_mon_read 7310 are set to "1" if any bit in the upper 17 bits of mon_write_addrs or mon_read_addrs (respectively) is a "1". These two outputs are used as the IND 190 bits for their respective fields in 100 during assembly of the monitor instruction 7470.

Further notice in FIG. 14C, that if ind_mon_read 7310 is a "1", meaning that current read cycle is indirect address mode, then mon_read_addrs[31:0] 7330 will be driven onto SrcA_addrs_q0 bus 6200. Likewise, if ind_mon_write 7340 is a "1", then mon_write_addrs[31:0] 7350 will be driven onto Dest_addrs_q0 bus 6230. Thus, monitor read or monitor write cycles with addresses less than 0x00008000, are direct access mode, and monitor read or monitor write cycles with addresses greater than 0x00007FFF are indirect access mode. Furthermore, notice that due to the arrangement of their respective address bus selectors in FIG. 14C, monitor read and monitor write operations have priority over ordinary processor accesses.

State-machine 7380 in FIG. 47B handles processor hardware breakpoints and single-stepping. If a pre-programmed event is detected, as indicated by event_det output 7320, or if a "1" is scanned into the force break bit (bit 1) of the break control register in the update/capture register block 7500, the "broke" bit will be registered as a "1", indicating that the processor is now in a break state and all instruction fetching has been suspended, as a result of the PC now being frozen. Once "broke" has been set to one (1), state-machine 7380 enters state "01" where it waits for the host debug station to scan a "1" into the single-step ("sstep") bit (bit 2) of the break control register in the update/capture register block 7500. When a "1" is scanned into the sstep bit, register "skip" is set to "1" for one clock cycle, causing the break state to be released for exactly one clock cycle, as shown in logic block 7302. This allows the processor to fetch and execute just one instruction. Note that the REPEAT counter circuit 1900 in FIG. 19, pre-PC 610 and PC 1620 remain frozen while break_q0 is active. Thus, when "skip" goes to "1" for exactly one clock cycle, break_q0 7304 goes inactive for exactly one clock cycle, releasing the break state for exactly one clock cycle, effectuating a single-step of the processor. When the single-step takes place, pre-PC 610 and PC 1620 are allowed to increment, just once, thereby advancing the fetch address to the next instruction, and REPEAT, if not zero, is allowed to decrement just once.

When state-machine 7380 enters state "10", register "skip_cmplt" is set to "1", indicating that the processor has completed its single-step as commanded by the host. The state of "skip_cmplt" can be captured by the break status register (bit 5) in the update/capture register block 7500 and scanned out by the host debug station. State-machine 7380 remains in state "10" until the host debug station scans a "0" into the "sstep" bit of the break control register in the update/capture register block 7500 to indicate that it acknowledges skip complete and to advance to the next state, state "11".

While in state "11", state-machine 7380 checks to see if a force break has been asserted. If not, state-machine 7380 returns to state "00" to begin searching for another break event or another force break. If force break ("frc_brk") is active "1", then state-machine 7380 returns to state "01" to begin looking for another single-step command issued by the host debug station.

It should be understood that the CPU need not be at a breakpoint to perform real-time-data-exchange operations, as these can be performed on-the-fly while the CPU is executing a program. It should be further understood that this real-time-data-exchange capability requires zero software overhead, meaning it works straight out of the box without any firmware in program memory.

Figure 47C:
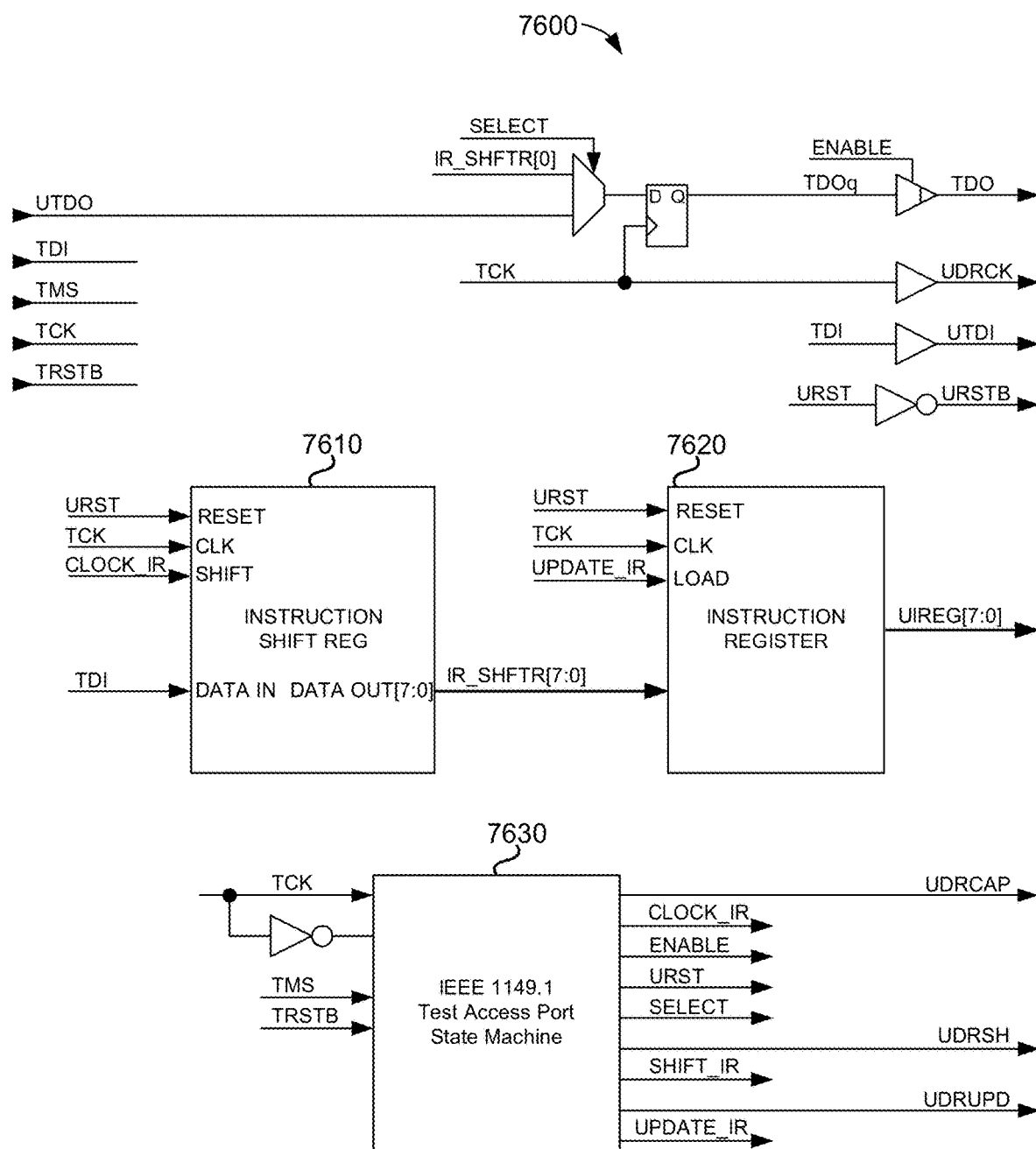
FIG. 47C (Prior Art) is a block diagram illustrating a conventional industry standard IEEE 1149.1 (JTAG) state machine Test Access Port (TAP)

FIG. 47C is a block diagram of a conventional industry standard IEEE 1149.1 JTAG state machine Test Access Port (TAP) 7600. The JTAG state machine TAP includes TAP state machine 7630, 8-bit JTAG instruction shift register 7610, and instruction register 7620. Outputs UDRCAP, UDRSH, and UDRUPD from state-machine 7630, as well as 8-bit output UIREG[7:0] from instruction register 7620, are used by the update/capture register block 7500 to load its registers with data scanned into and out of 64-bit data shift register 7130. There is nothing novel about the JTAG state machine TAP 7600, as it is well understood in the industry, but is included here for completeness and as an aid in describing the present invention's JTAG debug module 7000 (FIG. 47A).

Figure 48A:
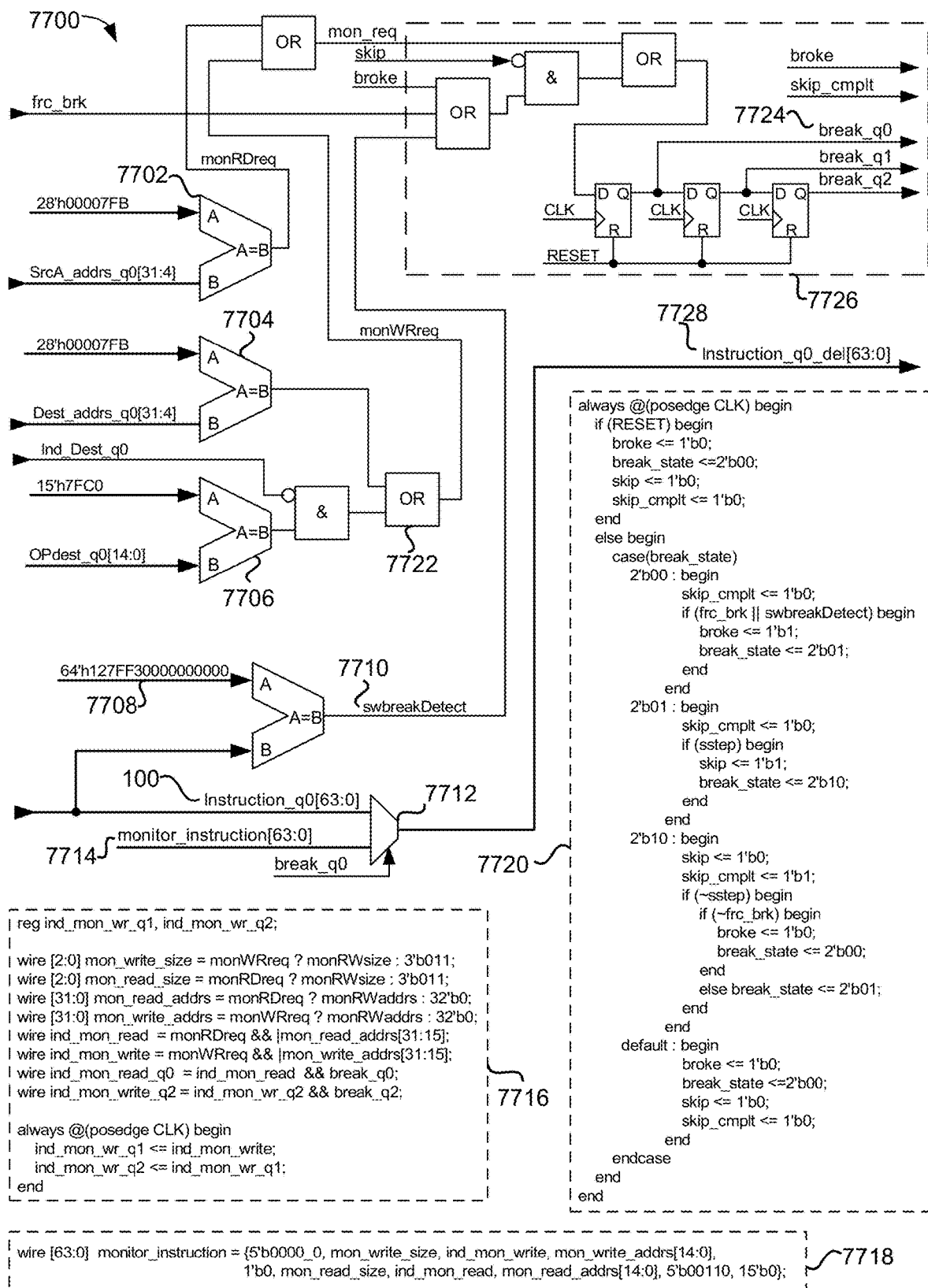
FIG. 48A is a simplified schematic and pertinent Verilog RTL source code describing behavior of the XCU breakpoint module in an exemplary embodiment of the present disclosure.

FIG. 48A is a simplified schematic and pertinent Verilog RTL source code describing behavior of a child XCU 800 breakpoint module 7700 in an exemplary embodiment of the present disclosure.

FIG. 48B illustrates exemplary snippets of Verilog RTL showing memory mapping and behavioral description of the parent CPU's XCU hardware breakpoint control and status registers in an exemplary embodiment of the present disclosure.

With reference to FIGS. 48A and 48B, the theory of operation of the child XCU breakpoint module 7700 will be explained. The child XCU breakpoint module 7700 operates similarly to the hardware breakpoint module 7300 (FIG. 47A), except, instead of monitor request, mon_read_addrs, mon_write_addrs, and their respective sizes coming from the JTAG update/capture registers 7500, they come directly from a memory-mapped XCU control register owned by the parent CPU.

Stated another way, in the present implementation, there is no IEEE 1149.1 accessible debug module 7000 connected directly to any XCUs. Instead, child XCUs each have a relatively simple breakpoint module 7700 attached to them, wherein the breakpoint and single-step control signals come from a 64-bit XCU control register 7742 mapped in the parent CPU's data space and status inputs from each XCU are visible to the CPU via a 64-bit XCU status register 7756 input, also mapped in the CPU's data memory space (see 2000 in FIG. 11).

For example, to force a hardware breakpoint on any one or any combination of XCUs, the parent CPU simply sets corresponding force_break bits 7750 in its XCU control register. To single-step an XCU, the CPU simply sets corresponding sstep bits 7752 in its XCU control register. To force a hard reset on any one XCU or any combination of up to 16 XCUs, the CPU simply sets the corresponding force reset bit 7748 in its XCU control register. In like manner, the parent CPU can force a preemption on any one or combination of XCUs attached to it by simply setting the corresponding preemption bits 7754 in its XCU control register 7742.

The parent CPU has a XCU status register 7756 mapped in its data memory space that provides it with visibility as to the 64-bit status of up to 16 child XCUs attached to it. Thus, referring to XCU_STATUS_REG 7756 in FIG. 48B, the CPU's XCU status register is made up of 16 XCU done bits 7758, 16 XCU software break detected bits 7760, 16 XCU broke bits 7762, and 16 XCU skip complete bits 7764.

The XCU done bits 7758 (bit positions 63 to 48) of XCU_STATUS_REG 7756 come from each of the XCU's DONE flag in their respective STATUS REGISTERs. On power-up or upon being reset, their DONE flag is set to "1". If there is no XCU attached for that bit position, then that bit will be read as "0", meaning that XCU slot is empty. Thus, on power-up initialization, the CPU can simply test that bit position to see if a XCU corresponding to that bit position is present. This ISA has adopted the policy that when the CPU has spawned a given XCU or group of XCUs to perform a task, the XCU routine will clear its DONE flag to signal that it is now busy performing the task and when complete, bring its DONE flag back to "1" to signal it has completed the task and that results are available.

XCU software break detected bits 7760 provide a means for the parent CPU to determine if one or more of the child XCUs attached to it has encountered a software breakpoint instruction 7708. If so, the bit(s) in the XCU software break detected bits 7760 are read as "1" for XCUs that have encountered a software breakpoint. These bits also provide a means for the parent CPU to determine what caused the XCU to break in cases where both software breakpoints and hardware breakpoints are employed, in that if a hardware breakpoint is encountered by a XCU, the corresponding XCU_BROKE 7762 will be set. It should be understood that the corresponding bit in XCU_BROKE 7762 is set to "1" if either a software breakpoint or hardware breakpoint is encountered. Therefore, XCU_SWBRKDET 7760 provides a means for determining what caused the break to occur.

Bit group XCU_SKIPCMPLT 7764 provides a means for the parent CPU to determine if a XCU or group of XCUs have performed a single-step command issued by the parent CPU via its XCU_CNTRL_REG 7742 XCU single-step control group 7752. When a given XCU is in break mode as indicated by its corresponding XCU_BROKE bit in 7762, the parent CPU can command it to perform a single-step (i.e., execute only the next instruction) by setting that XCU's single-step command bit in 7752 to "1". The parent CPU then tests that XCU's skip-complete bit in 7764 to see if that XCU has completed the single-step operation. If so, the CPU can then issue another single-step command after it brings the previous single-step bit back low again, and so forth. Referring to XCU breakpoint state-machine 7720 of FIG. 48A, it can be seen that this state-machine is very similar to that of the CPU's breakpoint state-machine 7380 (FIG. 47B). As such, it can be seen from either, that once the sstep bit is set to "1" and the target processor has completed the single-step, the sstep bit must be brought back to "0", otherwise the state-machine will not advance to the next state.

As can be seen from the XCU control register 7742 and XCU direct address map 7740, XCU_CNTRL_REG 7744 is made up of qty (4) 16-bit groups: FORCE_RESET 7748, FORCE_BREAK 7750, SSTEP 7752, and PREEMPT 7754. Bits 7746 show that all bits of all these groups can be written to simultaneously with a single direct write to XCU_STATUS_REG_ADDRS 15'h7FDE.

XCU_CNTRL_REG 7744 shows that on reset, XCU_PREEMPT[15:0], XCU_SSTEP[15:0], and XCU_FORCE_RESET[15:0] are cleared to 0x0000, while XCU_FORCE_BREAK[15:0] is set to 0xFFFF. This means that once the external reset is released, all XCUs will immediately be forced into a hardware breakpoint. The main reason for this is because it is anticipated that most XCU implementations will employ volatile SRAM for program memory and thus will have nothing to execute on power-up. Forcing a breakpoint immediately will cause each XCU to freeze, allowing an opportunity for the parent CPU to push a program or thread into the XCUs' program memory space using its real-time-data-exchange capability. Once a program is loaded into a given XCU's program memory, the parent CPU then brings the respective FORCE_BREAK bit in 7750 low, followed by bringing the corresponding single-step bit in 7752 to "1", which causes the target XCU to step out of the hardware break state. Implementors must remember to bring the single-step bit back low again, otherwise state-machine 7720 will not advance to subsequent states.

Observe that XCU_CNTRL_REG_ADDRS 15'h7FDE in the XCU direct address map 7740 is a global write address for the parent CPU's XCU control register 7742, meaning that all 64 bits of the parent CPU's XCU control register 7742 can be written simultaneously by pushing a 64-bit value there. Also notice that each 16-bit group within the parent CPU's XCU control register 7742 can be written exclusively, without disturbing the other groups, in that each 16-bit group has its own address that shadows XCU_CNTRL_REG_ADDRS 15'h7FDE as shown in the XCU direct address map 7740.

For example, to force a hardware break on XCU2 and XCU3, write a 0x000C to location 15'h7FD2, the XCU_FORCE_BREAK_ADDRS as shown in the XCU direct address map 7740. Then, to single-step only XCU3, write a 0x0004 to location 15'h7FD3, the XCU_SSTEP_ADDRS. To clear the hardware both hardware breakpoints, write a "0" to XCU_FORCE_BREAK_ADDRS then write 0x000C to XCU_SSTEP_ADDRS to cause both XCUs to step out of their respective breakpoints. Finally write a "0" to XCU_SSTEP_ADDRS to bring the respective single-step bits back low again, otherwise the respective XCU state-machine 7720 will not advance to subsequent states.

In FIG. 48A, it can be seen that the disclosed exemplary child XCU implementation also supports software breakpoints. When XCU instruction_q0[63:0] 100 compares equal to 64'h127FF30000000000 (the software breakpoint instruction 7708), swbreakDetect 7710 is driven high and enters XCU breakpoint logic block 7726 eventually causing break_q0 7724 to go high. As similarly explained for the parent CPU, break_q0 7724 for the XCU is used by its pre-PC, PC, and REPEAT counter, causing them to freeze while 7724 is active "1". "Skip" and "broke" inputs to 7726 come from state-machine 7720, such that when frc_brk or swbreakDetect are active, broke gets set to "1" and stays that way until the corresponding frc_brk bit from the parent CPU XCU_CONTRL_REG 7742 is brought back low, allowing the target XCU state-machine 7720 to be single-stepped out of break mode as explained above.

Note that XCU (and parent CPU) software break instruction 64'h127FF30000000000 is actually a conditional load PCC instruction that tests bit 0 of byte location 0x0000 in the processor's data RAM to see if it is "0". Since a read of location "0" always returns a "0" regardless of what value was previously written to it, the test always evaluates as true and a relative branch is always taken using the relative offset specified in the instruction. Since the offset specified is zero, the PC just continuously branches to itself-forever, unless or until a enabled interrupt, non-maskable interrupt occurs. But since interrupt service routines, when complete, ordinarily will return to where it left off, in this instance back to the software break, it will continue to loop here upon return.

When actually employing a software break instruction, a common practice is to save a copy of the original instruction in program memory at the location where a software breakpoint is desired, using a monitor read operation from program memory. Once a copy of the original instruction is saved, the software breakpoint instruction is written into that location with a monitor write operation initiated by the parent CPU. When a software breakpoint is encountered by the target processor, program execution comes to a halt and there it will remain until the software break instruction is replaced with another instruction that does not loop to itself, usually the copy of the original that was previously saved. Note that if the software breakpoint instruction has not been replaced, any attempt to single-step thru it will be futile because it will just continue to loop each step.

Thus, the common practice is, when a software breakpoint is encountered, replace the software breakpoint instruction with the copy of the original at that location, then perform the single-step to step out of the breakpoint and continue running. To remain in single-step mode after encountering a software breakpoint, assert the force hardware break bit in breakpoint control register, then replace the software breakpoint instruction.

CPU-XCU Fused Instruction Register

As mentioned previously and as can be seen from FIG. 48A, the theory of operation of the XCU breakpoint module 7700 is very similar to that of the parent CPU breakpoint module 7300. The main difference is that none of the child XCUs in the present implementation have a JTAG port. Instead, the parent CPU employs a body-snatching technique that involves hot-spots at specific locations in its direct data space and logic that substitutes a monitor instruction instantly assembled by such logic when such hot-spots are touched by parent CPU.

As can be seen in the XCU breakpoint module 7700, there are thirty-three hot-spots in the parent CPU's data memory: SrcA_addrs 0x00007FB0 thru 0x00007FBF, Dest_addrs 0x00007FB0 thru 0x00007FBF, and direct Destination address 0x00007FC0. This is due to the fact that only the upper 28 bits of SrcA_addrs_q0, SrcB_addrs_q0, and Dest_addrs_q0 of address comparators 7702, 7704, and 7706 (respectively) are being compared with their corresponding hot-spot (or trigger) address, thereby creating a 16-location window for each. This is explained in greater detail immediately below.

Referring to address comparator 7702, when the most significant 28 CPU SrcA address bits equal 28'h00007FB, comparator 7702 output is driven to "1", thereby asserting a monitor read request ("monRDreq") when the parent CPU reads from any SrcA location in the address range 0x00007FB0 thru 0x00007FBF, which is one location per XCU. For instance, a CPU read from location 0x00007FB0 initiates a monitor read operation from XCU0, a CPU read from location 0x00007FB1 initiates a monitor read operation from XCU1, and so forth.

Referring to address comparator 7704, when the most significant 28 Destination (write) address bits equal to 28'h00007FB, comparator 7704 output is driven to "1". When direct (write) address OPdest_q0 is equal to 15'h7FC0, comparator 7706 is driven to "1". Thus, when either address comparator 7704 is a "1" or address comparator 7706 is a "1", OR gate 7722 is driven to "1", thereby asserting a monitor write request ("monWRreq") when the parent CPU writes to either hot-spot. Note that, like address comparator 7702, address comparator 7704 will go active "1" anytime the parent CPU writes to data memory in the range 0x00007FB0 thru 0x00007FBF, which is one location per XCU. For instance, a CPU write to location 0x00007FB0 initiates a monitor write operation to XCU0, a CPU write to location 0x00007FB1 initiates a monitor write operation to XCU1, and so forth.

Address comparator 7706 is used to create a hot-spot in the parent CPU's data memory space that will allow it to initiate monitor write operations to all attached child XCUs-simultaneously. This capability is useful for copying threads, programs, data, parameters, etc. common to all XCUs so that the parent CPU does not have to waste time pushing the same data into the XCUs separately, since some threads and data blocks can be quite large.

Verilog RTL source code block 7718 shows the logic that assembles a monitor instruction 7714 that is substituted for the instruction 100 fetched by the child XCU from its own program memory. When the parent CPU pushes or pulls from the any hot-spot thus defined, a monitor request is asserted on breakpoint logic block 7726, causing break_q0 7724 to go active "1" for exactly one clock. During this time, data selector 7712 drives assembled monitor instruction 7714 onto the target child XCU(s)' instruction bus 7728 during its instruction fetch cycle, which gets decoded and executed by the target XCU(s).

Figure 48C:
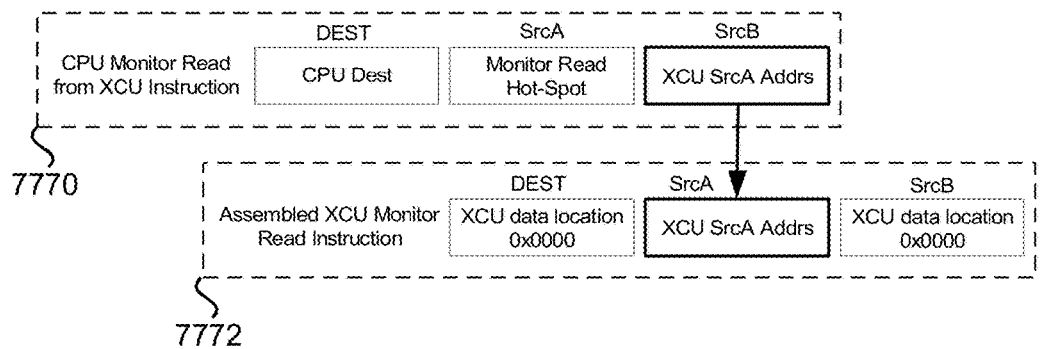
FIG. 48C is a diagram illustrating, in an exemplary embodiment, fusing of the parent CPU monitor read instruction to the child XCU monitor read instruction assembled by the parent CPU.

FIG. 48C is a diagram illustrating, in an exemplary embodiment, fusing of the parent CPU monitor read instruction to the child XCU monitor read instruction assembled by the parent CPU. In other words, logic in the parent CPU instantaneously assembles a monitor read instruction using information from within its own instruction when a parent CPU instruction references the respective hot-spot within the parent CPU's data space.

A monitor read instruction is defined as one in which the instruction 100 that the parent CPU has just fetched has a monitor-read hot-spot address (direct or indirect) in its srcA 130 field. As explained previously, any read from locations 0x00007FB0 thru 0x00007FBF will cause an XCU monitor read instruction to be assembled and instantaneously substituted for the instruction being simultaneously fetched by the target child XCU from its program memory for exactly one clock cycle. The target child XCU is specified by the last four bits of SrcA in CPU Monitor Read from XCU Instruction 7770.

The resulting address fields that make up the assembled XCU monitor read instruction fetched and executed by the target XCU are shown in Assembled XCU Monitor Read Instruction 7772. Notice that the destination address of the Assembled XCU Monitor Read Instruction 7772 is always 0x0000 in the target XCU's data space. SrcA address of the Assembled XCU Monitor Read Instruction 7772 is the address specified by the SrcB address field 140 (FIG. 1) of the parent CPU Monitor Read from XCU Instruction 7770, such that when the target XCU executes the Assembled XCU Monitor Read Instruction 7772, it will perform a data read from its data memory space at the address specified by the srcA address field in the Assembled XCU Monitor Read Instruction 7772, and then write the results to location 0x0000 in its own direct memory space. During Stage q2 of its execution pipeline, the parent CPU intercepts the data being written by the target XCU, "as if" the CPU had performed the read operation itself, and then the parent CPU writes the intercepted data to the CPU destination data address specified in the DEST 120 field of CPU Monitor Read from XCU Instruction 7770.

Figure 48D:
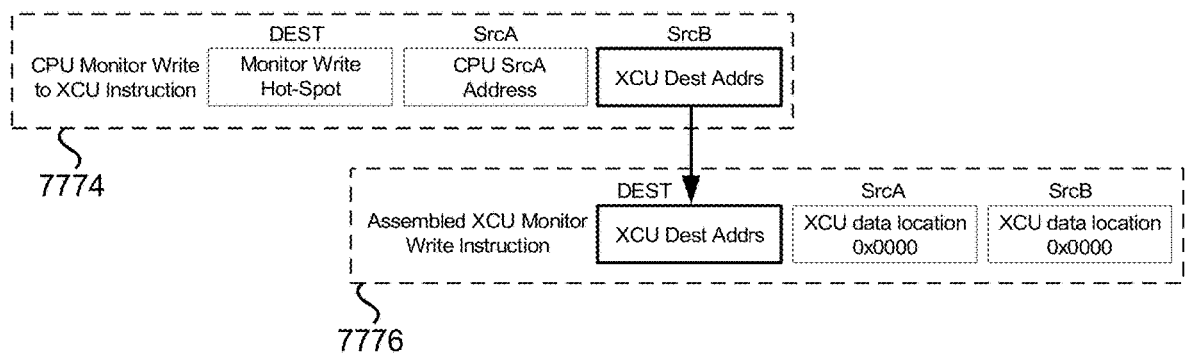
FIG. 48D is a diagram illustrating, in an exemplary embodiment, fusing of the parent CPU monitor write instruction to the child XCU monitor write instruction assembled by the parent CPU.

FIG. 48D is a diagram illustrating, in an exemplary embodiment, fusing of the parent CPU monitor write instruction to the child XCU monitor write instruction assembled by the parent CPU. In other words, logic in the parent CPU instantaneously assembles a monitor write instruction using information from within its own instruction when a parent CPU instruction references the respective hot-spot within the parent CPU's data space.

A monitor write instruction is defined as one in which the instruction 100 that the parent CPU has just fetched has a monitor-write hot-spot address (direct or indirect) in its DEST 120 field. As explained previously, any write to locations 0x00007FB0 thru 0x00007FBF will cause a XCU monitor write instruction to be assembled and instantaneously substituted for the instruction being simultaneously fetched by the target child XCU from its program memory for exactly one clock cycle. The target child XCU is specified by the last four bits of the DEST Monitor Write Hot-Spot specified in the CPU Monitor Write to XCU Instruction 7774. In cases where the hot-spot is the "poke-all" address 0x00007FC0 within the parent CPU's data space, all child XCUs attached to the CPU will be issued the monitor write instruction, rather than just one, resulting in a write into each XCU memory space of the same data provided by the parent CPU, hence the term "poke-all" or "push-all".

The resulting address fields that make up the assembled XCU monitor write instruction fetched and executed by the target XCU are shown in Assembled XCU Monitor Write Instruction 7776. Notice that the destination address DEST of the Assembled XCU Monitor Write Instruction 7776 is the address specified by the srcB 140 field of the parent CPU Monitor Write to XCU Instruction 7774. Also observe that the SrcA 130 address field and SrcB 140 address field of the Assembled XCU Monitor Write Instruction 7776 are both always 0x0000. Thus, when the parent CPU executes the CPU Monitor Write to XCU Instruction 7774, the parent CPU reads from its own data memory space, the contents of the address specified by the SrcA 130 address of the parent CPU Monitor Write to XCU Instruction 7774 and writes it to the monitor write hot-spot specified by DEST 120 address. During the child XCU Stage q2, the data being written by the parent CPU is intercepted by target child XCU internal logic and is written to the target XCU data memory address specified by the Assembled XCU Monitor Write Instruction 7776 XCU destination address DEST 120.

It should be understood that, fundamentally, the instruction registers of the parent CPU and child XCUs are fused. The parent CPU can reach into any child XCU anytime and grab what ever is needed and can write whatever is needed to any resource mapped into any child XCU's data space without the use of interrupts, opcodes, or DMA, because the parent-child relationship is one in which they share the same instruction register, albeit fused, anytime a monitor read or monitor write is fetched and executed by the parent CPU. Thus, in one instance, they are executing their own programs and then in another instance, they together and simultaneously execute an instruction fetched by the parent CPU.

Figure 49:
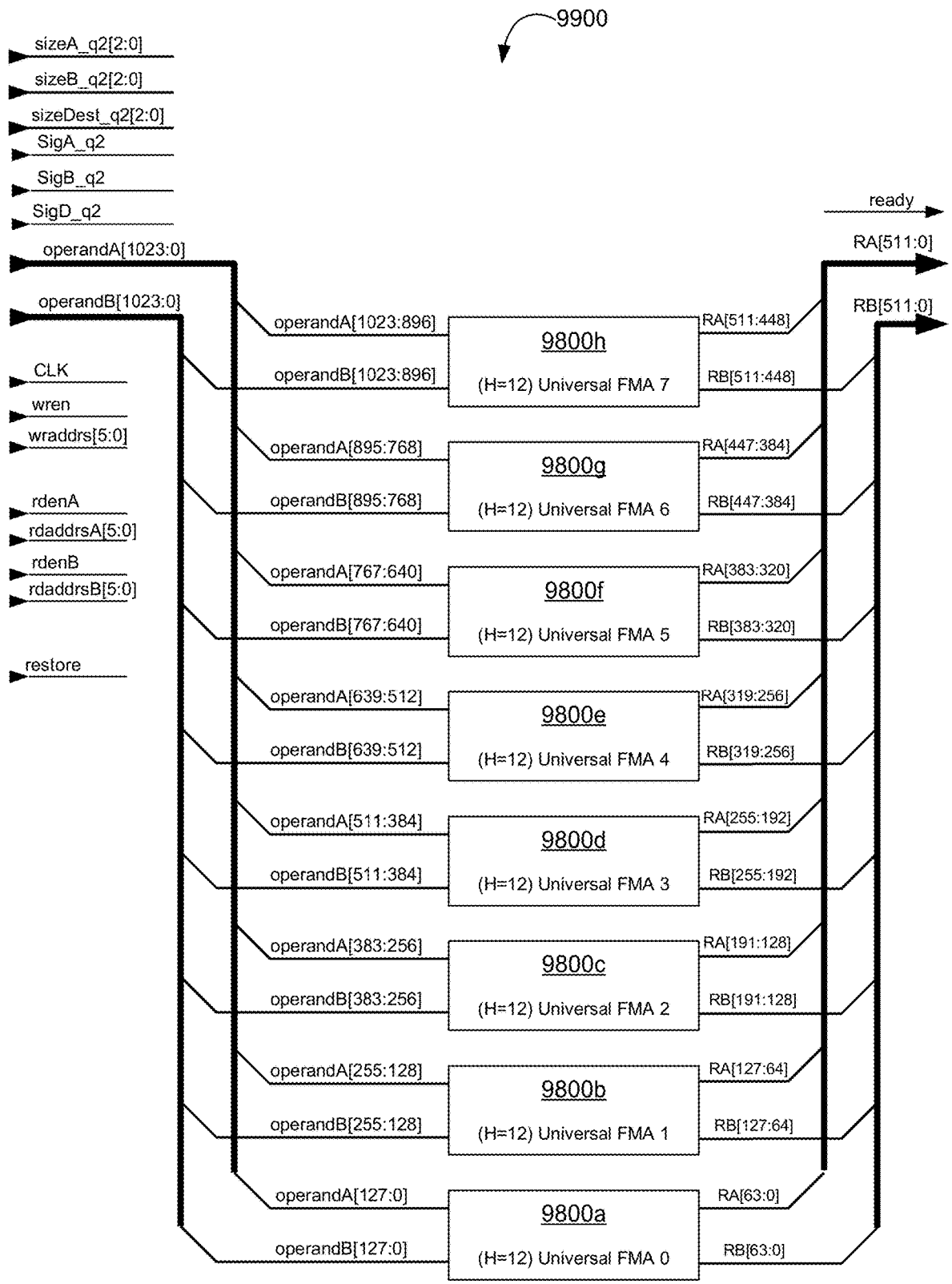
FIG. 49 is a block diagram illustrating an exemplary embodiment of a double-quad, single-precision (H=12) Universal FMA operator that can accept in a single push, quantity (8) 16-character decimal character sequence or binary32 format numbers as operandA and quantity (8) 16-character decimal character sequence or binary32 format numbers as operandB, outputting as quantity (8) binary32 format numbers (including corresponding exceptions) for a total 512 bits, or quantity (8) binary32 format numbers only, for a total of 256 bits for each pull.

Observe further that either direct or indirect addressing modes may be used, thereby giving the parent CPU full reach into any and child XCUs attached to it. Moreover, the CPU REPEAT instruction, along with indirect addressing (auto-post-modify) mode, can be used to easily and efficiently transfer entire blocks of memory into and out of any child XCU FIG. 49 is a block diagram illustrating an exemplary embodiment of a double-quad, single-precision (H=12) Universal FMA operator 9900 that can accept in a single push, quantity (8) 16-character decimal character sequence or binary32 format numbers as operandA, and quantity (8) 16-character decimal character sequence or binary32 format numbers as operandB, outputting as quantity (8) correctly rounded binary32 format numbers (including corresponding exceptions) for a total of 512 bits, or quantity (8) binary32 format numbers only, for a total of 256 bits, for each pull. Universal FMA blocks 9800a, 9800b, 9800c, 9800d, 9800e, 9800f, and 9800g are virtually identical to Universal FMA 9800 in FIG. 46A, except the decimal character to binary conversion circuit is H=12 compliant, meaning it can convert decimal character sequences up to twelve decimal digits in length. The Universal FMA operator 9900 is universal in the same way Universal FMA 9800 is, in that it can accept scientific notation, integers, characters sequences with token exponents, or binary16, binary32, or binary64 format numbers as operands.

Since all the FMAs share the same size and signal inputs, the numbers making up 1024-bit operandA gob must be the same format and numbers making up 1024-bit operandB gob must be the same format, but gob A can be a different format than gob B.

Like the Universal FMA in 9800, each Universal FMA in 9900 has a split 32-entry result buffer that is 37 bits wide (instead of 69 bits wide as shown in 9816), which is wide enough to accommodate a binary32 format result plus five exception bits. Results are read out as one 512-bit gob or one 256-bit gob for each result buffer location. The wider gob is for situations where the exception bits for each FMA are read out as part of that FMA's results in their respective position in the gob, in which case 64-bit words are pulled out in one 512-bit gob. Many applications can do without the exception bits, in such cases results can be read out as quantity (8) binary32 format numbers in one 256-bit gob.

Once pushed into fat memory, results can be pulled out in properly aligned 1, 2, 4, 8, 16, 32, 64, or 128-byte accesses. For example, the results of a single 128-byte push into fat memory can be read out as a sequence of quantity (128) 1-byte pulls, (64) 2-byte pulls, (32) 4-byte pulls, and so on. However, care must be exercised to ensure that the original 128-byte push is on a even 128-byte address boundary. The results of a single 64-byte push into fat memory can be read out as a sequence of quantity (64) 1-byte pulls, (32) 2-byte pulls, (16) 4-byte pulls, and so on. Like the previous example, care must be exercised to ensure that the original 64-byte push is on an even 64-byte address boundary. Thus the same can be done for pushes of 32, 16, 8, etc. bytes in length.

Each of the eight FMAs in the Universal FMA operator 9900 can be used as sum-of-products operators, in that each has quantity 32 C-register/accumulators and operate the same was as those in the Universal FMA 9800.

Finally, for intensive pure convertFromDecimalCharacter to binary conversion operations, the Universal FMA operator 9900 can be used to convert quantity (16) H=12 decimal character sequences every clock cycle.

FIG. 50A thru FIG. 50L comprise a example assembled source listing of a actual working 3D transform program 9950 written in the present disclosure's ISA assembly language that employs up to qty. (16) child XCUs to perform a 3D transform (scale, rotate, translate) on all three axes of a 3D object in .STL file format and write the resulting transformed 3D object back out to external memory when the transformation is complete. This program was simulated using the XILINX® Vivado® development environment (Vivado HLx Edition, v2018.2 (64-bit)) targeted to its Kintex® UltraScale and UltraScale+ brand FPGAs.

Referring to 3D transform program 9950, the parent CPU first determines how many child XCUs are available to perform the transformation by first counting the active DONE, one corresponding to each XCU, and then divides the number of triangles that make up the 3D object as evenly as possible. The parent then performs a "poke-all" monitor instruction to push the thread code simultaneously into all XCUs. It sets a breakpoint simultaneously on all XCUs at the same location in their program memory and then simultaneously asserts then releases a reset so that all XCUs begin to execute at the same location until they all reach their breakpoint.

The parent CPU then pushes the number of triangles each XCU is to transform, the location of where the triangles are located in XCU memory space, and then the triangles themselves. The parent then releases the breakpoint and single-steps all child XCUs out of the break state simultaneously, at which time the XCUs begin processing the triangles. During this time, each XCU brings its DONE bit inactive low, to signal it is busy. At this time the parent is monitoring its XCU status register for the DONE bits to be brought back to active high, indicating XCU processing is complete. When complete, the parent XCU then pulls the transformed triangles from each XCU result memory and pushes them back out to external memory.

If, at the initial stages described above, the parent CPU determines there are no XCUs available to perform the transform, the parent CPU performs the entire 3D transform solo (without the use of any XCU) and pushes the transformed triangles back out to external memory when complete. It should be understood that the parent CPU and the child XCUs (if any) execute the same instruction set. In this implementation, the 3D transform routine physically resides in the parent CPU program memory space. Thus, in this instance, when the parent performs a "push-all" of the required routine and parameters, it pulls the routine code out of its program memory space and pushes it into all XCUs program memories simultaneously. If the required program is not resident in the CPU's program space, it could alternatively pull it in from any child XCU program memory space or external memory space.

Figure 51:
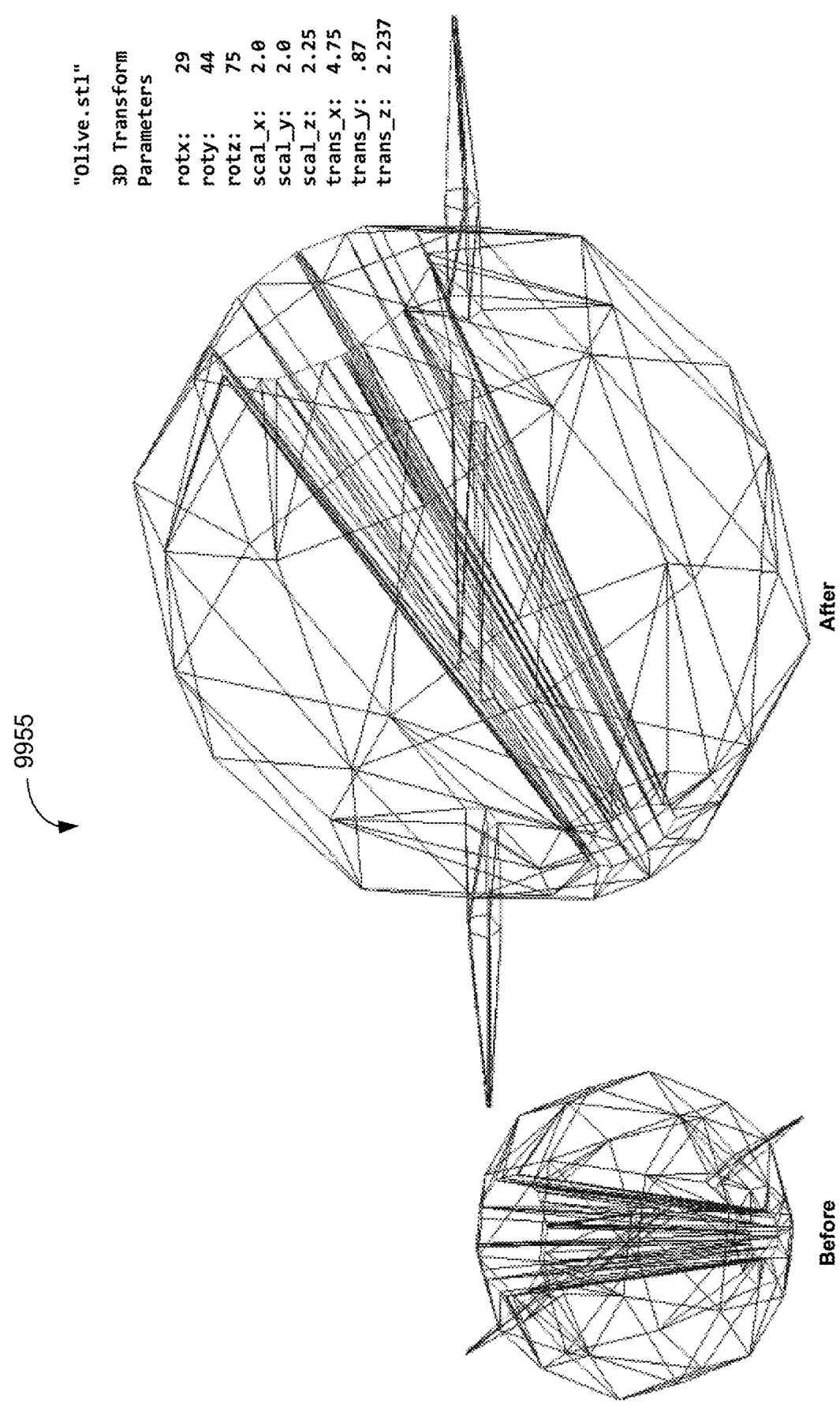
FIG. 51 is an actual wire-frame "Before" and "After" rendering of a simple cocktail "olive" 3D model in .STL file format performed by from 1 to 16 child XCUs or solo parent CPU using the scale, rotate, and translate parameters shown for each axis.

FIG. 51 is an actual wire-frame "Before" and "After" rendering 9955 of a simple "olive" 3D model in .STL file format performed by from 1 to 16 child XCUs or solo parent CPU using the scale, rotate, and translate parameters shown for each axis.

In the drawings and specification, there have been disclosed typical preferred embodiments of the disclosure and, although specific terms are employed, they are used in a generic and descriptive sense only and not for purposes of limitation, the scope of the invention being set forth in the following claims.

What is claimed is:

1. A universal floating-point Instruction Set Architecture (ISA) compute engine implemented entirely in hardware, said ISA compute engine comprising:
   means for converting human-readable decimal character sequence floating-point representation operands to binary format without explicitly performing a conversion-to-binary-format process in software; and
   means for computing directly with the converted human-readable decimal character sequence floating-point representation operands.

2. The universal floating-point ISA compute engine as recited in claim 1, wherein the means for converting includes means for accepting the human-readable decimal character sequence floating-point representation operands up to IEEE 754-2008 H=20 in length.

3. A universal floating-point Instruction Set Architecture (ISA) compute engine implemented entirely in hardware, said ISA compute engine comprising:
   a program memory; and
   hardware circuitry connected to the program memory, said hardware circuitry configured to compute directly with human-readable decimal character sequence floating-point representation operands using a single instruction per floating-point operation, the hardware circuitry comprising:
   a data memory having a write port and first and second read ports, said data memory configured to write data into the write port while simultaneously reading binary format operands or human-readable decimal character sequence floating-point representation operands from the first and second read ports;

at least one fully pipelined convertToBinaryFromDecimalCharacter hardware conversion circuit connected to the data memory and having one or more inputs and an output, the convertToBinaryFromDecimalCharacter hardware conversion circuit being configured to:
receive the binary format operands or human-readable decimal character sequence floating-point representation operands from the data memory,
convert the received human-readable decimal character sequence floating-point representation operands, if any, to IEEE 754-2008 binary floating-point representations, and
preserve the received binary format operands, if any, as unconverted binary format operands;
a multistage instruction pipeline logic circuit configured to fetch, decode, and execute instructions from the program memory, wherein, a single instruction that specifies one or more read addresses in the data memory causes one or more operands to be set in-flight within the convertToBinaryFromDecimalCharacter hardware conversion circuit, wherein the instruction pipeline logic is configured to:
simultaneously read from the first and/or second read ports of the data memory, at least one IEEE 754-2008 binary floating-point representation operand and/or at least one human-readable decimal character sequence floating-point representation operand residing at the one or more read addresses specified by the single instruction, and
simultaneously write the one or more operands to the one or more inputs of the at least one fully pipelined convertToBinaryFromDecimalCharacter hardware conversion circuit; and
at least one memory-mapped, fully pipelined, hardware floating-point operator connected in series with the output of the at least one convertToBinaryFromDecimalCharacter hardware conversion circuit, the at least one hardware floating-point operator automatically receiving the at least one IEEE 754-2008 binary floating-point representations and utilizing the received at least one IEEE 754-2008 binary floating-point representations as operands for use in the at least one hardware floating-point operator's computation when a destination address in the single instruction corresponds to the memory-map address of the at least one hardware floating-point operator, wherein results computed by the at least one hardware floating-point operator automatically spill into the data memory write port at the destination address specified by the single instruction.

4. The universal floating-point ISA compute engine as recited in claim 3, wherein the multi-stage instruction pipeline logic circuit is configured to fetch, decode, and execute instructions that do not include an opcode field.

5. The universal floating-point ISA compute engine as recited in claim 3, wherein the data memory includes hardware logic configured to enable results that automatically spill into it from the at least one hardware floating-point operator to be read out and immediately restored without having to re-compute the results.

6. The universal floating-point ISA compute engine as recited in claim 3, wherein the hardware circuitry is configured to implement an instruction set configured to specify with the single instruction:

a destination address for spilling results from the at least one hardware floating-point operator into the data memory write port; and
at least one operand source address for reading from the data memory first and/or second read ports, operands used in the floating-point operation.

7. The universal floating-point ISA compute engine as recited in claim 3, wherein the hardware circuitry is configured to implement an instruction set configured to specify with the single instruction, a rounding mode to be carried out as a step in the at least one hardware floating-point operator, wherein the at least one hardware floating-point operator includes hardware circuitry configured to perform the rounding step according to the rounding mode specified in the single instruction.

8. The universal floating-point ISA compute engine as recited in claim 3, wherein when the single instruction is preceded by a REPEAT instruction, hardware logic within the multistage instruction pipeline is configured to cause the single instruction to be repeated an additional number of times specified by a REPEAT value in the REPEAT instruction.

9. The universal floating-point ISA compute engine as recited in claim 8, wherein:
the at least one convertToBinaryFromDecimalCharacter hardware conversion circuit and the at least one hardware floating-point operator each include at least one stage, and each repetition of the single instruction causes a next stage to be filled with a result from an immediately preceding stage each clock cycle; and
when the REPEAT value is greater than or equal to a total combined number of stages in the at least one convertToBinaryFromDecimalCharacter hardware conversion circuit and the at least one hardware floating-point operator, and when the final repeated single instruction sets the last one or more operands in-flight into the at least one convertToBinaryFromDecimalCharacter hardware conversion circuit, the results from the first repeated single instruction have already spilled into the data memory write port and are available for reading, thereby effectuating an apparent single-clock latency to perform both the convertToBinaryFromDecimalCharacter conversion and the floating-point operator computation;
wherein the operand first and second read addresses and the result write address for the data memory are automatically added to by respective amounts specified by the single instruction each time the single instruction is repeated.

10. The universal floating-point ISA compute engine as recited in claim 9, wherein the human-readable decimal character sequence floating-point representations are IEEE 754-2008 H=20 in length, and there are two fully pipelined convertToBinaryFromDecimalCharacter hardware conversion circuits operating in parallel with each convertToBinaryFromDecimalCharacter hardware conversion circuit having up to 64 stages, said hardware circuitry of the ISA compute engine being thereby configured to convert the H=20 human-readable decimal character sequence floating-point representations to IEEE 754-2008 binary floating-point representations in 64 or fewer clock cycles.

11. The universal floating-point ISA compute engine as recited in claim 10, wherein the at least one hardware floating-point operator is configured to perform a binary64 MUL operation in four or fewer clock cycles or a binary64 ADD operation in eight or fewer clock cycles and to automatically spill the result into the data memory write port at the destination address specified by the single instruction.

12. The universal floating-point ISA compute engine as recited in claim 11, wherein the hardware circuitry of the ISA compute engine further comprises a convertToDecimal-CharacterFromBinary hardware conversion circuit configured to convert the result from the at least one hardware floating-point operator back to an H=20 human-readable decimal character sequence floating-point representation in an additional 64 or fewer clock cycles.

13. The universal floating-point ISA compute engine as recited in claim 3, wherein the at least one memory-mapped, fully pipelined, hardware floating-point operator includes a fully pipelined, floating-point Fused-Multiply-Add (FMA) operator configured to accept on its inputs, a new set of human-readable decimal character sequence floating-point representation or IEEE 754 binary floating-point format representation operands every clock cycle.

14. The universal floating-point ISA compute engine as recited in claim 13, further comprising a hardware logic automatic conversion circuit situated in series with the FMA pipeline output, wherein the hardware logic automatic conversion circuit is configured to automatically convert the FMA operator output to human-readable decimal character sequence floating-point representations before automatically spilling into the data memory write port at the destination address specified by the single instruction.

15. The universal floating-point ISA compute engine as recited in claim 3, wherein the universal ISA compute engine is configured as a parent universal ISA compute engine connected to at least one child universal ISA compute engine via fused instruction registers, and is further configured to:
fetch a real-time monitoring and data exchange instruction; and
execute the real-time monitoring and data exchange instruction simultaneously with the at least one child universal ISA compute engine connected to the parent universal ISA compute engine.

16. The universal floating-point ISA compute engine as recited in claim 3, further comprising an IEEE 1149.1-1990 (JTAG) interface configured to issue opcodeless real-time monitoring and data exchange instructions to the universal ISA compute engine and to retrieve results once executed, without the use of hardware breakpoints, interrupts, or Direct Memory Access (DMA) cycles.

17. The universal floating-point ISA compute engine as recited in claim 3, wherein logic within the compute engine is configured to implement in hardware, all computational floating-point operations mandated by the IEEE 754-2008 specification using a single instruction per operation such that a computation can be performed without having to explicitly convert the operands used in the computation from decimal character string floating-point representations beforehand.

18. The universal floating-point ISA compute engine as recited in claim 3, wherein an exponent of the human-readable decimal character sequence floating-point representation includes a token exponent.

19. The universal floating-point ISA compute engine as recited in claim 2, wherein the means for accepting further comprises means for accepting, in combination, a mix of the human-readable decimal character sequence floating-point representation operands and IEEE 754-2008 standard binary arithmetic format floating-point representation operands.

20. The universal floating-point ISA compute engine as recited in claim 19, wherein the means for converting includes means for delivering to an input of a specified computing means, either an accepted unconverted binary arithmetic format floating-point representation operand or a binary format floating-point representation operand that was converted from an accepted human-readable decimal character sequence floating-point representation operand, wherein delivering is based on a state of a format Select bit in a received instruction.

* * * * *